US012228650B2

(12) United States Patent
LaChapelle et al.

(10) Patent No.: US 12,228,650 B2
(45) Date of Patent: Feb. 18, 2025

(54) MASTER-OSCILLATOR POWER-AMPLIFIER (MOPA) LIGHT SOURCE WITH OPTICAL ISOLATOR

(71) Applicant: Luminar Technologies, Inc., Orlando, FL (US)

(72) Inventors: Joseph G. LaChapelle, Philomath, OR (US); Jason M. Eichenholz, Orlando, FL (US); Alex Michael Sincore, Orlando, FL (US); Lawrence Shah, Winter Park, FL (US)

(73) Assignee: Luminar Technologies, Inc., Orlando, FL (US)

( * ) Notice: Subject to any disclaimer, the term of this patent is extended or adjusted under 35 U.S.C. 154(b) by 1003 days.

(21) Appl. No.: 17/183,522

(22) Filed: Feb. 24, 2021

(65) Prior Publication Data
US 2022/0043115 A1 Feb. 10, 2022

Related U.S. Application Data

(60) Provisional application No. 63/063,658, filed on Aug. 10, 2020.

(51) Int. Cl.
*G01S 17/93* (2020.01)
*B60W 60/00* (2020.01)
(Continued)

(52) U.S. Cl.
CPC ......... *G01S 17/931* (2020.01); *B60W 60/001* (2020.02); *G01S 7/4814* (2013.01); *G01S 7/4817* (2013.01); *G01S 7/4818* (2013.01); *G01S 7/484* (2013.01); *G01S 7/486* (2013.01); *G01S 7/4861* (2013.01); *G01S 7/4865* (2013.01); *G01S 17/10* (2013.01);
(Continued)

(58) Field of Classification Search
None
See application file for complete search history.

(56) References Cited

U.S. PATENT DOCUMENTS 4,555,456 A 11/1985 Endo
4,995,720 A 2/1991 Amzajerdian
(Continued)

FOREIGN PATENT DOCUMENTS

EP 3026455 6/2016
WO 2018/185576 10/2018

OTHER PUBLICATIONS

Non-Final Office Action for U.S. Appl. No. 16/913,093 dated Jul. 14, 2022.
(Continued)

*Primary Examiner* — Hovhannes Baghdasaryan
(74) *Attorney, Agent, or Firm* — Van Pelt, Yi & James LLP

(57) ABSTRACT

In one embodiment, a light source is configured to emit an optical signal. The light source includes a seed laser diode configured to produce a seed optical signal and a semiconductor optical amplifier (SOA) configured to amplify the seed optical signal to produce the emitted optical signal. The light source also includes an optical isolator disposed between the seed laser diode and the SOA, where the optical isolator is configured to (i) transmit the seed optical signal to the SOA and (ii) reduce an amount of light that propagates from the SOA toward the seed laser diode.

28 Claims, 36 Drawing Sheets

(51) Int. Cl.

| | | |
|---|---|---|
| G01S 7/481 | (2006.01) | |
| G01S 7/484 | (2006.01) | |
| G01S 7/486 | (2020.01) | |
| G01S 7/4861 | (2020.01) | |
| G01S 7/4865 | (2020.01) | |
| G01S 17/10 | (2020.01) | |
| G01S 17/26 | (2020.01) | |
| G01S 17/88 | (2006.01) | |
| G01S 17/931 | (2020.01) | |
| G02B 6/12 | (2006.01) | |
| H01S 5/026 | (2006.01) | |
| H01S 5/065 | (2006.01) | |
| H01S 5/125 | (2006.01) | |

(52) U.S. Cl.
CPC ............ *G01S 17/26* (2020.01); *G01S 17/88* (2013.01); *G02B 6/12* (2013.01); *H01S 5/0265* (2013.01); *B60W 2420/408* (2024.01); *G02B 2006/12107* (2013.01); *G02B 2006/12121* (2013.01); *G02B 2006/12123* (2013.01); *H01S 5/0656* (2013.01); *H01S 5/125* (2013.01)

(56) References Cited

U.S. PATENT DOCUMENTS

| | | |
|---|---|---|
| 5,237,331 A | 8/1993 | Henderson et al. |
| 5,550,667 A | 8/1996 | Krimmel et al. |
| 5,651,018 A | 7/1997 | Mehuys et al. |
| 5,889,490 A | 3/1999 | Wachter et al. |
| 6,014,396 A | 1/2000 | Osinski et al. |
| 6,469,778 B2 | 1/2002 | Asaka et al. |
| 6,456,417 B1 | 9/2002 | Maywar et al. |
| 6,559,932 B1 | 5/2003 | Halmos |
| 6,580,497 B1 | 6/2003 | Asaka et al. |
| 7,202,941 B2 | 4/2007 | Munro |
| 8,593,725 B2 | 11/2013 | Kliner et al. |
| 8,891,069 B2 | 11/2014 | Pedersen et al. |
| 9,310,487 B2 | 4/2016 | Sakimura et al. |
| 10,003,168 B1 * | 6/2018 | Villeneuve ............ G01S 7/4818 |
| 10,032,950 B2 | 7/2018 | Campbell et al. |
| 10,136,819 B2 | 11/2018 | Islam |
| 10,732,265 B1 | 8/2020 | Parameswaran et al. |
| 10,802,120 B1 | 10/2020 | LaChapelle et al. |
| 10,962,628 B1 | 3/2021 | Laifenfeld et al. |
| 2001/0009458 A1 | 7/2001 | Asaka et al. |
| 2002/0122180 A1 | 9/2002 | Szafraniec |
| 2005/0123232 A1 | 6/2005 | Piede et al. |
| 2006/0104234 A1 | 5/2006 | Arimoto |
| 2006/0227317 A1 | 10/2006 | Henderson et al. |
| 2007/0024842 A1 | 2/2007 | Nishizawa et al. |
| 2007/0086017 A1 | 4/2007 | Buckland et al. |
| 2008/0304826 A1 | 12/2008 | Sochava |
| 2010/0110535 A1 | 5/2010 | Murison et al. |
| 2010/0128744 A1 | 5/2010 | Deladurantaye et al. |
| 2010/0246613 A1 | 9/2010 | Hasegawa |
| 2010/0277714 A1 | 11/2010 | Pedersen et al. |
| 2011/0285980 A1 | 11/2011 | Newbury et al. |
| 2011/0292371 A1 | 12/2011 | Chang |
| 2012/0301075 A1 | 11/2012 | Wang et al. |
| 2014/0072002 A1 | 3/2014 | Connolly et al. |
| 2015/0230978 A1 | 8/2015 | Vogler et al. |
| 2015/0331110 A1 | 11/2015 | Imaki et al. |
| 2016/0104324 A1 | 4/2016 | Palm et al. |
| 2016/0013057 A1 | 6/2016 | Avdokhin et al. |
| 2016/0238534 A1 | 8/2016 | Lau et al. |
| 2016/0274220 A1 | 9/2016 | Autran |
| 2016/0377722 A1 | 12/2016 | Lardin et al. |
| 2017/0115455 A1 | 4/2017 | Slotwinski et al. |
| 2017/0155225 A1 | 6/2017 | Villeneuve et al. |
| 2017/0343652 A1 | 11/2017 | de Mersseman et al. |
| 2018/0012918 A1 | 1/2018 | Na et al. |
| 2018/0180739 A1 | 6/2018 | Droz |
| 2018/0224547 A1 | 8/2018 | Crouch et al. |
| 2018/0284237 A1 | 10/2018 | Campbell et al. |
| 2018/0284277 A1 | 10/2018 | LaChapelle et al. |
| 2018/0372870 A1 | 12/2018 | Puglia |
| 2019/0032635 A1 | 1/2019 | Haraguchi et al. |
| 2019/0064331 A1 | 2/2019 | Russell et al. |
| 2019/0064358 A1 | 2/2019 | Desai et al. |
| 2019/0204441 A1 | 7/2019 | Feneyrou et al. |
| 2019/0288479 A1 | 9/2019 | Kawahara |
| 2019/0302262 A1 | 10/2019 | Singer |
| 2019/0310071 A1 | 10/2019 | Doerr |
| 2019/0346568 A1 | 11/2019 | Feng et al. |
| 2020/0028000 A1 | 1/2020 | Wang et al. |
| 2020/0252133 A1 | 8/2020 | Hong et al. |
| 2020/0284883 A1 | 9/2020 | Ferreira et al. |
| 2020/0295529 A1 | 9/2020 | Ooi et al. |
| 2021/0075191 A1 | 3/2021 | Enderlein et al. |
| 2021/0234333 A1 | 7/2021 | Nakamura et al. |
| 2021/0311170 A1 | 10/2021 | Spencer |
| 2021/0356588 A1 | 11/2021 | El Amili et al. |
| 2022/0043115 A1 | 2/2022 | LaChapelle et al. |
| 2022/0043149 A1 | 2/2022 | LaChapelle |
| 2022/0376475 A1 | 11/2022 | Pawlus et al. |

OTHER PUBLICATIONS

Non-Final Office Action dated May 4, 2021 for U.S. Appl. No. 17/183,937.

Fiber Bragg grating https://web.archive.org/web/20161017172702/ https://en.wikipedia.org/wiki/Fiber_Bragg_grating) (Year: 2016).

Adany, Peter, "Simplified Homodyne Detection for FM Chirped Lidar," University of Kansas, 2005.

Agrawal et al., "Effect of injection-current fluctuations on the spectral linewidth of semiconductor lasers," Phys. Rev. A 37, 2495-2501 (1988).

"Artilux Explore Series for Wide Spectrum 3D Sensing," Imaging and Machine Vision, Europe, Aug.-Sep. 2019.

Champagne et al., "Linewidth broadening in a distributed feedback laser integrated with a semiconductor optical amplifier," IEEE J. Quantum Electron. 38, 1493-1502 (2002).

Chan et al., "Short Pulse Coherent Doppler Nd: YAG Lidar," Optical Engineering, vol. 30, No. 1, pp. 49-54, Jan. 1991.

Faugeron et al., "Monolithic master oscillator power amplifier at 1.58 μm for LIDAR measurements," Proceedings vol. 10563, International Conference on Space Optics—ICSO 2014; 105630U (2017), https://doi.org/10.1117/12.2304239.

Fu et al., "Efficient adiabatic silicon-on-insulator waveguide taper," Photonics Research, vol. 2, No. 3, Jun. 2014.

Giuliani et al., "Laser diode self-mixing technique for sensing applications," Journal of Optics A: Pure and Applied Optics 4 (2002) S283-S294.

Ghosh et al., "Ce:YIG/Silicon-on-Insulator waveguide optical isolator realized by adhesive bonding," Optics Express, vol. 20, No. 2, 1839-1848, Jan. 12, 2012.

Hafiz et al., "Digitally Balanced Detection for Optical Tomography," Rev. Sci. Instrum. 78, 103101 (2007).

Henry, "Theory of the linewidth of semiconductor lasers," IEEE J. Quantum Electron. 18, 259-264 (1982).

Jedrzejczyk et al., "High-power distributed-feedback tapered master-oscillator power amplifiers emitting at 1064 nm," Proc. SPIE 7583, 758317 (2010).

Joo et al., "High-Sensitivity 10 Gbps Ge-on-Si Photoreceiver Operating at λ ~ 1.55 μm," Optical Society of America, vol. 18, No. 16, Aug. 2, 2010.

Kikuchi, "Fundamentals of Coherent Optical Fiber Communications," Journal of Lightwave Technology, vol. 34, No. 1, Jan. 1, 2016.

Kim et al., "Photonic waveguide to free-space Gaussian beam extreme mode converter," Light: Science & Applications (2018) 7:72.

Lang et al., "Numerical analysis of flared semiconductor laser amplifiers," IEEE J. Quantum Electron. 29, 2044-2051 (1993).

Lang et al., "Spontaneous filamentation in broad-area diode laser amplifiers," IEEE J. Quantum Electron. 30, 685-694 (1994).

(56) References Cited

OTHER PUBLICATIONS

Lee et al., "Coherent Pulse Detection and Multi-Channel Coherent Detection Based on a Single Balanced Homodyne Receiver," Optical Society of America, vol. 15, No. 5, Mar. 7, 2007.
Na et al., "Proposal and Demonstration of Lock-In Pixels for Indirect Time-of-Flight Measurements Based on Germanium-on-Silicon Technology," Arvix.org, 2018.
Na et al., "High-Performance Germanium-on-Silicon Lock-In Pixels for Indirect Time-of-Flight Applications," International Electron Devices Meeting (IEDM), Presentation 32.4, San Francisco, CA, Dec. 5, 2018.
Painchaud et al., "Performance of balanced Detection in a Coherent Receiver," Optical Society of America, vol. 17, No. 5, Mar. 2, 2009.
Perez, "Multimode Interference Waveguides," University of California, Santa Barbara (2012).
Petermann, "External optical feedback phenomena in semiconductor lasers," IEEE J. Sel. Top. Quant. Electron. 1, 480-489 (1995).
Saber et al., "Demonstration of a 120° Hybrid Based Simplified Coherent Receiver on SOI for High Speed PON Applications," Optics Express, vol. 26, No. 24, Nov. 26, 2018.
Sood et al., "SiGe Based Visible-NIR Photodetector Technology for Optoelectronic Applications," InTech, Feb. 25, 2015.
Spießberger et al., "Micro-integrated 1Watt semiconductor laser system with a linewidth of 3.6 kHz," Opt. Express 19, 7077-7083 (2011).
Suni et al., "Photonic Integrated Circuit FMCW Lidar on a Chip," 19$^{th}$ Coherent Laser Radar Conference, Jun. 18-21, 2018, Okinawa, Japan, Paper Mo *.
Takaki et al., "Reduced linewidth rebroadening by suppressing longitudinal spatial hole burning in high-power 1.55-μm continuous-wave distributed feedback (CW-DFB) laser diodes," IEEE J. Quantum Electronics, vol. 39, No. 9, Sep. 2003.
Wang et al., "Linear Optical Sampling Technique for Simultaneously Characterizing WDM Signals with a Single Receiving Channel," Optics Express, vol. 26, No. 2, Jan. 22, 2018.
Wilson et al., "Narrow-linewidth master-oscillator power amplifier based on a semiconductor tapered amplifier," Appl. Opt. 37, 4871-4875 (1998).
Non-Final Office Action dated May 4, 2020 for related U.S. Appl. No. 16/794,439.
International Search Report and Written Opinion for PCT/US2020/046745 dated Nov. 27, 2020.
International Search Report and Written Opinion for PCT/US2021/041395 dated Oct. 25, 2021.
International Search Report and Written Opinion for PCT/US2021/041784 dated Oct. 25, 2021.
Piracha et al., "A High Resolution, Chirped Pulse Lidar for Simultaneous Range and Velocity Measurements," in CLEO:2011—Laser Applications to Photonic Applications, OSA Technical Digest (Optical Society of America, 2011), paper CMG1, May 1, 2011.
Agrawal et al., "Semiconductor Optical Amplifiers with Bragg Gratings," Nonlinear Photonic Crystals, pp. 285-300, Springer-Verlag Berlin Heidelberg, 2003.
Non-Final Office Action for U.S. Appl. No. 17/183,719 dated May 10, 2024.
International Search Report and Written Opinion for PCT/US2023/080867 dated Jun. 13, 2024.
Non-Final office Action dated Apr. 4, 2023 for U.S. Appl. No. 16/794,500.
Final Office Action dated Oct. 17, 2023 for U.S. Appl. No. 16/794,500.
European Search Report for European Application No. 20854175.5 dated Aug. 28, 2023.
Non-Final office Action dated Nov. 7, 2022 for U.S. Appl. No. 16/794,500.

* cited by examiner

MASTER-OSCILLATOR POWER-AMPLIFIER (MOPA) LIGHT SOURCE WITH OPTICAL ISOLATOR

REFERENCE TO RELATED APPLICATIONS

This application claims the benefit of U.S. Provisional Patent Application No. 63/063,658, filed 10 Aug. 2020, which is incorporated by reference herein in its entirety.

TECHNICAL FIELD

This disclosure generally relates to light sources and lidar systems.

BACKGROUND

Light detection and ranging (lidar) is a technology that can be used to measure distances to remote targets. Typically, a lidar system includes a light source and an optical receiver. The light source can include, for example, a laser which emits light having a particular operating wavelength. The operating wavelength of a lidar system may lie, for example, in the infrared, visible, or ultraviolet portions of the electromagnetic spectrum. The light source emits light toward a target which scatters the light, and some of the scattered light is received back at the receiver. The system determines the distance to the target based on one or more characteristics associated with the received light. For example, the lidar system may determine the distance to the target based on the time of flight for a pulse of light emitted by the light source to travel to the target and back to the lidar system.

DESCRIPTION OF EXAMPLE EMBODIMENTS

Figure 1:
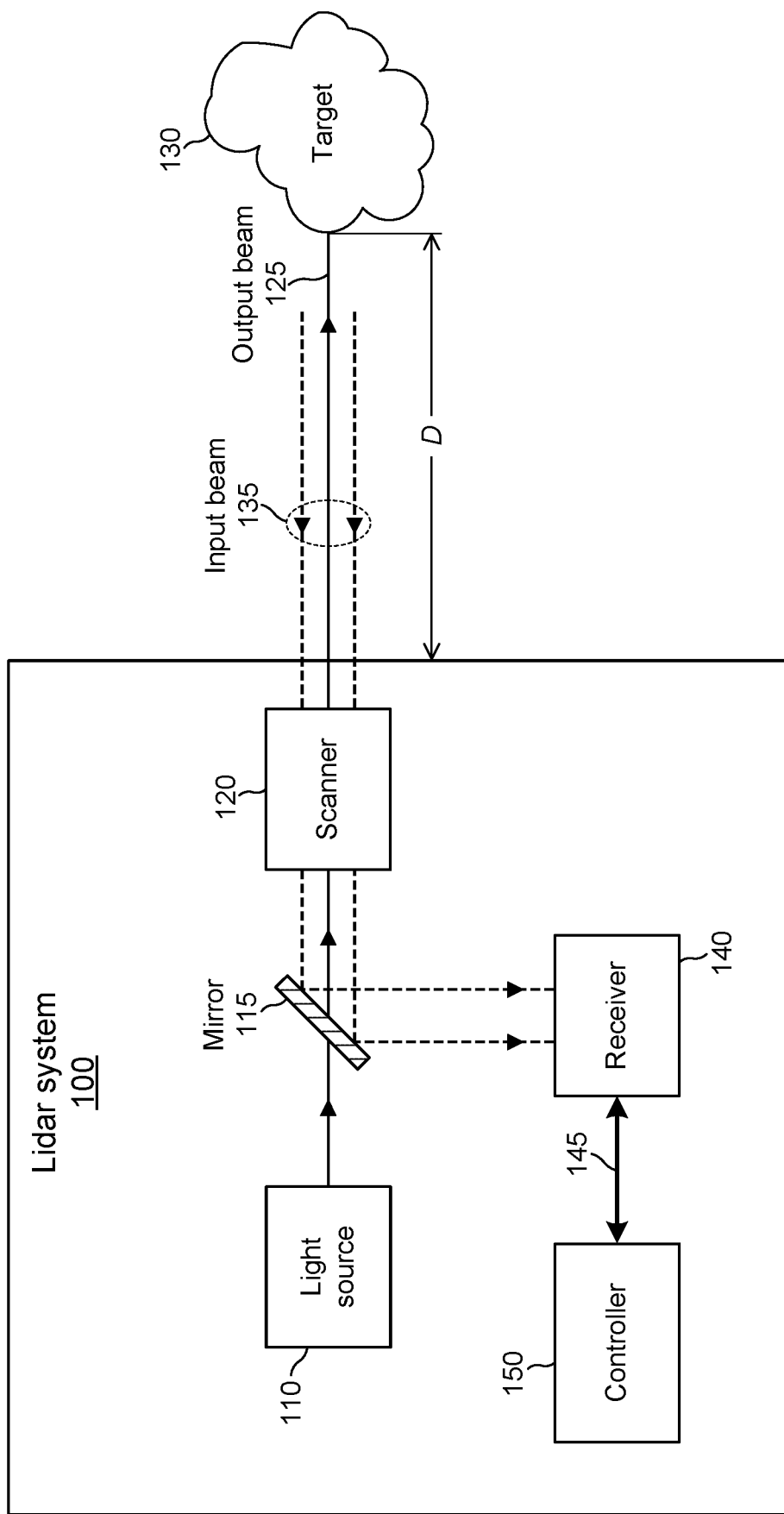
FIG. 1 illustrates an example light detection and ranging (lidar) system.

FIG. 1 illustrates an example light detection and ranging (lidar) system 100. In particular embodiments, a lidar system 100 may be referred to as a laser ranging system, a laser radar system, a LIDAR system, a lidar sensor, or a laser detection and ranging (LADAR or ladar) system. In particular embodiments, a lidar system 100 may include a light source 110, mirror 115, scanner 120, receiver 140, or controller 150. The light source 110 may include, for example, a laser which emits light having a particular operating wavelength in the infrared, visible, or ultraviolet portions of the electromagnetic spectrum. As an example, light source 110 may include a laser with one or more operating wavelengths between approximately 900 nanometers (nm) and 2000 nm. The light source 110 emits an output beam of light 125 which may be continuous wave (CW), pulsed, or modulated in any suitable manner for a given application. The output beam of light 125 is directed downrange toward a remote target 130. As an example, the remote target 130 may be located a distance D of approximately 1 m to 1 km from the lidar system 100.

Once the output beam 125 reaches the downrange target 130, the target may scatter or reflect at least a portion of light from the output beam 125, and some of the scattered or reflected light may return toward the lidar system 100. In the example of FIG. 1, the scattered or reflected light is represented by input beam 135, which passes through scanner 120 and is reflected by mirror 115 and directed to receiver 140. In particular embodiments, a relatively small fraction of the light from output beam 125 may return to the lidar system 100 as input beam 135. As an example, the ratio of input beam 135 average power, peak power, or pulse energy to output beam 125 average power, peak power, or pulse energy may be approximately $10^{-1}$, $10^{-2}$, $10^{-3}$, $10^{-4}$, $10^{-5}$, $10^{-6}$, $10^{-7}$, $10^{-8}$, $10^{-9}$, $10^{-10}$, $10^{-11}$, or $10^{-12}$. As another example, if a pulse of output beam 125 has a pulse energy of 1 microjoule (µJ), then the pulse energy of a corresponding pulse of input beam 135 may have a pulse energy of approximately 10 nanojoules (nJ), 1 nJ, 100 picojoules (pJ), 10 pJ, 1 pJ, 100 femtojoules (fJ), 10 fJ, 1 fJ, 100 attojoules (aJ), 10 aJ, 1 aJ, or 0.1 aJ.

In particular embodiments, output beam 125 may include or may be referred to as an optical signal, output optical signal, emitted optical signal, emitted pulse of light, laser beam, light beam, optical beam, emitted beam, emitted light, or beam. In particular embodiments, input beam 135 may include or may be referred to as a received optical signal, received pulse of light, input pulse of light, input optical signal, return beam, received beam, return light, received light, input light, scattered light, or reflected light. As used herein, scattered light may refer to light that is scattered or reflected by a target 130. As an example, an input beam 135 may include: light from the output beam 125 that is scattered by target 130; light from the output beam 125 that is reflected by target 130; or a combination of scattered and reflected light from target 130.

In particular embodiments, receiver 140 may receive or detect photons from input beam 135 and produce one or more representative signals. For example, the receiver 140 may produce an output electrical signal 145 that is representative of the input beam 135, and the electrical signal 145 may be sent to controller 150. In particular embodiments, receiver 140 or controller 150 may include a processor, computing system (e.g., an ASIC or FPGA), or other suitable circuitry. A controller 150 may be configured to analyze one or more characteristics of the electrical signal 145 from the receiver 140 to determine one or more characteristics of the target 130, such as its distance downrange from the lidar system 100. This may be done, for example, by analyzing a time of flight or a frequency or phase of a transmitted beam of light 125 or a received beam of light 135. If lidar system 100 measures a time of flight of $\Delta T$ (e.g., $\Delta T$ represents a round-trip time of flight for an emitted pulse of light to travel from the lidar system 100 to the target 130 and back to the lidar system 100), then the distance D from the target 130 to the lidar system 100 may be expressed as $D = c \cdot \Delta T/2$, where c is the speed of light (approximately $3.0 \times 10^8$ m/s). As an example, if a time of flight is measured to be $\Delta T = 300$ ns, then the distance from the target 130 to the lidar system 100 may be determined to be approximately D=45.0 m. As another example, if a time of flight is measured to be $\Delta T = 1.33$ µs, then the distance from the target 130 to the lidar system 100 may be determined to be approximately D=199.5 m. In particular embodiments, a distance D from lidar system 100 to a target 130 may be referred to as a distance, depth, or range of target 130. As used herein, the speed of light c refers to the speed of light in any suitable medium, such as for example in air, water, or vacuum. As an example, the speed of light in vacuum is approximately $2.9979 \times 10^8$ m/s, and the speed of light in air (which has a refractive index of approximately 1.0003) is approximately $2.9970 \times 10^8$ m/s.

In particular embodiments, light source 110 may include a pulsed or CW laser. As an example, light source 110 may be a pulsed laser configured to produce or emit pulses of light with a pulse duration or pulse width of approximately 10 picoseconds (ps) to 100 nanoseconds (ns). The pulses may have a pulse duration ($\Delta\tau$) of approximately 100 ps, 200 ps, 400 ps, 1 ns, 2 ns, 5 ns, 10 ns, 20 ns, 50 ns, 100 ns, or any other suitable pulse duration. As another example, light source 110 may be a pulsed laser that produces pulses with a pulse duration of approximately 1-5 ns. As another example, light source 110 may be a pulsed laser that produces pulses at a pulse repetition frequency of approximately 80 kHz to 10 MHz or a pulse period (e.g., a time between consecutive pulses) of approximately 100 ns to 12.5 μs. In particular embodiments, light source 110 may have a substantially constant pulse repetition frequency, or light source 110 may have a variable or adjustable pulse repetition frequency. As an example, light source 110 may be a pulsed laser that produces pulses at a substantially constant pulse repetition frequency of approximately 640 kHz (e.g., 640,000 pulses per second), corresponding to a pulse period of approximately 1.56 μs. As another example, light source 110 may have a pulse repetition frequency (which may be referred to as a repetition rate) that can be varied from approximately 200 kHz to 3 MHz. As used herein, a pulse of light may be referred to as an optical pulse, a light pulse, or a pulse.

In particular embodiments, light source 110 may include a pulsed or CW laser that produces a free-space output beam 125 having any suitable average optical power. As an example, output beam 125 may have an average power of approximately 1 milliwatt (mW), 10 mW, 100 mW, 1 watt (W), 10 W, or any other suitable average power. In particular embodiments, output beam 125 may include optical pulses with any suitable pulse energy or peak optical power. As an example, output beam 125 may include pulses with a pulse energy of approximately 0.01 μJ, 0.1 μJ, 0.5 μJ, 1 μJ, 2 μJ, 10 μJ, 100 μJ, 1 mJ, or any other suitable pulse energy. As another example, output beam 125 may include pulses with a peak power of approximately 10 W, 100 W, 1 kW, 5 kW, 10 kW, or any other suitable peak power. The peak power ($P_{peak}$) of a pulse of light can be related to the pulse energy (E) by the expression $E = P_{peak} \cdot \Delta t$, where $\Delta t$ is the duration of the pulse, and the duration of a pulse may be defined as the full width at half maximum duration of the pulse. For example, an optical pulse with a duration of 1 ns and a pulse energy of 1 μJ has a peak power of approximately 1 kW. The average power ($P_{av}$) of an output beam 125 can be related to the pulse repetition frequency (PRF) and pulse energy by the expression $P_{av} = PRF \cdot E$. For example, if the pulse repetition frequency is 500 kHz, then the average power of an output beam 125 with 1-μJ pulses is approximately 0.5 W.

In particular embodiments, light source 110 may include a laser diode, such as for example, a Fabry-Perot laser diode, a quantum well laser, a distributed Bragg reflector (DBR) laser, a distributed feedback (DFB) laser, a vertical-cavity surface-emitting laser (VCSEL), a quantum dot laser diode, a grating-coupled surface-emitting laser (GCSEL), a slab-coupled optical waveguide laser (SCOWL), a single-transverse-mode laser diode, a multi-mode broad area laser diode, a laser-diode bar, a laser-diode stack, or a tapered-stripe laser diode. As an example, light source 110 may include an aluminum-gallium-arsenide (AlGaAs) laser diode, an indium-gallium-arsenide (InGaAs) laser diode, an indium-gallium-arsenide-phosphide (InGaAsP) laser diode, or a laser diode that includes any suitable combination of aluminum (Al), indium (In), gallium (Ga), arsenic (As), phosphorous (P), or any other suitable material. In particular embodiments, light source 110 may include a pulsed or CW laser diode with a peak emission wavelength between 1200 nm and 1600 nm. As an example, light source 110 may include a current-modulated InGaAsP DFB laser diode that produces optical pulses at a wavelength of approximately 1550 nm. As another example, light source 110 may include a laser diode that emits light at a wavelength between 1500 nm and 1510 nm.

In particular embodiments, light source 110 may include a pulsed or CW laser diode followed by one or more optical-amplification stages. For example, a seed laser diode may produce a seed optical signal, and an optical amplifier may amplify the seed optical signal to produce an amplified optical signal that is emitted by the light source 110. In particular embodiments, an optical amplifier may include a fiber-optic amplifier or a semiconductor optical amplifier (SOA). For example, a pulsed laser diode may produce relatively low-power optical seed pulses which are amplified by a fiber-optic amplifier. As another example, a light source 110 may include a fiber-laser module that includes a current-modulated laser diode with an operating wavelength of approximately 1550 nm followed by a single-stage or a multi-stage erbium-doped fiber amplifier (EDFA) or erbium-ytterbium-doped fiber amplifier (EYDFA) that amplifies the seed pulses from the laser diode. As another example, light source 110 may include a continuous-wave (CW) or quasi-CW laser diode followed by an external optical modulator (e.g., an electro-optic amplitude modulator). The optical modulator may modulate the CW light from the laser diode to produce optical pulses which are sent to a fiber-optic amplifier or SOA. As another example, light source 110 may include a pulsed or CW seed laser diode followed by a semiconductor optical amplifier (SOA). The SOA may include an active optical waveguide configured to receive light from the seed laser diode and amplify the light as it propagates through the waveguide. The optical gain of the SOA may be provided by pulsed or direct-current (DC) electrical current supplied to the SOA. The SOA may be integrated on the same chip as the seed laser diode, or the SOA may be a separate device with an anti-reflection coating on its input facet or output facet. As another example, light source 110 may include a seed laser diode followed by a SOA, which in turn is followed by a fiber-optic amplifier. For example, the seed laser diode may produce relatively low-power seed pulses which are amplified by the SOA, and the fiber-optic amplifier may further amplify the optical pulses.

In particular embodiments, light source 110 may include a direct-emitter laser diode. A direct-emitter laser diode (which may be referred to as a direct emitter) may include a laser diode which produces light that is not subsequently amplified by an optical amplifier. A light source 110 that includes a direct-emitter laser diode may not include an optical amplifier, and the output light produced by a direct emitter may not be amplified after it is emitted by the laser diode. The light produced by a direct-emitter laser diode (e.g., optical pulses, CW light, or frequency-modulated light) may be emitted directly as a free-space output beam 125 without being amplified. A direct-emitter laser diode may be driven by an electrical power source that supplies current pulses to the laser diode, and each current pulse may result in the emission of an output optical pulse.

In particular embodiments, light source 110 may include a diode-pumped solid-state (DPSS) laser. A DPSS laser (which may be referred to as a solid-state laser) may refer to a laser that includes a solid-state, glass, ceramic, or crystal-based gain medium that is pumped by one or more pump laser diodes. The gain medium may include a host material that is doped with rare-earth ions (e.g., neodymium, erbium, ytterbium, or praseodymium). For example, a gain medium may include a yttrium aluminum garnet (YAG) crystal that is doped with neodymium (Nd) ions, and the gain medium may be referred to as a Nd:YAG crystal. A DPSS laser with a Nd:YAG gain medium may produce light at a wavelength between approximately 1300 nm and approximately 1400 nm, and the Nd:YAG gain medium may be pumped by one or more pump laser diodes with an operating wavelength between approximately 730 nm and approximately 900 nm. A DPSS laser may be a passively Q-switched laser that includes a saturable absorber (e.g., a vanadium-doped crystal that acts as a saturable absorber). Alternatively, a DPSS laser may be an actively Q-switched laser that includes an active Q-switch (e.g., an acousto-optic modulator or an electro-optic modulator). A passively or actively Q-switched DPSS laser may produce output optical pulses that form an output beam 125 of a lidar system 100.

In particular embodiments, an output beam of light 125 emitted by light source 110 may be a collimated optical beam having any suitable beam divergence, such as for example, a full-angle beam divergence of approximately 0.5 to 10 milliradians (mrad). A divergence of output beam 125 may refer to an angular measure of an increase in beam size (e.g., a beam radius or beam diameter) as output beam 125 travels away from light source 110 or lidar system 100. In particular embodiments, output beam 125 may have a substantially circular cross section with a beam divergence characterized by a single divergence value. As an example, an output beam 125 with a circular cross section and a full-angle beam divergence of 2 mrad may have a beam diameter or spot size of approximately 20 cm at a distance of 100 m from lidar system 100. In particular embodiments, output beam 125 may have a substantially elliptical cross section characterized by two divergence values. As an example, output beam 125 may have a fast axis and a slow axis, where the fast-axis divergence is greater than the slow-axis divergence. As another example, output beam 125 may be an elliptical beam with a fast-axis divergence of 4 mrad and a slow-axis divergence of 2 mrad.

In particular embodiments, an output beam of light 125 emitted by light source 110 may be unpolarized or randomly polarized, may have no specific or fixed polarization (e.g., the polarization may vary with time), or may have a particular polarization (e.g., output beam 125 may be linearly polarized, elliptically polarized, or circularly polarized). As an example, light source 110 may produce light with no specific polarization or may produce light that is linearly polarized.

In particular embodiments, lidar system 100 may include one or more optical components configured to reflect, focus, filter, shape, modify, steer, or direct light within the lidar system 100 or light produced or received by the lidar system 100 (e.g., output beam 125 or input beam 135). As an example, lidar system 100 may include one or more lenses, mirrors, filters (e.g., band-pass or interference filters), beam splitters, polarizers, polarizing beam splitters, wave plates (e.g., half-wave or quarter-wave plates), diffractive elements, holographic elements, isolators, couplers, detectors, beam combiners, or collimators. The optical components in a lidar system 100 may be free-space optical components, fiber-coupled optical components, or a combination of free-space and fiber-coupled optical components.

In particular embodiments, lidar system 100 may include a telescope, one or more lenses, or one or more mirrors configured to expand, focus, or collimate the output beam 125 or the input beam 135 to a desired beam diameter or divergence. As an example, the lidar system 100 may include one or more lenses to focus the input beam 135 onto a photodetector of receiver 140. As another example, the lidar system 100 may include one or more flat mirrors or curved mirrors (e.g., concave, convex, or parabolic mirrors) to steer or focus the output beam 125 or the input beam 135. For example, the lidar system 100 may include an off-axis parabolic mirror to focus the input beam 135 onto a photodetector of receiver 140. As illustrated in FIG. 1, the lidar system 100 may include mirror 115 (which may be a metallic or dielectric mirror), and mirror 115 may be configured so that light beam 125 passes through the mirror 115 or passes along an edge or side of the mirror 115 and input beam 135 is reflected toward the receiver 140. As an example, mirror 115 (which may be referred to as an overlap mirror, superposition mirror, or beam-combiner mirror) may include a hole, slot, or aperture which output light beam 125 passes through. As another example, rather than passing through the mirror 115, the output beam 125 may be directed to pass alongside the mirror 115 with a gap (e.g., a gap of width approximately 0.1 mm, 0.5 mm, 1 mm, 2 mm, 5 mm, or 10 mm) between the output beam 125 and an edge of the mirror 115.

In particular embodiments, mirror 115 may provide for output beam 125 and input beam 135 to be substantially coaxial so that the two beams travel along approximately the same optical path (albeit in opposite directions). The input and output beams being substantially coaxial may refer to the beams being at least partially overlapped or sharing a common propagation axis so that input beam 135 and output beam 125 travel along substantially the same optical path (albeit in opposite directions). As an example, output beam 125 and input beam 135 may be parallel to each other to within less than 10 mrad, 5 mrad, 2 mrad, 1 mrad, 0.5 mrad, or 0.1 mrad. As output beam 125 is scanned across a field of regard, the input beam 135 may follow along with the output beam 125 so that the coaxial relationship between the two beams is maintained.

In particular embodiments, lidar system 100 may include a scanner 120 configured to scan an output beam 125 across a field of regard of the lidar system 100. As an example, scanner 120 may include one or more scanning mirrors configured to pivot, rotate, oscillate, or move in an angular manner about one or more rotation axes. The output beam 125 may be reflected by a scanning mirror, and as the scanning mirror pivots or rotates, the reflected output beam 125 may be scanned in a corresponding angular manner. As an example, a scanning mirror may be configured to periodically pivot back and forth over a 30-degree range, which results in the output beam 125 scanning back and forth across a 60-degree range (e.g., a Θ-degree rotation by a scanning mirror results in a 2Θ-degree angular scan of output beam 125).

In particular embodiments, a scanning mirror (which may be referred to as a scan mirror) may be attached to or mechanically driven by a scanner actuator or mechanism which pivots or rotates the mirror over a particular angular range (e.g., over a 5° angular range, 30° angular range, 60° angular range, 120° angular range, 360° angular range, or any other suitable angular range). A scanner actuator or mechanism configured to pivot or rotate a mirror may include a galvanometer scanner, a resonant scanner, a piezoelectric actuator, a voice coil motor, an electric motor (e.g., a DC motor, a brushless DC motor, a synchronous electric motor, or a stepper motor), a microelectromechanical systems (MEMS) device, or any other suitable actuator or mechanism. As an example, a scanner 120 may include a scanning mirror attached to a galvanometer scanner configured to pivot back and forth over a 1° to 30° angular range. As another example, a scanner 120 may include a scanning mirror that is attached to or is part of a MEMS device configured to scan over a 1° to 30° angular range. As another example, a scanner 120 may include a polygon mirror configured to rotate continuously in the same direction (e.g., rather than pivoting back and forth, the polygon mirror continuously rotates 360 degrees in a clockwise or counter-clockwise direction). The polygon mirror may be coupled or attached to a synchronous motor configured to rotate the polygon mirror at a substantially fixed rotational frequency (e.g., a rotational frequency of approximately 1 Hz, 10 Hz, 50 Hz, 100 Hz, 500 Hz, or 1,000 Hz).

In particular embodiments, scanner 120 may be configured to scan the output beam 125 (which may include at least a portion of the light emitted by light source 110) across a field of regard of the lidar system 100. A field of regard (FOR) of a lidar system 100 may refer to an area, region, or angular range over which the lidar system 100 may be configured to scan or capture distance information. As an example, a lidar system 100 with an output beam 125 with a 30-degree scanning range may be referred to as having a 30-degree angular field of regard. As another example, a lidar system 100 with a scanning mirror that rotates over a 30-degree range may produce an output beam 125 that scans across a 60-degree range (e.g., a 60-degree FOR). In particular embodiments, lidar system 100 may have a FOR of approximately 10°, 20°, 40°, 60°, 120°, 360°, or any other suitable FOR.

In particular embodiments, scanner 120 may be configured to scan the output beam 125 horizontally and vertically, and lidar system 100 may have a particular FOR along the horizontal direction and another particular FOR along the vertical direction. As an example, lidar system 100 may have a horizontal FOR of 10° to 120° and a vertical FOR of 2° to 45°. In particular embodiments, scanner 120 may include a first scan mirror and a second scan mirror, where the first scan mirror directs the output beam 125 toward the second scan mirror, and the second scan mirror directs the output beam 125 downrange from the lidar system 100. As an example, the first scan mirror may scan the output beam 125 along a first direction, and the second scan mirror may scan the output beam 125 along a second direction that is substantially orthogonal to the first direction. As another example, the first scan mirror may scan the output beam 125 along a substantially horizontal direction, and the second scan mirror may scan the output beam 125 along a substantially vertical direction (or vice versa). As another example, the first and second scan mirrors may each be driven by galvanometer scanners. As another example, the first or second scan mirror may include a polygon mirror driven by an electric motor. In particular embodiments, scanner 120 may be referred to as a beam scanner, optical scanner, or laser scanner.

In particular embodiments, one or more scanning mirrors may be communicatively coupled to controller 150 which may control the scanning mirror(s) so as to guide the output beam 125 in a desired direction downrange or along a desired scan pattern. In particular embodiments, a scan pattern may refer to a pattern or path along which the output beam 125 is directed. As an example, scanner 120 may include two scanning mirrors configured to scan the output beam 125 across a 60° horizontal FOR and a 20° vertical FOR. The two scanner mirrors may be controlled to follow a scan path that substantially covers the 60°×20° FOR. As an example, the scan path may result in a point cloud with pixels that substantially cover the 60°×20° FOR. The pixels may be approximately evenly distributed across the 60°×20° FOR. Alternatively, the pixels may have a particular non-uniform distribution (e.g., the pixels may be distributed across all or a portion of the 60°×20° FOR, and the pixels may have a higher density in one or more particular regions of the 60°×20° FOR).

In particular embodiments, a lidar system 100 may include a scanner 120 with a solid-state scanning device. A solid-state scanning device may refer to a scanner 120 that scans an output beam 125 without the use of moving parts (e.g., without the use of a mechanical scanner, such as a mirror that rotates or pivots). For example, a solid-state scanner 120 may include one or more of the following: an optical phased array scanning device; a liquid-crystal scanning device; or a liquid lens scanning device. A solid-state scanner 120 may be an electrically addressable device that scans an output beam 125 along one axis (e.g., horizontally) or along two axes (e.g., horizontally and vertically). In particular embodiments, a scanner 120 may include a solid-state scanner and a mechanical scanner. For example, a scanner 120 may include an optical phased array scanner configured to scan an output beam 125 in one direction and a galvanometer scanner that scans the output beam 125 in an orthogonal direction. The optical phased array scanner may scan the output beam relatively rapidly in a horizontal direction across the field of regard (e.g., at a scan rate of 50 to 1,000 scan lines per second), and the galvanometer may pivot a mirror at a rate of 1-30 Hz to scan the output beam 125 vertically.

In particular embodiments, a lidar system 100 may include a light source 110 configured to emit pulses of light and a scanner 120 configured to scan at least a portion of the emitted pulses of light across a field of regard of the lidar system 100. One or more of the emitted pulses of light may be scattered by a target 130 located downrange from the lidar system 100, and a receiver 140 may detect at least a portion of the pulses of light scattered by the target 130. A receiver 140 may be referred to as a photoreceiver, optical receiver, optical sensor, detector, photodetector, or optical detector. In particular embodiments, lidar system 100 may include a receiver 140 that receives or detects at least a portion of input beam 135 and produces an electrical signal that corresponds to input beam 135. As an example, if input beam 135 includes an optical pulse, then receiver 140 may produce an electrical current or voltage pulse that corresponds to the optical pulse detected by receiver 140. As another example, receiver 140 may include one or more avalanche photodiodes (APDs) or one or more single-photon avalanche diodes (SPADs). As another example, receiver 140 may include one or more PN photodiodes (e.g., a photodiode structure formed by a p-type semiconductor and a n-type semiconductor, where the PN acronym refers to the structure having p-doped and n-doped regions) or one or more PIN photodiodes (e.g., a photodiode structure formed by an undoped intrinsic semiconductor region located between p-type and n-type regions, where the PIN acronym refers to the structure having p-doped, intrinsic, and n-doped regions). An APD, SPAD, PN photodiode, or PIN photodiode may each be referred to as a detector, photodetector, or photodiode. A detector may have an active region or an avalanche-multiplication region that includes silicon, germanium, InGaAs, InAsSb (indium arsenide antimonide), AlAsSb (aluminum arsenide antimonide), or AlInAsSb (aluminum indium arsenide antimonide). The active region may refer to an area over which a detector may receive or detect input light. An active region may have any suitable size or diameter, such as for example, a diameter of approximately 10 µm, 25 µm, 50 µm, 80 µm, 100 µm, 200 µm, 500 µm, 1 mm, 2 mm, or 5 mm.

In particular embodiments, receiver 140 may include electronic circuitry that performs signal amplification, sampling, filtering, signal conditioning, analog-to-digital conversion, time-to-digital conversion, pulse detection, threshold detection, rising-edge detection, or falling-edge detection. As an example, receiver 140 may include a transimpedance amplifier that converts a received photocurrent (e.g., a current produced by an APD in response to a received optical signal) into a voltage signal. The voltage signal may be sent to pulse-detection circuitry that produces an analog or digital output signal 145 that corresponds to one or more optical characteristics (e.g., rising edge, falling edge, amplitude, duration, or energy) of a received optical pulse. As an example, the pulse-detection circuitry may perform a time-to-digital conversion to produce a digital output signal 145. The electrical output signal 145 may be sent to controller 150 for processing or analysis (e.g., to determine a time-of-flight value corresponding to a received optical pulse).

In particular embodiments, a controller 150 (which may include or may be referred to as a processor, an FPGA, an ASIC, a computer, or a computing system) may be located within a lidar system 100 or outside of a lidar system 100. Alternatively, one or more parts of a controller 150 may be located within a lidar system 100, and one or more other parts of a controller 150 may be located outside a lidar system 100. In particular embodiments, one or more parts of a controller 150 may be located within a receiver 140 of a lidar system 100, and one or more other parts of a controller 150 may be located in other parts of the lidar system 100. For example, a receiver 140 may include an FPGA or ASIC configured to process an output electrical signal from the receiver 140, and the processed signal may be sent to a computing system located elsewhere within the lidar system 100 or outside the lidar system 100. In particular embodiments, a controller 150 may include any suitable arrangement or combination of logic circuitry, analog circuitry, or digital circuitry.

In particular embodiments, controller 150 may be electrically coupled or communicatively coupled to light source 110, scanner 120, or receiver 140. As an example, controller 150 may receive electrical trigger pulses or edges from light source 110, where each pulse or edge corresponds to the emission of an optical pulse by light source 110. As another example, controller 150 may provide instructions, a control signal, or a trigger signal to light source 110 indicating when light source 110 should produce optical pulses. Controller 150 may send an electrical trigger signal that includes electrical pulses, where each electrical pulse results in the emission of an optical pulse by light source 110. In particular embodiments, the frequency, period, duration, pulse energy, peak power, average power, or wavelength of the optical pulses produced by light source 110 may be adjusted based on instructions, a control signal, or trigger pulses provided by controller 150. In particular embodiments, controller 150 may be coupled to light source 110 and receiver 140, and controller 150 may determine a time-of-flight value for an optical pulse based on timing information associated with when the pulse was emitted by light source 110 and when a portion of the pulse (e.g., input beam 135) was detected or received by receiver 140. In particular embodiments, controller 150 may include circuitry that performs signal amplification, sampling, filtering, signal conditioning, analog-to-digital conversion, time-to-digital conversion, pulse detection, threshold detection, rising-edge detection, or falling-edge detection.

In particular embodiments, lidar system 100 may include one or more processors (e.g., a controller 150) configured to determine a distance D from the lidar system 100 to a target 130 based at least in part on a round-trip time of flight for an emitted pulse of light to travel from the lidar system 100 to the target 130 and back to the lidar system 100. The target 130 may be at least partially contained within a field of regard of the lidar system 100 and located a distance D from the lidar system 100 that is less than or equal to an operating range ($R_{OP}$) of the lidar system 100. In particular embodiments, an operating range (which may be referred to as an operating distance) of a lidar system 100 may refer to a distance over which the lidar system 100 is configured to sense or identify targets 130 located within a field of regard of the lidar system 100. The operating range of lidar system 100 may be any suitable distance, such as for example, 25 m, 50 m, 100 m, 200 m, 250 m, 500 m, or 1 km. As an example, a lidar system 100 with a 200-m operating range may be configured to sense or identify various targets 130 located up to 200 m away from the lidar system 100. The operating range $R_{OP}$ of a lidar system 100 may be related to the time τ between the emission of successive optical signals by the expression $R_{OP} = c \cdot \tau / 2$. For a lidar system 100 with a 200-m operating range ($R_{OP}$=200 m), the time τ between successive pulses (which may be referred to as a pulse period, a pulse repetition interval (PRI), or a time period between pulses) is approximately $2 \cdot R_{OP}/c \cong 1.33$ μs. The pulse period τ may also correspond to the time of flight for a pulse to travel to and from a target 130 located a distance $R_{OP}$ from the lidar system 100. Additionally, the pulse period τ may be related to the pulse repetition frequency (PRF) by the expression τ=1/PRF. For example, a pulse period of 1.33 μs corresponds to a PRF of approximately 752 kHz.

In particular embodiments, a lidar system 100 may be used to determine the distance to one or more downrange targets 130. By scanning the lidar system 100 across a field of regard, the system may be used to map the distance to a number of points within the field of regard. Each of these depth-mapped points may be referred to as a pixel or a voxel. A collection of pixels captured in succession (which may be referred to as a depth map, a point cloud, or a frame) may be rendered as an image or may be analyzed to identify or detect objects or to determine a shape or distance of objects within the FOR. As an example, a point cloud may cover a field of regard that extends 60° horizontally and 15° vertically, and the point cloud may include a frame of 100-2000 pixels in the horizontal direction by 4-400 pixels in the vertical direction.

In particular embodiments, lidar system 100 may be configured to repeatedly capture or generate point clouds of a field of regard at any suitable frame rate between approximately 0.1 frames per second (FPS) and approximately 1,000 FPS. As an example, lidar system 100 may generate point clouds at a frame rate of approximately 0.1 FPS, 0.5 FPS, 1 FPS, 2 FPS, 5 FPS, 10 FPS, 20 FPS, 100 FPS, 500 FPS, or 1,000 FPS. As another example, lidar system 100 may be configured to produce optical pulses at a rate of $5 \times 10^5$ pulses/second (e.g., the system may determine 500,000 pixel distances per second) and scan a frame of 1000×50 pixels (e.g., 50,000 pixels/frame), which corresponds to a point-cloud frame rate of 10 frames per second (e.g., 10 point clouds per second). In particular embodiments, a point-cloud frame rate may be substantially fixed, or a point-cloud frame rate may be dynamically adjustable. As an example, a lidar system 100 may capture one or more point clouds at a particular frame rate (e.g., 1 Hz) and then switch to capture one or more point clouds at a different frame rate (e.g., 10 Hz). A slower frame rate (e.g., 1 Hz) may be used to capture one or more high-resolution point clouds, and a faster frame rate (e.g., 10 Hz) may be used to rapidly capture multiple lower-resolution point clouds.

In particular embodiments, a lidar system 100 may be configured to sense, identify, or determine distances to one or more targets 130 within a field of regard. As an example, a lidar system 100 may determine a distance to a target 130, where all or part of the target 130 is contained within a field of regard of the lidar system 100. All or part of a target 130 being contained within a FOR of the lidar system 100 may refer to the FOR overlapping, encompassing, or enclosing at least a portion of the target 130. In particular embodiments, target 130 may include all or part of an object that is moving or stationary relative to lidar system 100. As an example, target 130 may include all or a portion of a person, vehicle, motorcycle, truck, train, bicycle, wheelchair, pedestrian, animal, road sign, traffic light, lane marking, road-surface marking, parking space, pylon, guard rail, traffic barrier, pothole, railroad crossing, obstacle in or near a road, curb, stopped vehicle on or beside a road, utility pole, house, building, trash can, mailbox, tree, any other suitable object, or any suitable combination of all or part of two or more objects. In particular embodiments, a target may be referred to as an object.

In particular embodiments, light source 110, scanner 120, and receiver 140 may be packaged together within a single housing, where a housing may refer to a box, case, or enclosure that holds or contains all or part of a lidar system 100. As an example, a lidar-system enclosure may contain a light source 110, mirror 115, scanner 120, and receiver 140 of a lidar system 100. Additionally, the lidar-system enclosure may include a controller 150. The lidar-system enclosure may also include one or more electrical connections for conveying electrical power or electrical signals to or from the enclosure. In particular embodiments, one or more components of a lidar system 100 may be located remotely from a lidar-system enclosure. As an example, all or part of light source 110 may be located remotely from a lidar-system enclosure, and pulses of light produced by the light source 110 may be conveyed to the enclosure via optical fiber. As another example, all or part of a controller 150 may be located remotely from a lidar-system enclosure.

In particular embodiments, light source 110 may include an eye-safe laser, or lidar system 100 may be classified as an eye-safe laser system or laser product. An eye-safe laser, laser system, or laser product may refer to a system that includes a laser with an emission wavelength, average power, peak power, peak intensity, pulse energy, beam size, beam divergence, exposure time, or scanned output beam such that emitted light from the system presents little or no possibility of causing damage to a person's eyes. As an example, light source 110 or lidar system 100 may be classified as a Class 1 laser product (as specified by the 60825-1:2014 standard of the International Electrotechnical Commission (IEC)) or a Class I laser product (as specified by Title 21, Section 1040.10 of the United States Code of Federal Regulations (CFR)) that is safe under all conditions of normal use. In particular embodiments, lidar system 100 may be an eye-safe laser product (e.g., with a Class 1 or Class I classification) configured to operate at any suitable wavelength between approximately 900 nm and approximately 2100 nm. As an example, lidar system 100 may include a laser with an operating wavelength between approximately 1200 nm and approximately 1400 nm or between approximately 1400 nm and approximately 1600 nm, and the laser or the lidar system 100 may be operated in an eye-safe manner. As another example, lidar system 100 may be an eye-safe laser product that includes a scanned laser with an operating wavelength between approximately 900 nm and approximately 1700 nm. As another example, lidar system 100 may be a Class 1 or Class I laser product that includes a laser diode, fiber laser, or solid-state laser with an operating wavelength between approximately 1200 nm and approximately 1600 nm. As another example, lidar system 100 may have an operating wavelength between approximately 1500 nm and approximately 1510 nm.

In particular embodiments, one or more lidar systems 100 may be integrated into a vehicle. As an example, multiple lidar systems 100 may be integrated into a car to provide a complete 360-degree horizontal FOR around the car. As another example, 2-10 lidar systems 100, each system having a 45-degree to 180-degree horizontal FOR, may be combined together to form a sensing system that provides a point cloud covering a 360-degree horizontal FOR. The lidar systems 100 may be oriented so that adjacent FORs have an amount of spatial or angular overlap to allow data from the multiple lidar systems 100 to be combined or stitched together to form a single or continuous 360-degree point cloud. As an example, the FOR of each lidar system 100 may have approximately 1-30 degrees of overlap with an adjacent FOR. In particular embodiments, a vehicle may refer to a mobile machine configured to transport people or cargo. For example, a vehicle may include, may take the form of, or may be referred to as a car, automobile, motor vehicle, truck, bus, van, trailer, off-road vehicle, farm vehicle, lawn mower, construction equipment, forklift, robot, golf cart, motorhome, taxi, motorcycle, scooter, bicycle, skateboard, train, snowmobile, watercraft (e.g., a ship or boat), aircraft (e.g., a fixed-wing aircraft, helicopter, or dirigible), unmanned aerial vehicle (e.g., drone), or spacecraft. In particular embodiments, a vehicle may include an internal combustion engine or an electric motor that provides propulsion for the vehicle.

In particular embodiments, one or more lidar systems 100 may be included in a vehicle as part of an advanced driver assistance system (ADAS) to assist a driver of the vehicle in operating the vehicle. For example, a lidar system 100 may be part of an ADAS that provides information (e.g., about the surrounding environment) or feedback to a driver (e.g., to alert the driver to potential problems or hazards) or that automatically takes control of part of a vehicle (e.g., a braking system or a steering system) to avoid collisions or accidents. A lidar system 100 may be part of a vehicle ADAS that provides adaptive cruise control, automated braking, automated parking, collision avoidance, alerts the driver to hazards or other vehicles, maintains the vehicle in the correct lane, or provides a warning if an object or another vehicle is in a blind spot.

In particular embodiments, one or more lidar systems 100 may be integrated into a vehicle as part of an autonomous-vehicle driving system. As an example, a lidar system 100 may provide information about the surrounding environment to a driving system of an autonomous vehicle. An autonomous-vehicle driving system may be configured to guide the autonomous vehicle through an environment surrounding the vehicle and toward a destination. An autonomous-vehicle driving system may include one or more computing systems that receive information from a lidar system 100 about the surrounding environment, analyze the received information, and provide control signals to the vehicle's driving systems (e.g., brakes, accelerator, steering mechanism, lights, or turn signals). As an example, a lidar system 100 integrated into an autonomous vehicle may provide an autonomous-vehicle driving system with a point cloud every 0.1 seconds (e.g., the point cloud has a 10 Hz update rate, representing 10 frames per second). The autonomous-vehicle driving system may analyze the received point clouds to sense or identify targets 130 and their respective locations, distances, or speeds, and the autonomous-vehicle driving system may update control signals based on this information. As an example, if lidar system 100 detects a vehicle ahead that is slowing down or stopping, the autonomous-vehicle driving system may send instructions to release the accelerator and apply the brakes.

In particular embodiments, an autonomous vehicle may be referred to as an autonomous car, driverless car, self-driving car, robotic car, or unmanned vehicle. In particular embodiments, an autonomous vehicle may refer to a vehicle configured to sense its environment and navigate or drive with little or no human input. As an example, an autonomous vehicle may be configured to drive to any suitable location and control or perform all safety-critical functions (e.g., driving, steering, braking, parking) for the entire trip, with the driver not expected to control the vehicle at any time. As another example, an autonomous vehicle may allow a driver to safely turn their attention away from driving tasks in particular environments (e.g., on freeways), or an autonomous vehicle may provide control of a vehicle in all but a few environments, requiring little or no input or attention from the driver.

In particular embodiments, an autonomous vehicle may be configured to drive with a driver present in the vehicle, or an autonomous vehicle may be configured to operate the vehicle with no driver present. As an example, an autonomous vehicle may include a driver's seat with associated controls (e.g., steering wheel, accelerator pedal, and brake pedal), and the vehicle may be configured to drive with no one seated in the driver's seat or with little or no input from a person seated in the driver's seat. As another example, an autonomous vehicle may not include any driver's seat or associated driver's controls, and the vehicle may perform substantially all driving functions (e.g., driving, steering, braking, parking, and navigating) without human input. As another example, an autonomous vehicle may be configured to operate without a driver (e.g., the vehicle may be configured to transport human passengers or cargo without a driver present in the vehicle). As another example, an autonomous vehicle may be configured to operate without any human passengers (e.g., the vehicle may be configured for transportation of cargo without having any human passengers onboard the vehicle).

In particular embodiments, an optical signal (which may be referred to as a light signal, a light waveform, an optical waveform, an output beam, an emitted optical signal, or emitted light) may include pulses of light, CW light, amplitude-modulated light, frequency-modulated (FM) light, or any suitable combination thereof. Although this disclosure describes or illustrates example embodiments of lidar systems 100 or light sources 110 that produce optical signals that include pulses of light, the embodiments described or illustrated herein may also be applied, where appropriate, to other types of optical signals, including continuous-wave (CW) light, amplitude-modulated optical signals, or frequency-modulated optical signals. For example, a lidar system 100 as described or illustrated herein may be a pulsed lidar system and may include a light source 110 configured to produce pulses of light. Alternatively, a lidar system 100 may be configured to operate as a frequency-modulated continuous-wave (FMCW) lidar system and may include a light source 110 configured to produce CW light or a frequency-modulated optical signal.

In particular embodiments, a lidar system 100 may be a FMCW lidar system where the emitted light from the light source 110 (e.g., output beam 125 in FIG. 1 or FIG. 3) includes frequency-modulated light. A pulsed lidar system is a type of lidar system 100 in which the light source 110 emits pulses of light, and the distance to a remote target 130 is determined based on the round-trip time-of-flight for a pulse of light to travel to the target 130 and back. Another type of lidar system 100 is a frequency-modulated lidar system, which may be referred to as a frequency-modulated continuous-wave (FMCW) lidar system. A FMCW lidar system uses frequency-modulated light to determine the distance to a remote target 130 based on a frequency of received light (which includes emitted light scattered by the remote target) relative to a frequency of local-oscillator (LO) light. A round-trip time for the emitted light to travel to a target 130 and back to the lidar system may correspond to a frequency difference between the received scattered light and the LO light. A larger frequency difference may correspond to a longer round-trip time and a greater distance to the target 130.

For example, for a linearly chirped light source (e.g., a frequency modulation that produces a linear change in frequency with time), the larger the frequency difference between the emitted light and the received light, the farther away the target 130 is located. The frequency difference may be determined by mixing the received light with a portion of the emitted light (e.g., by coupling the two beams onto a detector, or by mixing analog electric signals corresponding to the received light and the emitted light) and determining the resulting beat frequency. For example, an electrical signal from an APD may be analyzed using a fast Fourier transform (FFT) technique to determine the frequency difference between the emitted light and the received light. If a linear frequency modulation m (e.g., in units of Hz/s) is applied to a CW laser, then the round-trip time $\Delta T$ may be related to the frequency difference between the received scattered light and the emitted light $\Delta F$ by the expression $\Delta T = \Delta F/m$. Additionally, the distance D from the target 130 to the lidar system 100 may be expressed as $D = c \cdot \Delta F/(2m)$, where c is the speed of light. For example, for a light source 110 with a linear frequency modulation of $10^{12}$ Hz/s (or, 1 MHz/μs), if a frequency difference (between the received scattered light and the emitted light) of 330 kHz is measured, then the distance to the target is approximately 50 meters (which corresponds to a round-trip time of approximately 330 ns). As another example, a frequency difference of 1.33 MHz corresponds to a target located approximately 200 meters away.

The light source 110 for a FMCW lidar system may include a direct-emitter laser diode or may include a seed laser diode followed by a SOA. Alternatively, the light source 110 may include a seed laser diode followed by a fiber-optic amplifier or may include a seed laser diode followed by a SOA and then a fiber-optic amplifier. The seed laser diode or the direct-emitter laser diode may be operated in a CW manner (e.g., by driving the laser diode with a substantially constant DC current), and the frequency modulation may be provided by an external modulator (e.g., an electro-optic phase modulator). Alternatively, the frequency modulation may be produced by applying a DC bias current along with a current modulation to the seed laser diode or the direct-emitter laser diode. The current modulation produces a corresponding refractive-index modulation in the laser diode, which results in a frequency modulation of the light emitted by the laser diode. The current-modulation component (and corresponding frequency modulation) may have any suitable frequency or shape (e.g., piecewise linear, sinusoidal, triangle-wave, or sawtooth).

Figure 2:
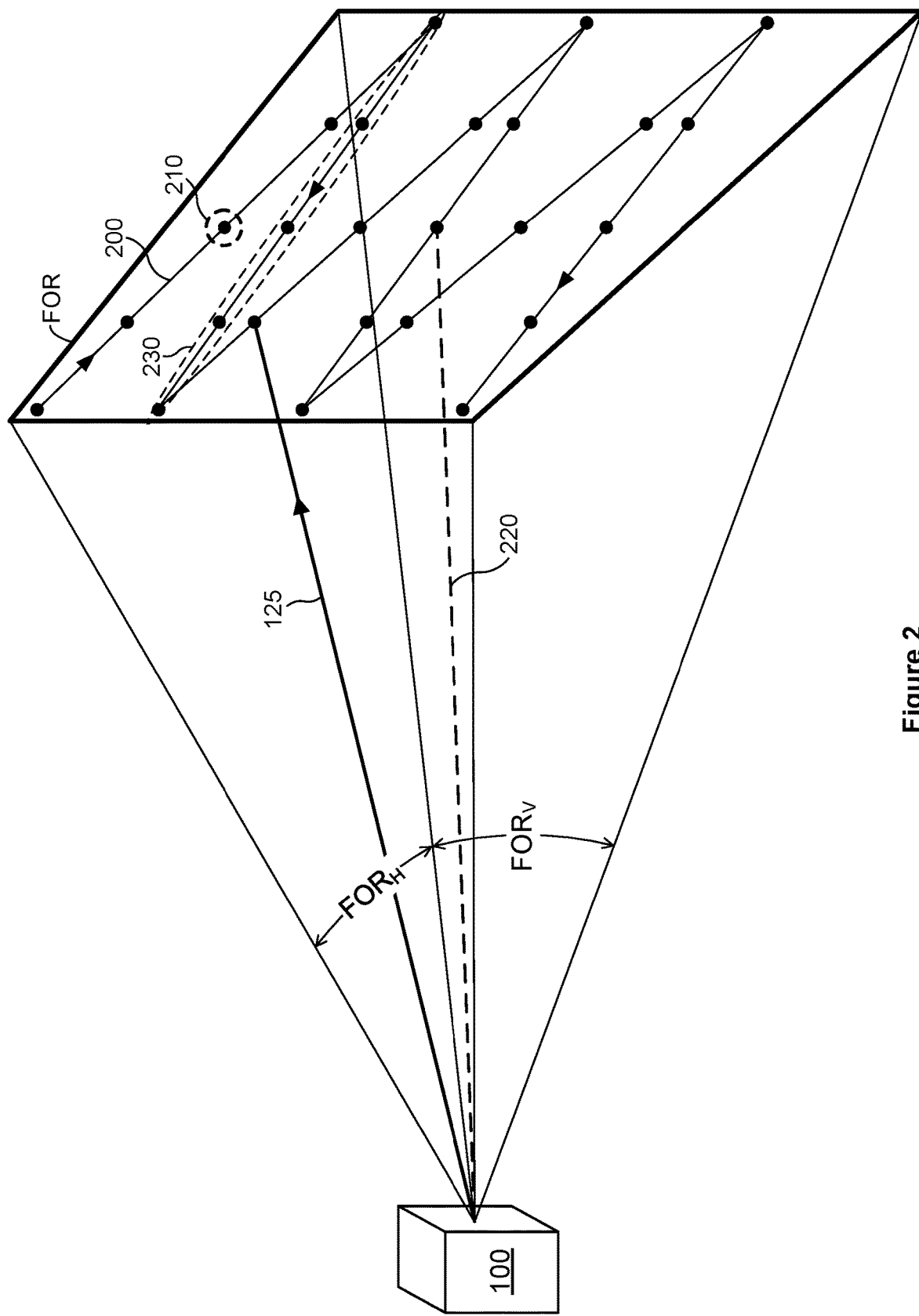
FIG. 2 illustrates an example scan pattern produced by a lidar system.

FIG. 2 illustrates an example scan pattern 200 produced by a lidar system 100. A scanner 120 of the lidar system 100 may scan the output beam 125 (which may include multiple emitted optical signals) along a scan pattern 200 that is contained within a FOR of the lidar system 100. A scan pattern 200 (which may be referred to as an optical scan pattern, optical scan path, scan path, or scan) may represent a path or course followed by output beam 125 as it is scanned across all or part of a FOR. Each traversal of a scan pattern 200 may correspond to the capture of a single frame or a single point cloud. In particular embodiments, a lidar system 100 may be configured to scan output optical beam 125 along one or more particular scan patterns 200. In particular embodiments, a scan pattern 200 may scan across any suitable field of regard (FOR) having any suitable horizontal FOR ($FOR_H$) and any suitable vertical FOR ($FOR_V$). For example, a scan pattern 200 may have a field of regard represented by angular dimensions (e.g., $FOR_H \times FOR_V$) 40°×30°, 90°×40°, or 60°×15°. As another example, a scan pattern 200 may have a $FOR_H$ greater than or equal to 10°, 25°, 30°, 40°, 60°, 90°, or 120°. As another example, a scan pattern 200 may have a $FOR_V$ greater than or equal to 2°, 5°, 10°, 15°, 20°, 30°, or 45°.

In the example of FIG. 2, reference line 220 represents a center of the field of regard of scan pattern 200. In particular embodiments, reference line 220 may have any suitable orientation, such as for example, a horizontal angle of 0° (e.g., reference line 220 may be oriented straight ahead) and a vertical angle of 0° (e.g., reference line 220 may have an inclination of 0°), or reference line 220 may have a nonzero horizontal angle or a nonzero inclination (e.g., a vertical angle of +10° or −10°). In FIG. 2, if the scan pattern 200 has a 60°×15° field of regard, then scan pattern 200 covers a ±30° horizontal range with respect to reference line 220 and a ±7.5° vertical range with respect to reference line 220. Additionally, optical beam 125 in FIG. 2 has an orientation of approximately −15° horizontal and +3° vertical with respect to reference line 220. Optical beam 125 may be referred to as having an azimuth of −15° and an altitude of +3° relative to reference line 220. In particular embodiments, an azimuth (which may be referred to as an azimuth angle) may represent a horizontal angle with respect to reference line 220, and an altitude (which may be referred to as an altitude angle, elevation, or elevation angle) may represent a vertical angle with respect to reference line 220.

In particular embodiments, a scan pattern 200 may include multiple pixels 210, and each pixel 210 may be associated with one or more laser pulses or one or more distance measurements. Additionally, a scan pattern 200 may include multiple scan lines 230, where each scan line represents one scan across at least part of a field of regard, and each scan line 230 may include multiple pixels 210. In FIG. 2, scan line 230 includes five pixels 210 and corresponds to an approximately horizontal scan across the FOR from right to left, as viewed from the lidar system 100. In particular embodiments, a cycle of scan pattern 200 may include a total of $P_x \times P_y$ pixels 210 (e.g., a two-dimensional distribution of $P_x$ by $P_y$ pixels). As an example, scan pattern 200 may include a distribution with dimensions of approximately 100-2,000 pixels 210 along a horizontal direction and approximately 4-400 pixels 210 along a vertical direction. As another example, scan pattern 200 may include a distribution of 1,000 pixels 210 along the horizontal direction by 64 pixels 210 along the vertical direction (e.g., the frame size is 1000×64 pixels) for a total of 64,000 pixels per cycle of scan pattern 200. In particular embodiments, the number of pixels 210 along a horizontal direction may be referred to as a horizontal resolution of scan pattern 200, and the number of pixels 210 along a vertical direction may be referred to as a vertical resolution. As an example, scan pattern 200 may have a horizontal resolution of greater than or equal to 100 pixels 210 and a vertical resolution of greater than or equal to 4 pixels 210. As another example, scan pattern 200 may have a horizontal resolution of 100-2,000 pixels 210 and a vertical resolution of 4-400 pixels 210.

In particular embodiments, each pixel 210 may be associated with a distance (e.g., a distance to a portion of a target 130 from which an associated laser pulse was scattered) or one or more angular values. As an example, a pixel 210 may be associated with a distance value and two angular values (e.g., an azimuth and altitude) that represent the angular location of the pixel 210 with respect to the lidar system 100. A distance to a portion of target 130 may be determined based at least in part on a time-of-flight measurement for a corresponding pulse. An angular value (e.g., an azimuth or altitude) may correspond to an angle (e.g., relative to reference line 220) of output beam 125 (e.g., when a corresponding pulse is emitted from lidar system 100) or an angle of input beam 135 (e.g., when an input signal is received by lidar system 100). In particular embodiments, an angular value may be determined based at least in part on a position of a component of scanner 120. As an example, an azimuth or altitude value associated with a pixel 210 may be determined from an angular position of one or more corresponding scanning mirrors of scanner 120.

Figure 3:
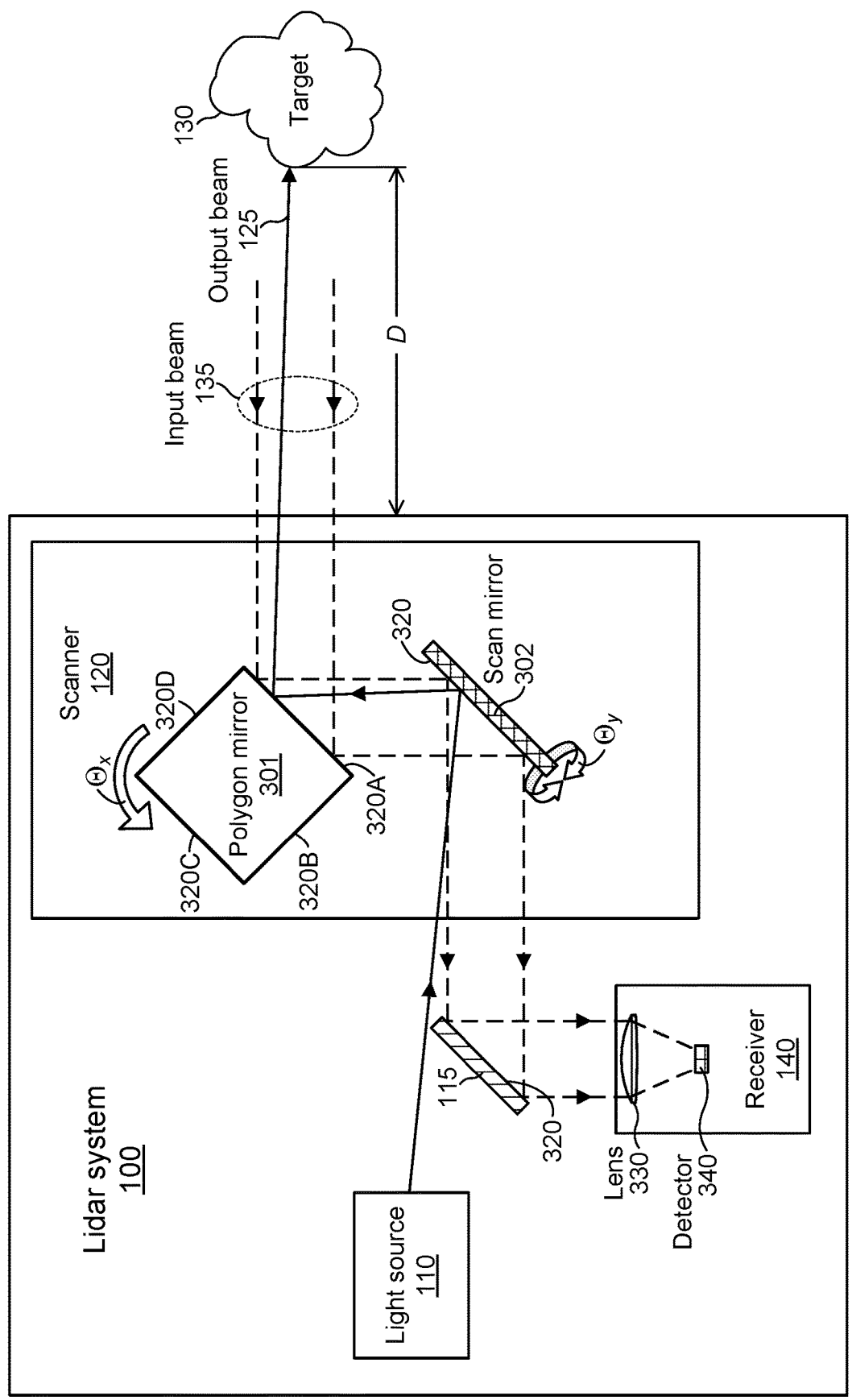
FIG. 3 illustrates an example lidar system with an example rotating polygon mirror.

FIG. 3 illustrates an example lidar system 100 with an example rotating polygon mirror 301. In particular embodiments, a scanner 120 may include a polygon mirror 301 configured to scan output beam 125 along a particular direction. In the example of FIG. 3, scanner 120 includes two scanning mirrors: (1) a polygon mirror 301 that rotates along the $\Theta_x$ direction and (2) a scanning mirror 302 that oscillates back and forth along the $\Theta_y$ direction. The output beam 125 from light source 110, which passes alongside mirror 115, is reflected by reflecting surface 320 of scan mirror 302 and is then reflected by a reflecting surface (e.g., surface 320A, 320B, 320C, or 320D) of polygon mirror 301. Scattered light from a target 130 returns to the lidar system 100 as input beam 135. The input beam 135 reflects from polygon mirror 301, scan mirror 302, and mirror 115, which directs input beam 135 through focusing lens 330 and to the detector 340 of receiver 140. The detector 340 may be a PN photodiode, a PIN photodiode, an APD, a SPAD, or any other suitable detector. A reflecting surface 320 (which may be referred to as a reflective surface) may include a reflective metallic coating (e.g., gold, silver, or aluminum) or a reflective dielectric coating, and the reflecting surface 320 may have any suitable reflectivity R at an operating wavelength of the light source 110 (e.g., R greater than or equal to 70%, 80%, 90%, 95%, 98%, or 99%).

In particular embodiments, a polygon mirror 301 may be configured to rotate along a $\Theta_x$ or $\Theta_y$ direction and scan output beam 125 along a substantially horizontal or vertical direction, respectively. A rotation along a $\Theta_x$ direction may refer to a rotational motion of mirror 301 that results in output beam 125 scanning along a substantially horizontal direction. Similarly, a rotation along a $\Theta_y$ direction may refer to a rotational motion that results in output beam 125 scanning along a substantially vertical direction. In FIG. 3, mirror 301 is a polygon mirror that rotates along the $\Theta_x$ direction and scans output beam 125 along a substantially horizontal direction, and mirror 302 pivots along the $\Theta_y$ direction and scans output beam 125 along a substantially vertical direction. In particular embodiments, a polygon mirror 301 may be configured to scan output beam 125 along any suitable direction. As an example, a polygon mirror 301 may scan output beam 125 at any suitable angle with respect to a horizontal or vertical direction, such as for example, at an angle of approximately 0°, 10°, 20°, 30°, 45°, 60°, 70°, 80°, or 90° with respect to a horizontal or vertical direction.

In particular embodiments, a polygon mirror 301 may refer to a multi-sided object having reflective surfaces 320 on two or more of its sides or faces. As an example, a polygon mirror may include any suitable number of reflective faces (e.g., 2, 3, 4, 5, 6, 7, 8, or 10 faces), where each face includes a reflective surface 320. A polygon mirror 301 may have a cross-sectional shape of any suitable polygon, such as for example, a triangle (with three reflecting surfaces 320), square (with four reflecting surfaces 320), pentagon (with five reflecting surfaces 320), hexagon (with six reflecting surfaces 320), heptagon (with seven reflecting surfaces 320), or octagon (with eight reflecting surfaces 320). In FIG. 3, the polygon mirror 301 has a substantially square cross-sectional shape and four reflecting surfaces (320A, 320B, 320C, and 320D). The polygon mirror 301 in FIG. 3 may be referred to as a square mirror, a cube mirror, or a four-sided polygon mirror. In FIG. 3, the polygon mirror 301 may have a shape similar to a cube, cuboid, or rectangular prism. Additionally, the polygon mirror 301 may have a total of six sides, where four of the sides include faces with reflective surfaces (320A, 320B, 320C, and 320D).

In particular embodiments, a polygon mirror 301 may be continuously rotated in a clockwise or counter-clockwise rotation direction about a rotation axis of the polygon mirror 301. The rotation axis may correspond to a line that is perpendicular to the plane of rotation of the polygon mirror 301 and that passes through the center of mass of the polygon mirror 301. In FIG. 3, the polygon mirror 301 rotates in the plane of the drawing, and the rotation axis of the polygon mirror 301 is perpendicular to the plane of the drawing. An electric motor may be configured to rotate a polygon mirror 301 at a substantially fixed frequency (e.g., a rotational frequency of approximately 1 Hz (or 1 revolution per second), 10 Hz, 50 Hz, 100 Hz, 500 Hz, or 1,000 Hz). As an example, a polygon mirror 301 may be mechanically coupled to an electric motor (e.g., a synchronous electric motor) which is configured to spin the polygon mirror 301 at a rotational speed of approximately 160 Hz (or, 9600 revolutions per minute (RPM)).

In particular embodiments, output beam 125 may be reflected sequentially from the reflective surfaces 320A, 320B, 320C, and 320D as the polygon mirror 301 is rotated. This results in the output beam 125 being scanned along a particular scan axis (e.g., a horizontal or vertical scan axis) to produce a sequence of scan lines, where each scan line corresponds to a reflection of the output beam 125 from one of the reflective surfaces of the polygon mirror 301. In FIG. 3, the output beam 125 reflects off of reflective surface 320A to produce one scan line. Then, as the polygon mirror 301 rotates, the output beam 125 reflects off of reflective surfaces 320B, 320C, and 320D to produce a second, third, and fourth respective scan line. In particular embodiments, a lidar system 100 may be configured so that the output beam 125 is first reflected from polygon mirror 301 and then from scan mirror 302 (or vice versa). As an example, an output beam 125 from light source 110 may first be directed to polygon mirror 301, where it is reflected by a reflective surface of the polygon mirror 301, and then the output beam 125 may be directed to scan mirror 302, where it is reflected by reflective surface 320 of the scan mirror 302. In the example of FIG. 3, the output beam 125 is reflected from the polygon mirror 301 and the scan mirror 302 in the reverse order. In FIG. 3, the output beam 125 from light source 110 is first directed to the scan mirror 302, where it is reflected by reflective surface 320, and then the output beam 125 is directed to the polygon mirror 301, where it is reflected by reflective surface 320A.

Figure 4:
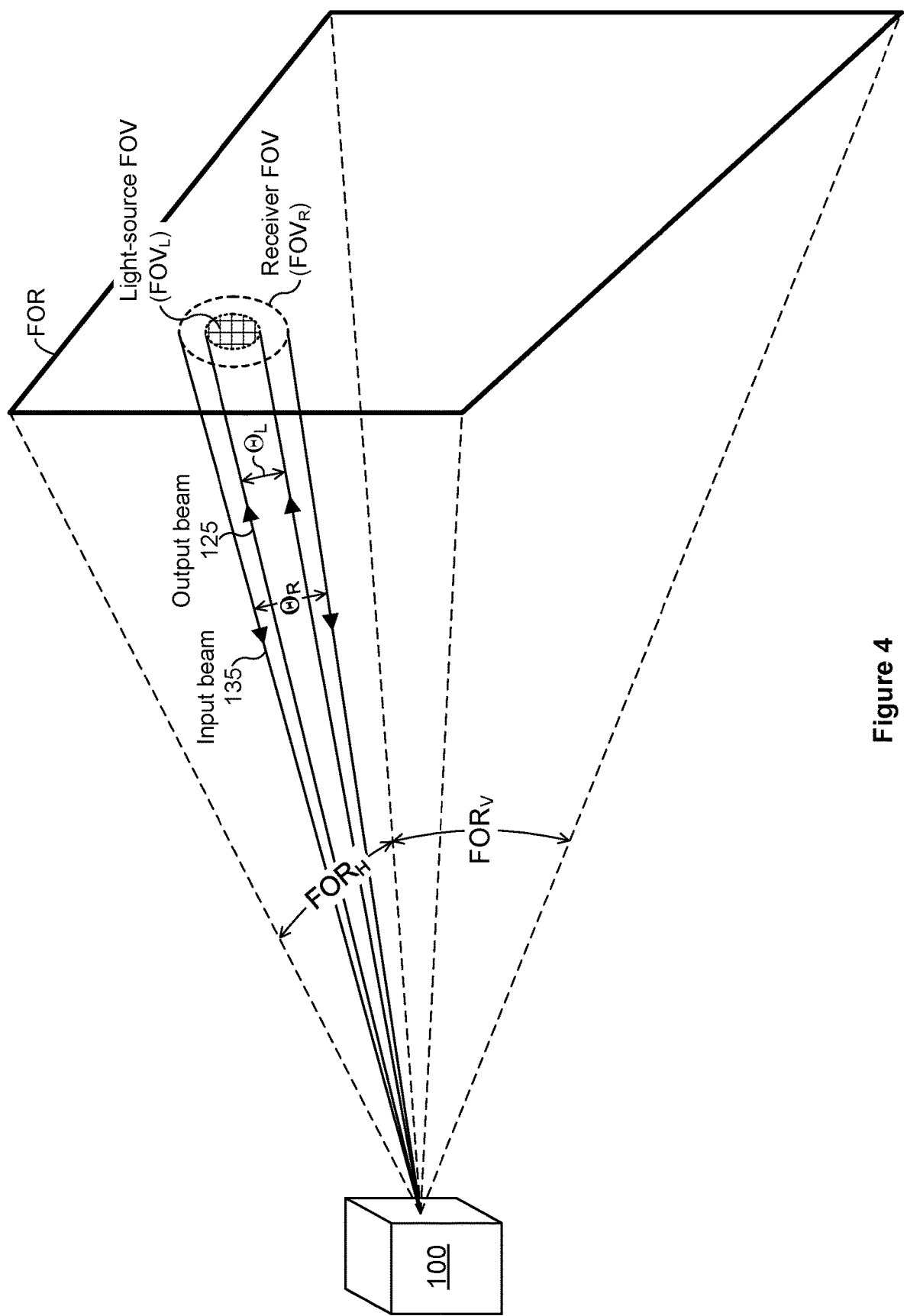
FIG. 4 illustrates an example light-source field of view ($FOV_L$) and receiver field of view ($FOV_R$) for a lidar system.

FIG. 4 illustrates an example light-source field of view ($FOV_L$) and receiver field of view ($FOV_R$) for a lidar system 100. A light source 110 of lidar system 100 may emit pulses of light as the $FOV_L$ and $FOV_R$ are scanned by scanner 120 across a field of regard (FOR). In particular embodiments, a light-source field of view may refer to an angular cone illuminated by the light source 110 at a particular instant of time. Similarly, a receiver field of view may refer to an angular cone over which the receiver 140 may receive or detect light at a particular instant of time, and any light outside the receiver field of view may not be received or detected. As an example, as the light-source field of view is scanned across a field of regard, a portion of a pulse of light emitted by the light source 110 may be sent downrange from lidar system 100, and the pulse of light may be sent in the direction that the $FOV_L$ is pointing at the time the pulse is emitted. The pulse of light may scatter off a target 130, and the receiver 140 may receive and detect a portion of the scattered light that is directed along or contained within the $FOV_R$.

In particular embodiments, scanner 120 may be configured to scan both a light-source field of view and a receiver field of view across a field of regard of the lidar system 100. Multiple pulses of light may be emitted and detected as the scanner 120 scans the $FOV_L$ and $FOV_R$ across the field of regard of the lidar system 100 while tracing out a scan pattern 200. In particular embodiments, the light-source field of view and the receiver field of view may be scanned synchronously with respect to one another, so that as the $FOV_L$ is scanned across a scan pattern 200, the $FOV_R$ follows substantially the same path at the same scanning speed. Additionally, the $FOV_L$ and $FOV_R$ may maintain the same relative position to one another as they are scanned across the field of regard. As an example, the $FOV_L$ may be substantially overlapped with or centered inside the $FOV_R$ (as illustrated in FIG. 4), and this relative positioning between $FOV_L$ and $FOV_R$ may be maintained throughout a scan. As another example, the $FOV_R$ may lag behind the $FOV_L$ by a particular, fixed amount throughout a scan (e.g., the $FOV_R$ may be offset from the $FOV_L$ in a direction opposite the scan direction).

In particular embodiments, the $FOV_L$ may have an angular size or extent $\Theta_L$ that is substantially the same as or that corresponds to the divergence of the output beam 125, and the $FOV_R$ may have an angular size or extent $\Theta_R$ that corresponds to an angle over which the receiver 140 may receive and detect light. In particular embodiments, the receiver field of view may be any suitable size relative to the light-source field of view. As an example, the receiver field of view may be smaller than, substantially the same size as, or larger than the angular extent of the light-source field of view. In particular embodiments, the light-source field of view may have an angular extent of less than or equal to 50 milliradians, and the receiver field of view may have an angular extent of less than or equal to 50 milliradians. The $FOV_L$ may have any suitable angular extent $\Theta_L$, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. Similarly, the $FOV_R$ may have any suitable angular extent $\Theta_R$, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. In particular embodiments, the light-source field of view and the receiver field of view may have approximately equal angular extents. As an example, $\Theta_L$ and $\Theta_R$ may both be approximately equal to 1 mrad, 2 mrad, or 4 mrad. In particular embodiments, the receiver field of view may be larger than the light-source field of view, or the light-source field of view may be larger than the receiver field of view. As an example, $\Theta_L$ may be approximately equal to 3 mrad, and $\Theta_R$ may be approximately equal to 4 mrad. As another example, $\Theta_R$ may be approximately L times larger than $\Theta_L$, where L is any suitable factor, such as for example, 1.1, 1.2, 1.5, 2, 3, 5, or 10.

In particular embodiments, a pixel 210 may represent or may correspond to a light-source field of view or a receiver field of view. As the output beam 125 propagates from the light source 110, the diameter of the output beam 125 (as well as the size of the corresponding pixel 210) may increase according to the beam divergence $\Theta_L$. As an example, if the output beam 125 has a $\Theta_L$ of 2 mrad, then at a distance of 100 m from the lidar system 100, the output beam 125 may have a size or diameter of approximately 20 cm, and a corresponding pixel 210 may also have a corresponding size or diameter of approximately 20 cm. At a distance of 200 m from the lidar system 100, the output beam 125 and the corresponding pixel 210 may each have a diameter of approximately 40 cm.

Figure 5:
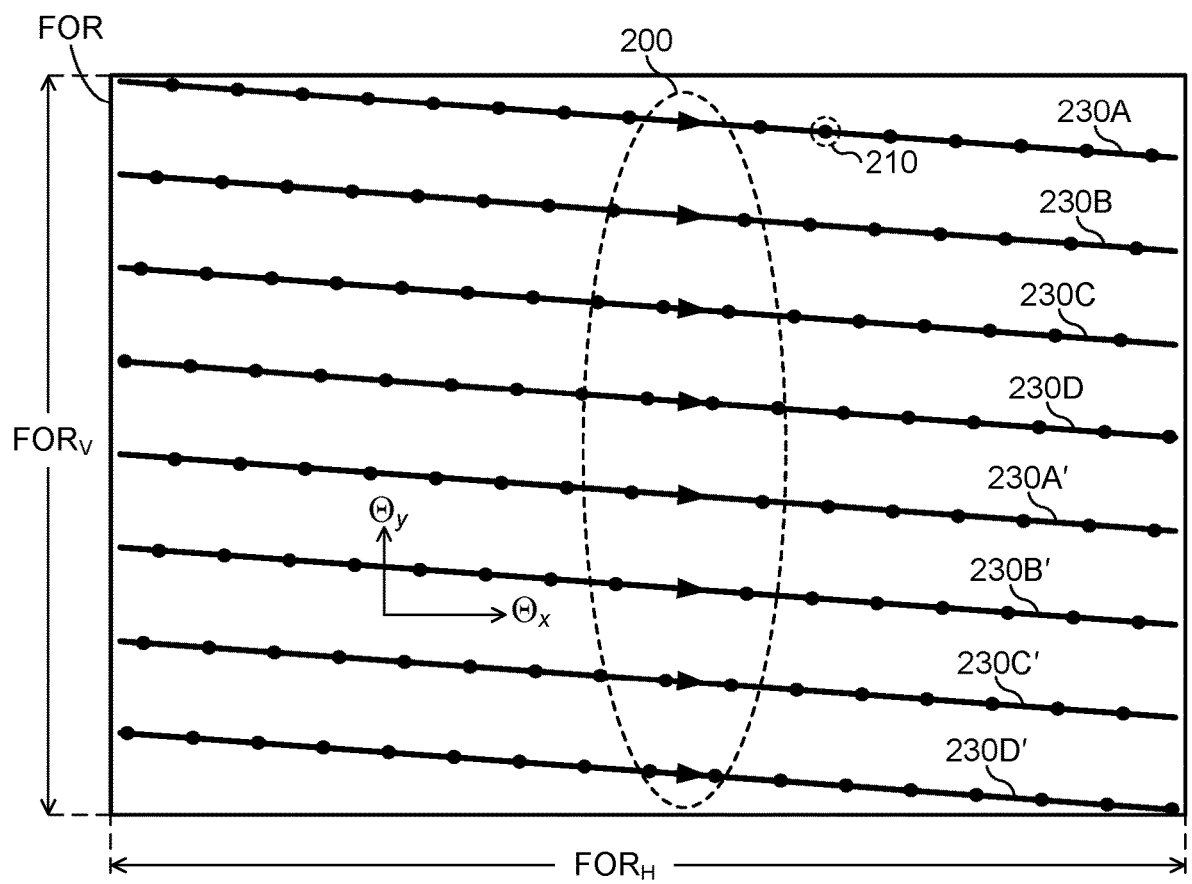
FIG. 5 illustrates an example unidirectional scan pattern that includes multiple pixels and multiple scan lines.

FIG. 5 illustrates an example unidirectional scan pattern 200 that includes multiple pixels 210 and multiple scan lines 230. In particular embodiments, scan pattern 200 may include any suitable number of scan lines 230 (e.g., approximately 1, 2, 5, 10, 20, 50, 100, 500, or 1,000 scan lines), and each scan line 230 of a scan pattern 200 may include any suitable number of pixels 210 (e.g., 1, 2, 5, 10, 20, 50, 100, 200, 500, 1,000, 2,000, or 5,000 pixels). The scan pattern 200 illustrated in FIG. 5 includes eight scan lines 230, and each scan line 230 includes approximately 16 pixels 210. In particular embodiments, a scan pattern 200 where the scan lines 230 are scanned in two directions (e.g., alternately scanning from right to left and then from left to right) may be referred to as a bidirectional scan pattern 200, and a scan pattern 200 where the scan lines 230 are scanned in the same direction may be referred to as a unidirectional scan pattern 200. The scan pattern 200 in FIG. 2 may be referred to as a bidirectional scan pattern, and the scan pattern 200 in FIG. 5 may be referred to as a unidirectional scan pattern 200 where each scan line 230 travels across the FOR in substantially the same direction (e.g., approximately from left to right as viewed from the lidar system 100). In particular embodiments, scan lines 230 of a unidirectional scan pattern 200 may be directed across a FOR in any suitable direction, such as for example, from left to right, from right to left, from top to bottom, from bottom to top, or at any suitable angle (e.g., at a 0°, 5°, 10°, 30°, or 45° angle) with respect to a horizontal or vertical axis. In particular embodiments, each scan line 230 in a unidirectional scan pattern 200 may be a separate line that is not directly connected to a previous or subsequent scan line 230.

In particular embodiments, a unidirectional scan pattern 200 may be produced by a scanner 120 that includes a polygon mirror (e.g., polygon mirror 301 of FIG. 3), where each scan line 230 is associated with a particular reflective surface 320 of the polygon mirror. As an example, reflective surface 320A of polygon mirror 301 in FIG. 3 may produce scan line 230A in FIG. 5. Similarly, as the polygon mirror 301 rotates, reflective surfaces 320B, 320C, and 320D may successively produce scan lines 230B, 230C, and 230D, respectively. Additionally, for a subsequent revolution of the polygon mirror 301, the scan lines 230A', 230B', 230C', and 230D' may be successively produced by reflections of the output beam 125 from reflective surfaces 320A, 320B, 320C, and 320D, respectively. In particular embodiments, N successive scan lines 230 of a unidirectional scan pattern 200 may correspond to one full revolution of a N-sided polygon mirror. As an example, the four scan lines 230A, 230B, 230C, and 230D in FIG. 5 may correspond to one full revolution of the four-sided polygon mirror 301 in FIG. 3. Additionally, a subsequent revolution of the polygon mirror 301 may produce the next four scan lines 230A', 230B', 230C', and 230D' in FIG. 5.

Figure 6:
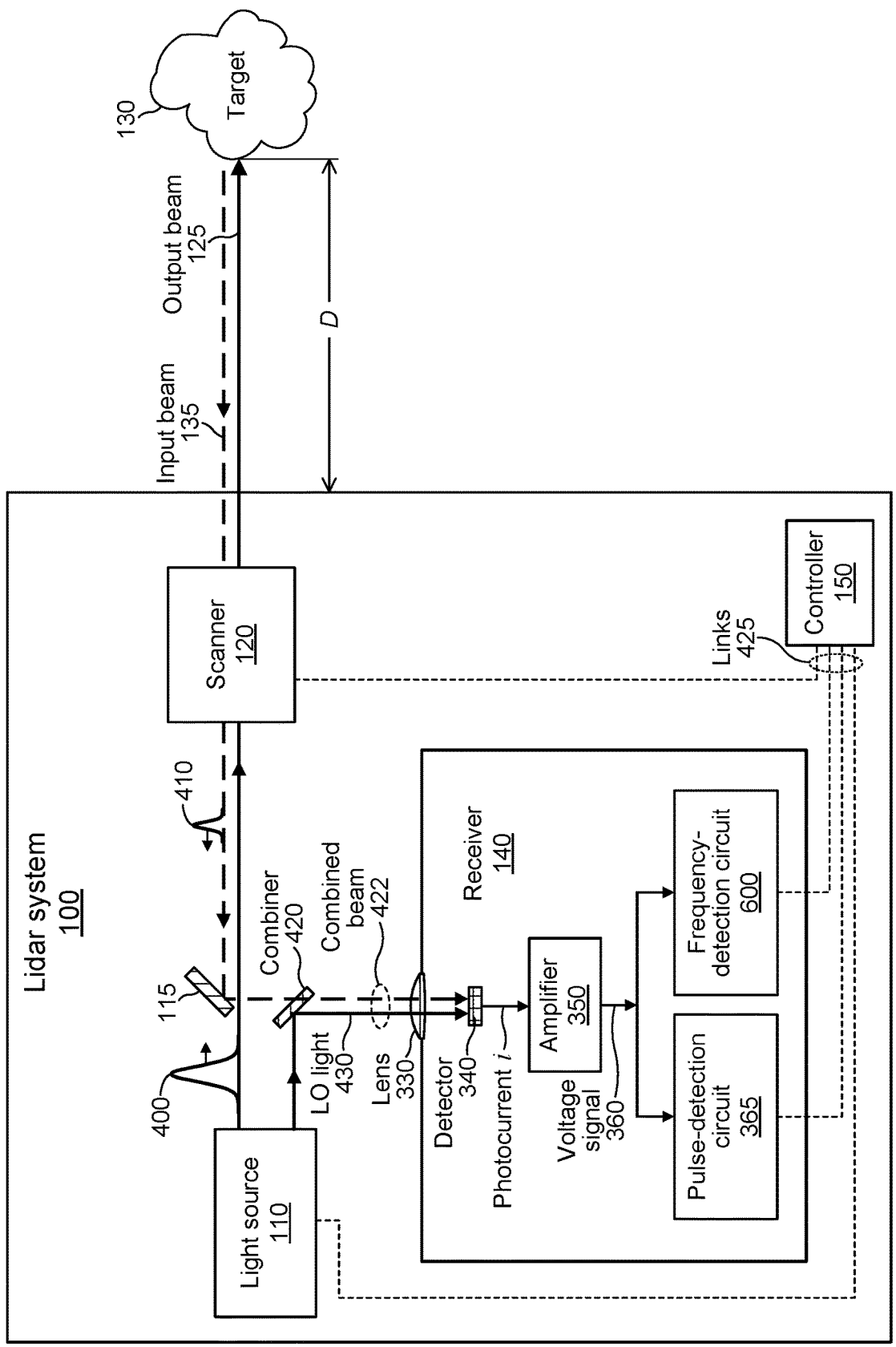
FIG. 6 illustrates an example lidar system with a light source that emits pulses of light and local-oscillator (LO) light.

FIG. 6 illustrates an example lidar system 100 with a light source 110 that emits pulses of light 400 and local-oscillator (LO) light 430. The lidar system 100 in FIG. 6 includes a light source 110, a scanner 120, a receiver 140, and a controller 150. The receiver 140 includes a detector 340, an amplifier 350, a pulse-detection circuit 365, and a frequency-detection circuit 600. The lidar system 100 illustrated in FIG. 6 may be referred to as a coherent pulsed lidar system in which the light source 110 emits LO light 430 and pulses of light 400, where each emitted pulse of light 400 is coherent with a corresponding portion of the LO light 430. Additionally, the receiver 140 in a coherent pulsed lidar system may be configured to detect the LO light 430 and a received pulse of light 410, where the LO light 430 and the received pulse of light 410 (which includes scattered light from one of the emitted pulses of light 400) are coherently mixed together at the receiver 140. The LO light 430 may be referred to as a local-oscillator optical signal or a LO optical signal.

In particular embodiments, a coherent pulsed lidar system 100 may include a light source 110 configured to emit pulses of light 400 and LO light 430. The emitted pulses of light 400 may be part of an output beam 125 that is scanned by a scanner 120 across a field of regard of the lidar system 100, and the LO light 430 may be sent to a receiver 140 of the lidar system 100. The light source 110 may include a seed laser that produces seed light and the LO light 430. Additionally, the light source 110 may include an optical amplifier that amplifies the seed light to produce the emitted pulses of light 400. For example, the optical amplifier may be a pulsed optical amplifier that amplifies temporal portions of the seed light to produce the emitted pulses of light 400, where each amplified temporal portion of the seed light corresponds to one of the emitted pulses of light 400. The pulses of light 400 emitted by the light source 110 may have one or more of the following optical characteristics: a wavelength between 900 nm and 1700 nm; a pulse energy between 0.01 µJ and 100 µJ; a pulse repetition frequency between 80 kHz and 10 MHz; and a pulse duration between 0.1 ns and 20 ns. For example, the light source 110 may emit pulses of light 400 with a wavelength of approximately 1550 nm, a pulse energy of approximately 0.5 µJ, a pulse repetition frequency of approximately 750 kHz, and a pulse duration of approximately 5 ns. As another example, the light source 110 may emit pulses of light with a wavelength from approximately 1500 nm to approximately 1510 nm.

In particular embodiments, a coherent pulsed lidar system 100 may include a scanner 120 configured to scan an output beam 125 across a field of regard of the lidar system 100. The scanner 120 may receive the output beam 125 (which includes the emitted pulses of light 400) from the light source 110, and the scanner 120 may include one or more scanning mirrors configured to scan the output beam 125. In addition to scanning the output beam 125, the scanner may also scan a FOV of the detector 340 across the field of regard so that the output beam 125 and the detector FOV are scanned at the same scanning speed or with the same relative position to one another. Alternatively, the lidar system 100 may be configured so that only the output beam 125 is scanned, and the detector has a static FOV that is not scanned. In this case, the input beam 135 (which includes received pulses of light 410) may bypass the scanner 120 and be directed to the receiver 140 without passing through the scanner 120.

In particular embodiments, a coherent pulsed lidar system 100 may include an optical combiner 420 configured to optically combine LO light 430 with a received pulse of light 410. Optically combining LO light 430 with a received pulse of light 410 (which is part of the input beam 135) may include spatially overlapping the LO light 430 with the input beam 135 to produce a combined beam 422. The combined beam 422 may include light from the LO light 430 and the input beam 135 combined together so that the two beams propagate coaxially along the same path. For example, the combiner 420 in FIG. 6 may be a free-space optical beam-splitter that reflects at least part of the LO light 430 and transmits at least part of the input beam 135 so that the LO light 430 and the input beam 135 are spatially overlapped and propagate coaxially to the detector 340. As another example, the combiner 420 in FIG. 6 may be a mirror that reflects the LO light 430 and directs it to the detector 340, where it is combined with the input beam 135. As another example, a combiner 420 may include an optical-waveguide component or a fiber-optic component that spatially overlaps the LO light 430 and the input beam 135 so that the LO light 430 and the input beam 135 propagate together in a waveguide or in a core of an optical fiber.

In particular embodiments, a coherent pulsed lidar system 100 may include a receiver 140 that detects LO light 430 and received pulses of light 410. A received pulse of light 410 may include light from one of the emitted pulses of light 400 that is scattered by a target 130 located a distance from the lidar system 100. The receiver 140 may include one or more detectors 340, and the LO light 430 and a received pulse of light 410 may be coherently mixed together at one or more of the detectors 340. One or more of the detectors 340 may produce photocurrent signals that correspond to the coherent mixing of the LO light 430 and the received pulse of light 410. The lidar system 100 in FIG. 6 includes a receiver 140 with one detector 340 that receives the LO light 430 and the pulse of light 410, which are coherently mixed together at the detector 340. In response to the coherent mixing of the received LO light 430 and pulse of light 410, the detector 340 produces a photocurrent signal i that is amplified by an electronic amplifier 350.

In particular embodiments, a receiver 140 may include a pulse-detection circuit 365 that determines a time-of-arrival for a received pulse of light 410. The time-of-arrival for a received pulse of light 410 may correspond to a time associated with a rising edge, falling edge, peak, or temporal center of the received pulse of light 410. The time-of-arrival may be determined based at least in part on a photocurrent signal i produced by a detector 340 of the receiver 140. For example, a photocurrent signal i may include a pulse of current corresponding to the received pulse of light 410, and the electronic amplifier 350 may produce a voltage signal 360 with a voltage pulse that corresponds to the pulse of current. The pulse-detection circuit 365 may determine the time-of-arrival for the received pulse of light 410 based on a characteristic of the voltage pulse (e.g., based on a time associated with a rising edge, falling edge, peak, or temporal center of the voltage pulse). For example, the pulse-detection circuit 365 may receive an electronic trigger signal (e.g., from the light source 110 or the controller 150) when a pulse of light 400 is emitted, and the pulse-detection circuit 365 may determine the time-of-arrival for the received pulse of light 410 based on a time associated with an edge, peak, or temporal center of the voltage signal 360. The time-of-arrival may be determined based on a difference between a time when the pulse 400 is emitted and a time when the received pulse 410 is detected.

In particular embodiments, a coherent pulsed lidar system 100 may include a processor (e.g., controller 150) that determines the distance to a target 130 based at least in part on a time-of-arrival for a received pulse of light 410. The time-of-arrival for the received pulse of light 410 may correspond to a round-trip time ($\Delta T$) for at least a portion of an emitted pulse of light 400 to travel to the target 130 and back to the lidar system 100, where the portion of the emitted pulse of light 400 that travels back to the target 130 corresponds to the received pulse of light 410. The distance D to the target 130 may be determined from the expression $D = c \cdot \Delta T / 2$. For example, if the pulse-detection circuit 365 determines that the time $\Delta T$ between emission of optical pulse 400 and receipt of optical pulse 410 is 1 µs, then the controller 150 may determine that the distance to the target 130 is approximately 150 m. In particular embodiments, a round-trip time may be determined by a receiver 140, by a controller 150, or by a receiver 140 and controller 150 together. For example, a receiver 140 may determine a round-trip time by subtracting a time when a pulse 400 is emitted from a time when a received pulse 410 is detected. As another example, a receiver 140 may determine a time when a pulse 400 is emitted and a time when a received pulse 410 is detected. These values may be sent to a controller 150, and the controller 150 may determine a round-trip time by subtracting the time when the pulse 400 is emitted from the time when the received pulse 410 is detected.

In particular embodiments, a controller 150 of a lidar system 100 may be coupled to one or more components of the lidar system 100 via one or more data links 425. Each link 425 in FIG. 6 represents a data link that couples the controller 150 to another component of the lidar system 100 (e.g., light source 110, scanner 120, receiver 140, pulse-detection circuit 365, or frequency-detection circuit 600). Each data link 425 may include one or more electrical links, one or more wireless links, or one or more optical links, and the data links 425 may be used to send data, signals, or commands to or from the controller 150. For example, the controller 150 may send a command via a link 425 to the light source 110 instructing the light source 110 to emit a pulse of light 400. As another example, the pulse-detection circuit 365 may send a signal via a link 425 to the controller with information about a received pulse of light 410 (e.g., a time-of-arrival for the received pulse of light 410). Additionally, the controller 150 may be coupled via a link (not illustrated in FIG. 6) to a processor of an autonomous-vehicle driving system. The autonomous-vehicle processor may receive point-cloud data from the controller 150 and may make driving decisions based on the received point-cloud data.

Figure 7:
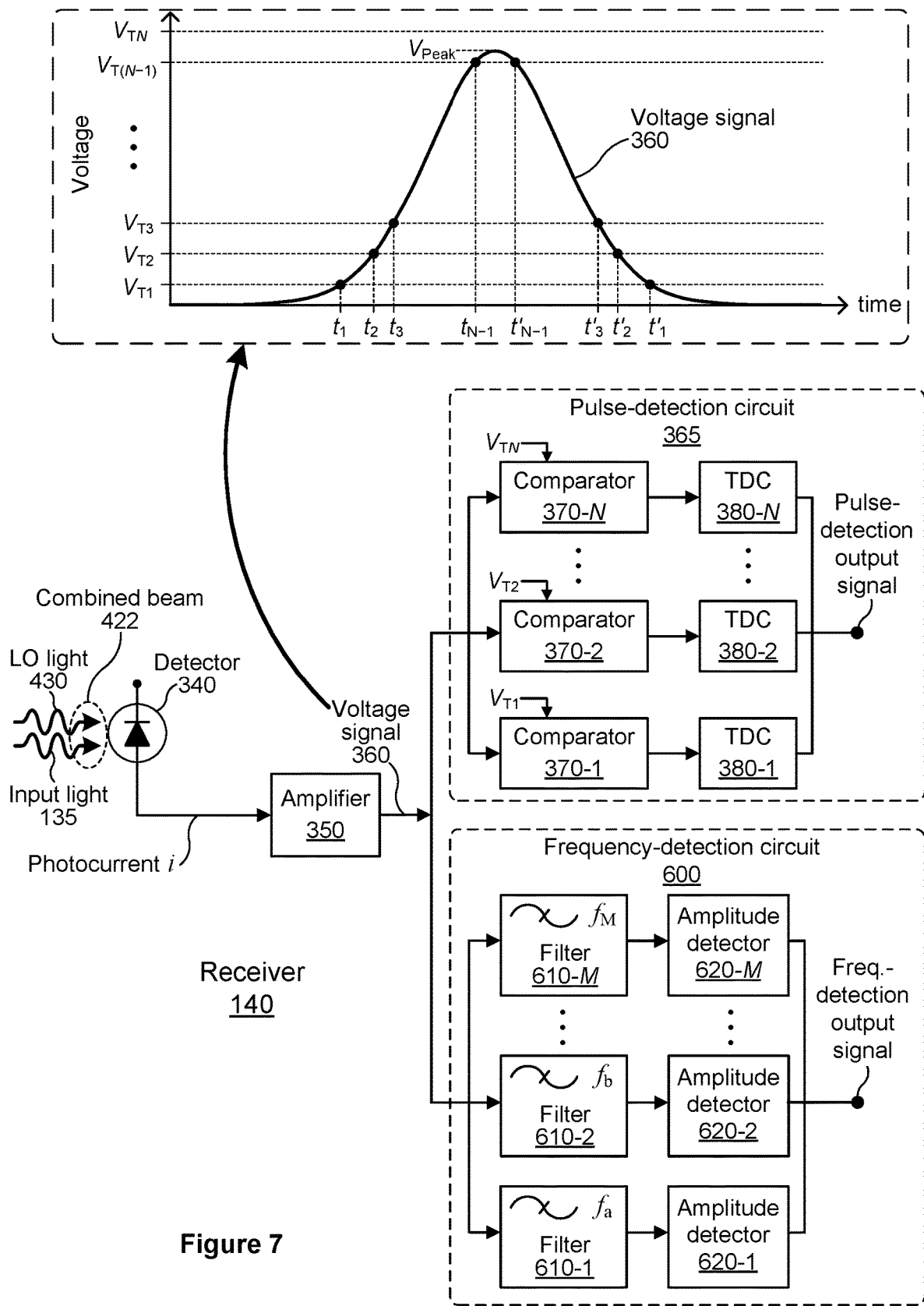
FIG. 7 illustrates an example receiver and an example voltage signal corresponding to a received pulse of light.

FIG. 7 illustrates an example receiver 140 and an example voltage signal 360 corresponding to a received pulse of light 410. A light source 110 of a lidar system 100 may emit a pulse of light 400, and a receiver 140 may be configured to detect a combined beam 422. The combined beam 422 in FIG. 7 includes LO light 430 and input light 135, where the input light 135 includes one or more received pulses of light 410. In particular embodiments, a receiver 140 of a lidar system 100 may include one or more detectors 340, one or more amplifiers 350, one or more pulse-detection circuits 365, or one or more frequency-detection circuits 600. A pulse-detection circuit 365 may include one or more comparators 370 or one or more time-to-digital converters (TDCs) 380. A frequency-detection circuit 600 may include one or more electronic filters 610 or one or more electronic amplitude detectors 620.

The receiver 140 illustrated in FIG. 7 includes a detector 340 configured to receive a combined beam 422 and produce a photocurrent i that corresponds to the coherent mixing of the LO light 430 a received pulse of light 410 (which is part of the input light 135). The photocurrent i produced by the detector 340 may be referred to as a photocurrent signal or an electrical-current signal. The detector 340 may include an APD, PN photodiode, or PIN photodiode. For example, the detector 340 may include a silicon APD or PIN photodiode configured to detect light at an 800-1100 nm operating wavelength of a lidar system 100, or the detector 340 may include an InGaAs APD or PIN photodiode configured to detect light at a 1200-1600 nm operating wavelength. In FIG. 7, the detector 340 is coupled to an electronic amplifier 350 configured to receive the photocurrent i and produce a voltage signal 360 that corresponds to the received photocurrent. For example, the detector 340 may be an APD that produces a pulse of photocurrent in response to coherent mixing of LO light 430 and a received pulse of light 410, and the voltage signal 360 may be an analog voltage pulse that corresponds to the pulse of photocurrent. The amplifier 350 may include a transimpedance amplifier configured to receive the photocurrent i and amplify the photocurrent to produce a voltage signal that corresponds to the photocurrent signal. Additionally, the amplifier 350 may include a voltage amplifier that amplifies the voltage signal or an electronic filter (e.g., a low-pass or high-pass filter) that filters the photocurrent or the voltage signal.

In FIG. 7, the voltage signal 360 produced by the amplifier 350 is coupled to a pulse-detection circuit 365 and a frequency-detection circuit 600. The pulse-detection circuit includes N comparators (comparators 370-1, 370-2, . . . , 370-N), and each comparator is supplied with a particular threshold or reference voltage ($V_{T1}$, $V_{T2}$, . . . , $V_{TN}$). For example, receiver 140 may include N=10 comparators, and the threshold voltages may be set to 10 values between 0 volts and 1 volt (e.g., VT1=0.1 V, VT2=0.2 V, and VT10=1.0 V). A comparator may produce an electrical-edge signal (e.g., a rising or falling electrical edge) when the voltage signal 360 rises above or falls below a particular threshold voltage. For example, comparator 370-2 may produce a rising edge when the voltage signal 360 rises above the threshold voltage $V_{T2}$. Additionally or alternatively, comparator 370-2 may produce a falling edge when the voltage signal 360 falls below the threshold voltage $V_{T2}$.

The pulse-detection circuit 365 in FIG. 7 includes N time-to-digital converters (TDCs 380-1, 380-2, . . . , 380-N), and each comparator is coupled to one of the TDCs. Each comparator-TDC pair in FIG. 7 (e.g., comparator 370-1 and TDC 380-1) may be referred to as a threshold detector. A comparator may provide an electrical-edge signal to a corresponding TDC, and the TDC may act as a timer that produces an electrical output signal (e.g., a digital signal, a digital word, or a digital value) that represents a time when the edge signal is received from the comparator. For example, if the voltage signal 360 rises above the threshold voltage $V_{T1}$, then the comparator 370-1 may produce a rising-edge signal that is supplied to the input of TDC 380-1, and the TDC 380-1 may produce a digital time value corresponding to a time when the edge signal was received by TDC 380-1. The digital time value may be referenced to the time when a pulse of light is emitted, and the digital time value may correspond to or may be used to determine a round-trip time for the pulse of light to travel to a target 130 and back to the lidar system 100. Additionally, if the voltage signal 360 subsequently falls below the threshold voltage $V_{T1}$, then the comparator 370-1 may produce a falling-edge signal that is supplied to the input of TDC 380-1, and the TDC 380-1 may produce a digital time value corresponding to a time when the edge signal was received by TDC 380-1.

In particular embodiments, a pulse-detection output signal may be an electrical signal that corresponds to a received pulse of light 410. For example, the pulse-detection output signal in FIG. 7 may be a digital signal that corresponds to the analog voltage signal 360, which in turn corresponds to the photocurrent signal i, which in turn corresponds to a received pulse of light 410. If an input light signal 135 includes a received pulse of light 410, the pulse-detection circuit 365 may receive a voltage signal 360 (corresponding to the photocurrent i) and produce a pulse-detection output signal that corresponds to the received pulse of light 410. The pulse-detection output signal may include one or more digital time values from each of the TDCs 380 that received one or more edge signals from a comparator 370, and the digital time values may represent the analog voltage signal 360. The pulse-detection output signal may be sent to a controller 150, and a time-of-arrival for the received pulse of light 410 may be determined based at least in part on the one or more time values produced by the TDCs. For example, the time-of-arrival may be determined from a time associated with the peak (e.g., $V_{peak}$) of the voltage signal 360 or from a temporal center of the voltage signal 360. The pulse-detection output signal in FIG. 7 may correspond to the electrical output signal 145 in FIG. 1.

In particular embodiments, a pulse-detection output signal may include one or more digital values that correspond to a time interval between (1) a time when a pulse of light 400 is emitted and (2) a time when a received pulse of light 410 is detected by a receiver 140. The pulse-detection output signal in FIG. 7 may include digital values from each of the TDCs that receive an edge signal from a comparator, and each digital value may represent a time interval between the emission of an optical pulse 400 by a light source 110 and the receipt of an edge signal from a comparator. For example, a light source 110 may emit a pulse of light 400 that is scattered by a target 130, and a receiver 140 may receive a portion of the scattered pulse of light as an input pulse of light 410. When the light source emits the pulse of light 400, a count value of the TDCs may be reset to zero counts. Alternatively, the TDCs in receiver 140 may accumulate counts continuously over two or more pulse periods (e.g., for 10, 100, 1,000, 10,000, or 100,000 pulse periods), and when a pulse of light 400 is emitted, the current TDC count may be stored in memory. After the pulse of light 400 is emitted, the TDCs may accumulate counts that correspond to elapsed time (e.g., the TDCs may count in terms of clock cycles or some fraction of clock cycles).

In FIG. 7, when TDC 380-1 receives an edge signal from comparator 370-1, the TDC 380-1 may produce a digital signal that represents the time interval between emission of the pulse of light 400 and receipt of the edge signal. For example, the digital signal may include a digital value that corresponds to the number of clock cycles that elapsed between emission of the pulse of light 400 and receipt of the edge signal. Alternatively, if the TDC 380-1 accumulates counts over multiple pulse periods, then the digital signal may include a digital value that corresponds to the TDC count at the time of receipt of the edge signal. The pulse-detection output signal may include digital values corresponding to one or more times when a pulse of light 400 was emitted and one or more times when a TDC received an edge signal. A pulse-detection output signal from a pulse-detection circuit 365 may correspond to a received pulse of light 410 and may include digital values from each of the TDCs that receive an edge signal from a comparator. The pulse-detection output signal may be sent to a controller 150, and the controller may determine the distance to the target 130 based at least in part on the pulse-detection output signal. Additionally or alternatively, the controller 150 may determine an optical characteristic of a received pulse of light 410 based at least in part on the pulse-detection output signal received from the TDCs of a pulse-detection circuit 365.

In particular embodiments, a receiver 140 of a lidar system 100 may include one or more analog-to-digital converters (ADCs). As an example, instead of including multiple comparators and TDCs, a receiver 140 may include an ADC that receives a voltage signal 360 from amplifier 350 and produces a digital representation of the voltage signal 360. Although this disclosure describes or illustrates example receivers 140 that include one or more comparators 370 and one or more TDCs 380, a receiver 140 may additionally or alternatively include one or more ADCs. As an example, in FIG. 7, instead of the N comparators 370 and N TDCs 380, the receiver 140 may include an ADC configured to receive the voltage signal 360 and produce a digital output signal that includes digitized values that correspond to the voltage signal 360.

The example voltage signal 360 illustrated in FIG. 7 corresponds to a received pulse of light 410. The voltage signal 360 may be an analog signal produced by an electronic amplifier 350 and may correspond to a pulse of light detected by the receiver 140 in FIG. 7. The voltage levels on the y-axis correspond to the threshold voltages $V_{T1}$, $V_{T2}$, . . . , $V_{TN}$ of the respective comparators 370-1, 370-2, . . . , 370-N. The time values $t_1$, $t_2$, $t_3$, . . . , $t_{N-1}$ correspond to times when the voltage signal 360 exceeds the corresponding threshold voltages, and the time values $t'_1$, $t'_2$, $t'_3$, . . . , $t'_{N-1}$ correspond to times when the voltage signal 360 falls below the corresponding threshold voltages. For example, at time $t_1$ when the voltage signal 360 exceeds the threshold voltage $V_{T1}$, comparator 370-1 may produce an edge signal, and TDC 380-1 may output a digital value corresponding to the time $t_1$. Additionally, the TDC 380-1 may output a digital value corresponding to the time $t'_1$ when the voltage signal 360 falls below the threshold voltage $V_{T1}$. Alternatively, the receiver 140 may include an additional TDC (not illustrated in FIG. 7) configured to produce a digital value corresponding to time $t'_1$ when the voltage signal 360 falls below the threshold voltage $V_{T1}$. The pulse-detection output signal from pulse-detection circuit 365 may include one or more digital values that correspond to one or more of the time values $t_1$, $t_2$, $t_3$, . . . , $t_{N-1}$ and $t'_1$, $t'_2$, $t'_3$, . . . , $t'_{N-1}$. Additionally, the pulse-detection output signal may also include one or more values corresponding to the threshold voltages associated with the time values. Since the voltage signal 360 in FIG. 7 does not exceed the threshold voltage $V_{TN}$, the corresponding comparator 370-N may not produce an edge signal. As a result, TDC 380-N may not produce a time value, or TDC 380-N may produce a signal indicating that no edge signal was received.

In particular embodiments, a pulse-detection output signal produced by a pulse-detection circuit 365 of a receiver 140 may correspond to or may be used to determine an optical characteristic of a received pulse of light 410 detected by the receiver 140. An optical characteristic of a received pulse of light 410 may correspond to a peak optical intensity, a peak optical power, an average optical power, an optical energy, a shape or amplitude, a temporal duration, or a temporal center of the received pulse of light 410. For example, a pulse of light 410 detected by receiver 140 may have one or more of the following optical characteristics: a peak optical power between 1 nanowatt and 10 watts; a pulse energy between 1 attojoule and 10 nanojoules; and a pulse duration between 0.1 ns and 50 ns. In particular embodiments, an optical characteristic of a received pulse of light 410 may be determined from a pulse-detection output signal provided by one or more TDCs 380 of a pulse-detection circuit 365 (e.g., as illustrated in FIG. 7), or an optical characteristic may be determined from a pulse-detection output signal provided by one or more ADCs of a pulse-detection circuit 365.

In particular embodiments, a peak optical power or peak optical intensity of a received pulse of light 410 may be determined from one or more values of a pulse-detection output signal provided by a receiver 140. As an example, a controller 150 may determine the peak optical power of a received pulse of light 410 based on a peak voltage ($V_{peak}$) of the voltage signal 360. The controller 150 may use a formula or lookup table that correlates a peak voltage of the voltage signal 360 with a value for the peak optical power. In the example of FIG. 7, the peak optical power of a pulse of light 410 may be determined from the threshold voltage $V_{T(N-1)}$, which is approximately equal to the peak voltage $V_{peak}$ of the voltage signal 360 (e.g., the threshold voltage $V_{T(N-1)}$ may be associated with a pulse of light 410 having a peak optical power of 10 mW). As another example, a controller 150 may apply a curve-fit or interpolation operation to the values of a pulse-detection output signal to determine the peak voltage of the voltage signal 360, and this peak voltage may be used to determine the corresponding peak optical power of a received pulse of light 410.

In particular embodiments, an energy of a received pulse of light 410 may be determined from one or more values of a pulse-detection output signal. For example, a controller 150 may perform a summation of digital values that correspond to a voltage signal 360 to determine an area under the voltage-signal curve, and the area under the voltage-signal curve may be correlated with a pulse energy of a received pulse of light 410. As an example, the approximate area under the voltage-signal curve in FIG. 7 may be determined by subdividing the curve into M subsections (where M is approximately the number of time values included in the pulse-detection output signal) and adding up the areas of each of the subsections (e.g., using a numerical integration technique such as a Riemann sum, trapezoidal rule, or Simpson's rule). For example, the approximate area A under the voltage-signal curve 360 in FIG. 7 may be determined from a Riemann sum using the expression $A=\Sigma_{k=1}^{M} V_{Tk} \times \Delta t_k$, where $V_{Tk}$ is a threshold voltage associated with the time value $t_k$, and $\Delta t_k$ is a width of the subsection associated with time value $t_k$. In the example of FIG. 7, the voltage signal 360 may correspond to a received pulse of light 410 with a pulse energy of 1 picojoule.

In particular embodiments, a duration of a received pulse of light 410 may be determined from a duration or width of a corresponding voltage signal 360. For example, the difference between two time values of a pulse-detection output signal may be used to determine a duration of a received pulse of light 410. In the example of FIG. 7, the duration of the pulse of light 410 corresponding to voltage signal 360 may be determined from the difference ($t'_3-t_3$), which may correspond to a received pulse of light 410 with a pulse duration of 4 nanoseconds. As another example, a controller 150 may apply a curve-fit or interpolation operation to the values of the pulse-detection output signal, and the duration of the pulse of light 410 may be determined based on the curve-fit or interpolation. One or more of the approaches for determining an optical characteristic of a received pulse of light 410 as described herein may be implemented using a receiver 140 that includes multiple comparators 370 and TDCs 380 (as illustrated in FIG. 7) or using a receiver 140 that includes one or more ADCs.

In FIG. 7, the voltage signal 360 produced by amplifier 350 is coupled to a frequency-detection circuit 600 as well as a pulse-detection circuit 365. The pulse-detection circuit 365 may provide a pulse-detection output signal that is used to determine time-domain information for a received pulse of light 410 (e.g., a time-of-arrival, duration, or energy of the received pulse of light 410), and the frequency-detection circuit 600 may provide frequency-domain information for the received pulse of light 410. For example, the frequency-detection output signal of the frequency-detection circuit 600 may include amplitude information for particular frequency components of the received pulse of light 410. The frequency-detection output signal may include the amplitude of one or more frequency components of a received pulse of light 410, and this amplitude information may be sent to a controller 150 for further processing. For example, the controller 150 may determine, based at least in part on the amplitude information, whether a received pulse of light is a valid received pulse of light 410 or an interfering pulse of light.

In particular embodiments, a frequency-detection circuit 600 may include multiple parallel frequency-measurement channels, and each frequency-measurement channel may include a filter 610 and a corresponding amplitude detector 620. In FIG. 7, the frequency-detection circuit 600 includes M electronic filters (filters 610-1, 610-2, . . . , 610-M), where each filter is associated with a particular frequency component (frequencies $f_a$, $f_b$, . . . , $f_M$). Each filter 610 in FIG. 7 may include an electronic band-pass filter having a particular pass-band center frequency and width. For example, filter 610-2 may be a band-pass filter with a center frequency $f_b$ of 1 GHz and a pass-band width of 20 MHz. Each filter 610 may include a passive filter implemented with one or more passive electronic components (e.g., one or more resistors, inductors, or capacitors). Alternatively, each filter 610 may include an active filter that includes one or more active electronic components (e.g., one or more transistors or op-amps) along with one or more passive components.

In addition to the M electronic filters 610, the frequency-detection circuit 600 in FIG. 7 also includes M electronic amplitude detectors (amplitude detectors 620-1, 620-2, . . . , 620-M). An amplitude detector 620 may be configured to provide an output signal that corresponds to an amplitude (e.g., a peak value, a size, or an energy) of an electrical signal received from a filter 610. For example, filter 610-M may receive voltage signal 360 and provide to amplitude detector 620-M the portion of the voltage signal 360 having a frequency component at or near the frequency $f_M$. The amplitude detector 620-M may produce a digital or analog output signal that corresponds to the amplitude, peak value, size, or energy of the signal associated with the frequency component $f_M$. Each amplitude detector 620 may include a sample-and-hold circuit, a peak-detector circuit, an integrator circuit, or an ADC. For example, amplitude detector 620-M may include a sample-and-hold circuit and an ADC. The sample-and-hold circuit may produce an analog voltage corresponding to the amplitude of a signal received from filter 610-M, and the ADC may produce a digital signal that represents the analog voltage.

A frequency-detection circuit 600 may include 1, 2, 4, 8, 10, 20, or any other suitable number of filters 610 and amplitude detectors 620, and each filter may have a center frequency between approximately 200 MHz and approximately 20 GHz. Additionally, each filter 610 may include a band-pass filter having a pass-band with a frequency width of approximately 1 MHz, 10 MHz, 20 MHz, 50 MHz, 100 MHz, 200 MHz, or any other suitable frequency width. For example, a frequency-detection circuit 600 may include four band-pass filters 610 with center frequencies of approximately 1.0 GHz, 1.1 GHz, 1.2 GHz, and 1.3 GHz, and each filter may have a pass-band with a frequency width of approximately 20 MHz. A 1.0-GHz filter with a 20-MHz pass-band may pass or transmit frequency components from approximately 0.99 GHz to approximately 1.01 GHz and may attenuate frequency components outside of that frequency range.

In particular embodiments, a light source 110 of a lidar system 100 may impart a particular spectral signature to an emitted pulse of light 400. A spectral signature (which may be referred to as a frequency signature, frequency tag, or frequency change) may correspond to the presence or absence of particular frequency components that are imparted to an emitted pulse of light 400. Additionally or alternatively, a spectral signature may include an amplitude modulation, frequency modulation, or frequency change applied to an emitted pulse of light 400. For example, a spectral signature may include an amplitude or frequency modulation at a particular frequency (e.g., 1 GHz) that is applied to an emitted pulse of light 400. As another example, a spectral signature may include an amplitude or frequency modulation at two or more particular frequencies (e.g., 1.6 GHz and 2.0 GHz) that is applied to an emitted pulse of light 400. A received pulse of light 410 may include the same spectral signature that was applied to an associated emitted pulse of light 400, and the photocurrent signal i (as well as the corresponding voltage signal 360) may include one or more frequency components that correspond to the spectral signature. A frequency-detection circuit 600 may determine, based on the voltage signal 360 (which corresponds to the photocurrent signal i), one or more amplitudes of the one or more frequency components. In the example of FIG. 7, the frequency-detection circuit 600 may include M band-pass filters 610 and M amplitude detectors 620. Each band-pass filter 610 may have a center frequency corresponding to one of the frequency components (from $f_a$ to $f_M$), and each amplitude detector 620 may produce a signal corresponding to the amplitude of one of the respective frequency components. The frequency-detection output signal produced by the frequency-detection circuit 600 may include M digital values corresponding to the amplitudes of the M frequency components.

In particular embodiments, a controller 150 may determine, based on the amplitudes of one or more frequency components associated with a received pulse of light 410, whether the received pulse of light 410 is associated with a particular emitted pulse of light 400. If one or more frequency components of a received pulse of light 410 match a spectral signature of a particular emitted pulse of light 400, then the controller 150 may determine that the received pulse of light 410 is associated with the particular emitted pulse of light 400 (e.g., the received pulse of light 410 includes scattered light from the emitted pulse of light 400). Otherwise, if the frequency components do not match, then the controller 150 may determine that the received pulse of light 410 is not associated with the particular emitted pulse of light 400. For example, the received pulse of light 410 may be associated with a different pulse of light 400 emitted by the light source 110 of the lidar system 100, or the received pulse of light 410 may be associated with an interfering optical signal emitted by a different light source external to the lidar system 100. As another example, a particular pulse of light 400 emitted by the light source 110 may include a spectral signature with an amplitude modulation at a particular frequency (e.g., 2 GHz), and a frequency-detection circuit 600 may include a filter 610 and amplitude detector 620 that determine the amplitude of a 2-GHz frequency component for a received pulse of light 410. If the amplitude of the 2-GHz frequency component is greater than a particular threshold value (or within a range of two particular threshold values), then the controller 150 may determine that the received pulse of light 410 is associated with and includes light from the particular emitted pulse of light 400. Otherwise, if the amplitude of the 2-GHz frequency component is less than the particular threshold value, then the controller 150 may determine that the received pulse of light 410 is not associated with and does not include light from the particular emitted pulse of light 400. Additionally or alternatively, if the amplitude of a different frequency component (e.g., a 1.8-GHz frequency component) that is not part of a particular spectral signature is greater than a particular threshold value, then the controller may determine that the received pulse of light 400 is not associated with the emitted pulse of light 400 having that particular spectral signature.

In particular embodiments, the amplitudes of the one or more frequency components associated with a received pulse of light 410 may be scaled by a scaling factor. This scaling of the frequency-component amplitudes may be used to compensate for a decrease in the energy, power, or intensity of a received pulse of light 410 as a function of distance of the target 130 from the lidar system 100. A controller 150 may receive, from a frequency-detection circuit 600, digital values corresponding to the amplitudes of one or more frequency components of a received pulse of light 410. Prior to comparing the frequency-component values to threshold values to determine whether the received pulse of light 410 is valid, the frequency-component values may be divided by a scaling factor that corresponds to an optical characteristic of the received pulse of light 410 (e.g., the energy, peak power, or peak intensity of the received pulse of light 410). Alternatively, the frequency-component amplitudes may be multiplied by a scaling factor that corresponds to D or $D^2$, where D is a distance to the target 130 from which the corresponding emitted pulse of light was scattered.

In particular embodiments, a light source 110 may emit pulses of light 400 where each emitted pulse of light 400 has a particular spectral signature of one or more different spectral signatures. The spectral signatures may be used to determine whether a received pulse of light is a valid received pulse of light 410 that is associated with an emitted pulse of light 400. A valid received pulse of light 410 may refer to a received pulse of light 410 that includes scattered light from a pulse of light 400 that was emitted by the light source 110. For example, a light source 110 may emit pulses of light 400 that each include the same spectral signature. If a received pulse of light matches that same spectral signature, then the received pulse of light may be determined to be a valid received pulse of light 410 that is associated with an emitted pulse of light 400. As another example, a light source 110 may emit pulses of light 400 that each include one spectral signature of two or more different spectral signatures. If a received pulse of light matches one of the spectral signatures, then the received pulse of light may be determined to be a valid received pulse of light 410 that is associated with an emitted pulse of light 400.

In particular embodiments, a received pulse of light may be determined to match a particular spectral signature if the received pulse of light includes each of the one or more frequency components associated with the particular spectral signature. Additionally, a received pulse of light may be determined to match the particular spectral signature if the received pulse of light does not include any frequency components that are not associated with the particular spectral signature. Similarly, a received pulse of light may be determined to not match a spectral signature if (i) the received pulse of light does not include all of the one or more frequency components associated with the spectral signature or (ii) the received pulse of light includes one or more frequency components not associated with the spectral signature. Determining whether a received pulse of light 410 includes a particular frequency component may include determining the amplitude of the particular frequency component (e.g., based on a signal from an amplitude detector 620). If the amplitude of the particular frequency component is greater than a particular threshold value (or between a minimum threshold value and a maximum threshold value), then a controller 150 may determine that a received pulse of light 410 includes the particular frequency component. Additionally or alternatively, if the amplitude of the particular frequency component is less than the particular threshold value, then the controller 150 may determine that the received pulse of light 410 does not include the particular frequency component.

In particular embodiments, a light source 110 may emit pulses of light 400 where each emitted pulse of light 400 has a particular spectral signature of two or more different spectral signatures, and the spectral signatures may be used to associate a received pulse of light 410 with a particular emitted pulse of light 400. For example, a light source 110 may emit pulses of light 400 with spectral signatures that alternate (e.g., sequentially or in a pseudo-random manner) between two, three, four, or any other suitable number of different spectral signatures. One spectral signature may include an amplitude modulation at 1.5 GHz, and another spectral signature may include an amplitude modulation at 1.7 GHz. A frequency-detection circuit 600 may include two filters and amplitude detectors that determine the amplitudes of the frequency components at 1.5 GHz and 1.7 GHz. Based on the amplitudes of the 1.5-GHz and 1.7-GHz frequency components of a received pulse of light 410, the controller 150 may determine whether the received pulse of light 410 is associated with an emitted pulse of light 400 having a 1.5-GHz spectral signature or a 1.7-GHz spectral signature. If a light source 110 emits a first pulse with a 1.5-GHz modulation and a second pulse with a 1.7-GHz modulation, then a controller 150 may determine that a received pulse of light 410 with a 1.5-GHz frequency component is associated with the first emitted pulse. Emitting pulses of light 400 that have different spectral signatures may allow a frequency-detection circuit 600 and controller 150 to prevent problems with ambiguity as to which emitted pulse a received pulse is associated with. A received pulse of light 410 may be unambiguously associated with an emitted pulse of light 400 based on the frequency components of the received pulse of light 410 matching the spectral signature of the emitted pulse of light 400.

In particular embodiments, a light source 110 may emit pulses of light 400 where each emitted pulse of light 400 has a particular spectral signature of one or more different spectral signatures, and the spectral signatures may be used to determine whether a received pulse of light is a valid received pulse of light 410 or an interfering optical signal. An interfering optical signal may refer to an optical signal that is sent by a light source external to the lidar system 100. For example, another lidar system may emit a pulse of light that is detected by the receiver 140, and the received pulse of light may be determined to be an interfering optical signal since it does not match the spectral signatures of the emitted pulses of light 400 from the light source 110. A controller 150 may distinguish valid pulses from interfering pulses by comparing the frequency components for a received pulse of light with the expected frequency components associated with the spectral signatures imparted to emitted pulses of light 400. If the frequency components of a received pulse of light do not match any of the one or more different spectral signatures imparted to the emitted pulses of light 400, then the controller 150 may determine that the received pulse of light is invalid and is not associated with any of the emitted pulses of light 400. For example, the received pulse of light may be an interfering pulse of light sent from a light source external to the lidar system 100, and the interfering pulse of light may be discarded or ignored since it is not associated with any of the emitted pulses of light 400.

Figure 8:
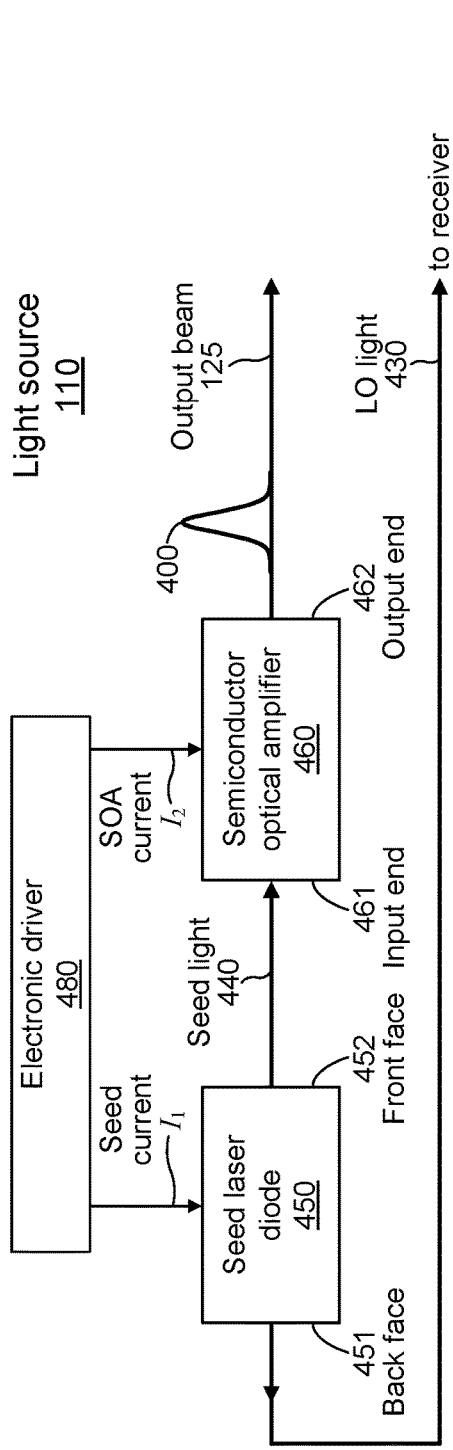
FIG. 8 illustrates an example light source that includes a seed laser diode and a semiconductor optical amplifier (SOA).

FIG. 8 illustrates an example light source 110 that includes a seed laser diode 450 and a semiconductor optical amplifier (SOA) 460. In particular embodiments, a light source 110 of a lidar system 100 may include (i) a seed laser 450 that produces seed light 440 and LO light 430 and (ii) a pulsed optical amplifier 460 that amplifies temporal portions of the seed light 440 to produce emitted pulses of light 400. In the example of FIG. 8, the seed laser is a seed laser diode 450 that produces seed light 440 and LO light 430. The seed laser diode 450 may include a Fabry-Perot laser diode, a quantum well laser, a DBR laser, a DFB laser, a VCSEL, a quantum dot laser diode, or any other suitable type of laser diode. In FIG. 8, the pulsed optical amplifier is a semiconductor optical amplifier (SOA) 460 that emits a pulse of light 400 that is part of the output beam 125. A SOA 460 may include a semiconductor optical waveguide that receives the seed light 440 from the seed laser diode 450 and amplifies a temporal portion of the seed light 440 as it propagates through the waveguide to produce an emitted pulse of light 400. A SOA 460 may have an optical power gain of 20 decibels (dB), 25 dB, 30 dB, 35 dB, 40 dB, 45 dB, or any other suitable optical power gain. For example, a SOA 460 may have a gain of 40 dB, and a temporal portion of seed light 440 with an energy of 20 pJ may be amplified by the SOA 460 to produce a pulse of light 400 with an energy of approximately 0.2 µJ. A light source 110 that includes a seed laser diode 450 that supplies seed light 440 that is amplified by a SOA 460 may be referred to as a master-oscillator power-amplifier laser (MOPA laser) or a MOPA light source. The seed laser diode 450 may be referred to as a master oscillator, and the SOA 460 may be referred to as a power amplifier.

In particular embodiments, a light source 110 may include an electronic driver 480 that (i) supplies electrical current to a seed laser 450 and (ii) supplies electrical current to a SOA 460. In FIG. 8, the electronic driver 480 supplies seed current $I_1$ to the seed laser diode 450 to produce the seed light 440 and the LO light 430. The seed current $I_1$ supplied to the seed laser diode 450 may be a substantially constant DC electrical current so that the seed light 440 and the LO light 430 each include continuous-wave (CW) light or light having a substantially constant optical power. For example, the seed current $I_1$ may include a DC current of approximately 1 mA, 10 mA, 100 mA, 200 mA, 500 mA, or any other suitable DC electrical current. Additionally or alternatively, the seed current $I_1$ may include a pulse of electrical current. The seed laser 450 may be pulsed with a pulse of current having a duration that is long enough so that the wavelength of the seed-laser light emitted by the seed laser 450 (e.g., seed light 440 and LO light 430) stabilizes or reaches a substantially constant value at some time during the pulse. For example, the duration of the current pulse may be between 50 ns and 2 µs, and the SOA 460 may be configured to amplify a 5-ns temporal portion of the seed light 440 to produce the emitted pulse of light 400. The temporal portion of the seed light 440 that is selected for amplification may be located in time near the middle or end of the electrical current pulse to allow sufficient time for the wavelength of the seed-laser light to stabilize.

In FIG. 8, the electronic driver 480 supplies SOA current $I_2$ to the SOA 460, and the SOA current $I_2$ provides optical gain to temporal portions of the seed light 440 that propagate through the waveguide of the SOA 460. The SOA current $I_2$ may include pulses of electrical current, where each pulse of current causes the SOA 460 to amplify one temporal portion of the seed light 440 to produce an emitted pulse of light 400. The SOA current $I_2$ may have a duration of approximately 0.5 ns, 1 ns, 2 ns, 5 ns, 10 ns, 20 ns, 50 ns, 100 ns, or any other suitable duration. The SOA current $I_2$ may have a peak amplitude of approximately 1 A, 2 A, 5 A, 10 A, 20 A, 50 A, 100 A, 200 A, 500 A, or any other suitable peak current. For example, the SOA current $I_2$ supplied to the SOA 460 may include a series of current pulses having a duration of approximately 5-10 ns and a peak current of approximately 100 A. The series of current pulses may result in the emission of a corresponding series of pulses of light 400, and each emitted pulse of light 400 may have a duration that is less than or equal to the duration of the corresponding electrical current pulse. For example, an electronic driver 480 may supply 5-ns duration current pulses to the SOA 460 at a repetition frequency of 700 kHz. This may result in emitted pulses of light 400 that have a duration of approximately 4 ns and a pulse repetition frequency of 700 kHz.

A pulsed optical amplifier may refer to an optical amplifier that is operated in a pulsed mode so that the output beam 125 emitted by the optical amplifier includes pulses of light 400. For example, a pulsed optical amplifier may include a SOA 460 that is operated in a pulsed mode by supplying the SOA 460 with pulses of current. The seed light 440 may include CW light or light having a substantially constant optical power, and each pulse of current supplied to the SOA 460 may amplify a temporal portion of seed light to produce an emitted pulse of light 400. As another example, a pulsed optical amplifier may include an optical amplifier along with an optical modulator. The optical modulator may be an acousto-optic modulator (AOM) or an electro-optic modulator (EOM) operated in a pulsed mode so that the modulator selectively transmits pulses of light. The SOA 460 may also be operated in a pulsed mode in synch with the optical modulator to amplify the temporal portions of the seed light, or the SOA 460 may be supplied with substantially DC current to operate as a CW optical amplifier. The optical modulator may be located between the seed laser diode 450 and the SOA 460, and the optical modulator may be operated in a pulsed mode to transmit temporal portions of the seed light 440 which are then amplified by the SOA 460. Alternatively, the optical modulator may be located after the SOA 460, and the optical modulator may be operated in a pulsed mode to transmit the emitted pulses of light 400.

The seed laser diode 450 illustrated in FIG. 8 includes a front face 452 and a back face 451. The seed light 440 is emitted from the front face 452 and directed to the input end 461 of the SOA 460. The LO light 430 is emitted from the back face 451 and directed to the receiver 140 of the lidar system 100. The seed light 440 or the LO light 430 may be emitted as a free-space beam, and a light source 110 may include one or more lenses (not illustrated in FIG. 10) that (i) collimate the LO light 430 emitted from the back face 451, (ii) collimate the seed light 440 emitted from the front face 452, or (iii) focus the seed light 440 into the SOA 460.

In particular embodiments a front face 452 or a back face 451 may include a discrete facet formed by a semiconductor-air interface (e.g., a surface formed by cleaving or polishing a semiconductor structure to form the seed laser diode 450). Additionally, the front face 452 or the back face 451 may include a dielectric coating that provides a reflectivity (at the seed-laser operating wavelength) of between approximately 50% and approximately 99.9%. For example, the back face 451 may have a reflectivity of 90% to 99.9% at a wavelength of the LO light 430. The average power of the LO light 430 emitted from the back face 451 may depend at least in part on the reflectivity of the back face 451, and a value for the reflectivity of the back face 451 may be selected to provide a particular average power of the LO light 430. For example, the back face 451 may be configured to have a reflectivity between 90% and 99%, and the seed laser diode 450 may emit LO light 430 having an average optical power of 10 µW to 1 mW. In some conventional laser diodes, the reflectivity of the back face may be designed to be relatively high or as close to 100% as possible in order to minimize the amount of light produced from the back face or to maximize the amount of light produced from the front face. In the seed laser diode 450 of FIG. 8, the reflectivity of the back face 451 may be reduced to a lower value compared to a conventional laser diode so that a particular power of LO light 430 is emitted from the back face 451. As an example, a conventional laser diode may have a back face with a reflectivity of greater than 98%, and a seed laser diode 450 may have a back face with a reflectivity between 90% and 98%.

In particular embodiments, the wavelength of the seed light 440 and the wavelength of the LO light 430 may be approximately equal. For example, a seed laser diode 450 may have a seed-laser operating wavelength of approximately 1508 nm, and the seed light 440 and the LO light 430 may each have the same wavelength of approximately 1508 nm. As another example, the wavelength of the seed light 440 and the wavelength of the LO light 430 may be equal to within some percentage (e.g., to within approximately 0.1%, 0.01%, or 0.001%) or to within some wavelength range (e.g., to within approximately 0.1 nm, 0.01 nm, or 0.001 nm). If the wavelengths are within 0.01% of 1508 nm, then the wavelengths of the seed light 440 and the LO light 430 may each be in the range from 1507.85 nm to 1508.15 nm).

Figure 9:
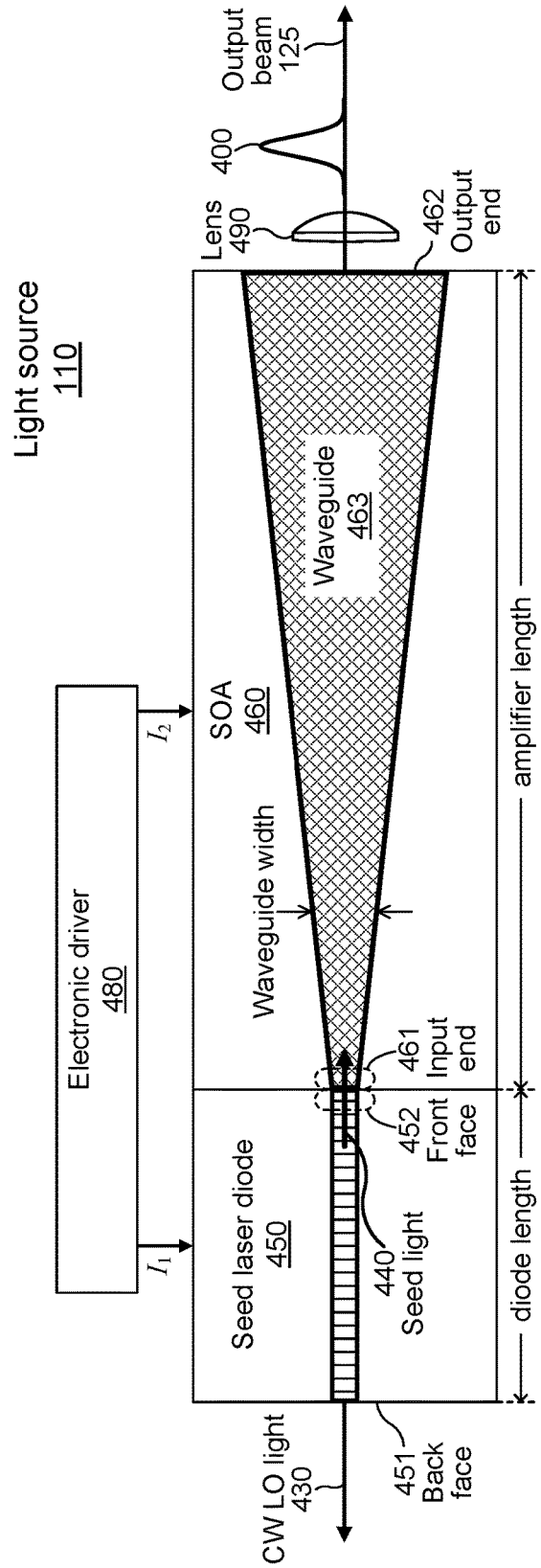
FIG. 9 illustrates an example light source that includes a semiconductor optical amplifier (SOA) with a tapered optical waveguide.

FIG. 9 illustrates an example light source 110 that includes a semiconductor optical amplifier (SOA) 460 with a tapered optical waveguide 463. In particular embodiments, a SOA 460 may include an input end 461, an output end 462, and an optical waveguide 463 extending from the input end 461 to the output end 462. The input end 461 may receive the seed light 440 from the seed laser diode 450. The waveguide 463 may amplify a temporal portion of the seed light 440 as the temporal portion propagates along the waveguide 463 from the input end 461 to the output end 462. The amplified temporal portion may be emitted from the output end 462 as an emitted pulse of light 400. The emitted pulse of light 400 may be part of the output beam 125, and the light source 110 may include a lens 490 configured to collect and collimate emitted pulses of light 400 from the output end 462 to produce a collimated output beam 125. The seed laser diode 450 in FIG. 9 may have a diode length of approximately 100 µm, 200 µm, 500 µm, 1 mm, or any other suitable length. The SOA 460 may have an amplifier length of approximately 1 mm, 2 mm, 3 mm, 5 mm, 10 mm, 20 mm, or any other suitable length. For example, the seed laser diode 450 may have a diode length of approximately 300 µm, and the SOA 460 may have an amplifier length of approximately 4 mm.

In particular embodiments, a waveguide 463 may include a semiconductor optical waveguide formed at least in part by the semiconductor material of the SOA 460, and the waveguide 463 may confine light along transverse directions while the light propagates through the SOA 460. In particular embodiments, a waveguide 463 may have a substantially fixed width or a waveguide 463 may have a tapered width. For example, a waveguide 463 may have a substantially fixed width of approximately 5 µm, 10 µm, 20 µm, 50 µm, 100 µm, 200 µm, 500 µm, or any other suitable width. In FIG. 9, the SOA 460 has a tapered waveguide 463 with a width that increases from the input end 461 to the output end 462. For example, the width of the tapered waveguide 463 at the input end 461 may be approximately equal to the width of the waveguide of the seed laser diode 450 (e.g., the input end 461 may have a width of approximately 1 µm, 2 µm, 5 µm, 10 µm, or 50 µm). At the output end 462 of the SOA 460, the tapered waveguide 463 may have a width of approximately 50 µm, 100 µm, 200 µm, 500 µm, 1 mm, or any other suitable width. As another example, the width of the tapered waveguide 463 may increase linearly from a width of approximately 20 µm at the input end 461 to a width of approximately 250 µm at the output end 462.

In particular embodiments, the input end 461 or the output end 462 of a SOA 460 may be a discrete facet formed by a semiconductor-air interface. Additionally, the input end 461 or the output end 462 may include a dielectric coating (e.g., an anti-reflection coating to reduce the reflectivity of the input end 461 or the output end 462). An anti-reflection (AR) coating may have a reflectivity at the seed-laser operating wavelength of less than 5%, 2%, 0.5%, 0.1%, or any other suitable reflectivity value. In FIG. 8, the input end 461 may have an AR coating that reduces the amount of seed light 440 reflected by the input end 461. In FIG. 8 or FIG. 9, the output end 462 may have an AR coating that reduces the amount of amplified seed light reflected by the output end 462. An AR coating applied to the input end 461 or the output end 462 may also prevent the SOA 460 from acting as a laser by emitting coherent light when no seed light 440 is present.

In particular embodiments, a light source 110 may include a seed laser diode 450 and a SOA 460 that are integrated together and disposed on or in a single chip or substrate. For example, a seed laser diode 450 and a SOA 460 may each be fabricated separately and then attached to the same substrate (e.g., using epoxy or solder). The substrate may be electrically or thermally conductive, and the substrate may have a coefficient of thermal expansion (CTE) that is approximately equal to the CTE of the seed laser 450 and the SOA 460. As another example, the seed laser diode 450 and the SOA 460 may be fabricated together on the same substrate (e.g., using semiconductor-fabrication processes, such as for example, lithography, deposition, and etching).

The seed laser diode 450 and the SOA 460 may each include InGaAs or InGaAsP semiconductor structures, and the substrate may include indium phosphide (InP). The InP substrate may be n-doped or p-doped so that it is electrically conductive, and a portion of the InP substrate may act as an anode or cathode for both the seed laser diode 450 and the SOA 460. The substrate may be thermally coupled to (i) a heat sink that dissipates heat produced by the seed laser diode 450 or the SOA 460 or (ii) a temperature-control device (e.g., a thermoelectric cooler) that stabilizes the temperature of the seed laser diode 450 or the SOA 460 to a particular temperature setpoint or to within a particular temperature range. In the example of FIG. 8, the seed laser 450 and the SOA 460 may be separate devices that are not disposed on a single substrate, and the seed light 440 may be a free-space beam. Alternatively, in the example of FIG. 8, the seed laser 450 and the SOA 460 may be separate devices that are disposed together on a single substrate. In the example of FIG. 9, the seed laser 450 and the SOA 460 may be integrated together and disposed on or in a single chip or substrate.

In FIG. 9, rather than having a discrete facet formed by a semiconductor-air interface, the front face 452 of the seed laser diode 450 and the input end 461 of the SOA 460 may be coupled together without a semiconductor-air interface. For example, the seed laser diode 450 may be directly connected to the SOA 460 so that the seed light 440 is directly coupled from the seed laser diode 450 into the waveguide 463 of the SOA 460. The front face 452 may be butt-coupled or affixed (e.g., using an optically transparent adhesive) to the input end 461, or the seed laser diode 450 and the SOA 460 may be fabricated together so that there is no separate front face 452 or input end 461 (e.g., the front face 452 and the input end 461 may be merged together to form a single interface between the seed laser diode 450 and the SOA 460). Alternatively, the seed laser diode 450 may be coupled to the SOA 460 via a passive optical waveguide that transmits the seed light 440 from the front face 452 of the seed laser diode 450 to the input end 461 of the SOA 460.

In particular embodiments, during a period of time between two successive temporal portions of seed light 440, a SOA 460 may be configured to optically absorb most of the seed light 440 propagating in the SOA 460. The seed light 440 from the seed laser diode 450 may be coupled into the waveguide 463 of the SOA 460. Depending on the amount of SOA current $I_2$ supplied to the SOA 460, the seed light 440 may be optically amplified or optically absorbed while propagating along the waveguide 463. If the SOA current $I_2$ exceeds a threshold gain value (e.g., 100 mA) that overcomes the optical loss of the SOA 460, then the seed light 440 may be optically amplified by stimulated emission of photons. Otherwise, if the SOA current $I_2$ is less than the threshold gain value, then the seed light 440 may be optically absorbed. The process of optical absorption of the seed light 440 may include photons of the seed light 440 being absorbed by electrons located in the semiconductor structure of the SOA 460.

In particular embodiments, the SOA current $I_2$ may include pulses of current separated by a period of time that corresponds to the pulse period τ of the light source 110, and each pulse of current may result in the emission of a pulse of light 400. For example, if the SOA current $I_2$ includes 20-A current pulses with a 10-ns duration, then for each current pulse, a corresponding 10-ns temporal portion of the seed light 440 may be amplified, resulting in the emission of a pulse of light 400. During the time periods τ between successive pulses of current, the SOA current $I_2$ may be set to approximately zero or to some other value below the threshold gain value, and the seed light 440 present in the SOA 460 during those time periods may be optically absorbed. The optical absorption of the SOA 460 when the SOA current $I_2$ is zero may be greater than or equal to approximately 10 decibels (dB), 15 dB, 20 dB, 25 dB, or 30 dB. For example, if the optical absorption is greater than or equal to 20 dB, then less than or equal to 1% of the seed light 440 that is coupled into the input end 461 of the waveguide 463 may be emitted from the output end 462 as unwanted leakage light. Having most of the seed light 440 absorbed in the SOA 460 may prevent unwanted seed light 440 (e.g., seed light 440 located between successive pulses of light 400) from leaking out of the SOA 460 and propagating through the rest of the lidar system 100. Additionally, optically absorbing the unwanted seed light 440 may allow the seed laser 450 to be operated with a substantially constant current $I_1$ or a substantially constant output power so that the wavelengths of the seed light 440 and LO light 430 are stable and substantially constant.

In particular embodiments, a SOA 460 may include an anode and a cathode that transmit SOA current $I_2$ from an electronic driver 480 to or from the SOA 460. For example, the anode of the SOA 460 may include or may be electrically coupled to a conductive electrode material (e.g., gold) deposited onto the top surface of the SOA 460, and the cathode may include or may be electrically coupled to a substrate located on the opposite side of the SOA 460. Alternatively, the anode of the SOA 460 may include or may be electrically coupled to the substrate of the SOA 460, and the cathode may include or may be electrically coupled to the electrode on the top surface of the SOA 460. The anode and cathode may be electrically coupled to the electronic driver 480, and the driver 480 may supply a positive SOA current $I_2$ that flows from the driver 480 into the anode, through the SOA 460, out of the cathode, and back to the driver 480. When considering the electrical current as being made up of a flow of electrons, then the electrons may be viewed as flowing in the opposite direction (e.g., from the driver 480 into the cathode, through the SOA 460, and out of the anode and back to the driver 480).

In particular embodiments, an electronic driver 480 may electrically couple the SOA anode to the SOA cathode during a period of time between two successive pulses of current. For example, for most or all of the time period τ between two successive pulses of current, the electronic driver 480 may electrically couple the anode and cathode of the SOA 460. Electrically coupling the anode and cathode may include electrically shorting the anode directly to the cathode or coupling the anode and cathode through a particular electrical resistance (e.g., approximately 1 Ω, 10Ω, or 100Ω). Alternatively, electrically coupling the anode and the cathode may include applying a reverse-bias voltage (e.g., approximately −1 V, −5 V, or −10 V) to the anode and cathode, where the reverse-bias voltage has a polarity that is opposite the forward-bias polarity associated with the applied pulses of current. By electrically coupling the anode to the cathode, the optical absorption of the SOA may be increased. For example, the optical absorption of the SOA 460 when the anode and cathode are electrically coupled may be increased (compared to the anode and cathode not being electrically coupled) by approximately 3 dB, 5 dB, 10 dB, 15 dB, or 20 dB. The optical absorption of the SOA 460 when the anode and cathode are electrically coupled may be greater than or equal to approximately 20 dB, 25 dB, 30 dB, 35 dB, or 40 dB. For example, the optical absorption of a SOA 460 when the SOA current $I_2$ is zero and the anode and cathode are not electrically coupled may be 20 dB. When the anode and cathode are electrically shorted together, the optical absorption may increase by 10 dB to 30 dB. If the optical absorption of the SOA 460 is greater than or equal to 30 dB, then less than or equal to 0.1% of the seed light 440 that is coupled into the input end 461 of the waveguide 463 may be emitted from the output end 462 as unwanted leakage light.

Figure 10:
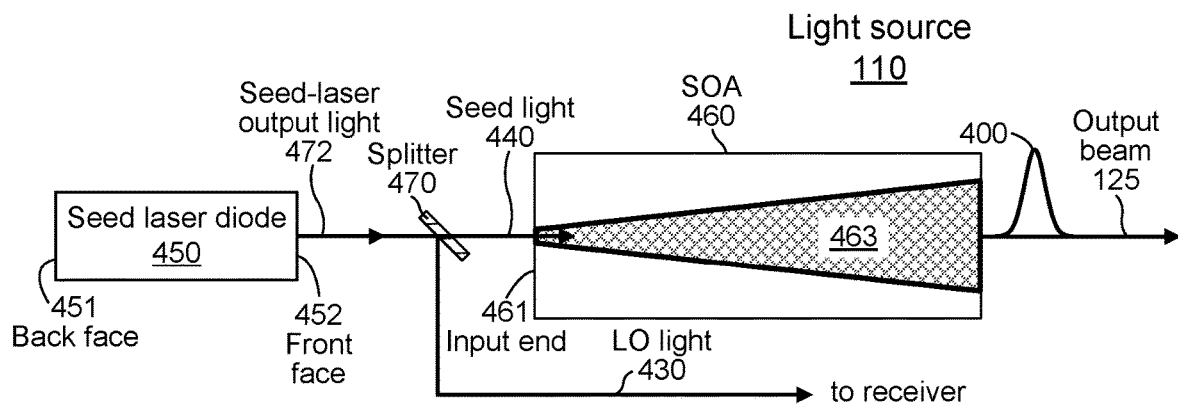
FIG. 10 illustrates an example light source with an optical splitter that splits output light from a seed laser diode to produce seed light and local-oscillator (LO) light.

FIG. 10 illustrates an example light source 110 with an optical splitter 470 that splits output light 472 from a seed laser diode 450 to produce seed light 440 and local-oscillator (LO) light 430. In particular embodiments, a light source 110 may include (i) a seed laser diode 450 with a front face 452 from which seed-laser output light 472 is emitted and (ii) an optical splitter 470 that splits the output light 472 to produce seed light 440 and LO light 430. In FIG. 10, the output light 472 emitted by the seed laser diode 450 is a free-space optical beam, and the optical splitter 470 is a free-space optical beam-splitter that produces the free-space beams: seed light 440 and LO light 430. In the examples of FIGS. 8 and 9, light emitted from the back face 451 of the seed laser diode 450 is used to produce the LO light 430. In contrast, in the example of FIG. 10, both the seed light 440 and the LO light 430 are produced from the output light 472 emitted from the front face 452 of the seed laser diode 450. The seed light 440 is transmitted through the splitter 470 and directed to the SOA 460, and the LO light 430 is reflected by the splitter 470 and directed to the receiver 140 of the lidar system 100. A light source 110 may include one or more lenses (not illustrated in FIG. 10) that collimate the seed-laser output light 472 or focus the seed light 440 into the waveguide 463 of the SOA 460.

The optical splitter 470 in FIG. 10 is a free-space optical splitter that receives the seed-laser output light 472 as a free-space optical beam and produces two free-space beams: seed light 440 and LO light 430. In FIG. 10, the free-space optical beam-splitter 470 reflects a first portion of the incident seed-laser output light 472 to produce the LO light 430 and transmits a second portion of the output light 472 to produce the seed light 440. Alternatively, the beam-splitter 470 may be arranged to reflect a portion of the output light 472 to produce the seed light 440 and transmit a portion of the output light 472 to produce the LO light 430. The free-space beam-splitter 470 in FIG. 10 may have a reflectivity of less than or equal to 1%, 2%, 5%, 10%, 20%, 50%, or any other suitable reflectivity value. For example, the splitter 470 may reflect 10% or less of the incident seed-laser output light 472 to produce the LO light 430, and the remaining 90% or more of the output light 472 may be transmitted through the splitter 470 to produce the seed light 440. As another example, if the output light 472 has an average power of 25 mW and the splitter 470 reflects approximately 4% of the output light 472, then the LO light 430 may have an average power of approximately 1 mW, and the seed light 440 may have an average power of approximately 24 mW. As used herein, a splitter 470 may refer to a free-space optical splitter, a fiber-optic splitter, or an optical-waveguide splitter. Additionally, an optical-waveguide splitter may be referred to as an integrated-optic splitter.

In particular embodiments, a light source 110 may include a fiber-optic splitter 470 that splits the seed-laser output light 472 to produce seed light 440 and LO light 430. Instead of using a free-space optical splitter 470 (as illustrated in FIG. 10), a light source 110 may use a fiber-optic splitter 470. The fiber-optic splitter 470 may include one input optical fiber and two or more output optical fibers, and light that is coupled into the input optical fiber may be split between the output optical fibers. The output light 472 may be coupled from the front face 452 of the seed laser diode 450 into the input optical fiber of the fiber-optic splitter 470, and the fiber-optic splitter 470 may split the output light 472 into the seed light 440 and the LO light 430. The output light 472 may be coupled into the input optical fiber using one or more lenses, or the output light 472 may be directly coupled into the input optical fiber (e.g., the input optical fiber may be butt-coupled to the front face 452 of the seed laser diode 450). The seed light 440 may be directed to the SOA 460 by a first output fiber, and the LO light 430 may be directed to a receiver 140 by a second output fiber. The seed light 440 may be coupled from the first output fiber into the waveguide 463 of the SOA 460 by one or more lenses, or the seed light 440 may be directly coupled into waveguide 463 (e.g., the first output fiber may be butt-coupled to the input end 461 of the SOA 460). A fiber-optic splitter 470 may split off less than or equal to 1%, 2%, 5%, 10%, 20%, 50%, or any other suitable amount of the output light 472 to produce the LO light 430, and the remaining light may form the seed light 440. For example, a fiber-optic splitter 470 may split off 10% or less of the output light 472 to produce the LO light 430, which is directed to one output fiber. The remaining 90% or more of the output light 472 may be directed to the other output fiber as the seed light 440.

Figure 11:
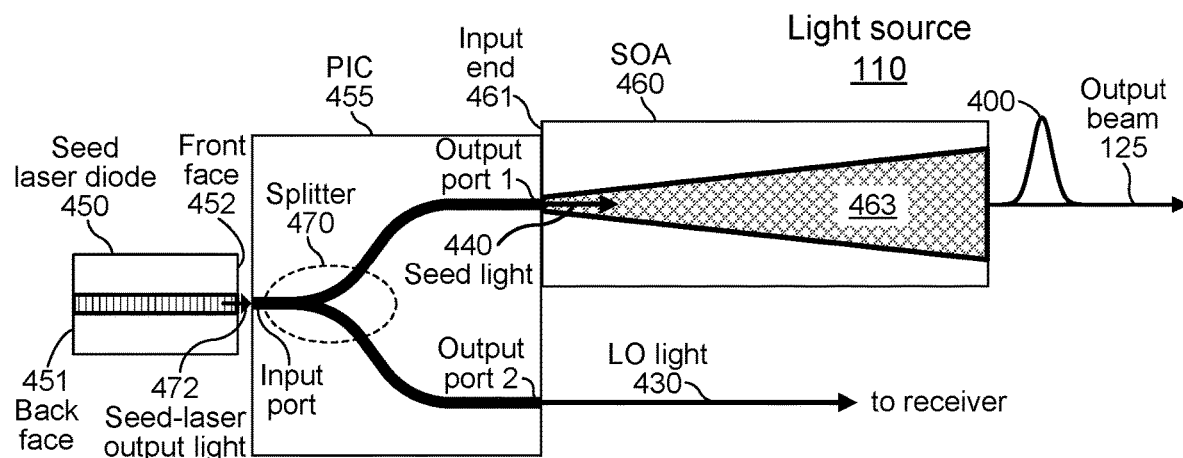
FIG. 11 illustrates an example light source with a photonic integrated circuit (PIC) that includes an optical-waveguide splitter.

FIG. 11 illustrates an example light source 110 with a photonic integrated circuit (PIC) 455 that includes an optical-waveguide splitter 470. In particular embodiments, a light source 110 may include an optical splitter 470 and a PIC 455, where the optical splitter 470 is an optical-waveguide splitter of the PIC. A PIC 455 (which may be referred to as a planar lightwave circuit (PLC), an integrated-optic device, an integrated optoelectronic device, or a silicon optical bench) may include one or more optical waveguides or one or more optical-waveguide devices (e.g., optical-waveguide splitter 470) integrated together into a single device. A PIC 455 may include or may be fabricated from a substrate that includes silicon, InP, glass (e.g., silica), a polymer, an electro-optic material (e.g., lithium niobate (LiNbO$_3$) or lithium tantalate (LiTaO$_3$)), or any suitable combination thereof. One or more optical waveguides may be formed on or in a PIC substrate using micro-fabrication techniques, such as for example, lithography, deposition, or etching. For example, an optical waveguide may be formed on a glass or silicon substrate by depositing and selectively etching material to form a ridge or channel waveguide on the substrate. As another example, an optical waveguide may be formed by implanting or diffusing a material into a substrate (e.g., by diffusing titanium into a LiNbO$_3$ substrate) to form a region in the substrate having a higher refractive index than the surrounding substrate material.

In particular embodiments, an optical-waveguide splitter 470 may include an input port and two or more output ports. In FIG. 11, the seed-laser output light 472 from the seed laser diode 450 is coupled into the input optical waveguide (input port) of the waveguide splitter 470, and the waveguide splitter 470 splits the output light 472 between two output waveguides, output port 1 and output port 2. The seed-laser output light 472 may be coupled from the front face 452 of the seed laser diode 450 to the input port of the splitter 470 using one or more lenses, or the seed laser diode 450 may be butt-coupled to the input port so that the output light 472 is directly coupled into the input port. The seed light 440 is formed by the portion of output light 472 that is sent by the splitter 470 to output port 1, and the LO light 430 is formed by the portion of output light 472 that is sent by the splitter 470 to output port 2. The waveguide splitter 470 directs the seed light 440 to output port 1, which is coupled to waveguide 463 of the SOA 460. Additionally, the waveguide splitter 470 directs the LO light 430 to output port 2, which sends the LO light 430 to a receiver 140. An optical-waveguide splitter 470 may split off less than or equal to 1%, 2%, 5%, 10%, 20%, 50%, or any other suitable amount of the output light 472 to produce the LO light 430, and the remaining light may form the seed light 440. For example, the optical-waveguide splitter 470 may send 10% or less of the output light 472 to output port 2 to produce the LO light 430, and the remaining 90% or more of the output light 472 may be sent to output port 1 to produce the seed light 440.

In particular embodiments, a light source 110 may include one or more discrete optical devices combined with a PIC 455. The discrete optical devices (which may include a seed laser diode 450, a SOA 460, one or more lenses, or one or more optical fibers) may be configured to couple light into the PIC 455 or to receive light emitted from the PIC 455. In the example of FIG. 11, the light source 110 includes a PIC 455, a seed laser diode 450, and a SOA 460. The seed laser diode 450 and the SOA 460 may each be attached or bonded to the PIC 455, or the seed laser diode 450, the SOA 460, and the PIC 455 may be attached to a common substrate. For example, the front face 452 of the seed laser diode 450 may be bonded to the input port of the PIC 455 so that the output light 472 is directly coupled into the input port. As another example, the input end 461 of the SOA 460 may be bonded to the output port 1 of the PIC 455 so that the seed light 440 is directly coupled into the waveguide 463 of the SOA 460. As another example, the light source 110 may include a lens (not illustrated in FIG. 11) attached to or positioned near output port 2, and the lens may collect and collimate the LO light 430. As another example, the light source 110 may include an optical fiber (not illustrated in FIG. 11) attached to or positioned near output port 2, and the LO light 430 may be coupled into the optical fiber, which directs the LO light 430 to a receiver 140.

Figure 12:
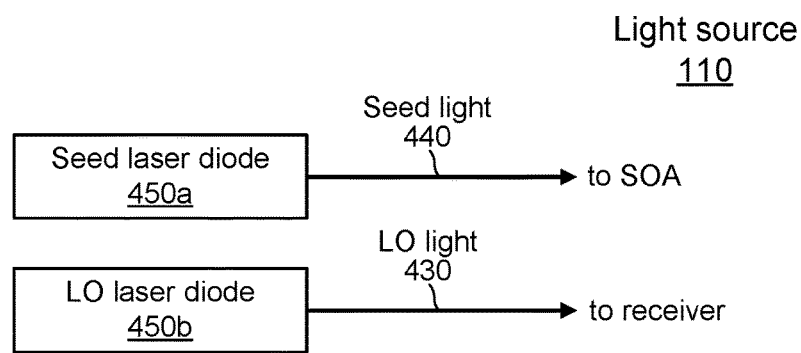
FIG. 12 illustrates an example light source that includes a seed laser diode and a local-oscillator (LO) laser diode.

FIG. 12 illustrates an example light source 110 that includes a seed laser diode 450*a* and a local-oscillator (LO) laser diode 450*b*. In particular embodiments, a seed laser of a light source 110 may include a seed laser diode 450*a* that produces seed light 440 and a LO laser diode 450*b* that produces LO light 430. Instead of having one laser diode that produces both the seed light 440 and the LO light 430 (e.g., as illustrated in FIGS. 8-11), a light source 110 may include two laser diodes, one to produce the seed light 440 and the other to produce the LO light 430. A light source 110 with two laser diodes may not include an optical splitter 470. Rather, the seed light 440 emitted by the seed laser diode 450*a* may be coupled to a SOA 460, and the LO light 430 emitted by the LO laser diode 450*b* may be sent to a receiver 140. For example, the seed laser diode 450*a* may be butt-coupled to the input end 461 of the SOA 460, and the LO light 430 from the LO laser diode 450*b* may be coupled into an optical fiber, which may direct the LO light 430 to a receiver 140.

In particular embodiments, a seed laser diode 450*a* and a LO laser diode 450*b* may be operated so that the seed light 440 and the LO light 430 have a particular frequency offset. For example, the seed light 440 and the LO light 430 may have an optical frequency offset of approximately 0 Hz, 1 kHz, 1 MHz, 100 MHz, 1 GHz, 2 GHz, 5 GHz, 10 GHz, 20 GHz, or any other suitable frequency offset. An optical frequency f (which may be referred to as a frequency or a carrier frequency) and a wavelength λ, may be related by the expression λ·f=c. For example, seed light 440 with a wavelength of 1550 nm corresponds to seed light 440 with an optical frequency of approximately 193.4 THz. In some cases herein, the terms wavelength and frequency may be used interchangeably when referring to an optical property of light. For example, LO light 430 having a substantially constant optical frequency may be equivalent to the LO light 430 having a substantially constant wavelength. As another example, LO light 430 having approximately the same wavelength as seed light 440 may also be referred to as the LO light 430 having approximately the same frequency as the seed light 440. As another example, LO light 430 having a particular wavelength offset from seed light 440 may also be referred to as the LO light 430 having a particular frequency offset from the seed light 440. An optical frequency offset ($\Delta f$) and a wavelength offset ($\Delta \lambda$) may be related by the expression $\Delta f/f = -\Delta \lambda/\lambda$. For example, for seed light 440 with a 1550-nm wavelength, LO light 430 that has a +10-GHz frequency offset from the seed light 440 corresponds to LO light 430 with a wavelength offset of approximately −0.08-nm from the 1550-nm wavelength of the seed light 440 (e.g., a wavelength for the LO light 430 of approximately 1549.92 nm).

In particular embodiments, a seed laser diode 450*a* or a LO laser diode 450*b* may be frequency locked so that they emit light having a substantially fixed wavelength or so that there is a substantially fixed frequency offset between the seed light 440 and the LO light 430. Frequency locking a laser diode may include locking the wavelength of the light emitted by the laser diode to a stable frequency reference using, for example, an external optical cavity, an atomic optical absorption line, or light injected into the laser diode. For example, the seed laser diode 450*a* may be frequency locked (e.g., using an external optical cavity), and some of the light from the seed laser diode 450*a* may be injected into the LO laser diode 450*b* to frequency lock the LO laser diode 450 to approximately the same wavelength as the seed laser diode 450*a*. As another example, the seed laser diode 450*a* and the LO laser diode 450*b* may each be separately frequency locked so that the two laser diodes have a particular frequency offset (e.g., a frequency offset of approximately 2 GHz).

Figure 13:
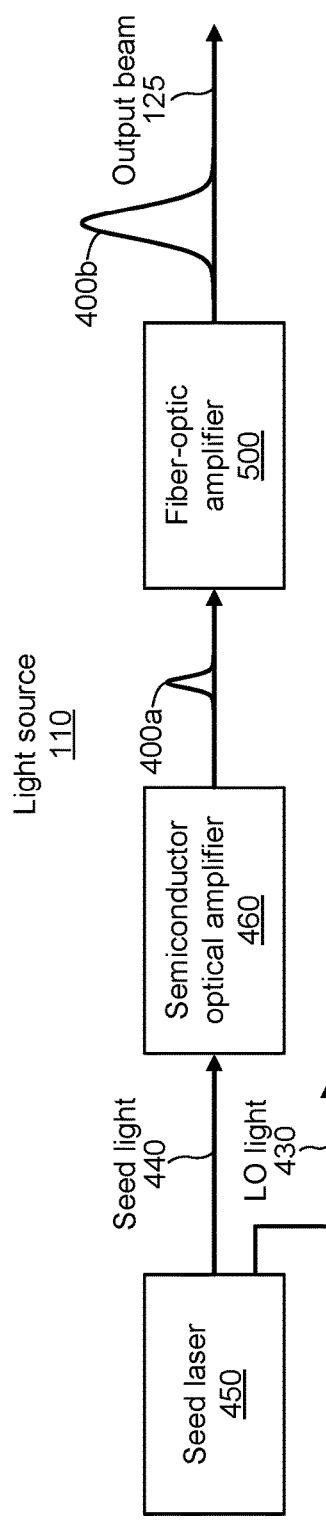
FIG. 13 illustrates an example light source that includes a seed laser, a semiconductor optical amplifier (SOA), and a fiber-optic amplifier.

FIG. 13 illustrates an example light source 110 that includes a seed laser 450, a semiconductor optical amplifier (SOA) 460, and a fiber-optic amplifier 500. In particular embodiments, in addition to a seed laser 450 and a pulsed optical amplifier 460, a light source 110 may also include a fiber-optic amplifier 500 that amplifies pulses of light 400*a* produced by the pulsed optical amplifier 460. In FIG. 13, the SOA 460 may amplify temporal portions of seed light 440 from the seed laser 450 to produce pulses of light 400*a*, and the fiber-optic amplifier 500 may amplify the pulses of light 400*a* from the SOA 460 to produce amplified pulses of light 400*b*. The amplified pulses of light 400*b* may be part of a free-space output beam 125 that is sent to a scanner 120 and scanned across a field of regard of a lidar system 100.

A SOA 460 and a fiber-optic amplifier 500 may each have an optical power gain of 10 dB, 15 dB, 20 dB, 25 dB, 30 dB, 35 dB, 40 dB, or any other suitable optical power gain. In the example of FIG. 13, the SOA 460 may have a gain of 30 dB, and the fiber-optic amplifier 500 may have a gain of 20 dB, which corresponds to an overall gain of 50 dB. A temporal portion of seed light 440 with an energy of 5 pJ may be amplified by the SOA 460 (with a gain of 30 dB) to produce a pulse of light 400*a* with an energy of approximately 5 nJ. The fiber-optic amplifier 500 may amplify the 5-nJ pulse of light 400*a* by 20 dB to produce an output pulse of light 400*b* with an energy of approximately 0.5 µJ. The seed laser 450 in FIG. 13 produces seed light 440 and LO light 430. The seed light 440 may be emitted from a front face 452 of a seed laser diode 450, and the LO light 430 may be emitted from a back face 451 of the seed laser diode 450. Alternatively, the light source 110 may include a splitter 470 that splits seed-laser output light 472 to produce the seed light 440 and the LO light 430.

Figure 14:
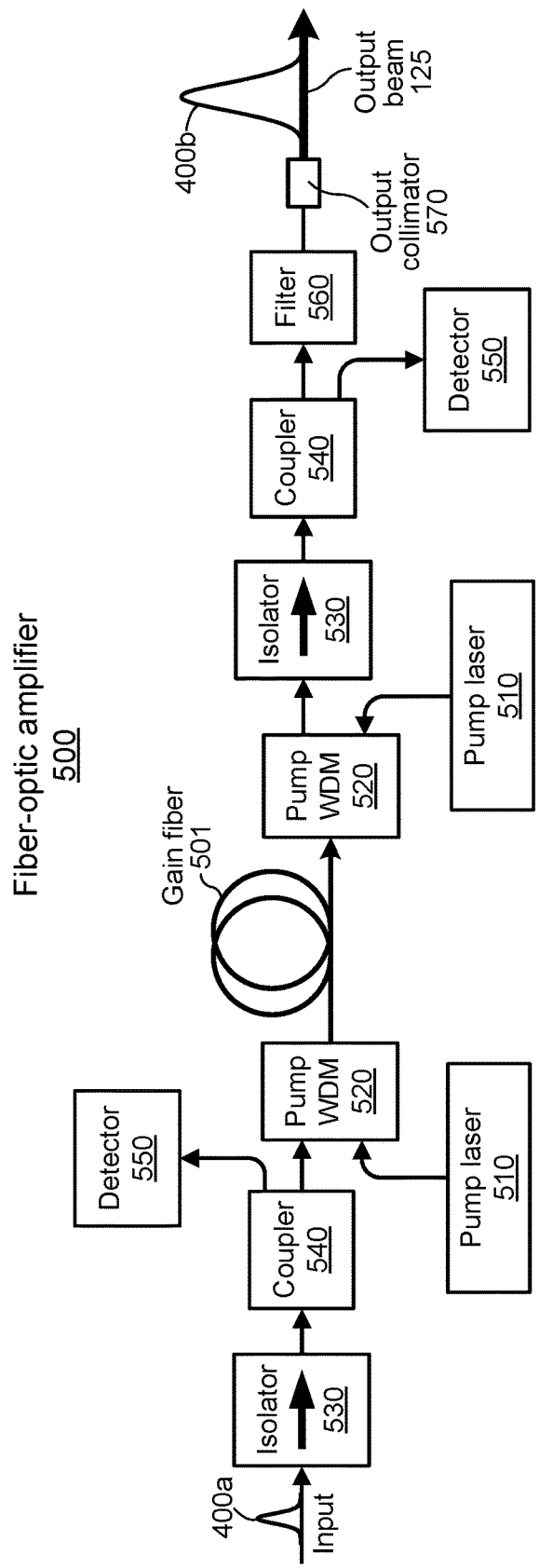
FIG. 14 illustrates an example fiber-optic amplifier.

FIG. 14 illustrates an example fiber-optic amplifier 500. In particular embodiments, a light source 110 of a lidar system 100 may include a fiber-optic amplifier 500 that amplifies pulses of light 400a produced by a SOA 460 to produce an output beam 125 with amplified pulses of light 400b. A fiber-optic amplifier 500 may be terminated by a lens (e.g., output collimator 570) that produces a collimated free-space output beam 125 which may be directed to a scanner 120. In particular embodiments, a fiber-optic amplifier 500 may include one or more pump lasers 510, one or more pump WDMs 520, one or more optical gain fibers 501, one or more optical isolators 530, one or more couplers 540, one or more detectors 550, one or more optical filters 560, or one or more output collimators 570.

A fiber-optic amplifier 500 may include an optical gain fiber 501 that is optically pumped (e.g., provided with energy) by one or more pump lasers 510. The optically pumped gain fiber 501 may provide optical gain to each input pulse of light 400a while propagating through the gain fiber 501. The pump-laser light may travel through the gain fiber 501 in the same direction (co-propagating) as the pulse of light 400a or in the opposite direction (counter-propagating). The fiber-optic amplifier 500 in FIG. 14 includes one co-propagating pump laser 510 on the input side of the amplifier 500 and one counter-propagating pump laser 510 on the output side. A pump laser 510 may produce light at any suitable wavelength to provide optical excitation to the gain material of gain fiber 501 (e.g., a wavelength of approximately 808 nm, 810 nm, 915 m, 940 nm, 960 nm, 976 nm, or 980 nm). A pump laser 510 may be operated as a CW light source and may produce any suitable amount of average optical pump power, such as for example, approximately 1 W, 2 W, 5 W, 10 W, or 20 W of pump power. The pump-laser light from a pump laser 510 may be coupled into gain fiber 501 via a pump wavelength-division multiplexer (WDM) 520. A pump WDM 520 may be used to combine or separate pump light and the pulses of light 400a that are amplified by the gain fiber 501.

The fiber-optic core of a gain fiber 501 may be doped with a gain material that absorbs pump-laser light and provides optical gain to pulses of light 400a as they propagate along the gain fiber 501. The gain material may include rare-earth ions, such as for example, erbium ($Er^{3+}$), ytterbium ($Yb^{3+}$), neodymium ($Nd^{3+}$), praseodymium ($Pr^{3+}$), holmium ($Ho^{3+}$), thulium ($Tm^{3+}$), dysprosium ($Dy^{3+}$), or any other suitable rare-earth element, or any suitable combination thereof. For example, the gain fiber 501 may include a core doped with erbium ions or with a combination of erbium and ytterbium ions. The rare-earth dopants absorb pump-laser light and are "pumped" or promoted into excited states that provide amplification to the pulses of light 400a through stimulated emission of photons. The rare-earth ions in excited states may also emit photons through spontaneous emission, resulting in the production of amplified spontaneous emission (ASE) light by the gain fiber 501.

A gain fiber 501 may include a single-clad or multi-clad optical fiber with a core diameter of approximately 6 μm, 7 μm, 8 μm, 9 μm, 10 μm, 12 μm, 20 μm, 25 μm, or any other suitable core diameter. A single-clad gain fiber 501 may include a core surrounded by a cladding material, and the pump light and the pulses of light 400a may both propagate substantially within the core of the gain fiber 501. A multi-clad gain fiber 501 may include a core, an inner cladding surrounding the core, and one or more additional cladding layers surrounding the inner cladding. The pulses of light 400a may propagate substantially within the core, while the pump light may propagate substantially within the inner cladding and the core. The length of gain fiber 501 in an amplifier 500 may be approximately 0.5 m, 1 m, 2 m, 4 m, 6 m, 10 m, 20 m, or any other suitable gain-fiber length.

A fiber-optic amplifier 500 may include one or more optical filters 560 located at the input or output side of the amplifier 500. An optical filter 560 (which may include an absorptive filter, dichroic filter, long-pass filter, short-pass filter, band-pass filter, notch filter, Bragg grating, or fiber Bragg grating) may transmit light over a particular optical pass-band and substantially block light outside of the pass-band. The optical filter 560 in FIG. 14 is located at the output side of the amplifier 500 and may reduce the amount of ASE from the gain fiber 501 that accompanies the output pulses of light 400b. For example, the filter 560 may transmit light at the wavelength of the pulses of light 400a (e.g., 1550 nm) and may attenuate light at wavelengths away from a 5-nm pass-band centered at 1550 nm.

A fiber-optic amplifier 500 may include one or more optical isolators 530. An isolator 530 may reduce or attenuate backward-propagating light, which may destabilize or cause damage to a seed laser diode 450, SOA 460, pump laser 510, or gain fiber 501. The isolators 530 in FIG. 14 may allow light to pass in the direction of the arrow drawn in the isolator and block light propagating in the reverse direction. Backward-propagating light may arise from ASE light from gain fiber 501, counter-propagating pump light from a pump laser 510, or optical reflections from one or more optical interfaces of a fiber-optic amplifier 500. An optical isolator 530 may prevent the destabilization or damage associated with backward-propagating light by blocking most of the backward-propagating light (e.g., by attenuating backward-propagating light by greater than or equal to 5 dB, 10 dB, 20 dB, 30 dB, 40 dB, 50 dB, or any other suitable attenuation value).

A fiber-optic amplifier 500 may include one or more couplers 540 and one or more detectors 550. A coupler 540 may split off a portion of light (e.g., approximately 0.1%, 0.5%, 1%, 2%, or 5% of light received by the coupler 540) and direct the split off portion to a detector 550. In FIG. 14, each coupler 540 may split off and send approximately 1% of each pulse of light (400a or 400b) to a detector 550. One or more detectors 550 may be used to monitor the performance or health of a fiber-optic amplifier 500. If an electrical signal from a detector 550 drops below a particular threshold level, then a controller 150 may determine that there is a problem with the amplifier 500 (e.g., there may be insufficient optical power in the input pulses of light 400a or a pump laser 510 may be failing). In response to determining that there is a problem with the amplifier 500, the controller 150 may shut down or disable the amplifier 500, shut down or disable the lidar system 100, or send a notification that the lidar system 100 is in need of service or repair.

In particular embodiments, a fiber-optic amplifier 500 may include an input optical fiber configured to receive input pulses of light 400a from a SOA 460. The input optical fiber may be part of or may be coupled or spliced to one of the components of the fiber-optic amplifier 500. For example, pulses of light 400a may be coupled into an optical fiber which is spliced to an input optical fiber of the isolator 530 located at the input to the amplifier 500. As another example, the pulses of light 400a from a SOA 460 may be part of a free-space beam that is coupled into an input optical fiber of fiber-optical amplifier 500 using one or more lenses. As another example, an input optical fiber of fiber-optic amplifier 500 may be positioned at or near the output end 462 of a SOA 460 so that the pulses of light 400a are directly coupled from the SOA 460 into the input optical fiber.

In particular embodiments, the optical components of a fiber-optic amplifier 500 may be free-space components, fiber-coupled components, or a combination of free-space and fiber-coupled components. As an example, each optical component in FIG. 14 may be a free-space optical component or a fiber-coupled optical component. As another example, the input pulses of light 400a may be part of a free-space optical beam, and the isolator 530, coupler 540, and pump WDM 520 located on the input side of the amplifier 500 may each be free-space optical components. Additionally, the light from the pump laser 510 on the input side may be a free-space beam that is combined with the input pulses of light 400a by the pump WDM 520 on the input side, and the combined pump-seed light may form a free-space beam that is coupled into the gain fiber 501 via one or more lenses.

Figure 15:
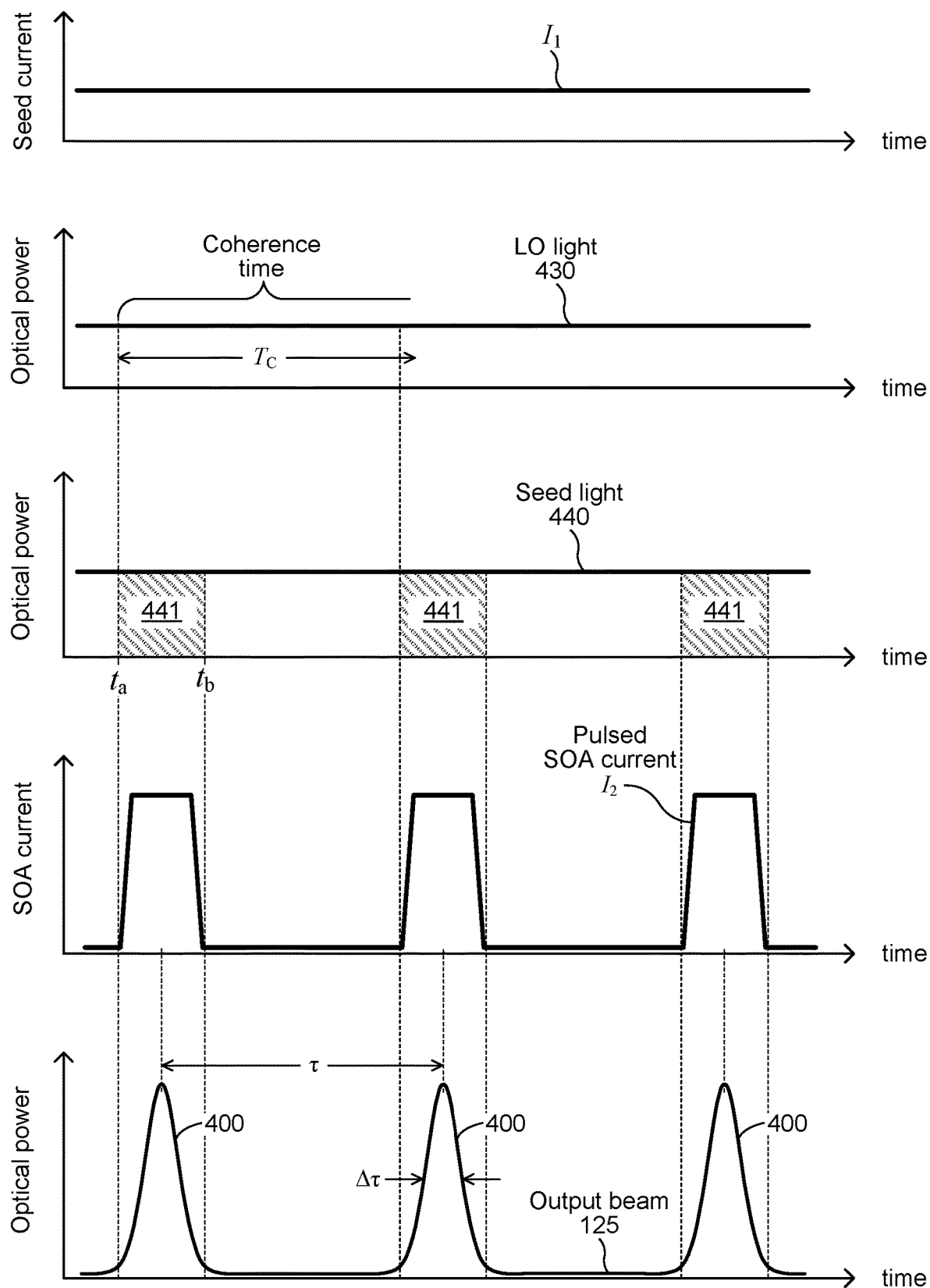
FIG. 15 illustrates example graphs of seed current ($I_1$), LO light, seed light, pulsed SOA current ($I_2$), and emitted optical pulses.

FIG. 15 illustrates example graphs of seed current ($I_1$), LO light 430, seed light 440, pulsed SOA current ($I_2$), and emitted optical pulses 400. Each of the parameters ($I_1$, LO light 430, seed light 440, $I_2$, and emitted optical pulses 400) in FIG. 15 is plotted versus time. The graph of seed current $I_1$ corresponds to a substantially constant DC electrical current that is supplied to a seed laser diode 450. Based on the DC electrical current $I_1$, the LO light 430 and seed light 440 produced by the seed laser diode 450 may each include CW light or light having a substantially constant optical power, as represented by the graphs of LO light 430 and seed light 440 in FIG. 15. For example, the LO light 430 may have a substantially constant average optical power of approximately 1 µW, 10 µW, 100 µW, 1 mW, 10 mW, 20 mW, 50 mW, or any other suitable average optical power. As another example, the seed light 440 may have a substantially constant average optical power of approximately 1 mW, 10 mW, 20 mW, 50 mW, 100 mW, 200 mW or any other suitable average optical power. As another example, the LO light 430 may have a substantially constant optical power of approximately 10 µW, and the seed light 440 may have a substantially constant optical power of approximately 100 mW. The LO light 430 or the seed light 440 having a substantially constant optical power may correspond to the optical power being substantially constant over particular time interval (e.g., a time interval greater than or equal to the pulse period τ, the coherence time $T_c$, or the time interval $t_b-t_a$). For example, the power of the LO light 430 may vary by less than ±1% over a time interval greater than or equal to the pulse period τ.

In particular embodiments, CW light may refer to light having a substantially fixed or stable optical frequency or wavelength over a particular time interval (e.g., over pulse period τ, over coherence time $T_c$, or over the time interval $t_b-t_a$). Light with a substantially fixed or stable optical frequency may refer to light having a variation in optical frequency over a particular time interval of less than or equal to ±0.1%, ±0.01%, ±0.001%, ±0.0001%, ±0.00001%, ±0.000001%, or any other suitable variation. For example, if LO light 430 with a 1550-nm wavelength (which corresponds to an optical frequency of approximately 193.4 THz) has a frequency variation of less than or equal to ±0.000001% over a particular time interval, then the frequency of the LO light 430 may vary by less than or equal to approximately ±1.94 MHz over the time interval.

In particular embodiments, the average optical power for LO light 430 may be set to a particular value based at least in part on a saturation value of a receiver 140. For example, a seed laser 450 may be configured to emit LO light 430 having an average optical power that is less than a saturation value of a receiver 140 (e.g., less than a saturation value of a detector 340 or an amplifier 350 of the receiver 140). If a receiver 140 receives an input optical signal (e.g., combined beam 422) that exceeds an optical-power saturation value of the detector 340, then the detector 340 may saturate or produce a photocurrent i that is different from or distorted with respect to the input optical signal. A detector 340 may saturate with an input optical power of approximately 0.1 mW, 0.5 mW, 1 mW, 5 mW, 10 mW, 20 mW, or 100 mW. If an amplifier 350 of a receiver 140 receives an input photocurrent i that exceeds an electrical-current saturation value, then the amplifier 350 may saturate or produce a voltage signal 360 that is different from or distorted with respect to the photocurrent signal i. To prevent saturation of the detector 340 or amplifier 350, the optical power of the input beam 135 or of the LO light 430 may be selected to be below a saturation power of the receiver 140. For example, a detector 340 may saturate with an input optical power of 10 mW, and to prevent the detector 340 from saturating, the optical power of a combined beam 422 may be limited to less than 10 mW. In particular embodiments, a limit may be applied to the average power of the LO light 430 to prevent saturation. For example, a detector 340 may saturate with an average optical power of 1 mW, and to prevent the detector 340 from saturating, the average optical power of LO light 430 that is sent to the detector 340 may be configured to be less than 1 mW. As another example, the average optical power of the LO light 430 may be set to a value between 1 µW and 100 µW to prevent saturation effects in a detector 340.

In particular embodiments, the average optical power of LO light 430 may be configured by adjusting or setting (i) an amount of seed current $I_1$ supplied to a seed laser diode 450, (ii) a reflectivity of the back face 451 of the seed laser diode 450, (iii) a reflectivity of a free-space splitter 470, or (iv) an amount of light split off by a fiber-optic or optical-waveguide splitter 470. In the example of FIG. 8 or FIG. 9, the seed current $I_1$ and the reflectivity of the back face 451 of the seed laser diode 450 may be configured so that the average optical power of the LO light 430 is set to a particular value (e.g., a value between 10 µW and 100 µW). In the example of FIG. 10, the seed current $I_1$ and the reflectivity of the splitter 470 may be configured so that the average optical power of the LO light 430 is set to a particular value (e.g., a value below 10 mW). In the example of FIG. 11, the seed current supplied to the seed laser diode 450 and the amount of light split off to output port 2 by the optical-waveguide splitter 470 may be configured so that the average optical power of the LO light 430 is set to a particular value (e.g., a value below 1 mW).

In FIG. 15, the hatched regions 441 of the seed light 440 correspond to temporal portions of the seed light 440 that are amplified by a SOA 460. The SOA current $I_2$ includes pulses of electrical current, and each pulse of current may cause the SOA 460 to amplify a corresponding temporal portion 441 of the seed light 440 to produce an emitted pulse of light 400. A temporal portion 441 of seed light 440 may refer to a portion of the seed light 440 located in a particular interval of time over which a pulse of current $I_2$ is applied to a SOA 460. For example, the portion of seed light 440 located in the time interval between times $t_a$ and $t_b$ in FIG. 15 corresponds to one temporal portion 441 of the seed light 440. The corresponding pulse of SOA current between the times $t_a$ and $t_b$ results in the amplification of the temporal portion 441 and the emission of a pulse of light 400. The duration of a temporal portion 441 (e.g., as represented by $t_b-t_a$) or the duration of a SOA current pulse may be approximately 0.5 ns, 1 ns, 2 ns, 5 ns, 10 ns, 20 ns, 50 ns, 100 ns, or any other suitable duration.

Each emitted pulse of light 400 in FIG. 15 may include a temporal portion 441 of seed light 440 that is amplified by a SOA 460, and during the time period between successive pulses of SOA current $I_2$, the seed light 440 may be substantially absorbed by the SOA 460. The emitted pulses of light 400 are part of an output beam 125 and have a pulse duration of $\Delta T$ and a pulse period of $\tau$. For example, the emitted pulses of light 400 may have a pulse period of approximately 100 ns, 200 ns, 500 ns, 1 µs, 2 µs, 5 µs, 10 µs, or any other suitable pulse period. As another example, the emitted pulses of light 400 may have a pulse duration of 1-10 ns and a pulse period of 0.5-2.0 µs. In particular embodiments, when a current pulse is applied to a SOA 460, there may be a time delay until the optical gain of the SOA 460 builds up to exceed the optical loss of the SOA 460. As a result, the pulse duration $\Delta \tau$ of an emitted pulse of light 400 may be less than or equal to the duration of a corresponding pulse of SOA current $I_2$. For example, a SOA current pulse with a duration of 8 ns may produce an emitted pulse of light 400 with a duration of 6 ns. In the example of FIG. 15, the emitted pulses of light 400 may have a duration of approximately 5 ns, and the SOA current pulses may have a duration (e.g., as represented by $t_b-t_a$) of approximately 5 ns to 10 ns.

Figure 16:
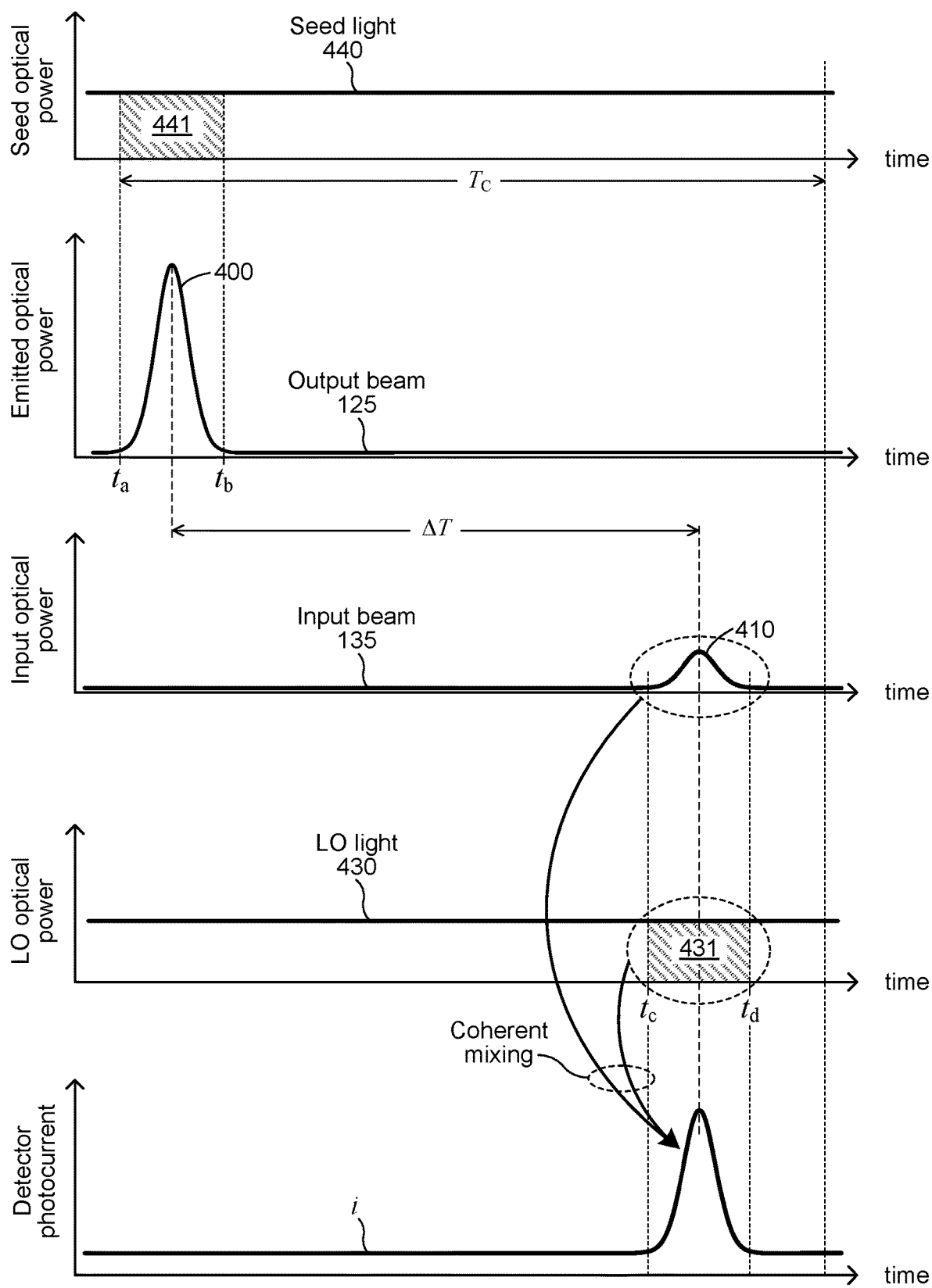
FIG. 16 illustrates example graphs of seed light, an emitted optical pulse, a received optical pulse, LO light, and detector photocurrent.

FIG. 16 illustrates example graphs of seed light 440, an emitted optical pulse 400, a received optical pulse 410, LO light 430, and detector photocurrent i. Each of the parameters (seed light 440, emitted optical pulse 400, received optical pulse 410, LO light 430, and photocurrent i) in FIG. 15 is plotted versus time. The seed light 440 may include CW light or light having a substantially constant optical power, and the temporal portion 441 of the seed light 440 may be amplified by a SOA 460 to produce the emitted pulse of light 400. The emitted pulse of light 400 is part of output beam 125, and the received pulse of light 410 is part of input beam 135. The received pulse of light 410, which is received a time interval $\Delta T$ after the pulse of light 400 is emitted, may include light from the emitted optical pulse 400 that is scattered by a target 130. The distance D from the lidar system 100 to the target 130 may be determined from the expression $D=c \cdot \Delta T/2$.

In particular embodiments, a received pulse of light 410 and LO light 430 may be combined and coherently mixed together at one or more detectors 340 of a receiver 140. Each detector 340 may produce a photocurrent signal i that corresponds to coherent mixing of the received pulse of light 410 and the LO light 430. In FIG. 16, the received pulse of light 410 is coherently mixed with a temporal portion 431 of the LO light 430 to produce a corresponding pulse of detector photocurrent i. A temporal portion 431 of LO light 430 may refer to a portion of the LO light 430 that is coincident with a received pulse of light 410. In FIG. 16, temporal portion 431 and the received pulse of light 410 are each located in the time interval between times $t_c$ and $t_d$. The coherent mixing of the pulse of light 410 and the temporal portion 431 may occur at a detector 340 of the receiver 140, and the detector 340 may produce a pulse of detector photocurrent i in response to the coherent mixing. Coherent mixing of two optical signals (e.g., a received pulse of light 410 and LO light 430) may be referred to as optical mixing, mixing, optical interfering, coherent combining, coherent detection, homodyne detection, or heterodyne detection.

In particular embodiments, coherent mixing may occur when two optical signals that are coherent with one another are optically combined and then detected by a detector 340. If two optical signals can be coherently mixed together, the two optical signals may be referred to as being coherent with one another. Two optical signals being coherent with one another may include two optical signals (i) that have approximately the same optical frequency, (ii) that have a particular optical frequency offset ($\Delta f$), or (iii) that each have a substantially fixed or stable optical frequency over a particular period of time. For example, seed light 440 and LO light 430 in FIG. 16 may be coherent with one another since they may have approximately the same optical frequency or each of their frequencies may be substantially fixed over a time period approximately equal to coherence time $T_c$. As another example, the emitted pulse of light 400 and the temporal portion 431 of LO light 430 in FIG. 16 may be coherent with one another. And since the received pulse of light 410 may include a portion of the emitted pulse of light 400, the received pulse of light 410 and the temporal portion 431 may also be coherent with one another.

In particular embodiments, if two optical signals each have a stable frequency over a particular period of time, then the two optical signals may be (i) optically combined together and (ii) coherently mixed at a detector 340. Optically combining two optical signals (e.g., an input beam 135 and LO light 430) may refer to combining two optical signals so that their respective electric fields are summed together. Optically combining two optical signals may include overlapping the two optical signals (e.g., with an optical combiner 420) so that they are substantially coaxial and travel together in the same direction and along approximately the same optical path. Additionally, optically combining two optical signals may include overlapping the two optical signals so that at least a portion of their respective polarizations have the same orientation. Once the two optical signals are optically combined, they may be coherently mixed at a detector 340, and the detector 340 may produce a photocurrent signal i corresponding to the summed electrical fields of the two optical signals.

In particular embodiments, a portion of seed light 440 may be coherent with a portion of LO light 430. For example, LO light 430 and seed light 440 may be coherent with one another over a time period approximately equal to the coherence time $T_c$. In each of FIGS. 8-11, the LO light 430 and the seed light 440 may be coherent with one another since the two optical signals are derived from the same seed laser diode 450. In FIG. 12, the LO light 430 and the seed light 440 may be coherent with one another since the two optical signals may have a particular frequency offset. In FIG. 16, the temporal portion 441 of the seed light 440 may be coherent with the temporal portion 431 of the LO light 430. Additionally, the temporal portion 441 may be coherent with any portion of the LO light 430 extending over at least the time interval $\Delta T$ or $T_c$ (e.g., from approximately time $t_a$ to at least time $t_d$). The coherence time $T_c$ may correspond to a time over which light emitted by a seed laser diode 450 is coherent (e.g., the emitted light may have a substantially fixed or stable frequency over a time interval of $T_c$). The coherence length $L_c$ is the distance over which the light from a seed laser diode 450 is coherent, and the coherence time and coherence length may be related by the expression $L_c=c \cdot T_c$. For example, a seed laser diode 450 may have a coherence length of approximately 500 m, which corresponds to a coherence time of approximately 1.67 µs. The seed light 440 and LO light 430 emitted by a seed laser diode 450 may have a coherence length of approximately 1 m, 10 m, 50 m, 100 m, 300 m, 500 m, 1 km, or any other suitable coherence length. Similarly, the seed light 440 and LO light 430 may have a coherence time of approximately 3 ns, 30 ns, 150 ns, 300 ns, 1 µs, 1.5 µs, 3 µs, or any other suitable coherence time.

In particular embodiments, each emitted pulse of light 400 may be coherent with a corresponding portion of LO light 430. In FIG. 16, the corresponding portion of the LO light 430 may include any portion of the LO light 430 (including temporal portion 431) extending from approximately time $t_a$ to at least time $t_d$, and the emitted pulse of light 400 may be coherent with any portion of the LO light 430 from time $t_a$ to time $t_d$. In FIG. 15, each emitted pulse of light 400 may be coherent with the LO light 430 over a time period from when the pulse of light 400 is emitted until at least a time τ (the pulse period) after the pulse is emitted. Similarly, in each of FIGS. 8-11, the emitted pulse of light 400 may be coherent with the LO light 430 for at least a time τ after the pulse 400 is emitted. In FIG. 13, the fiber-optic amplifier 500 may preserve the coherence of the pulse of light 400a, and the emitted pulse of light 400b may be coherent with the LO light 430 for at least a time τ after the pulse 400b is emitted.

In particular embodiments, each emitted pulse of light 400 may include a temporal portion 441 of the seed light 440 that is amplified by a SOA 460, and the amplification process may be a coherent amplification process that preserves the coherence of the temporal portion 441. Since the temporal portion 441 may be coherent with a corresponding portion of the LO light 430, the emitted pulse of light 400 may also be coherent with the same portion of the LO light 430. An emitted pulse of light 400 being coherent with a corresponding portion of LO light 430 may correspond to temporal portion 441 being coherent with the corresponding portion of the LO light 430. In the example of FIG. 16, the temporal portion 441 may be coherent with the LO light 430 over at least the time interval ΔT or $T_c$ (e.g., from approximately time $t_a$ to at least time $t_d$). Since the emitted pulse of light 400 may be coherent with the temporal portion 441, the emitted pulse of light 400 may also be coherent with any portion of the LO light 430 (including the temporal portion 431) from approximately time $t_a$ until at least time $t_d$. An emitted pulse of light 400 being coherent with any portion of LO light 430 in the time period from time $t_a$ until at least time $t_d$ indicates that the emitted pulse of light 400 may be coherently mixed with any portion of the LO light 430 (including the temporal portion 431) over this same time period. The received pulse of light 410 includes light from the emitted pulse of light 400 (e.g., light from the emitted pulse of light 400 that is scattered by a target 130), and so the received pulse of light 410 may be coherent with the emitted pulse of light 400. Based on this, the received pulse of light 410 may also be coherently mixed with any portion of the LO light 430 over the $t_a$ to $t_d$ time period.

In particular embodiments, an emitted pulse of light 400 being coherent with a corresponding portion of LO light 430 may correspond to the LO light 430 having a coherence length greater than or equal to $2 \times R_{OP}$, where $R_{OP}$ is an operating range of the lidar system 100. The coherence length $L_c$ being greater than or equal to $2 \times R_{OP}$ corresponds to the coherence time $T_c$ being greater than or equal to $2 \times R_{OP}/c$. Since the quantity $2 \times R_{OP}/c$ may be approximately equal to the pulse period τ, the coherence length $L_c$ being greater than or equal to $2 \times R_{OP}$ may correspond to the coherence time $T_c$ being greater than or equal the pulse period τ. The LO light 430 and the seed light 440 may be coherent with one another over the coherence time $T_c$, which corresponds to the temporal portion 441 in FIG. 16 being coherent with the LO light 430 over the coherence time $T_c$. Similarly, the emitted pulse of light 400, which includes the temporal portion 441 amplified by the SOA 460, may be coherent with the LO light 430 over the coherence time $T_c$. If the coherence length of the LO light 430 is greater than or equal to $2 \times R_{OP}$ (or, if $T_c$ is greater than or equal to τ), then an emitted pulse of light 400 may be coherent with any portion of the LO light 430 (including the temporal portion 431) from a time when the pulse of light 400 is emitted until at least a time τ after the pulse is emitted. This indicates that a received pulse of light 410 (which includes light from the emitted pulse of light 400 scattered from a target 130) may be coherently mixed with the LO light 430 as long as the distance D to the target 130 is within the operating range of the lidar system 100 (e.g., $D \le R_{OP}$).

In particular embodiments, each emitted pulse of light 400 may be coherent with a corresponding portion of LO light 430, and the corresponding portion of the LO light 430 may include temporal portion 431 of the LO light 430. The temporal portion 431 represents the portion of the LO light 430 that is detected by a receiver 140 at the time when the received pulse of light 410 is detected by the receiver 140. In FIG. 16, the temporal portion 431 is coincident with the received pulse of light 410, and both optical signals are located between times $t_c$ and $t_d$. Since the received pulse of light 410 includes scattered light from the emitted pulse of light 400, the received pulse of light 410 may be coherent with the temporal portion 431 of the LO light 430. The received pulse of light 410 and the temporal portion 431 may be coherently mixed together at a detector 340 of the receiver, and the coherent mixing may result in a pulse of detector photocurrent i, as illustrated in FIG. 16.

In particular embodiments, a received pulse of light 410 may be coherent with a temporal portion 431 of LO light 430. In FIG. 16, the received pulse of light 410 and the temporal portion 431, which are coherently mixed together, are coherent with one another. In particular embodiments, the coherent mixing of a received pulse of light 410 and a temporal portion 431 may not require that the coherence time $T_c$ associated with seed light 440 or LO light 430 be greater than or equal to the pulse period τ. For example, the received pulse of light 410 and the temporal portion 431 may be coherently mixed even if the coherence time is less than ΔT or less than the pulse period τ. Coherent mixing may occur if the coherence time $T_c$ associated with the seed light 440 or the LO light 430 is greater than or equal to the duration of the received pulse of light 410 or the duration of the temporal portion 431. If a received pulse of light 410 and a temporal portion 431 each has a substantially fixed frequency over at least the duration of the temporal portion 431, then the received pulse of light 410 and the temporal portion 431 may be coherently mixed together. As long as the received pulse of light 410 and the temporal portion 431 each has an optical frequency that is substantially stable over the duration of the pulse of light 410 or over the duration of the temporal portion 431, then the two optical signals may be coherently mixed together. In the example of FIG. 16, the received pulse of light 410 and the temporal portion 431 may be coherent over the duration of the temporal portion 431 (e.g., the coherence time $T_c$ may be greater than or equal to $t_d-t_c$), and their electric fields may be coherently combined (e.g., summed together) and coherently mixed together.

Figure 17:
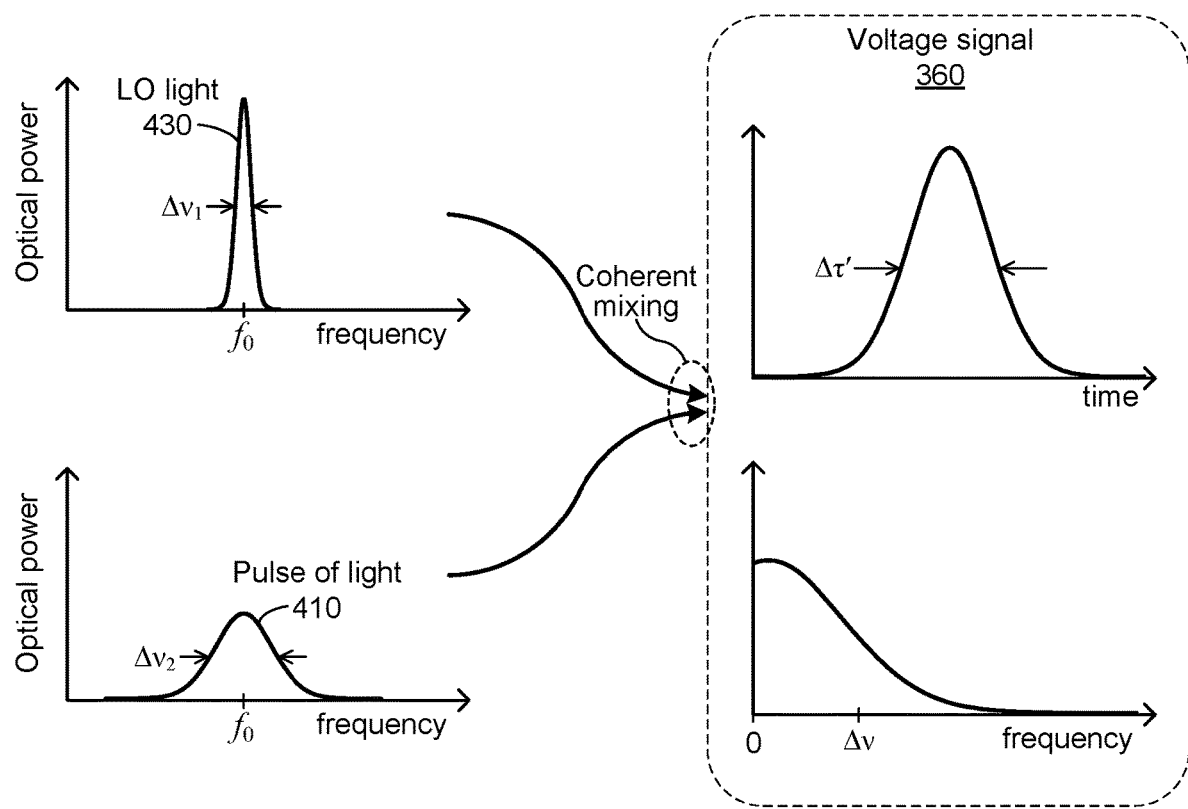
FIG. 17 illustrates an example voltage signal that results from the coherent mixing of LO light and a received pulse of light.

FIG. 17 illustrates an example voltage signal 360 that results from coherent mixing of LO light 430 and a received pulse of light 410. The LO light 430 and the received pulse of light 410 are each represented by a frequency-domain graph that illustrates the relative optical power versus optical frequency. The LO light 430 has a center optical frequency of $f_0$ and a relatively narrow spectral linewidth of $\Delta v_1$. The pulse of light 410 has the same center frequency $f_0$ and a broader spectral linewidth of $\Delta v_2$. The coherent mixing of the LO light 430 and the pulse of light 410 at a detector 340 may result in a pulse of photocurrent i which is amplified by an amplifier 350 that produces the voltage signal 360. The upper voltage-signal graph illustrates the voltage signal 360 in the time domain and includes a pulse of voltage with a duration of $\Delta\tau'$. The duration $\Delta\tau'$ of the voltage pulse may be greater than the duration $\Delta\tau$ of the corresponding emitted pulse of light 400. For example, the duration of an emitted pulse of light 410 may increase while propagating to and from a target 130 or due to pulse-broadening effects of scattering from the target 130. Additionally or alternatively, the finite temporal response of a detector 340 or amplifier 350 may result in a voltage pulse with a longer duration than the duration of a corresponding emitted pulse of light 400 or received pulse of light 410. The lower voltage-signal graph in FIG. 17 is a frequency-domain graph of the voltage signal 360 that indicates that the voltage signal 360 has an electrical bandwidth of $\Delta v$.

A spectral linewidth of an optical signal (e.g., seed light 440, LO light 430, or pulse of light 410) may be referred to as a linewidth, optical linewidth, bandwidth, or optical bandwidth. The spectral linewidth or electrical bandwidth may refer to an approximate width of a spectrum as measured at the half-power points of the spectrum (which may be referred to as the 3-dB points). A spectral linewidth or an electrical bandwidth may be specified over a particular time period, such as for example, over a period of time approximately equal to a pulse duration (e.g., $\Delta\tau$ or $t_b-t_a$), a temporal-portion duration (e.g., $t_d-t_c$), a pulse period $\tau$, a coherence time $T_c$, or any other suitable period of time. A spectral linewidth or an electrical bandwidth may be specified over a time period of approximately 1 µs, 10 µs, 100 µs, 1 ms, 10 ms, 100 ms, 1 s, 10 s, 100 s, or any other suitable time period. For example, the LO light 430 may have a spectral linewidth $\Delta v_1$ of 4 MHz when measured over a 100-ms time interval. A spectral linewidth for an optical signal may be related to a variation in optical frequency of the optical signal. For example, LO light 430 having a spectral linewidth $\Delta v_1$ of 4 MHz may correspond to LO light 430 having a frequency variation of approximately ±2 MHz over a 100-ms time interval.

In particular embodiments, the seed light 440 or the LO light 430 may have a spectral linewidth $\Delta v_1$ of less than approximately 50 MHz, 10 MHz, 5 MHz, 3 MHz, 1 MHz, 0.5 MHz, 100 kHz, or any other suitable spectral-linewidth value. In the example of FIG. 17, the LO light 430 in FIG. 17 may have a spectral linewidth $\Delta v_1$ of approximately 3 MHz, and the corresponding seed light (not illustrated in FIG. 17) may have approximately the same spectral linewidth. When a temporal portion 441 of the seed light 440 is amplified to produce an emitted pulse of light 400, the spectral linewidth of the emitted pulse of light 400 may have a broadened linewidth $\Delta v_2$ that is greater than $\Delta v_1$. For example, an emitted pulse of light 400 and a corresponding received pulse of light 410 may each have spectral linewidth $\Delta v_2$ of approximately 10 MHz, 50 MHz, 100 MHz, 200 MHz, 300 MHz, 500 MHz, 1 GHz, 10 GHz, or any other suitable linewidth. As another example, the LO light 430 in FIG. 17 may have a spectral linewidth $\Delta v_1$ of 5 MHz, and the received pulse of light 410 in FIG. 17 may have a spectral linewidth $\Delta v_2$ of 100 MHz. As another example, the received pulse of light 410 in FIG. 17 may have a duration $\Delta\tau$ of approximately 3-6 ns and a spectral linewidth $\Delta v_2$ of approximately 75-150 MHz.

In particular embodiments, an electrical bandwidth $\Delta v$ of a voltage signal 360 may be approximately equal to a numeric combination of the linewidths of the corresponding LO light 430 and received pulse of light 410. The electrical bandwidth $\Delta v$ may be greater than both of the linewidths $\Delta v_1$ and $\Delta v_2$. For example, the electrical bandwidth $\Delta v$ may be approximately equal to the sum of the linewidths of the LO light 430 and the received pulse of light 410 (e.g., $\Delta v \approx \Delta v_1 + \Delta v_2$). As another example, the electrical bandwidth $\Delta v$ may be approximately equal to $\sqrt{\Delta v_1^2 + \Delta v_2^2}$. In FIG. 17, the LO light 430 may have a spectral linewidth $\Delta v_1$ of approximately 3 MHz, and the received pulse of light 410 may have a spectral linewidth $\Delta v_2$ of approximately 150 MHz. The electrical bandwidth $\Delta v$ of the voltage signal 360 may be approximately equal to the sum of the two linewidths, or 153 MHz.

In particular embodiments, a photocurrent signal i produced by a detector 340 in response to the coherent mixing of LO light 430 and a received pulse of light 410 may be expressed as $i(t)=k|\varepsilon_{Rx}(t)+\varepsilon_{LO}(t)|^2$, where k is a constant (e.g., k may account for the responsivity of the detector 340 as well as other constant parameters or conversion factors). For clarity, the constant k or other constants (e.g., conversion constants or factors of 2 or 4) may be excluded from expressions herein related to the photocurrent i. In the expression for i(t), $\varepsilon_{Rx}(t)$ is the electric field of the received pulse of light 410, and $\varepsilon_{LO}(t)$ is the electric field of the LO light 430. The electric field of the received pulse of light 410 may be expressed as $E_{Rx}\cos[\omega_{Rx}t+\phi_{Rx}(t)]$, where $E_{Rx}$ is the amplitude of the electric field of the received pulse of light 410, which may be expressed as $E_{Rx}(t)$, since the electric field amplitude may vary with time. Similarly, the electric field of the LO light 430 may be expressed as $E_{LO}\cos[\omega_{LO}t+\phi_{LO}(t)]$, where $E_{LO}$ is the amplitude of the electric field of the LO light 430, which may also be expressed as $E_{LO}(t)$. The frequency $\omega_{Rx}$ represents the optical frequency of the electric field of the received pulse of light 410, and $\omega_{LO}$ represents the optical frequency of the electric field of the LO light 430. A frequency represented by $\omega$ is a radial frequency (with units radians/s) and is related to the optical frequency f (with units cycles/s) by the expression $\omega=2\pi f$. Each of the frequencies $\omega_{Rx}$ and $\omega_{LO}$, which may be expressed as $\omega_{Rx}(t)$ or $\omega_{LO}(t)$, may vary with time or may be substantially constant with time. The parameter $\phi_{Rx}(t)$ represents a phase of the electric field of the received pulse of light 410, and $\phi_{LO}(t)$ represents a phase of the electric field of the LO light 430. Each of the phases $\phi_{Rx}(t)$ and $\phi_{LO}(t)$, which may be expressed as $\phi_{Rx}$ and $\phi_{LO}$, may vary with time or may be substantially constant with time.

The above expression for the photocurrent signal i may be expanded and written as $i(t)=E_{Rx}^2+E_{LO}^2+2E_{Rx}E_{LO}\cos[(\omega_{Rx}-\omega_{LO})t+\phi_{Rx}(t)-\phi_{LO}(t)]$. In this expanded expression for the photocurrent signal i(t), the first term $E_{Rx}^2$ corresponds to the power of the received pulse of light 410, and the second term $E_{LO}^2$ corresponds to the power of the LO light 430. If the received pulse of light 410 is a Gaussian pulse with a pulse width of $\Delta\tau$, the first term may be expressed as $E_{Rx}^2(t)=P_{Rx}\exp[-(2\sqrt{\ln 2}\,t/\Delta\tau)^2]$, where $P_{Rx}$ is the peak power of the received pulse of light 410. If the LO light 430 has a substantially constant optical power, the second term may be expressed as $E_{LO}^2=P_{LO}$, where $P_{LO}$ is the average power of the LO light 430. In particular embodiments, a photocurrent signal i corresponding to the coherent mixing of LO light 430 and a received pulse of light 410 may include a coherent-mixing term. The third term in the above expression, $2E_{Rx}E_{LO} \cos[(\omega_{Rx}-\omega_{LO})t+\phi_{Rx}(t)-\phi_{LO}(t)]$, may be referred to as a coherent-mixing term. If the received pulse of light 410 and the LO light 430 have approximately the same optical frequency, then $\omega_{Rx}$ is approximately equal to $\omega_{LO}$, and the coherent-mixing term may be expressed as $2E_{Rx}E_{LO} \cos[\phi_{Rx}(t)-\phi_{LO}(t)]$. The coherent-mixing term represents coherent mixing between the electric fields of the received pulse of light 410 and the LO light 430. The coherent-mixing term is proportional to (i) $E_{Rx}$, the amplitude of the electric field of the received pulse of light 410 and (ii) $E_{LO}$, the amplitude of the electric field of the LO light 430. The amplitude of the electric field of the received pulse of light 410 may be time dependent (e.g., corresponding to a Gaussian or other pulse shape), and the $E_{LO}$ term may be substantially constant, corresponding to an optical power of LO light 430 that is substantially constant.

A coherent pulsed lidar system 100 as described herein may have a higher sensitivity than a conventional non-coherent pulsed lidar system. For example, compared to a conventional non-coherent pulsed lidar system, a coherent pulsed lidar system may be able to detect targets 130 that are farther away or that have lower reflectivity. In a conventional non-coherent pulsed lidar system, a received pulse of light may be directly detected by a detector, without LO light and without coherent mixing. The photocurrent signal produced in a conventional non-coherent pulsed lidar system may correspond to the $E_{Rx}^2$ term discussed above, which represents the power of a received pulse of light. The size of the $E_{Rx}^2$ term may be determined primarily by the distance to the target 130 and the reflectivity of the target 130, and aside from boosting the energy of the emitted pulses of light 400, increasing the size of the $E_{Rx}^2$ term may not be practical or feasible. In a coherent pulsed lidar system 100 as discussed herein, the detected signal includes a coherent-mixing term, which is proportional to the product of $E_{Rx}$ and $E_{LO}$, and the improved sensitivity of a coherent pulsed lidar system 100 may result from the coherent-mixing term. While it may not be practical or feasible to increase the amplitude of $E_{Rx}$ for far-away or low-reflectivity targets 130, the amplitude of the $E_{LO}$ term may be increased by increasing the power of the LO light 430. The power of the LO light 430 can be set to a level that results in an effective boosting of the size of the coherent-mixing term, which results in an increased sensitivity of the lidar system 100. In the case of a conventional non-coherent pulsed lidar system, the signal of interest depends on $E_{Rx}^2$, the power of the received pulse of light. In a coherent pulsed lidar system 100, the signal of interest, which depends on the product of $E_{Rx}$ and $E_{LO}$, may be increased by increasing the power of the LO light 430. The LO light 430 acts to effectively boost the coherent-mixing term, which may result in an improved sensitivity of the lidar system 100.

Figure 18:
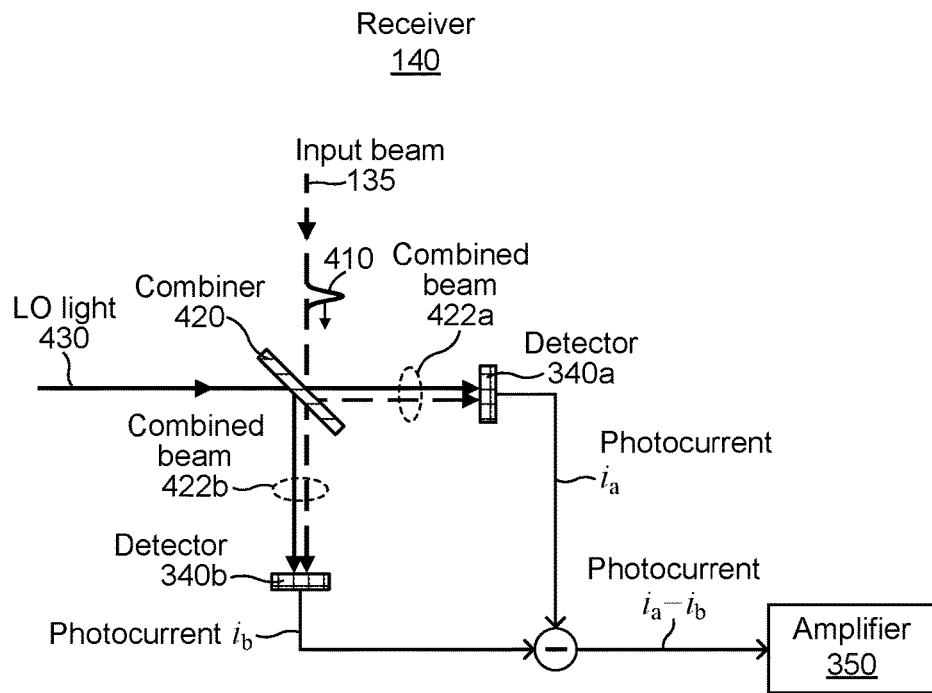
FIG. 18 illustrates an example receiver that includes a combiner and two detectors.

FIG. 18 illustrates an example receiver 140 that includes a combiner 420 and two detectors (340a, 340b). In particular embodiments, a receiver 140 of a lidar system 100 may include an optical combiner 420 that (i) combines LO light 430 with a received pulse of light 410 (which is part of an input beam 135) and (ii) directs a first portion 422a of the combined light to a first output and directs a second portion 422b of the combined light to a second output. For example, combiner 420 may be a 50-50 free-space optical beam-splitter that reflects approximately 50% of incident light and transmits approximately 50% of incident light. In FIG. 18, the combined beam 422a is directed to detector 340a and includes a transmitted portion of LO light 430 and a reflected portion of the received pulse of light 410 (e.g., approximately 50% of the incident LO light 430 and approximately 50% of the received pulse of light 410). Similarly, the combined beam 422b is directed to detector 340b and includes a reflected portion of LO light 430 and a transmitted portion of the received pulse of light 410.

In particular embodiments, a receiver 140 of a lidar system 100 may include one or more detectors 340 configured to produce one or more respective photocurrent signals i corresponding to coherent mixing of LO light 430 and a received pulse of light 410. The receiver 140 in FIG. 18 includes two detectors 340a and 340b, and each detector produces a respective photocurrent signal $i_a$ and $i_b$. The portions of LO light 430 and received pulse of light 410 that make up the combined beam 422a may be coherently mixed at detector 340a to produce the photocurrent signal $i_a$. Similarly, the portions of LO light 430 and received pulse of light 410 that make up the combined beam 422b may be coherently mixed at detector 340b to produce the photocurrent signal $i_b$.

In particular embodiments, each of the detectors 340a and 340b may produce a photocurrent signal, and the two detectors 340a and 340b may be configured so that their respective photocurrents $i_a$ and $i_b$ are subtracted. For example, the anode of detector 340a may be electrically connected to the cathode of detector 340b, and the subtracted photocurrent signal $i_a-i_b$ from the anode-cathode connection may be sent to amplifier 350. The subtracted photocurrent signal may be expressed as $i_a(t)-i_b(t)=2E_{Rx}E_{LO} \cos[(\omega_{Rx}-\omega_{LO})t+\phi_{Rx}(t)-\phi_{LO}(t)]$, which corresponds to the coherent-mixing term discussed above. The subtracted photocurrent signal does not include the terms $E_{Rx}^2$ and $E_{LO}^2$. By subtracting the two photocurrents, the common-mode terms $E_{Rx}^2$ and $E_{LO}^2$ (as well as common-mode noise) that appear in each of the photocurrent signals $i_a$ and $i_b$ are removed, leaving the coherent-mixing term, which is the quantity of interest. Since subtracting may remove common-mode noise, the subtracted photocurrent signal may have a reduced noise compared to each of the photocurrent signals $i_a$ and $i_b$ alone. If the frequencies $\omega_{Rx}$ and $\omega_{LO}$ are approximately equal, then the coherent-mixing term may be expressed as $2E_{Rx}E_{LO} \cos[\phi_{Rx}(t)-\phi_{LO}(t)]$.

Figure 19:
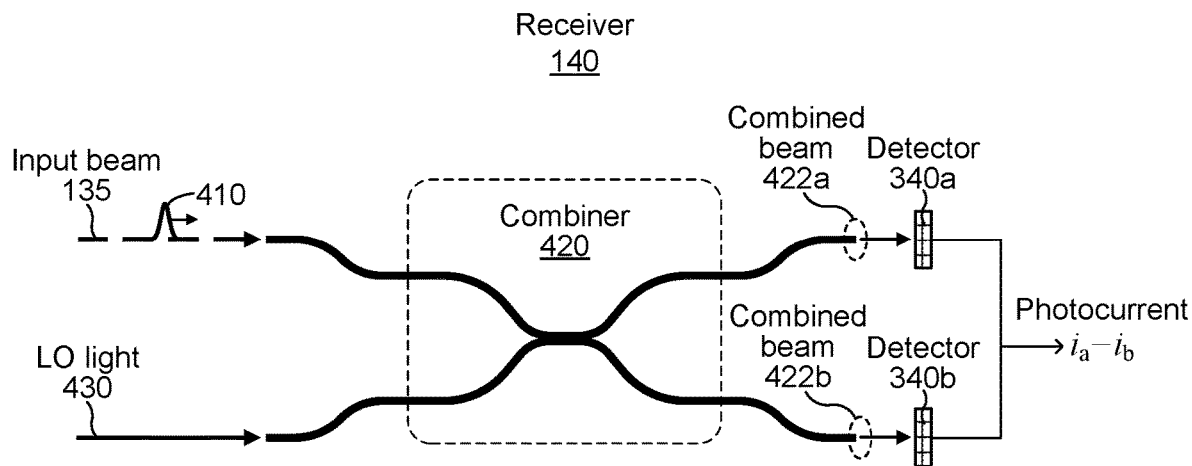
FIG. 19 illustrates an example receiver that includes an integrated-optic combiner and two detectors.

FIG. 19 illustrates an example receiver 140 that includes an integrated-optic combiner 420 and two detectors (340a, 340b). The integrated-optic combiner 420 in FIG. 19 may function similar to the free-space optical combiner 420 in FIG. 18, but the integrated-optic combiner 420 may include optical waveguides that direct, combine, or split light (rather than having the light propagate as free-space beams). The integrated-optic combiner 420 may be part of a PIC that includes two input ports and two output ports. In FIG. 19, one input port receives the input beam 135 (which includes a received pulse of light 410), and the other input port receives the LO light 430. The combiner 420 combines the input beam 135 with the LO light 430 and directs combined beam 422a to one output port and combined beam 422b to the other output port. The combined beam 422a is directed to detector 340a and includes portions of the LO light 430 and the received pulse of light 410 (e.g., approximately 50% of the LO light 430 and approximately 50% of the received pulse of light 410). The combined beam 422b is directed to detector 340b and includes the other portions of the LO light 430 and the received pulse of light 410. In FIG. 19 (as in FIG. 18), the photocurrents from each of the detectors 340a and 340*b* are subtracted to produce a subtracted photocurrent signal $i_a - i_b$ that may be sent to an amplifier. The subtracted photocurrent signal in FIG. 19 (as in FIG. 18) may be expressed as $i_a(t) - i_b(t) = 2E_{Rx}E_{LO} \cos[(\omega_{Rx} - \omega_{LO})t + \phi_{Rx}(t) - \phi_{LO}(t)]$.

In particular embodiments, a receiver 140 may include one or more lenses. For example, the receiver 140 in FIG. 18 may include one or more lenses (not illustrated in FIG. 18) that focus the combined beam 422*a* onto the detector 340*a* or that focus the combined beam 422*b* onto the detector 340*b*. As another example, the receiver 140 in FIG. 19 may include one or more lenses (not illustrated in FIG. 19) that focus the input beam 135 or the LO light 430 into an optical waveguide of the combiner 420. As another example, the receiver 140 in FIG. 19 may include one or more lenses (not illustrated in FIG. 19) that focus the combined beam 422*a* as a free-space optical beam onto the detector 340*a* or that focus the combined beam 422*b* as a free-space optical beam onto the detector 340*b*. Alternatively, each of the detectors 340*a* and 340*b* in FIG. 19 may be butt-coupled or affixed to an output port of the combiner 420 without an intervening lens. For example, detectors 340*a* and 340*b* may each be positioned close to an output port of the combiner 420 to directly receive the respective combined beams 422*a* and 422*b*. In FIG. 19, rather than being free-space optical beams, the combined beams 422*a* and 422*b* may primarily be confined beams that propagate through a waveguide of the combiner 420 and are directly coupled, with a minimum of free-space propagation (e.g., less than 1 mm of free-space propagation), onto the detectors 340*a* and 340*b*.

Figure 20:
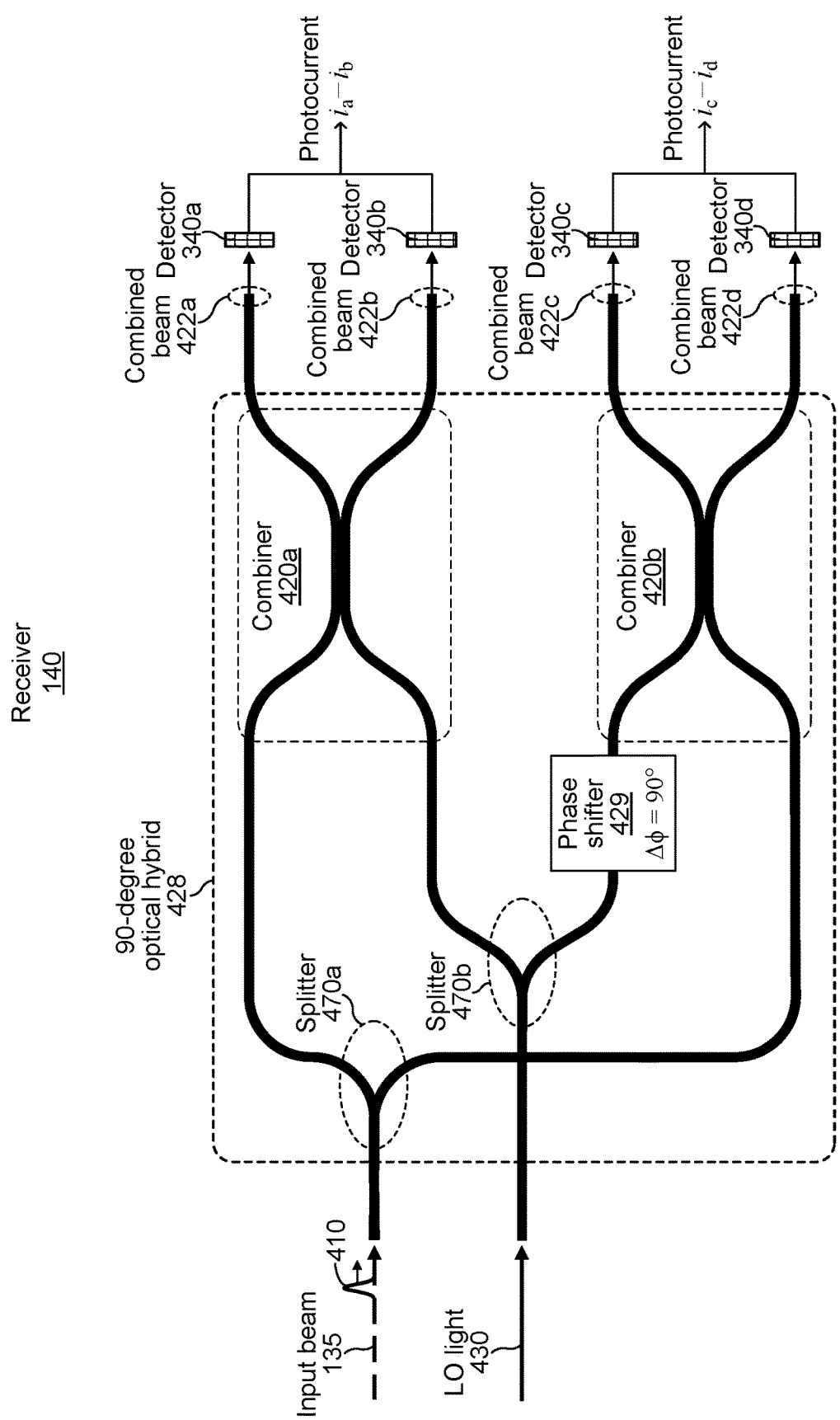
FIG. 20 illustrates an example receiver that includes a 90-degree optical hybrid and four detectors.

FIG. 20 illustrates an example receiver 140 that includes a 90-degree optical hybrid 428 and four detectors (340*a*, 340*b*, 340*c*, 340*d*). A 90-degree optical hybrid 428 is an optical-combiner component that may include two input ports and four output ports. Input light received at each of the two input ports is combined and split between each of the four output ports. In particular embodiments, a receiver 140 may include a 90-degree optical hybrid 428 that combines LO light 430 and an input beam 135 (which includes a received pulse of light 410) and produces four combined beams (422*a*, 422*b*, 422*c*, 422*d*). Each of the combined beams may include a portion of the LO light 430 and a portion of the received pulse of light 410, and each of the combined beams may be directed to one of the four detectors of the receiver 140. In FIG. 20, each of the four detectors may produce a photocurrent signal that corresponds to the coherent mixing of a portion of LO light 430 with a portion of the received pulse of light 410.

In particular embodiments, a 90-degree optical hybrid 428 may be configured so that the combined beams directed to each of the output ports may have approximately the same optical power or energy. For example, the 90-degree optical hybrid 428 in FIG. 20 may split the input beam 135 into four approximately equal portions and direct each of the input-beam portions to one of the detectors. Similarly, the LO light 430 may be split into four approximately equal portions directed to each of the four detectors. In the example of FIG. 20, the combined beam 422*a*, which is directed to detector 340*a*, may include approximately one-quarter of the power of the LO light 430 and approximately one-quarter of the energy of the received pulse of light 410. Similarly, each of the other combined beams (422*b*, 422*c*, 422*d*) in FIG. 20 may also include approximately one-quarter of the LO light 430 and approximately one-quarter of the received pulse of light 410.

In particular embodiments, a 90-degree optical hybrid 428 may be implemented as an integrated-optic device. The 90-degree optical hybrid 428 in FIG. 20 is an integrated-optic device that includes two integrated-optic splitters (470*a*, 470*b*) and two integrated-optic combiners (420*a*, 420*b*). Splitter 470*a* may split the received pulse of light 410 into two parts having substantially equal pulse energy, a first part directed to combiner 420*a* and a second part directed to combiner 420*b*. Similarly, splitter 470*b* may split the LO light 430 into two parts having substantially equal power, a first part directed to combiner 420*a* and a second part directed to combiner 420*b*. Each optical combiner may combine a part of the received pulse of light 410 with a part of the LO light 430, and the combined parts may be split into a first combined beam (e.g., combined beam 422*a*) and a second combined beam (e.g., combined beam 422*b*). The combined beam 422*a* is directed to detector 340*a* and includes portions of the LO light 430 and the received pulse of light 410 (e.g., approximately 25% of the LO light 430 and approximately 25% of the received pulse of light 410). The combined beam 422*b* is directed to detector 340*b* and may include approximately 25% of the LO light 430 and approximately 25% of the received pulse of light 410.

In particular embodiments, a 90-degree optical hybrid 428 may be implemented as a free-space optical device. For example, a free-space 90-degree optical hybrid 428 may include a beam-splitter cube that receives input beam 135 and LO light 430 as free-space beams and produces four free-space combined beams (422*a*, 422*b*, 422*c*, 422*d*). In particular embodiments, a 90-degree optical hybrid 428 may be implemented as a fiber-optic device. For example, a free-space 90-degree optical hybrid 428 may be contained in a package with two input optical fibers that direct the input beam 135 and LO light 430 into the package and four output optical fibers that receive the four respective combined beams and direct them to four respective detectors.

In particular embodiments, a 90-degree optical hybrid 428 may include a phase shifter 429 that imparts a 90-degree phase change ($\Delta\phi$) to a part of a received pulse of light 410 or to a part of the LO light 430. For example, a splitter 470*a* may split the received pulse of light 410 into two parts, and a phase shifter 429 may impart a 90-degree phase change to one part of the pulse of light 410 with respect to the other part. As another example, a splitter 470*b* may split the LO light 430 into two parts, and a phase shifter 429 may impart a 90-degree phase change to one part of the LO light 430 with respect to the other part. In FIG. 20, splitter 470*b* splits the LO light 430 into two parts, and the phase shifter 429 imparts a 90-degree phase change to the part of LO light 430 directed to combiner 420*b*. The other part of LO light 430 directed to combiner 420*a* does not pass through the phase shifter 429 and does not receive a phase shift from the phase shifter 429. A 90-degree phase change may also be expressed in radians as a $\pi/2$ phase change. A phase change may be referred to as a phase shift.

In particular embodiments, a phase shifter 429 may be implemented as a part of an integrated-optic 90-degree optical hybrid 428. For example a phase shifter 429 may be implemented as a portion of optical waveguide that only one part of the LO light 430 propagates through. The portion of optical waveguide may be temperature controlled to adjust the refractive index of the waveguide portion and produce a relative phase delay of approximately 90 degrees between the two parts of LO light 430. Additionally or alternatively, the 90-degree optical hybrid 428 as a whole may be temperature controlled to set and maintain a 90-degree phase delay. As another example, a phase shifter 429 may be implemented by applying an external electric field to a portion of optical waveguide to change the refractive index of the waveguide portion and produce a 90-degree phase delay. In particular embodiments, a phase shifter 429 may be implemented as a part of a free-space or fiber-coupled 90-degree optical hybrid 428. For example the input and output beams in a free-space 90-degree optical hybrid 428 may be reflected by or transmitted through the optical surfaces of the optical hybrid 428 so that a relative phase shift of 90 degrees is imparted to one part of LO light 430 with respect to the other part of LO light 430.

In FIG. 20, the photocurrents from detectors 340*a* and 340*b* are subtracted to produce the subtracted photocurrent signal $i_a(t)-i_b(t)=E_{Rx}E_{LO} \cos([\omega_{Rx}-\omega_{LO}]t+\phi_{Rx}(t)-\phi_{LO}(t))$. If $\omega_{Rx}$ and $\omega_{LO}$ are approximately equal, then the subtracted photocurrent signal $i_a-i_b$ may be expressed as $E_{Rx}E_{LO} \cos[\phi_{Rx}(t)-\phi_{LO}(t)]$. Similarly, the photocurrents from detectors 340*c* and 340*d* are subtracted to produce the photocurrent signal $i_c(t)-i_d(t)=E_{Rx}E_{LO} \sin[(\omega_{Rx}-\omega_{LO})t+\phi_{Rx}(t)-\phi_{LO}(t)]$, which may be expressed as $E_{Rx}E_{LO} \sin[\phi_{Rx}(t)-\phi_{LO}(t)]$ if the two frequencies are approximately equal. Each of the subtracted photocurrent signals represents a coherent-mixing term corresponding to the coherent mixing of a portion of the received pulse of light 410 and a portion of the LO light 430. The two subtracted photocurrent signals are similar, except $i_a-i_b$ includes a cosine function, while $i_c-i_d$ includes a sine function. This difference between the two subtracted photocurrent signals arises from the 90-degree phase shift provided by the phase shifter 429. Because a 90-degree phase shift is imparted to the LO light 430 directed to the combiner 420*b*, the subtracted photocurrent signal $i_c-i_d$ includes a sine function (which has a 90-degree phase offset with respect to a cosine function).

The phase term $\phi_{Rx}-\phi_{LO}$ in the above subtracted photocurrent expressions represents the relative phase offset between the received pulse of light 410 and the LO light 430. If the phase term $\phi_{Rx}-\phi_{LO}$ is approximately equal to 90° (modulo $2\pi$), then the subtracted photocurrent signal $i_a-i_b$ may be approximately zero, and the subtracted photocurrent signal $i_c-i_d$ may be approximately $E_{Rx}E_{LO}$. Conversely, if the phase term $\phi_{Rx}-\phi_{LO}$ is approximately equal to 0° (modulo $2\pi$), then the subtracted photocurrent signal $i_a-i_b$ may be approximately $E_{Rx}E_{LO}$, and the subtracted photocurrent signal $i_c-i_d$ may be approximately zero. Thus, both subtracted photocurrent signals vary based on the relative phase $\phi_{Rx}-\phi_{LO}$ between the received pulse of light 410 and the LO light 430. The relative phase $\phi_{Rx}-\phi_{LO}$, which corresponds to the difference in optical path length between the input beam 135 and the LO light 430, may vary by greater than or equal to $\pi/8$, $\pi/4$, $\pi/2$, $\pi$, or $2\pi$ over a particular time interval (e.g., due at least in part to relatively small changes in the optical path length caused by temperature change or small path-length changes). This variation in the relative phase may result in a significant time-dependent variation in each of the subtracted photocurrent signals.

The variation in the subtracted photocurrent signals may be addressed by processing or combining signals associated with the two subtracted photocurrent signals to produce an output electrical signal that is independent of the relative phase difference. For example, electrical signals associated with the two subtracted signals may be squared and then added together (e.g., a receiver 140 or controller 150 may produce an output electrical signal corresponding to $(i_a-i_b)^2+(i_c-i_d)^2$. This squaring-and-summing operation results in an output electrical signal that is proportional to $E_{Rx}^2 E_{LO}^2$ (or, equivalently, $P_{Rx}P_{LO}$, which is the product of the power of the received pulse of light 410 and the power of the LO light 430) but does not depend on the relative phase difference $\phi_{Rx}-\phi_{LO}$. In this way, an output electrical signal may be obtained that is proportional to the power of the received pulse of light 410 and the power of the LO light 430 but is not sensitive to the relative phase difference $\phi_{Rx}-\phi_{LO}$. In a conventional non-coherent pulsed lidar system, the output signal may depend primarily on the power of a received pulse of light. Since the output electrical signal in a coherent pulsed lidar system 100 may depend on both $P_{Rx}$ and $P_{LO}$, the sensitivity of the lidar system 100 may be improved (with respect to a conventional non-coherent pulsed lidar system) by selecting a suitable power for the LO light 430.

Figure 21:
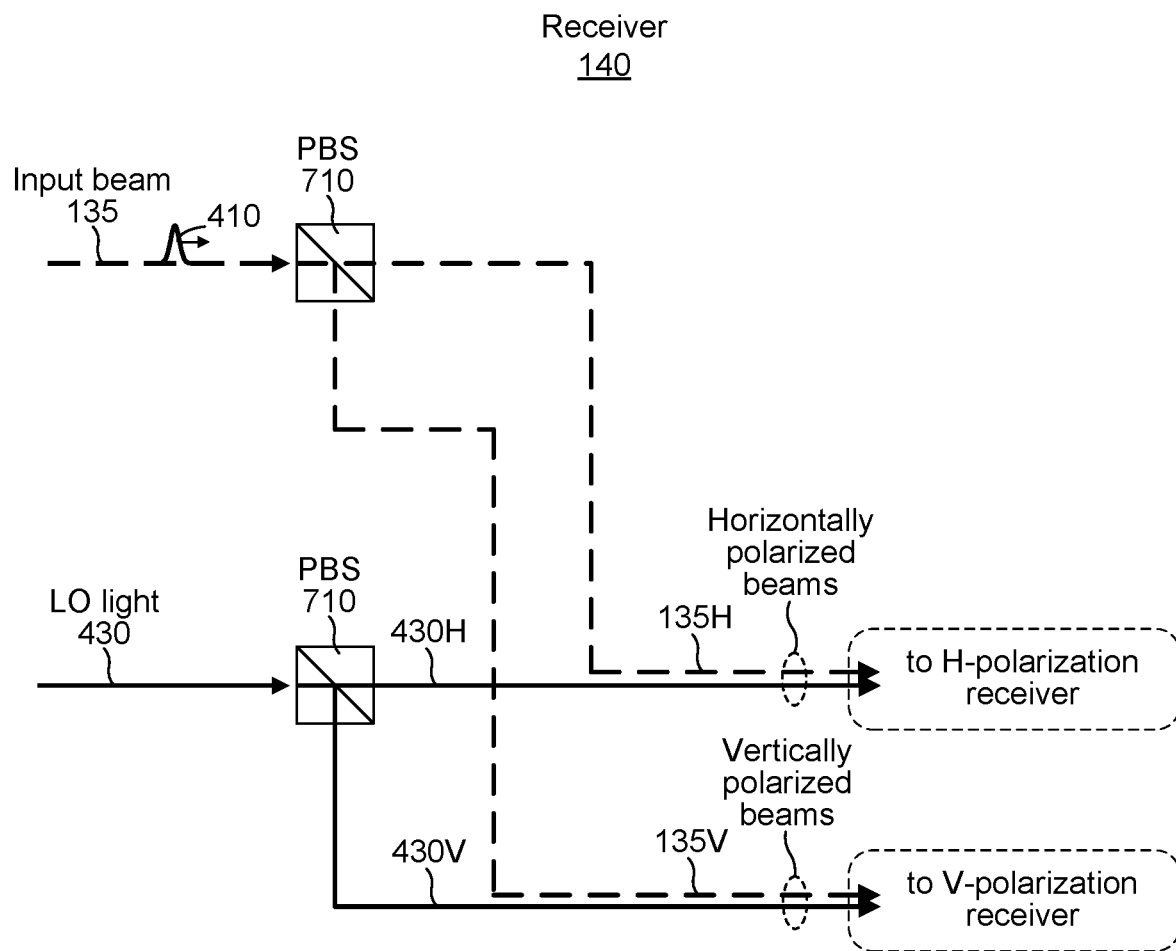
FIG. 21 illustrates an example receiver that includes two polarization beam-splitters.

FIG. 21 illustrates an example receiver 140 that includes two polarization beam-splitters 710. In particular embodiments, a receiver 140 may include a LO-light polarization splitter 710 that splits LO light 430 into two orthogonal polarization components (e.g., horizontal and vertical). Additionally, the receiver 140 may include an input-beam polarization splitter 710 that splits an input beam 135 (which includes a received pulse of light 410) into the same two orthogonal polarization components. In FIG. 21, the LO-light polarization beam-splitter (PBS) 710 splits the LO light 430 into a horizontally polarized LO-light beam 430H and a vertically polarized LO-light beam 430V. Similarly, the input-beam PBS 710 splits the input beam 135 into a horizontally polarized input beam 135H and a vertically polarized input beam 135V. The horizontally polarized beams are directed to a horizontal-polarization receiver, and the vertically polarized beams are directed to a vertical-polarization receiver. The receiver 140 illustrated in FIG. 21 may be referred to as a polarization-insensitive receiver since the receiver 140 may be configured to detect received pulses of light 410 regardless of the polarization of the received pulses of light 410.

In particular embodiments, a polarization-insensitive receiver 140 as illustrated in FIG. 21 may be implemented with free-space components, fiber-optic components, integrated-optic components, or any suitable combination thereof. For example, the two PBSs 710 may be free-space polarization beam-splitting cubes, and the input beam 135 and the LO light 430 may be free-space optical beams. As another example, the two PBSs 710 may be fiber-optic components, and the input beam 135 and the LO light 430 may be conveyed to the PBSs 710 via optical fiber (e.g., single-mode optical fiber or polarization-maintaining optical fiber). Additionally, the horizontally and vertically polarized beams may be conveyed to the respective H-polarization and V-polarization receivers via polarization-maintaining optical fiber.

In particular embodiments, a receiver 140 may include a horizontal-polarization receiver and a vertical-polarization receiver. The H-polarization receiver may combine a horizontally polarized LO-light beam 430H and a horizontally polarized input beam 135H and produce one or more photocurrent signals corresponding to coherent mixing of the two horizontally polarized beams. Similarly, the V-polarization receiver may combine the vertically polarized LO-light beam 430V and the vertically polarized input beam 135V and produce one or more photocurrent signals corresponding to coherent mixing of the two vertically polarized beams. Each of the H-polarization and V-polarization receivers may include (i) an optical combiner 420 and two detectors 340 (e.g., as illustrated in FIG. 18 or 19) or (ii) a 90-degree optical hybrid 428 and four detectors 340 (e.g., as illustrated in FIG. 20). The H-polarization and V-polarization receivers may each preserve the polarization of the respective horizontally and vertically polarized beams. For example, the H-polarization and V-polarization receivers may each include polarization-maintaining optical fiber that maintains the polarization of the beams. Additionally or alternatively, the H-polarization and V-polarization receivers may each include a PIC with optical waveguides configured to maintain the polarization of the beams.

The polarization of an input beam 135 may vary with time or may not be controllable by a lidar system 100. For example, the polarization of received pulses of light 410 may vary depending at least in part on (i) the optical properties of a target 130 from which pulses of light 400 are scattered or (ii) atmospheric conditions encountered by pulses of light 400 while propagating to the target 130 and back to the lidar system 100. However, since the LO light 430 is produced and contained within the lidar system 100, the polarization of the LO light 430 may be set to a particular polarization state. For example, the polarization of the LO light 430 sent to the LO-light PBS 710 may be configured so that the LO-light beam 430H and 430V produced by the PBS 710 have approximately the same power. The LO light 430 produced by a seed laser 450 may be linearly polarized, and a half-wave plate may be used to rotate the polarization of the LO light 430 so that it is oriented at approximately 45 degrees with respect to the LO-light PBS 710. The LO-light PBS 710 may split the 45-degree polarized LO light 430 into horizontal and vertical components having approximately the same power. By providing a portion of the LO light 430 to both the H-polarization receiver and the V-polarization receiver, the receiver 140 in FIG. 21 may produce a valid, non-zero output electrical signal regardless of the polarization of the received pulse of light 410.

Coherent mixing of LO light 430 and a received pulse of light 410 may require that the electric fields of the LO light 430 and the received pulse of light 410 are oriented in approximately the same direction. For example, if LO light 430 and input beam 135 are both vertically polarized, then the two beams may be optically combined together and coherently mixed at a detector 340. However, if the two beams are orthogonally polarized (e.g., LO light 430 is vertically polarized and input beam 135 is horizontally polarized), then the two beams may not be coherently mixed, since their electric fields are not oriented in the same direction. Orthogonally polarized beams that are incident on a detector 340 may not be coherently mixed, resulting in little to no output signal from a receiver 140. To mitigate problems with polarization-related signal variation, a lidar system 100 may include (i) a polarization-insensitive receiver 140 (e.g., as illustrated in FIG. 21) or (ii) an optical polarization element to ensure that at least a portion of the LO light 430 and input beam 135 have the same polarization.

A polarization-insensitive receiver 140 as illustrated in FIG. 21 may ensure that the receiver 140 produces a valid, non-zero output electrical signal in response to a received pulse of light 410, regardless of the polarization of the received pulse of light 410. For example, the output electrical signals from the H-polarization and V-polarization receivers may be added together, resulting in a combined output signal that is insensitive to the polarization of the received pulse of light 410. If a received pulse of light 410 is horizontally polarized, then the H-polarization receiver may generate a non-zero output signal and the V-polarization receiver may generate little to no output signal. Similarly, if a received pulse of light 410 is vertically polarized, then the H-polarization receiver may generate little to no output signal and the V-polarization receiver may generate a non-zero output signal. If a received pulse of light 410 has a polarization that includes a vertical component and a horizontal component, then each of the H-polarization and V-polarization receivers may generate a non-zero output signal corresponding to the respective polarization component. By adding together the signals from the H-polarization and V-polarization receivers, a valid, non-zero output electrical signal may be produced by the receiver 140 regardless of the polarization of the received pulse of light 410.

In particular embodiments, a lidar system 100 may include an optical polarization element that alters the polarization of an emitted pulse of light 400, LO light 430, or a received pulse of light 410. The optical polarization element may allow the LO light 430 and the received pulse of light 410 to be coherently mixed. For example, an optical polarization element may alter the polarization of the LO light 430 so that, regardless of the polarization of a received pulse of light 410, the LO light 430 and the received pulse of light 410 may be coherently mixed together. The optical polarization element may ensure that at least a portion of the received pulse of light 410 and the LO light 430 have polarizations that are oriented in the same direction. An optical polarization element may include one or more quarter-wave plates, one or more half-wave plates, one or more optical polarizers, one or more optical depolarizers, or any suitable combination thereof. For example, an optical polarization element may include a quarter-wave plate that converts the polarization of an emitted pulse of light 400 or a received pulse of light 410 to a substantially circular or elliptical polarization. An optical polarization element may include a free-space optical component, a fiber-optic component, an integrated-optic component, or any suitable combination thereof.

In particular embodiments, an optical polarization element may be included in a receiver 140 as an alternative to configuring a receiver to be a polarization-insensitive receiver. For example, rather than producing horizontally polarized beams and vertically polarized beams and having two receiver channels (e.g., H-polarization receiver and V-polarization receiver), a receiver 140 may include an optical polarization element that ensures that at least a portion of the LO light 430 and the received pulse of light 410 may be coherently mixed together. An optical polarization element may be included in each of the receivers 140 illustrated in FIG. 18, 19, or 20 to allow the receiver to coherently mix the LO light 430 and a received pulse of light 410 regardless of the polarization of the received pulse of light 410.

In particular embodiments, an optical polarization element (e.g., a quarter-wave plate) may convert the polarization of the LO light 430 into circularly polarized light. For example, the LO light 430 produced by a seed laser 450 may be linearly polarized, and a quarter-wave plate may convert the linearly polarized LO light 430 into circularly polarized light. The circularly polarized LO light 430 may include both vertical and horizontal polarization components. So, regardless of the polarization of a received pulse of light 410, at least a portion of the circularly polarized LO light 430 may be coherently mixed with the received pulse of light 410. In the receiver 140 illustrated in FIG. 18 or 19, the LO light 430 may be sent through a quarter-wave plate prior to passing through the combiner 420.

In particular embodiments, an optical polarization element may depolarize a polarization of the LO light 430. For example, the LO light 430 produced by a seed laser 450 may be linearly polarized, and an optical depolarizer may convert the linearly polarized LO light 430 into depolarized light having a polarization that is substantially random or scrambled. The depolarized LO light 430 may include two or more different polarizations so that, regardless of the polarization of a received pulse of light 410, at least a portion of the depolarized LO light 430 may be coherently mixed with the received pulse of light 410. An optical depolarizer may include a Cornu depolarizer, a Lyot depolarizer, a wedge depolarizer, or any other suitable depolarizer element. In the receiver 140 illustrated in FIG. 20, the LO light 430 may be sent through a quarter-wave plate or a depolarizer prior to passing through the splitter 470b of the 90-degree optical hybrid 428.

FIGS. 22-25 each illustrate an example light source 110 that includes a seed laser 450, a semiconductor optical amplifier (SOA) 460, and one or more optical modulators 495. In particular embodiments, a light source 110 may include a phase or amplitude modulator 495 configured to change a frequency, phase, or amplitude of seed light 440, LO light 430, or emitted pulse of light 400. An optical phase or amplitude modulator 495 may include an electro-optic modulator (EOM), an acousto-optic modulator (AOM), an electro-absorption modulator, a liquid-crystal modulator, or any other suitable type of optical phase or amplitude modulator. For example, an optical modulator 495 may include an electro-optic phase modulator or an AOM that changes the frequency or phase of seed light 440 or LO light 430. As another example, an optical modulator 495 may include an electro-optic amplitude modulator, an electro-absorption modulator, or a liquid-crystal modulator that changes the amplitude of the seed light 440 or LO light 430. An optical modulator 495 may be a free-space modulator, a fiber-optic modulator (e.g., with fiber-optic input or output ports), or an integrated-optic modulator (e.g., a waveguide-based modulator integrated into a PIC).

In particular embodiments, an optical modulator 495 may be included in a seed laser diode 450 or a SOA 460. For example, a seed laser diode 450 may include a waveguide section to which an external electrical current or electric field may be applied to change the carrier density or refractive index of the waveguide section, resulting in a change in the frequency or phase of seed light 440 or LO light 430. As another example, the frequency, phase, or amplitude of seed light 440 or LO light 430 may be changed by changing or modulating the seed current $I_1$ or the SOA current $I_2$. In this case, the seed laser diode 450 or SOA 460 may not include a separate or discrete modulator, but rather, a modulation function may be distributed within the seed laser diode 450 or SOA 460. For example, the optical frequency of the seed light 440 or LO light 430 may be changed by changing the seed current $I_1$. Changing the seed current $I_1$ may cause a refractive-index change in the seed laser diode 450, which may result in a change in the optical frequency of light produced by the seed laser diode 450.

Figure 22:
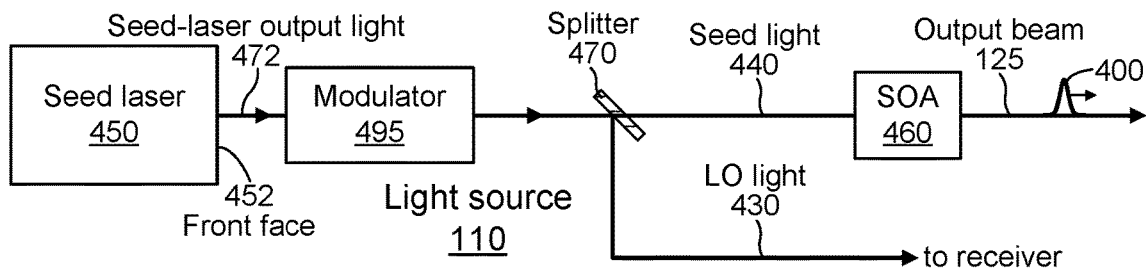
FIGS. 22-25 each illustrate an example light source that includes a seed laser, a semiconductor optical amplifier (SOA), and one or more optical modulators.

In FIG. 22, the light source 110 includes a modulator 495 located between the seed laser 450 and the optical splitter 470. The seed-laser output light 472 passes through the modulator 495 and is then split by the splitter 470 to produce the seed light 440 and LO light 430. The modulator 495 in FIG. 22 may be configured to change a frequency, phase, or amplitude of the seed-laser output light 472. For example, the modulator 495 may be a phase modulator that applies a time-varying phase shift to the seed-laser output light 472, which may result in a frequency change of the seed-laser output light 472. The modulator 495 may be driven in synch with the emitted pulses of light 400 so that the emitted pulses of light 400 and the LO light 430 each have a different frequency change imparted by the modulator 495.

Figure 23:
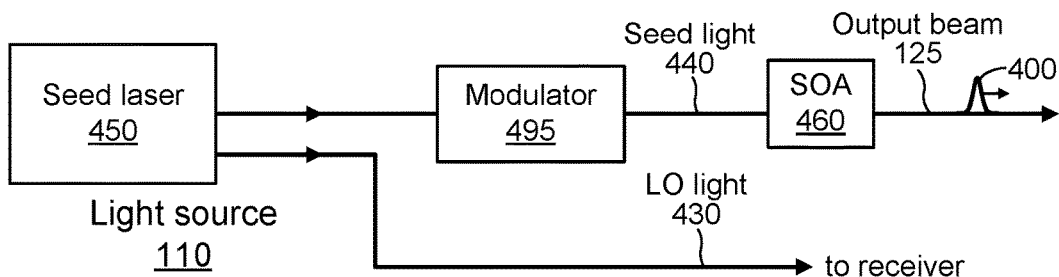
Figure 24:
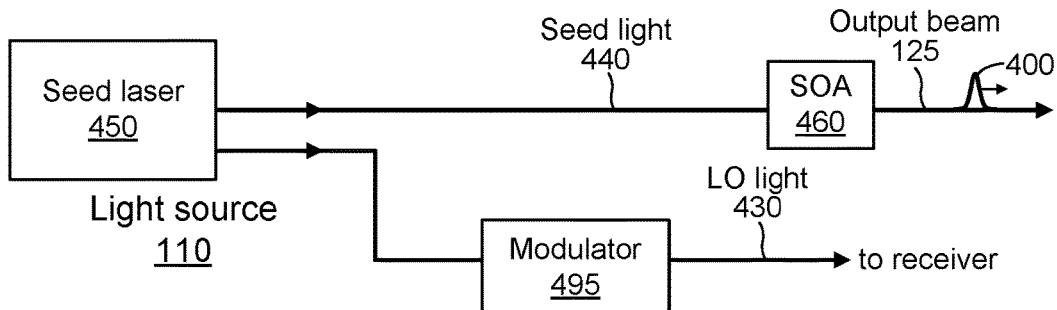

In FIG. 23, the light source 110 includes a modulator 495 located between the seed laser 450 and the SOA 460. The modulator 495 in FIG. 23 may be configured to change a frequency, phase, or amplitude of the seed light 440. For example, since the LO light 430 does not pass through the modulator 495, the modulator 495 may change the optical frequency of the seed light 440 so that it is different from the optical frequency of the LO light 430. In FIG. 24, the light source 110 includes a modulator 495 located in the path of the LO light 430. The modulator 495 in FIG. 23 may be configured to change a frequency, phase, or amplitude of the LO light 430. For example, since the seed light 440 does not pass through the modulator 495, the modulator 495 may change the optical frequency of the LO light 430 so that it is different from the optical frequency of the seed light 440. In FIG. 23 or 24, the seed light 440 and LO light 430 may be produced by an optical splitter 470 that splits seed-laser output light 472 to produce the seed light 440 and the LO light 430. Alternatively, in FIG. 23 or 24, the seed light 440 may be emitted from a front face 452 of a seed laser diode, and the LO light 430 may be emitted from the back face 451 of the seed laser diode.

Figure 25:
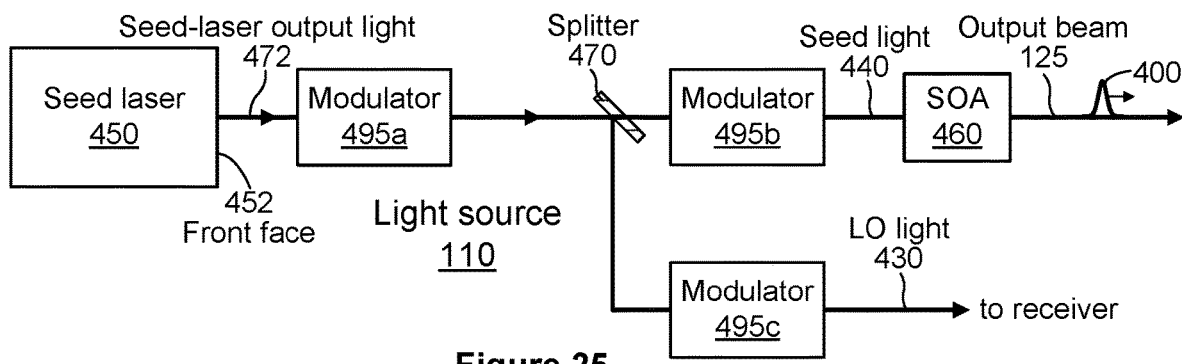

In FIG. 25, the light source 110 includes three optical modulators 495a, 495b, and 495c. In particular embodiments, a light source 110 may include one, two, three, or any other suitable number of modulators 495. Each of the modulators 495a, 495b, and 495c may be configured to change a frequency, phase, or amplitude of the seed-laser output light 472, seed light 440, or LO light 430. For example, modulator 495b may be an amplitude modulator that modulates the amplitude of the seed light 440 before passing through the SOA 460. As another example, modulator 495b may be a phase modulator that changes the frequency of the seed light 440. As another example, modulator 495c may be a phase modulator that changes the frequency of the LO light 430.

Figure 26:
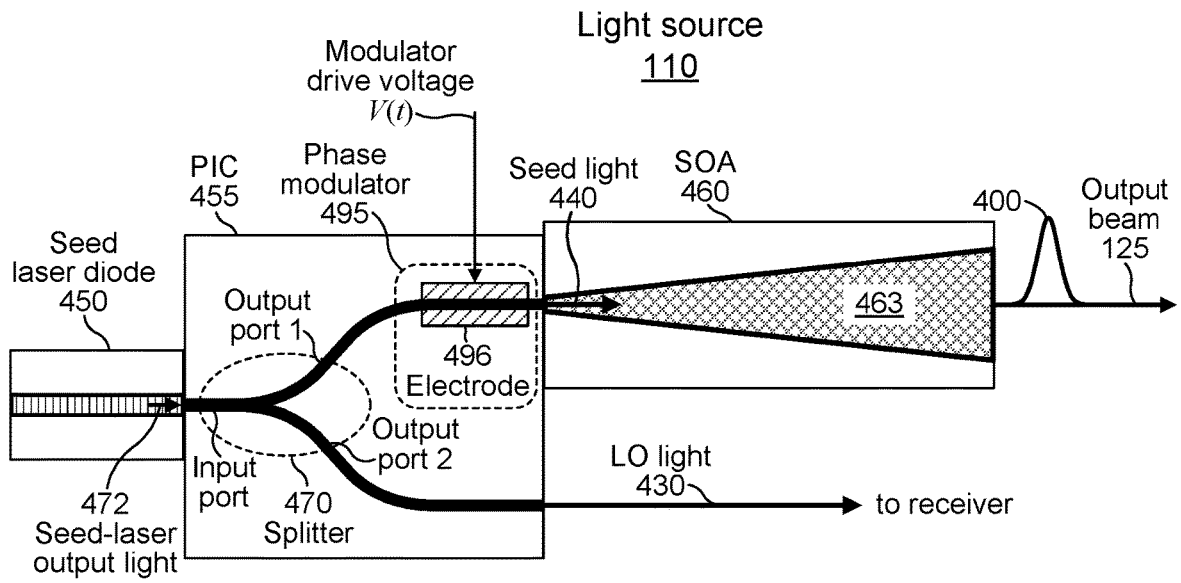
FIG. 26 illustrates an example light source with a photonic integrated circuit (PIC) that includes a phase modulator.

FIG. 26 illustrates an example light source 110 with a photonic integrated circuit (PIC) 455 that includes a phase modulator 495. The arrangement in FIG. 26 corresponds to that in FIG. 23 where a modulator 495 located between seed laser 450 and SOA 460 applies a modulation to the seed light 440. A phase modulator 495 may be used to change the optical frequency of light that travels through the modulator. For example, a light source 110 may include a phase modulator 495 that changes the optical frequency of seed-laser output light 472, seed light 440, LO light 430, or emitted pulses of light 400. A phase modulator 495 may include an electrode 496 to which a modulator drive voltage V(t) may be applied. The section of PIC waveguide located near the electrode 496 may include an electro-optic material (e.g., lithium niobate) or a semiconductor material (e.g., silicon or InP) that exhibits a change in refractive index when an electric field is applied to the material. The electric field from an applied voltage signal may cause a refractive-index change in the waveguide section near the electrode 496, and the refractive-index change may impart a corresponding phase shift to light propagating through the phase modulator 495. If a time-varying modulator drive-voltage signal V(t) is applied, the corresponding time-varying phase shift imparted to the light propagating through the phase modulator 495 may result in a frequency change of the light.

The phase modulator 495 illustrated in FIG. 26 is configured to change the optical frequency of the seed light 440 that travels through the modulator. In FIG. 26, the optical frequency $f_0$ of the seed light 440 that propagates through the phase modulator 495 may be changed by applying one or more particular time-varying voltage signals to the electrode 496. For example, applying a sinusoidal voltage signal V(t) with frequency $\Delta f$ (e.g., $V(t)=V_0 \sin(2\pi \cdot \Delta f \cdot t)$) to the electrode 496 may cause a corresponding sinusoidal refractive-index variation that results in the generation of frequency sidebands of the seed light 440 at frequencies $f_0 \pm n\Delta f$, where n is a positive integer. Other voltage signals (e.g., linear voltage ramp, square wave, sawtooth wave, or triangle wave) applied to the electrode 496 may result in other frequency changes, such as for example, a shift of $\Delta f$ in the frequency $f_0$ of the seed light 440 to an optical frequency $f_0 + \Delta f$ or $f_0 - \Delta f$.

In particular embodiments, a light source 110 may include an optical phase modulator 495 that changes an optical frequency of seed light 440 or LO light 430 by $\Delta f$ so that the seed light 440 and the LO light 430 have a frequency offset of $\Delta f$. The frequency offset $\Delta f$ may be any suitable frequency offset between approximately 10 MHz and approximately 50 GHz, such as for example, a frequency offset of 100 MHz, 500 MHz, 1 GHz, 2 GHz, or 5 GHz. A light source 110 may include a phase modulator 495 that shifts the frequency of seed light 440 or a phase modulator 495 that shifts the frequency of LO light 430. For example, a light source 110 may include a phase modulator 495 that shifts the frequency of LO light 430 by 1 GHz so that the seed light 440 and the LO light 430 have a 1-GHz frequency offset. In FIG. 26, the seed-laser output light 472 is split by the splitter 470 to produce the seed light 440 (which is sent to output port 1) and the LO light 430 (which is sent to output port 2). The seed-laser output light 472 and the LO light 430 may have an optical frequency $f_0$. The seed light 440 passes through the phase modulator 495, and the phase modulator 495 may shift the optical frequency of the seed light 440 by $\Delta f$ to a frequency $f_1$, where $f_1 = f_0 + \Delta f$. In FIG. 26, the phase modulator 495 may be driven in synch with current pulses that are supplied to the SOA 460 so that a particular frequency change is applied to each of the emitted pulses of light 400. During time periods between successive emitted pulses of light 400 when the seed light 440 may be substantially absorbed by the SOA 460, the phase modulator 495 may be inactive or may not be driven with a particular voltage signal, and a frequency change may not be applied to the seed light 440.

Figure 27:
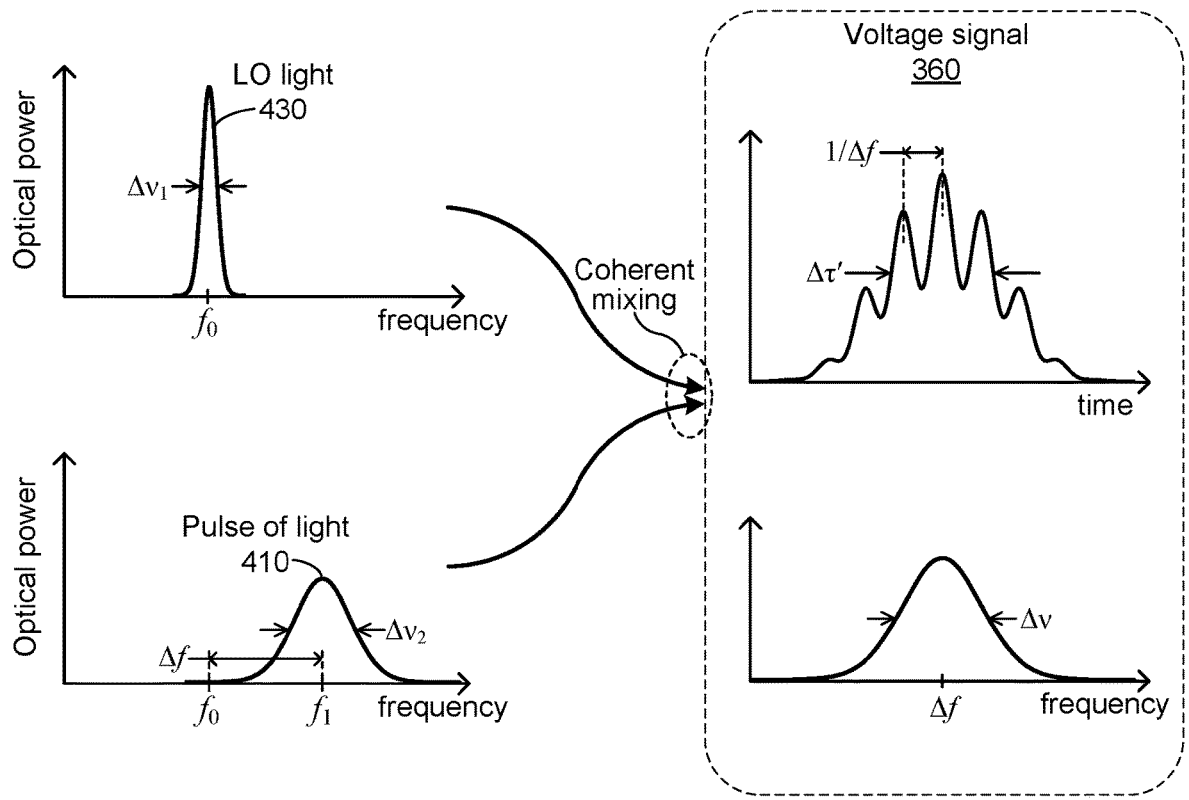
FIG. 27 illustrates an example voltage signal that results from the coherent mixing of LO light and a received pulse of light, where the LO light and the received pulse of light have a frequency difference of $\Delta f$.

FIG. 27 illustrates an example voltage signal 360 that results from the coherent mixing of LO light 430 and a received pulse of light 410, where the LO light 430 and the received pulse of light 410 have a frequency difference of $\Delta f$. The LO light 430 has a center optical frequency of $f_0$ and a relatively narrow spectral linewidth of $\Delta v_1$. The received pulse of light 410 has a center frequency $f_1$ and a broader spectral linewidth of $\Delta v_2$, and the frequency of the pulse of light 410 is shifted by $\Delta f$ with respect to the frequency of the LO light 430 so that $f_1 = f_0 + \Delta f$. For example, the seed light 440 may be sent through a phase modulator 495 that shifts the optical frequency of the seed light by $\Delta f$. The SOA 460, which amplifies a temporal portion 441 of the seed light 440, may substantially maintain the optical frequency of the seed light 440. As a result, the emitted pulse of light 400 or the corresponding received pulse of light 410 may also have approximately the same optical frequency offset of $\Delta f$ with respect to the LO light 430.

The coherent mixing of the LO light 430 and the pulse of light 410 at a detector 340 may result in a pulse of photocurrent i which is amplified by an amplifier 350 that produces the voltage signal 360 illustrated in FIG. 27. The upper voltage-signal graph illustrates the voltage signal 360 in the time domain and includes a pulse of voltage with a duration of $\Delta \tau'$. The voltage pulse (which corresponds to the pulse of photocurrent i) exhibits periodic pulsations, each pulsation separated by a time interval $1/\Delta f$. The lower voltage-signal graph is a frequency-domain graph of the voltage signal 360 that indicates that the voltage signal 360 is centered at a frequency of $\Delta f$ and has an electrical bandwidth of $\Delta v$. The voltage signal 360 being centered at the frequency $\Delta f$ indicates that the voltage signal 360 has a frequency component at approximately $\Delta f$, which corresponds to the periodic time-domain pulsations with time interval $1/\Delta f$. The frequency component $\Delta f$ in the voltage signal 360 arises from the frequency offset of $\Delta f$ between the received pulse of light 410 and the LO light 430. The coherent mixing of LO light 430 and a received pulse of light 410 may result in a photocurrent signal i with a coherent mixing term that may be expressed as $E_{Rx}E_{LO} \cos[2\pi \cdot \Delta f \cdot t + \phi_{Rx} - \phi_{LO}]$. Here, since the optical frequencies of the LO light 430 and the received pulse of light 410 are different, the coherent mixing term varies periodically with a frequency of $\Delta f$. This variation in the coherent mixing term corresponds to the periodic pulsations and the frequency component of $\Delta f$ in the voltage signal 360 in FIG. 27. The graphs in FIG. 27 are similar to those in FIG. 17, with the difference being that in FIG. 27, the LO light 430 and the received pulse of light 410 have a frequency difference of $\Delta f$ (which gives rise to the periodic pulsations in the voltage signal 360), while in FIG. 17, there is no frequency difference (e.g., $\Delta f$ is approximately zero, and there are no periodic pulsations in the voltage signal 360).

In particular embodiments, an optical frequency change of $\Delta f$ applied to seed light 440 may correspond to a spectral signature imparted to an emitted pulse of light 400. For example, a receiver 140 may include a frequency-detection circuit 600 (e.g., as illustrated in FIG. 7) that determines the amplitude of the frequency component $\Delta f$ in the voltage signal 360. The frequency-detection circuit 600 may include a band-pass filter 610 with a center frequency of $\Delta f$, and a corresponding amplitude detector 620 may determine an amplitude of the $\Delta f$ frequency component. The frequency-detection circuit 600 may be used to determine (i) whether a received pulse of light 410 is valid and is associated with a pulse of light 400 emitted by the light source 110 or (ii) whether a received pulse of light is not valid and is associated with an interfering optical signal.

In particular embodiments, an optical frequency change applied to seed light 440 or LO light 430 may be selected so that the frequency change $\Delta f$ is greater than $1/\Delta t$ (where $\Delta t$ is the duration of emitted pulse of light 400) or greater than $1/\Delta T'$ (where $\Delta T'$ is the duration of a voltage pulse corresponding to a received pulse of light 410). For example, the frequency change $\Delta f$ may be approximately equal to $2/\Delta \tau$, $4/\Delta \tau$, $10/\Delta \tau$, $20/\Delta \tau$, or any other suitable factor of $1/\Delta \tau$. As another example, an emitted pulse of light 400 with a duration $\Delta \tau$ of 5 ns may have a frequency change $\Delta f$ of greater than 200 MHz. As another example, a light source 110 that emits 5-ns pulses of light 400 may be configured so that the emitted pulses of light have a 1-GHz frequency offset with respect to the LO light 430. Having $\Delta f$ greater than $1/\Delta \tau$ may ensure that voltage signal 360 includes a sufficient number of pulsations that are distinct from the overall pulse envelope of the voltage signal 360. In the example of FIG. 27, $\Delta f$ is approximately equal to $3/\Delta T'$, and the voltage signal 360 includes approximately seven pulsations superimposed on the pulse envelope. This difference between $\Delta f$ and $1/\Delta \tau$ may allow the frequency component $\Delta f$ in the voltage signal 360 to be determined (e.g., by a frequency-detection circuit 600) distinctly from a frequency component associated with the overall pulse envelope of the voltage signal 360.

Figure 28:
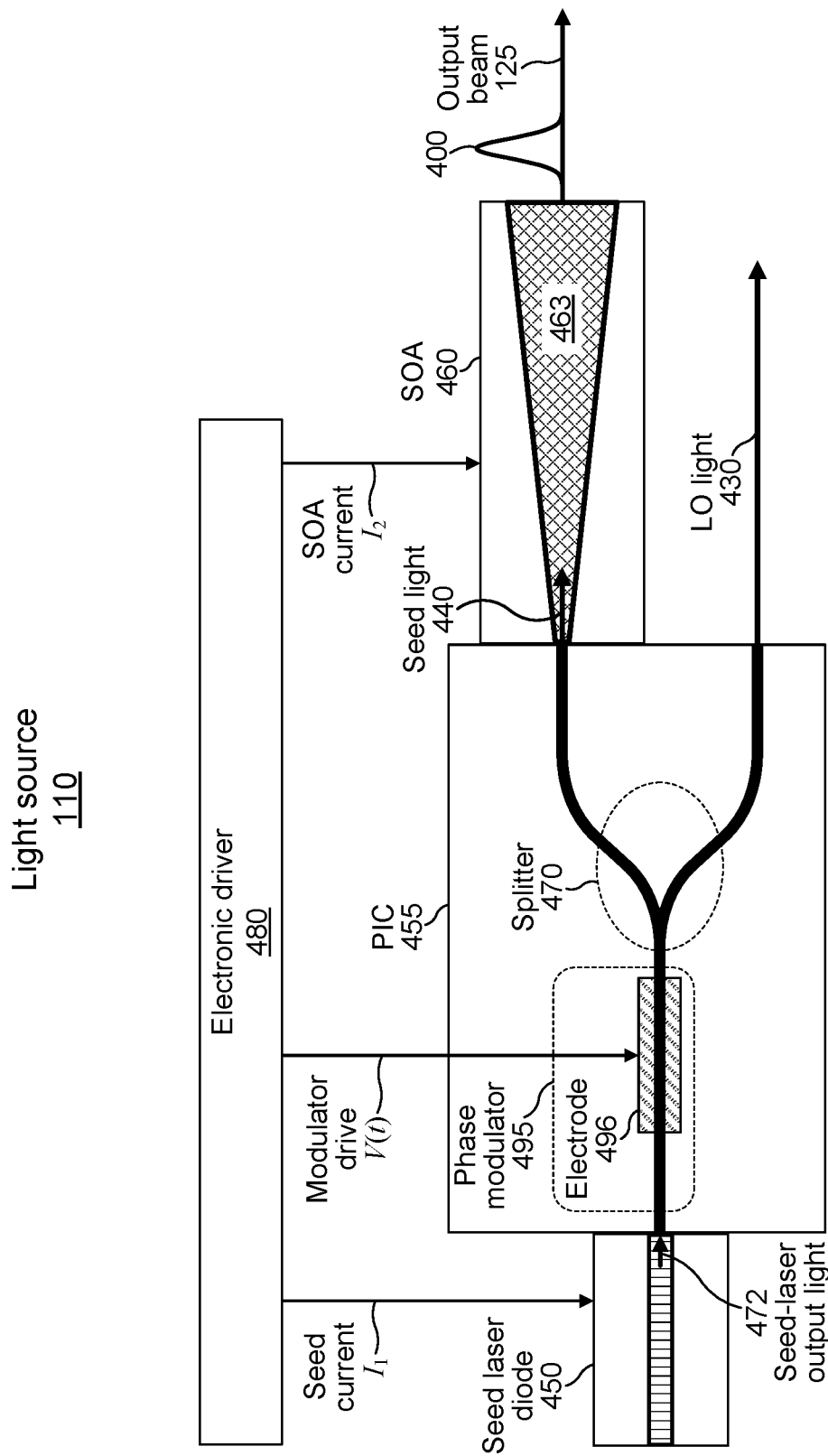
FIG. 28 illustrates an example light source with a photonic integrated circuit (PIC) that includes a phase modulator located before an optical splitter.

FIG. 28 illustrates an example light source 110 with a photonic integrated circuit (PIC) 455 that includes a phase modulator 495 located before an optical splitter 470. In particular embodiments, a light source 110 may include a modulator 495 that modulates seed-laser output light 472 prior to the output light 472 being split to produce seed light 440 and LO light 430. The arrangement in FIG. 28 corresponds to that in FIG. 22 where a modulator 495 is located between the seed laser 450 and the optical splitter 470. The seed-laser output light 472 emitted from the front face 452 of seed laser diode 450 is directed to a phase modulator 495. The modulator 495 may be driven with a time-varying drive voltage V(t) supplied to the electrode 496 to change the optical frequency of the seed-laser output light 472. After passing through the phase modulator 495, the seed-laser output light 472 is split by the splitter 470 to produce the seed light 440 and LO light 430.

In particular embodiments, a phase modulator 495 may be operated so that different frequency changes are applied to different portions of the seed-laser output light 472. For example, a phase modulator 495 may (i) apply a first frequency change to portions of the seed-laser output light 472 corresponding to temporal portions 441 of seed light 440 that are amplified by the SOA 460 and (ii) apply a second frequency change (different from the first frequency change) to other portions of the seed-laser output light 472. The emitted pulses of light 400 may include the first frequency change, and the LO light 430 located between the emitted pulses of light 400 may include the second frequency change. The first and second frequency changes may each be approximately 0 Hz, 100 MHz, 500 MHz, 1 GHz, 2 GHz, 5 GHz, or any other suitable frequency change. For example, the first frequency change applied to the emitted pulses of light 400 may be 1-5 GHz, and the second frequency change applied to portions of LO light 430 between the emitted pulses of light 400 may be approximately 0 Hz. In particular embodiments, a phase modulator 495 may be driven in synch with SOA current pulses ($I_2$) supplied to the SOA 460 so that a particular frequency change is applied to each of the emitted pulses of light 400. During the time period between successive emitted pulses of light 400, the phase modulator 495 may be inactive (e.g., the drive voltage may be set to zero volts) so that little or no frequency change is applied to the LO light 430. In the example of FIG. 28, the phase modulator 495 may be activated when a pulse of light 400 is emitted to apply a frequency change to the emitted pulse of light 400, and at other times, the phase modulator 495 may be inactive so that no frequency change is applied to the LO light 430. A received pulse of light 410 may be coherently mixed with the LO light 430 to produce a coherent mixing term with a frequency component corresponding to the frequency difference between the received pulse of light 410 and the LO light 430.

Figure 29:
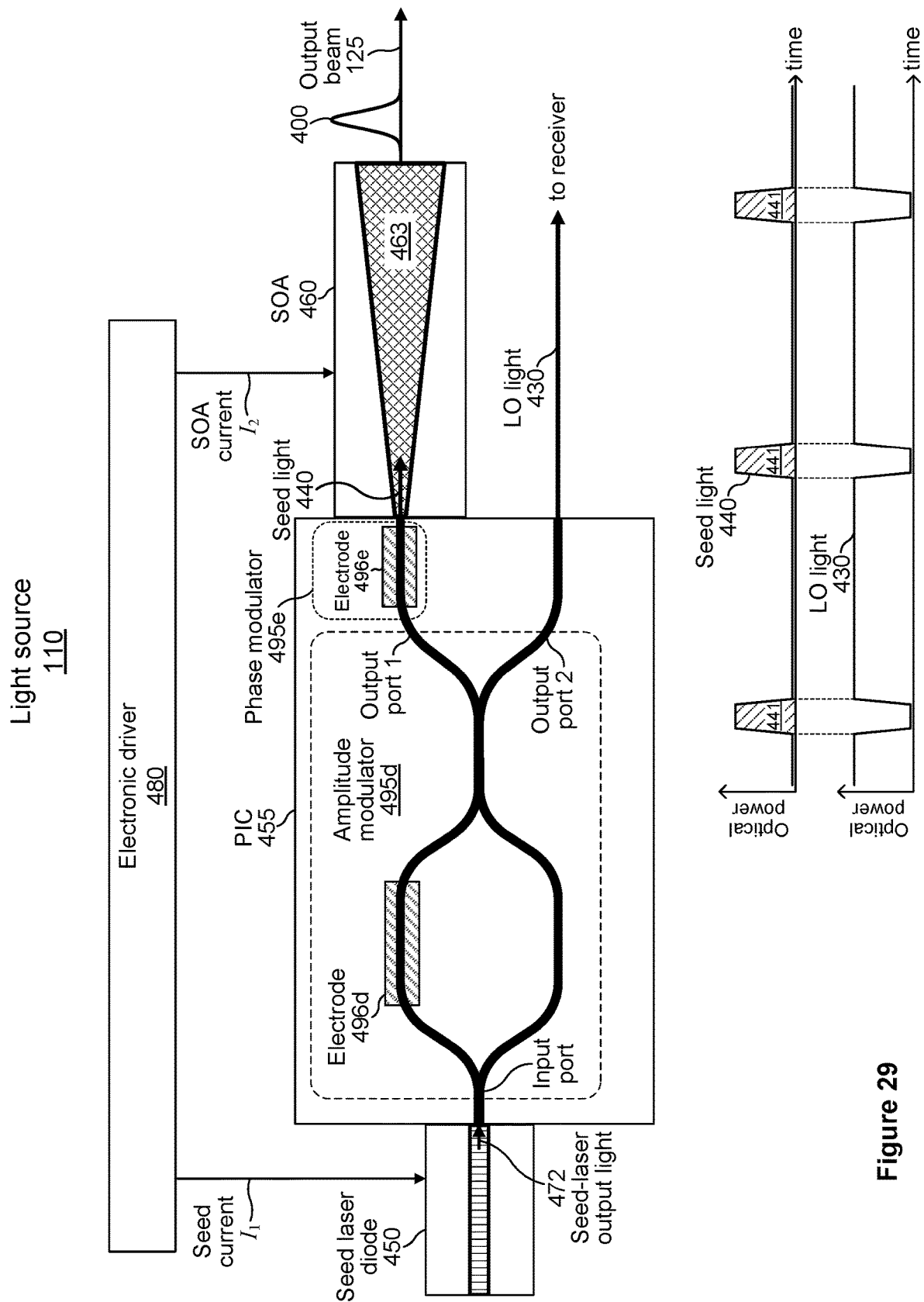
FIG. 29 illustrates an example light source with a photonic integrated circuit (PIC) that includes an amplitude modulator and a phase modulator.

FIG. 29 illustrates an example light source 110 with a photonic integrated circuit (PIC) 455 that includes an amplitude modulator 495*d* and a phase modulator 495*e*. In particular embodiments, a light source 110 may include an amplitude modulator 495*d* with: (i) an input port that receives seed-laser output light 472 from a seed laser diode 450, (ii) a first output port coupled to a SOA 460, and (iii) a second output port coupled to a receiver 140. The integrated-optic amplitude modulator 495*d* illustrated in FIG. 29 (which may be referred to as a switch or an optical switch) includes a Mach-Zehnder interferometer with an electrode 496*d* disposed on one path of the interferometer. By applying different voltages to the electrode 496*d*, the seed-laser output light 472 received at the input port may be switched between the two output ports. The seed light 440 includes the portion of output light 472 directed by the amplitude modulator 495*d* to output port 1, and the LO light 430 includes the portion of output light 472 that is directed to output port 2. For example, a first voltage applied to electrode 496*d* may cause the amplitude modulator 495*d* to direct substantially all of the output light 472 to output port 1. This portion of the output light 472 forms the seed light 440 which is sent through phase modulator 495*e* and then to SOA 460. A second voltage, different from the first voltage, applied to electrode 496*d* may cause the amplitude modulator 495*d* to direct substantially all of the output light 472 to output port 2, and this portion of the output light 472 forms the LO light 430 which may be sent to a receiver 140.

The seed laser diode 450 may be provided with a substantially constant seed current $I_1$ so that the power of the seed-laser output light 472 is substantially constant. A time-varying voltage signal may be supplied to the amplitude modulator 495*d* to switch the seed-laser output light 472 between output port 1 and output port 2. For example, a voltage signal applied to electrode 496*d* may alternate between the first and second voltages so that the output light 472 is switched between output ports 1 and 2, respectively. Switching the output light 472 alternately between the two output ports may result in the seed light 440 and the LO light 430 being time-interleaved so that when the seed light 440 is maximized, the LO light 430 is minimized, and vice versa, as illustrated by the two graphs in FIG. 29. Pulses of voltage may be applied to the electrode 496*d* to direct corresponding pulses of the output light 472 to output port 1. Each pulse of output light 472 corresponds to a temporal portion 441 of the seed light that is amplified by the SOA 460 to produce an emitted pulse of light 400. The portions of the output light 472 located between the pulses of voltage may be directed to output port 2 as the LO light 430. The amplitude modulator 495*d* may be driven in synch with SOA current pulses ($I_2$) supplied to the SOA 460 so that each portion of output light 472 directed to output port 1 is amplified by the SOA 460 to produce an emitted pulse of light 400.

The example PIC 455 in FIG. 29 includes a phase modulator 495*e* which may be similar to the phase modulator 495 illustrated in FIG. 26. A particular voltage signal V(t) applied to the electrode 496*e* may produce a frequency change in each temporal portion 441 of the seed light 440, which results in a corresponding frequency change in each of the emitted pulses of light 400. The drive voltages supplied to each of the modulators 495*d* and 495*e* may be in synch with the SOA current pulses supplied to the SOA 460 so that a frequency change is imparted to each temporal portion 441 which is then amplified by the SOA 460. A received pulse of light 410 may be coherently mixed with the LO light 430 to produce a coherent mixing term with a frequency component corresponding to the frequency difference between the received pulse of light 410 and the LO light 430.

Figure 30:
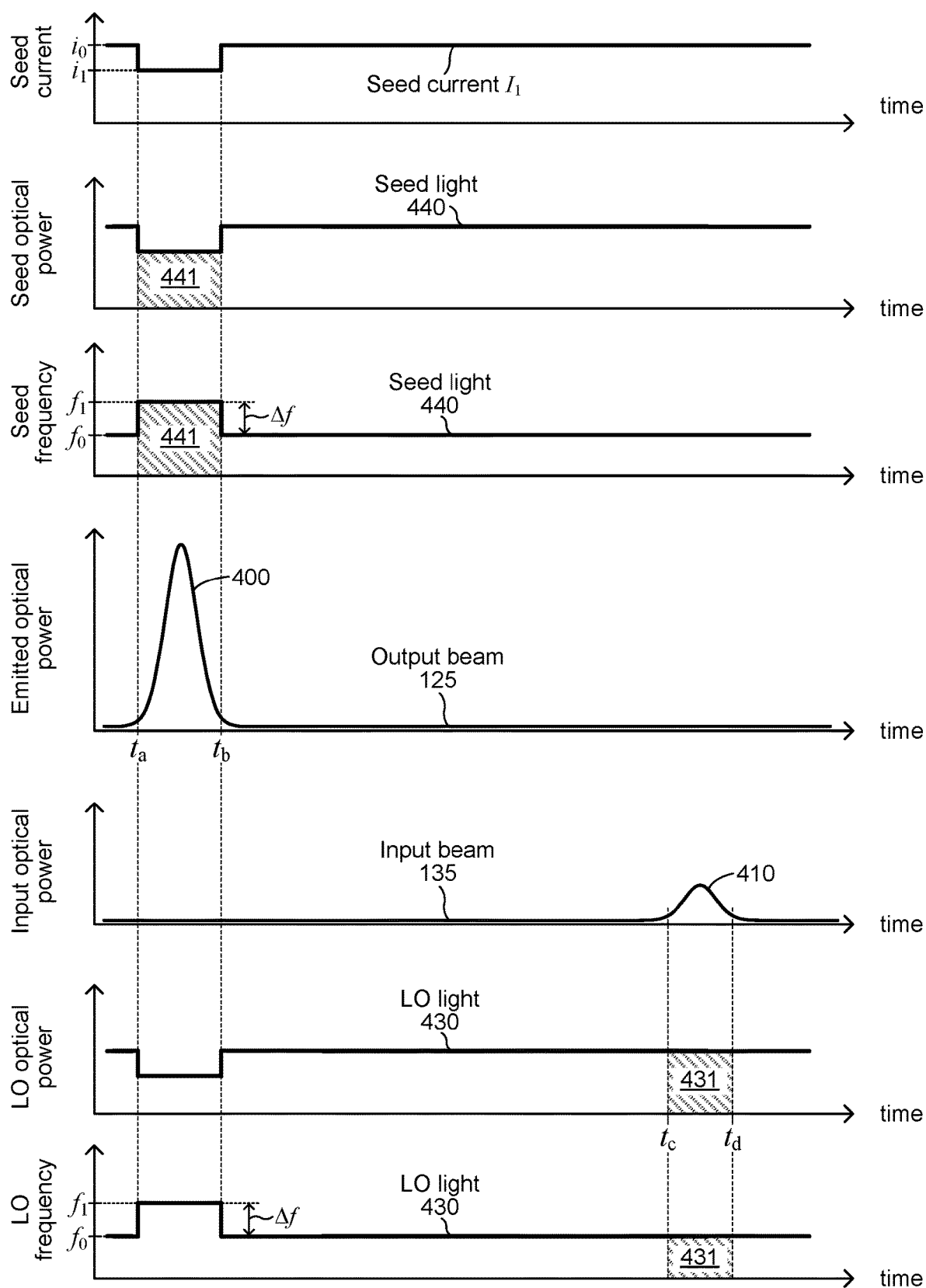
FIG. 30 illustrates example graphs of seed current ($I_1$), seed light, an emitted optical pulse, a received optical pulse, and LO light.

FIG. 30 illustrates example graphs of seed current ($I_1$), seed light 440, an emitted optical pulse 400, a received optical pulse 410, and LO light 430. The graphs in FIG. 30 each illustrate a particular quantity plotted versus time, including the temporal behavior of both the optical power and the optical frequency of the seed light 440 and the LO light 430. In particular embodiments, a light source 110 may change an optical frequency of seed-laser output light 472, seed light 440, LO light 430, or emitted pulses of light 400 by changing the seed current $I_1$ supplied to a seed laser diode 450 or by changing the SOA current $I_2$ supplied to a SOA 460. Rather than incorporating a discrete optical modulator 495 into a light source 110, a light source 110 may impart optical frequency changes based on the electrical current supplied to the seed laser diode 450 or the SOA 460. For example, the light source 110 illustrated in FIG. 6, 8, 9, 10, 11, 12, or 13 may not include a modulator 495 and may impart an optical frequency change based on the electrical current supplied to the seed laser diode 450 or the SOA 460. Changing the electrical current supplied to a seed laser diode 450 or a SOA 460 may cause a corresponding change in the optical frequency of the light emitted by the seed laser diode 450 or the SOA 460 (e.g., the change in optical frequency may result from a change in refractive index, carrier density, or temperature associated with the change in electrical current). For example, an electronic driver 480 may supply a seed laser diode 450 with a time-varying seed current $I_1$ that results in a frequency offset of $\Delta f$ between a received pulse of light 410 and a corresponding temporal portion 431 of LO light 430.

In particular embodiments, a seed current $I_1$ may be alternated between K+1 different current values (where K equals 1, 2, 3, 4, or any other suitable positive integer) so that (i) each temporal portion 441 (and each corresponding emitted pulse of light 400) has a particular optical frequency of K different frequencies and (ii) each corresponding temporal portion 431 of the LO light 430 has one particular optical frequency that is different from each of the other K frequencies. In the example of FIG. 30, the seed current $I_1$ supplied to a seed laser diode 450 alternates between the two values $i_0$ and $i_1$. The difference $i_0-i_1$ between the two seed-current values may be approximately 1 mA, 2 mA, 5 mA, 10 mA, 20 mA, or any other suitable difference in seed current. For example, an electronic driver 480 may supply seed currents of approximately $i_0$=102 mA and $i_1$=100 mA, corresponding to a seed-current difference of 2 mA. The seed laser diode 450 produces seed light 440 and LO light 430, and the optical power of the seed light 440 and the LO light 430 may exhibit changes when the seed current $I_1$ is changed. For example, when the seed current $I_1$ is reduced from $i_0$ to $i_1$, the optical power of the seed light 440 or the LO light 430 may be reduced by less than approximately 1 mW, 5 mW, or 10 mW. Additionally, when the seed current $I_1$ is changed between the values $i_0$ and $i_1$, the optical frequency of the seed light 440 and the LO light 430 may change by $\Delta f$ between the respective values $f_0$ and $f_1$. The frequency change $\Delta f$ caused by a change in seed current $I_1$ may be any suitable frequency change between approximately 10 MHz and approximately 50 GHz, such as for example, a frequency change of 100 MHz, 500 MHz, 1 GHz, 2 GHz, or 5 GHz.

In particular embodiments, an electronic driver 480 may (i) supply electrical current ii to a seed laser diode 450 during a time interval when a pulse of light 400 is emitted by a light source 110 and (ii) supply a different electrical current $i_0$ to the seed laser diode 450 for a period of time after the pulse of light 400 is emitted and prior to the emission of a subsequent pulse of light 400. Switching the electrical current from $i_1$ to $i_0$ may result in a change of the frequency of the LO light 430 by $\Delta f$, where the frequency change is with respect to: (i) the frequency of the seed light 440 or LO light 430 during the time interval when the pulse of light 400 is emitted and (ii) the frequency of the emitted pulse of light 400. A photocurrent signal produced by coherent mixing of a received pulse of light 410 with the LO light 430 may include a frequency component at a frequency of approximately $\Delta f$. In the example of FIG. 30, the seed current $I_1$ is alternated in time between two current values ($i_0$ and $i_1$) so that (i) the temporal portion 441 of the seed light 440 has a frequency $f_1$ and (ii) the LO light 430 (including the temporal portion 431) during a period of time after the pulse of light 400 is emitted has a frequency of $f_0$, where $f_1=f_0+\Delta f$. The emitted optical pulse 400 and the received optical pulse 410 may each have optical frequencies of approximately $f_1$, corresponding to the frequency of the temporal portion 441. The received optical pulse 410 may be coherently mixed with the temporal portion 431 of the LO light 430 (which may have a frequency of $f_0$) between the times $t_c$ and $t_d$ to produce a photocurrent signal having a frequency component at a frequency of approximately $\Delta f$.

In particular embodiments, seed current $I_1$ and SOA current $I_2$ maybe synched together so that (i) the seed current $I_1$ is set to a first value when a pulse of SOA current is supplied to the SOA 460 and (ii) the seed current $I_1$ is set to a second value during the time periods between successive pulses of SOA current. In FIG. 30, when a pulse of light 400 is emitted (between times $t_a$ and $t_b$), the seed current $I_1$ is set to the value $i_1$, and during the time periods between successive pulses of light 400, the seed current $I_1$ is set to the value $i_0$. The seed current $I_1$ may be set to the value $i_0$ for a period of time less than or equal to the pulse period $\tau$, which corresponds to the time between successive pulses of light 400. For example, the seed current $I_1$ may be set to $i_0$ from time $t_b$ until at least time $t_d$. At or before a time when a subsequent pulse of light 400 (not illustrated in FIG. 30) is emitted, the seed current $I_1$ may be switched back to the value $i_1$, which changes the frequency of the seed light 440 and LO light 430 back to $f_1$. After that subsequent pulse of light 400 is emitted, the seed current $I_1$ may again be set to the value $i_0$, which changes the frequency of the LO light 430 by $\Delta f$ to $f_0$.

In particular embodiments, an electronic driver 480 may supply seed current $I_1$ to a seed laser diode 450 where the seed current $I_1$ includes: (i) a substantially constant electrical current (e.g., a DC current) and (ii) a modulated electrical current. The modulated electrical current may include any suitable waveform, such as for example, a sinusoidal, square, pulsed, sawtooth, or triangle waveform. The constant-current portion of the seed current $I_1$ may include a DC current of approximately 50 mA, 100 mA, 200 mA, 500 mA, or any other suitable DC electrical current, and the modulated portion of the seed current $I_1$ may be smaller, with an amplitude of less than or equal to 1 mA, 5 mA, 10 mA, or 20 mA. The modulated portion of the electrical current may produce a corresponding frequency or amplitude modulation in the seed light 440 or the LO light 430. For example, the modulated electrical current may be applied to the seed laser diode 450 when a pulse of light 400 is emitted so that the emitted pulse of light 400 includes a corresponding frequency or amplitude modulation. The modulated electrical current may not be applied during the time period between successive pulses of light 400, and so, during this time the LO light 430 may not include a corresponding frequency or amplitude modulation. When a received pulse of light 410 is coherently mixed with the LO light 430, the photocurrent signal may have a characteristic frequency component corresponding to the frequency or amplitude modulation applied to the emitted pulse of light 400. For example, the characteristic frequency component may be detected or measured by a frequency-detection circuit 600 to determine whether a received pulse of light is a valid received pulse of light.

In particular embodiments, a light source 110 may be configured to impart a frequency change to an emitted pulse of light 400 based on (i) seed current $I_1$ supplied to a seed laser diode 450 or (ii) SOA current $I_2$ supplied to a SOA 460. For example, in addition to or instead of imparting a frequency change to an emitted pulse of light 400 based on the seed current $I_1$, a light source 110 may impart a frequency change to an emitted pulse of light based on the SOA current $I_2$ supplied to a SOA 460. In particular embodiments, an electronic driver 480 may supply SOA current $I_2$ to a SOA 460, where the SOA current is configured to impart a frequency change to an emitted pulse of light 400. For example, the SOA current $I_2$ may include pulses of current, where each pulse of current results in the SOA 460 (i) amplifying a temporal portion 441 of seed light 440 to produce an emitted pulse of light 400 and (ii) imparting a frequency change to the emitted pulse of light 400. A frequency change may be imparted to a temporal portion 441 while propagating through the SOA 460, resulting in an emitted pulse of light 400 that has a frequency offset with respect to LO light 430. The frequency change may result from a nonlinear optical effect in the SOA waveguide 463 or from a change in refractive index, carrier density, or temperature associated with a pulse of SOA current $I_2$. For example, a pulse of SOA current may include a modulation (e.g., a linear or sinusoidal current variation added to the current pulse) that causes a refractive-index variation in the SOA waveguide 463, which in turn results in a frequency change imparted to the emitted pulse of light 400. A frequency change of $\Delta f$ imparted to an emitted pulse of light 400 by a SOA 460 may result in a photocurrent signal (e.g., produced by coherent mixing of a received pulse of light 410 with LO light 430) with a frequency component at a frequency of approximately $\Delta f$.

In particular embodiments, a light source 110 may include an optical modulator 495 or an electronic driver 480 that imparts different frequency changes $\Delta f_k$ to different temporal portions 441 of seed light 440. An optical modulator 495 or an electronic driver 480 may apply a repeating series or a pseudo-random series of a particular number (e.g., 2, 3, 4, or any other suitable number) of different frequency changes to different respective temporal portions 441 of seed light 440. For example, the optical modulator 495 in FIG. 26 may change the optical frequency of a first temporal portion 441 of seed light 440 by $\Delta f_1$, and the optical modulator 495 may change the optical frequency of a second temporal portion 441 of the seed light 440 by a different frequency-change value $\Delta f_2$. The frequency changes applied to the temporal portions 441 may result in corresponding frequency changes to the emitted pulses of light 400 and the received pulses of light 410. As another example, the electronic driver 480 in FIG. 9 may supply three different values of seed current $I_1$ to the seed laser diode 450. One value of the seed current may be applied to the seed laser diode 450 after a pulse of light 400 is emitted and prior to the emission of a subsequent pulse of light 400. This value of seed current sets the optical frequency of the temporal portion 431 of the LO light 430. The other two values of the seed current may be used to change the optical frequency of a first temporal portion 441 by $\Delta f_1$ (relative to the frequency of the temporal portion 431) and the optical frequency of a second temporal portion by $\Delta f_2$.

In particular embodiments, different frequency changes may correspond to different spectral signatures that may be used to associate a received pulse of light 410 with a particular emitted pulse of light 400. For example, a first received pulse of light 410 with a frequency change of $\Delta f_1$ may result in a photocurrent signal i having a frequency component at a frequency of approximately $\Delta f_1$. A received pulse of light 410 that results in a frequency component at approximately $\Delta f_1$ may be associated with an emitted pulse of light 400 having a corresponding $\Delta f_1$ frequency change (e.g., the received pulse of light 410 may include light from the emitted pulse of light 400 that is scattered by a target 130). Similarly, a second received pulse of light 410 with a frequency change of $\Delta f_2$ may result in a photocurrent signal i having a frequency component at a frequency of approximately $\Delta f_2$. A received pulse of light 410 that results in a frequency component at approximately $\Delta f_2$ may be associated with an emitted pulse of light 400 having a corresponding $\Delta f_2$ frequency change. An optical modulator 495 or an electronic driver 480 may alternate between the $\Delta f_1$ and $\Delta f_2$ frequency changes so that successive emitted pulses of light 400 have different frequency changes. The alternating frequency changes may allow a received pulse of light 410 to be unambiguously associated with an emitted pulse of light 400 based on the different frequency components associated with different received pulses of light 410.

In particular embodiments, a frequency change imparted to an emitted pulse of light 400 may be referred to as a spectral signature and may be used to (i) determine whether a received pulse of light is a valid received pulse of light 410, (ii) associate a received pulse of light 410 with an emitted pulse of light 400, or (iii) determine whether a received pulse of light is an interfering optical signal. For example, a light source 110 may impart a spectral signature of one or more different spectral signatures to seed light 440 or to an amplified temporal portion 441 of the seed light 440 so that each emitted pulse of light 400 includes one of the spectral signatures. Each spectral signature may include a particular frequency change that may be imparted (i) using a modulator 495 (e.g., an electro-optic phase modulator or an acousto-optic modulator), (ii) based on the seed current $I_1$ supplied to a seed laser diode 450, or (iii) based on the SOA current $I_2$ supplied to a SOA 460. For example, a light source 110 may impart the same frequency change $\Delta f$ to each emitted pulse of light 400 based on supplying two different values of seed current $I_1$ to the seed laser diode 450. If coherent mixing of a received pulse of light 410 with LO light 430 produces a frequency component at approximately the same frequency $\Delta f$, then the received pulse of light 410 may be determined to be a valid received pulse of light. If coherent mixing of a received pulse of light with LO light 430 does not produce a frequency component at $\Delta f$ (or the amplitude of the frequency component at $\Delta f$ is below a particular threshold value), then the received pulse of light may be ignored or may be determined to be an interfering optical signal. As another example, a light source 110 may impart one of K different frequency changes to each emitted pulse of light 400 (where K equals 1, 2, 3, 4, or any other suitable positive integer). The frequency changes may be imparted in a repeating sequential manner or in a pseudo-random manner. If coherent mixing of a received pulse of light 410 with LO light 430 produces a frequency component at one of the K frequencies $\Delta f_k$, then the received pulse of light 410 may be determined to be associated with a particular emitted pulse of light 400 having the frequency change $\Delta f_k$. If coherent mixing of a received pulse of light with LO light 430 does not produce a frequency component corresponding to one of the imparted frequency changes (or the amplitude of the frequency components are below a particular threshold value), then the received pulse of light may be ignored or may be determined to be an interfering optical signal.

Figure 31:
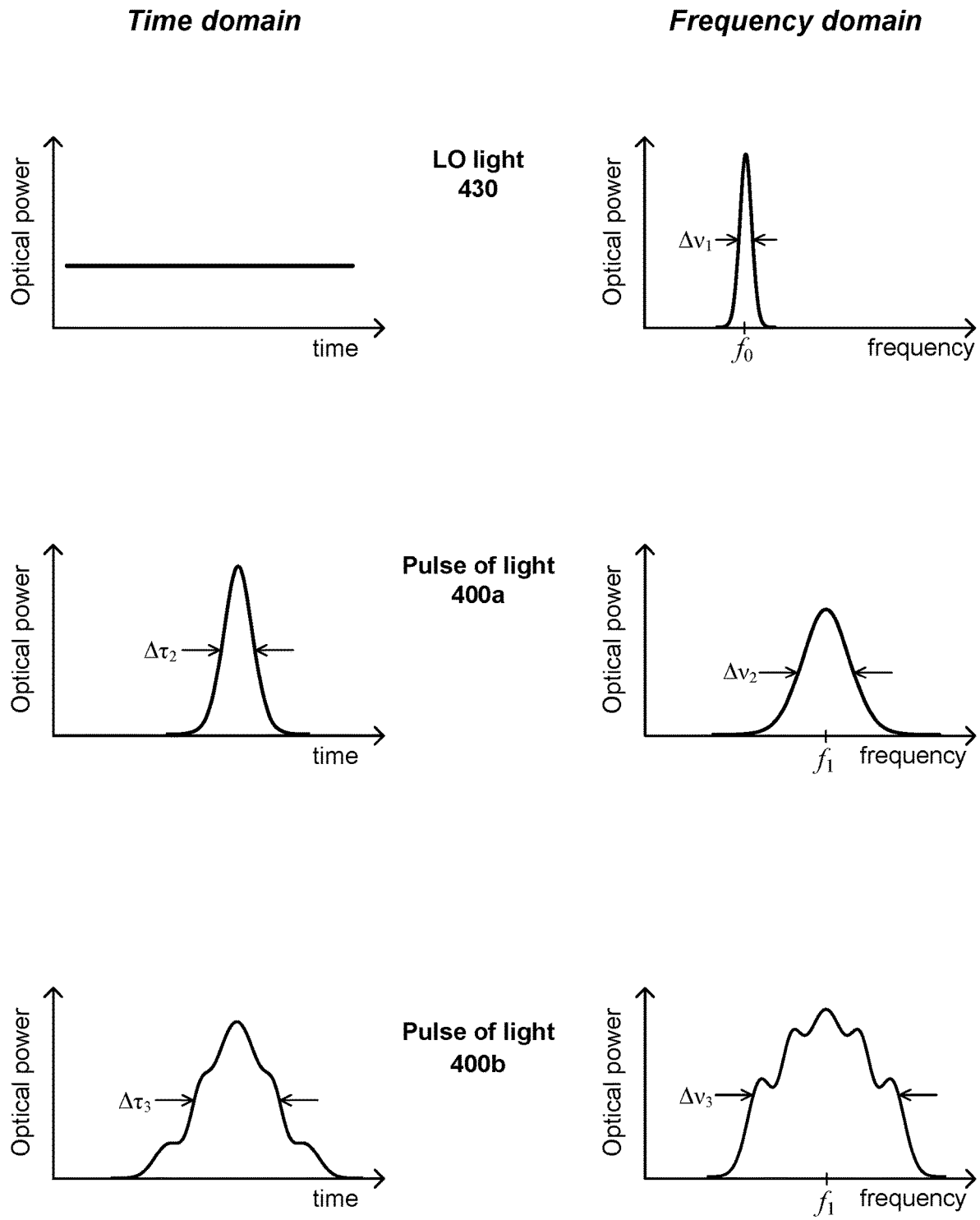
FIG. 31 illustrates example time-domain and frequency-domain graphs of LO light and two emitted pulses of light.

FIG. 31 illustrates example time-domain and frequency-domain graphs of LO light 430 and two emitted pulses of light 400a and 400b. The time-domain graph of the LO light 430 indicates that the optical power of the LO light 430 is substantially constant. The frequency-domain graph of the LO light 430 indicates that the LO light 430 has a center optical frequency of $f_0$ and a relatively narrow spectral linewidth of $\Delta v_1$. The pulse of light 400a represents an emitted pulse of light with pulse duration $\Delta\tau_2$, optical frequency $f_1$, and spectral linewidth $\Delta v_2$. The pulse of light 400b represents an emitted pulse of light with pulse duration $\Delta\tau_3$, optical frequency $f_1$, and spectral linewidth $\Delta v_3$. The pulses of light 400a and 400b each have an optical frequency $f_1$ that is shifted with respect to the LO light (e.g., $f_1=f_0+\Delta f$). For example, the frequency of the pulse of light 400a or 400b may be shifted by a phase modulator 495 or by an electronic driver 480 that changes the seed current $I_1$ supplied to a seed laser diode 450. Compared to pulse of light 400a, the pulse of light 400b has an additional modulation applied to it. For example, in addition to changing the seed current $I_1$ to shift the frequency of the pulse of light 400b, an amplitude modulation (e.g., a linear or sinusoidal modulation) may be added to the seed current $I_1$ that results in additional variation that is imparted to the pulse of light 400b. The additional modulation may result in a wider spectral linewidth so that $\Delta v_3$ is greater than $\Delta v_2$. Additionally or alternatively, the additional modulation may result in an amplitude variation added to the pulse of light 400b in the time domain or in the frequency domain. The additional modulation added to the pulse of light 400b may be used as a spectral signature so that a corresponding received pulse of light 410r may be associated with the emitted pulse of light 400b. A light source may apply two or more different modulations to different respective emitted pulses of light 400 so that a received pulse of light 410 may be unambiguously associated with a particular emitted pulse of light 400.

Figure 32:
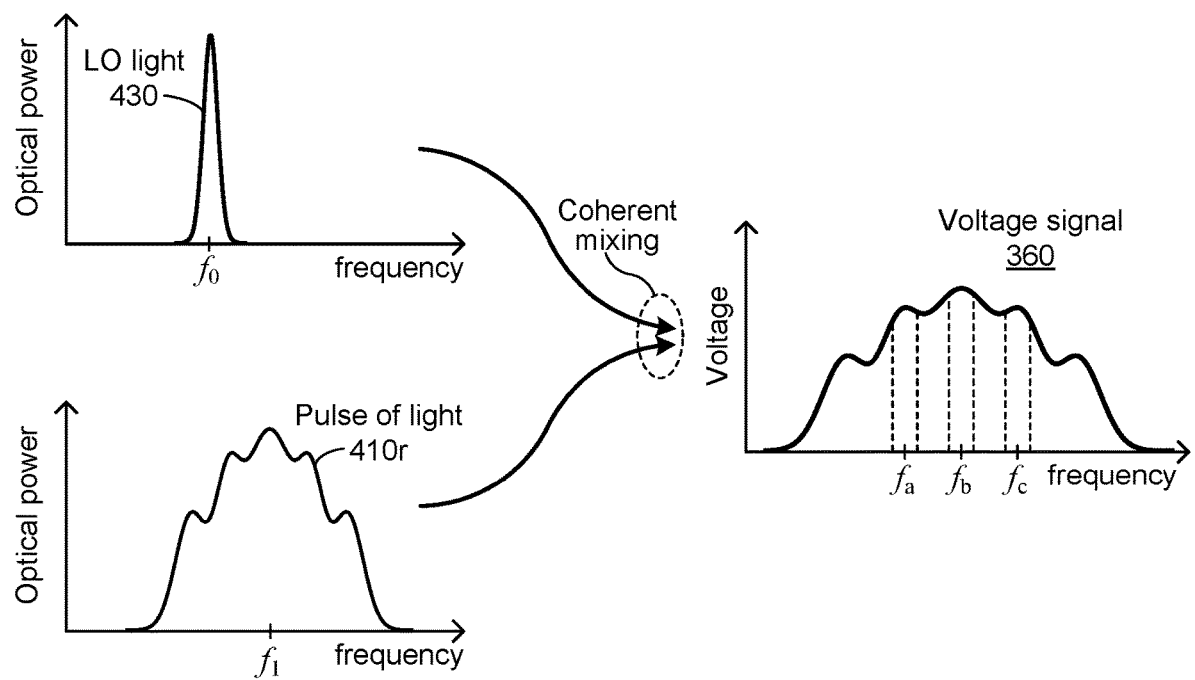
FIG. 32 illustrates an example voltage signal that results from the coherent mixing of LO light and a received pulse of light.

FIG. 32 illustrates an example voltage signal 360 that results from the coherent mixing of LO light 430 and a received pulse of light 410r. The received pulse of light 410r corresponds to the emitted pulse of light 400b in FIG. 31 (e.g., the received pulse of light 410r may include light from the emitted pulse of light 400b that is scattered by a target 130). The voltage signal 360 is graphed in the frequency domain and exhibits variations in amplitude. These amplitude variations may result from the modulation added to the pulse of light 400r and may be used as a spectral signature. The frequency-domain graph of the voltage signal 360 includes peaks at the frequencies $f_a$, $f_b$, and $f_c$. A receiver 140 may include a frequency-detection circuit 600 with three electronic band-pass filters 610 having three respective center frequencies $f_a$, $f_b$, and $f_c$. Based on the amplitudes of these three frequency components, a receiver 140 or controller 150 may determine whether a received pulse of light 410r is associated with a particular emitted pulse of light 400b. For example, if the amplitudes of the three frequency components match a spectral signature for a particular emitted pulse of light 400b, then the received pulse of light 410r may be determined to include scattered light from that emitted pulse of light 400b.

Figure 33:
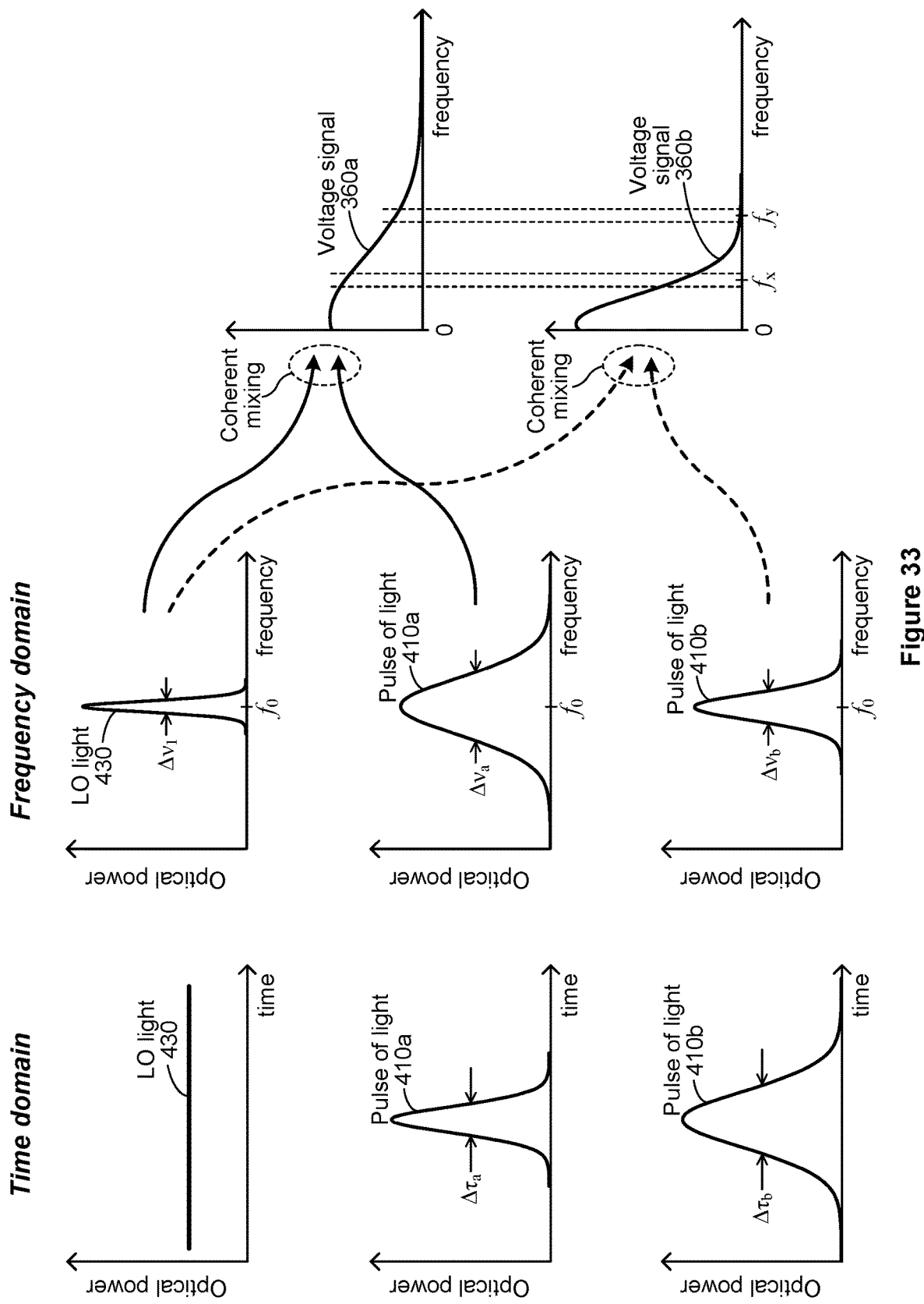
FIG. 33 illustrates two example voltage signals that result from the coherent mixing of LO light with two different received pulses of light.

FIG. 33 illustrates two example voltage signals (360a, 360b) that result from the coherent mixing of LO light 430 with two different received pulses of light (410a, 410b). The LO light 430 and the received pulses of light 410a and 410b are each represented by a time-domain graph and a frequency-domain graph. The time-domain graph of the LO light 430 indicates that the LO light 430 has a substantially constant optical power. The frequency-domain graph indicates that the LO light 430 has a center optical frequency of $f_0$ and a relatively narrow spectral linewidth of $\Delta v_1$. For example, the optical frequency $f_0$ may be approximately 199.2 THz (corresponding to a wavelength of approximately 1505 nm), and the spectral linewidth $\Delta v_1$ may be approximately 2 MHz. The received pulse of light 410a has a pulse duration of $\Delta t_a$ and a spectral linewidth of $\Delta v_a$. The received pulse of light 410b has a pulse duration of $\Delta\tau_b$ (where $\Delta\tau_b$ is greater than $\Delta t_a$) and a spectral linewidth of $\Delta v_b$ (where $\Delta v_b$ is less than $\Delta v_a$). As an example, the pulse of light 410a may have a 3-ns pulse duration and a 500-MHz spectral linewidth, and the pulse of light 410b may have a 6-ns pulse duration and a 250-MHz spectral linewidth. The coherent mixing of the LO light 430 and the pulse of light 410a at a detector 340 may result in a pulse of photocurrent i which is amplified by an amplifier 350 that produces the voltage signal 360a. Similarly, the coherent mixing of the LO light 430 and the pulse of light 410b at a detector 340 may result in a pulse of photocurrent i which is amplified by an amplifier 350 that produces the voltage signal 360b.

A pulse duration ($\Delta\tau$) and spectral linewidth ($\Delta v$) of a pulse of light may have an inverse relationship where the product $\Delta\tau\cdot\Delta v$ (which may be referred to as a time-bandwidth product) is equal to a constant value. For example, a pulse of light with a Gaussian temporal shape may have a time-bandwidth product equal to a constant value that is greater than or equal to 0.441. If a Gaussian pulse has a time-bandwidth product that is approximately equal to 0.441, then the pulse may be referred to as a transform-limited pulse. For a transform-limited Gaussian pulse, the pulse duration ($\Delta\tau$) and spectral linewidth ($\Delta v$) may be related by the expression $\Delta t\cdot\Delta v=0.441$. The inverse relationship between pulse duration and spectral linewidth indicates that a shorter-duration pulse has a larger spectral linewidth (and vice versa). For example, in FIG. 33, pulse of light 410a has a shorter duration and a larger spectral linewidth than pulse of light 410b. This inverse relationship between pulse duration and spectral linewidth results from the Fourier-transform relationship between time-domain and frequency-domain representations of a pulse. In the example of FIG. 33, the received pulse of light 410a may be a transform-limited Gaussian pulse with a pulse duration $\Delta\tau_a$ of 2 ns and a spectral linewidth $\Delta v_a$ of approximately 220 MHz. Similarly, the received pulse of light 410b may be a transform-limited Gaussian pulse with a pulse duration $\Delta\tau_b$ of 4 ns and a spectral linewidth $\Delta v_b$ of approximately 110 MHz. If a Gaussian pulse of light has a time-bandwidth product that is greater than 0.441, then the pulse of light may be referred to as a non-transform-limited pulse of light. For example, if the pulses of light in FIG. 33 are non-transform-limited with a time-bandwidth product of 1, then the received pulse of light 410a may have a pulse duration $\Delta\tau_a$ of 2 ns and a spectral linewidth $\Delta v_a$ of approximately 500 MHz. Similarly, the received pulse of light 410b may have a pulse duration $\Delta\tau_b$ of 4 ns and a spectral linewidth $\Delta v_b$ of approximately 250 MHz.

When LO light 430 and a received pulse of light 410 are coherently mixed, a voltage signal 360 may be produced, and the voltage signal may include a voltage pulse having a particular frequency-domain representation. In FIG. 33, the graph of voltage signal 360a is a frequency-domain representation of the voltage signal that results from the coherent mixing of LO light 430 and received pulse of light 410a. The graph of voltage signal 360b is a frequency-domain representation of the voltage signal that results from the coherent mixing of LO light 430 and received pulse of light 410b. The voltage signal 360a includes frequency components that depend on a numeric combination of the linewidths of the LO light 430 and pulse of light 410a. Similarly, the voltage signal 360b includes frequency components that depend on the linewidths of the LO light 430 and pulse of light 410b. The voltage signal 360a has frequency components that extend over a wider frequency range than voltage signal 360b, which corresponds to the spectral linewidth $\Delta v_a$ of pulse of light 410a being larger than the spectral linewidth $\Delta ve$ of pulse of light 410b.

In particular embodiments, an electronic driver 480 may supply pulses of current to a SOA 460, and each pulse of current may cause the SOA 460 to (i) amplify a temporal portion 441 of seed light 440 to produce an emitted pulse of light 400 and (ii) impart a spectral signature to the temporal portion 441 so that the emitted pulse of light 400 includes the spectral signature. A spectral signature may be imparted by amplifying a temporal portion 441 of seed light 440 to produce an emitted pulse of light 400 having a particular spectral linewidth. The spectral signature may correspond to one or more of the frequency components associated with the spectral linewidth of the emitted pulse of light 400. The seed light 440 may have a relatively narrow linewidth (e.g., which may be approximately equal to $\Delta v_1$ in FIG. 33), and amplifying a temporal portion 441 of seed light 440 may result in the linewidth being broadened according to the inverse relationship between pulse duration ($\Delta \tau$) and spectral linewidth ($\Delta v$). For example, amplifying a temporal portion 441 may produce a pulse of duration $\Delta \tau_a$ (e.g., as illustrated in FIG. 33) from seed light 440, which results in the spectral linewidth being broadened from $\Delta v_1$ to $\Delta v_a$.

In particular embodiments, an electronic driver 480 may be configured to supply pulses of current to a SOA 460, where each pulse of current imparts to each corresponding emitted pulse of light 400 a spectral signature of one or more different spectral signatures. For example, an electronic driver 480 may supply electrical current pulses having one or more different durations, and each current-pulse duration may result in an emitted pulse of light 400 having a particular pulse duration and a corresponding particular spectral linewidth. As another example, an electronic driver 480 may alternate between supplying two different pulses of current, where one pulse of current results in an emitted pulse of light 400 (e.g., associated with received pulse of light 410a in FIG. 33) having a particular pulse duration and spectral linewidth, and the other pulse of current results in an emitted pulse of light 400 (e.g., associated with received pulse of light 410b) having a longer pulse duration and a narrower spectral linewidth. A particular spectral signature being imparted to a temporal portion 441 or to an emitted pulse of light 400 may result from a corresponding rise time, a fall time, pulse duration, or pulse shape of a pulse of current supplied to the SOA 460. For example, applying a pulse of current having a particular duration may result in an emitted pulse of light 400 that has a particular spectral linewidth corresponding to the duration of the current pulse. Shorter-duration current pulses supplied to the SOA 460 may result in emitted pulses of light 400 having shorter pulse durations and broader spectral linewidths. In FIG. 33, the pulse of light 410a may be associated with an emitted pulse of light produced by applying a 5-ns current pulse to a SOA 460, and the pulse of light 410b may be associated with an emitted pulse of light produced by applying a 9-ns current pulse to the SOA 460. As another example, applying a pulse of current having a particular rise time may result in an emitted pulse of light 400 having a particular spectral linewidth corresponding to the rise time of the current pulse. Current pulses with shorter-duration rise times may result in emitted pulses of light 400 having broader spectral linewidths.

In particular embodiments, a spectral signature of a pulse of light may be associated with a pulse characteristic (e.g., a rise time, a fall time, pulse duration, or a pulse shape) of the pulse of light. For example, an emitted pulse of light 400 having a particular pulse duration or rise time may correspond to a particular spectral signature. Emitted pulses of light 400 or received pulses of light 410 having shorter pulse durations or shorter rise times may be associated with broader spectral linewidths. In FIG. 33, the shorter pulse duration $\Delta \tau_a$ of the received pulse of light 410a is associated with the broader spectral linewidth $\Delta v_a$, and the longer pulse duration $\Delta \tau_b$ of the received pulse of light 410b is associated with the narrower spectral linewidth $\Delta v_b$.

In particular embodiments, a spectral signature of an emitted pulse of light 400 or a received pulse of light 410 may correspond to one or more frequency components of the pulse of light. In FIG. 33, the frequency components of received pulse of light 410a that are located outside the spectral linewidth of the LO light 430 may correspond to the spectral signature of the received pulse of light 410a. These frequency components may correspond to new frequency components outside of the $\Delta v_1$ linewidth that are imparted to a temporal portion 441 when an emitted pulse of light 400 is produced. For example, the spectral signature of the received pulse of light 410a may correspond to one or more frequency components located approximately in the range from $f_0 - \Delta v_a$ to $f_0 - \Delta v_1$ and approximately in the range from $f_0 + \Delta v_1$ to $f_0 + \Delta v_a$. Similarly, the spectral signature of the received pulse of light 410b may correspond to the frequency components located approximately in the range from $f_0 - \Delta v_b$ to $f_0 - \Delta v_1$ and approximately in the range from $f_0 + \Delta v_1$ to $f_0 + \Delta v_b$.

In particular embodiments, a spectral signature may correspond to the presence or absence of one or more particular frequency components in a received pulse of light 410. A receiver 140 may include a frequency-detection circuit 600 configured to determine the amplitude of one or more frequency components of a received pulse of light 410. Based on the amplitudes of the one or more frequency components, a receiver 140 or a controller 150 may determine whether a received pulse of light 410 (i) matches the spectral signature of an emitted pulse of light 400, (ii) is a valid received pulse of light 410, or (iii) is an interfering pulse of light. For example, a frequency-detection circuit 600 may include one or more band-pass filters 610 at frequencies that correspond to frequency components associated with one or more spectral signatures. If one or more particular frequency components each has an amplitude above or below a particular threshold value or within a particular range of values, then a receiver 140 or controller 150 may determine that a received pulse of light 410 is a valid received pulse of light that is associated with an emitted pulse of light 400. For example, based on voltage signal 360a in FIG. 33, if the amplitude of frequency component $f_y$ of a received pulse of light is above a particular threshold value, then a receiver 140 or controller 150 may determine that the received pulse of light is a valid received pulse of light that matches the spectral signature associated with pulse 410a.

In particular embodiments, a light source 110 may emit pulses of light 400 with pulse durations and spectral linewidths that alternate between two or more different pulse durations and spectral linewidths (e.g., the pulse durations and linewidths of pulses 410a and 410b illustrated in FIG. 33). Based on the example voltage signals 360a and 360b illustrated in FIG. 33, a frequency-detection circuit 600 may include two band-pass filters 610 having respective center frequencies of $f_x$ and $f_y$. As an example, the frequency-detection circuit 600 may determine the amplitude of the frequency component $f_y$, and based at least in part on that amplitude, a receiver 140 or controller 150 may determine whether a received pulse of light matches the spectral signature associated with pulse 410a or pulse 410b. If the amplitude of frequency component $f_y$ of a received pulse of light 410 exceeds a particular threshold value, then a receiver 140 or controller 150 may determine that the received pulse of light 410 is associated with an emitted pulse of light 400 having the spectral signature associated with pulse 410a. As another example, the frequency-detection circuit 600 may determine the amplitudes of the two frequency components $f_x$ and $f_y$, and based at least in part on those amplitudes, a receiver 140 or controller 150 may determine whether a received pulse of light matches the spectral signature associated with pulse 410a or pulse 410b. If the amplitudes of frequency components $f_x$ and $f_y$ are each above or below a particular threshold value or within a particular range of values, then a receiver 140 or controller 150 may determine whether a received pulse of light 410 matches the spectral signature of pulse 410a or 410b. Additionally or alternatively, if the ratio of the amplitudes of the two frequency components $f_x$ and $f_y$ is above or below a particular threshold value, then a receiver 140 or controller 150 may determine whether a received pulse of light 410 matches the spectral signature of pulse 410a or 410b. For example, a receiver 140 or controller 150 may determine the ratio $A(f_y)/A(f_x)$, where $A(f_y)$ is the amplitude of frequency component $f_y$, and $A(f_x)$ is the amplitude of frequency component $f_x$. If the ratio is greater than a particular threshold value (e.g., if $A(f_y)/A(f_x)$ is greater than 0.25), then the corresponding received pulse of light 410 may be determined to be associated with an emitted pulse of light 400 having the spectral signature associated with pulse 410a. Similarly, if the ratio is less than a particular threshold value, then the corresponding received pulse of light 410 may be determined to match the spectral signature of pulse 410b.

Figure 34:
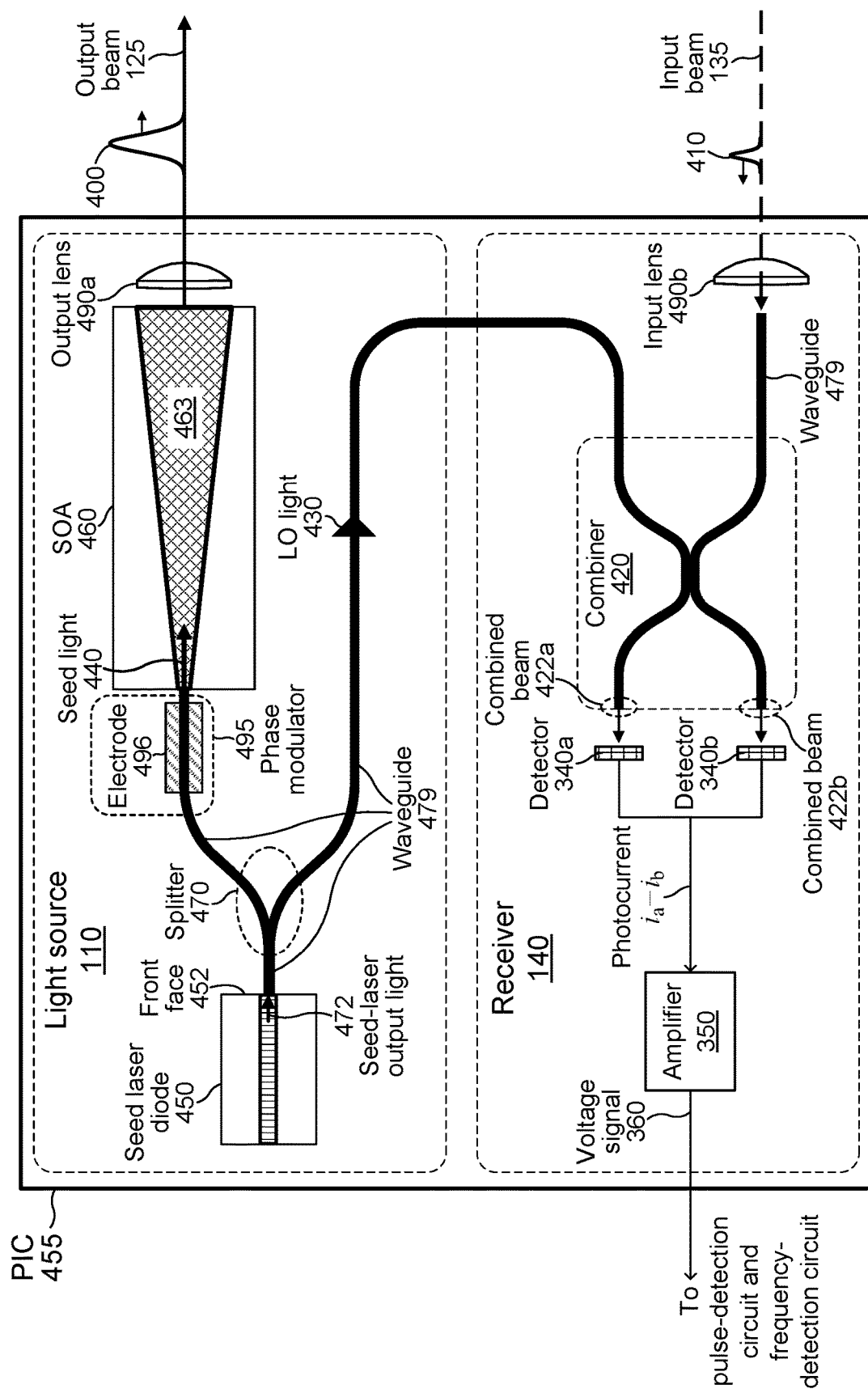
FIG. 34 illustrates an example light source and receiver integrated into a photonic integrated circuit (PIC).

FIG. 34 illustrates an example light source 110 and receiver 140 integrated into a photonic integrated circuit (PIC) 455. In particular embodiments, a lidar system 100 may include a PIC 455 where at least part of the light source 110 or at least part of the receiver 140 are disposed on or in the PIC 455. The PIC 455 in FIG. 34 includes the following optical components: seed laser diode 450, splitter 470, phase modulator 495, SOA 460, output lens 490a, input lens 490b, combiner 420, and detectors 340a and 340b. Additionally, the PIC 455 includes optical waveguides 479 that convey light from one optical component to another. The waveguides 479 may be passive optical waveguides formed in a PIC substrate material that includes silicon, InP, glass, polymer, or lithium niobate. The amplifier 350 in FIG. 34 may be attached to, electrically coupled to, or located near the PIC 455. One or more optical components of the light source 110 or receiver 140 may be fabricated separately and then integrated with the PIC 455. For example, the seed laser diode 450, SOA 460, lenses 490a and 490b, or detectors 340a and 340b may be fabricated separately and then integrated into the PIC 455. An optical component may be integrated into the PIC 455 by attaching or connecting the optical component to the PIC 455 or to a substrate to which the PIC 455 is also attached. For example, an optical component may be attached to a PIC 445 using epoxy or solder.

In particular embodiments, a PIC 455 may include a phase or amplitude modulator 495 that changes a frequency or amplitude of seed light 440, emitted pulses of light 400, or LO light 430. The phase modulator 495 in FIG. 34 is located after the splitter 470 and may be used to change the optical frequency of the seed light 440. In particular embodiments, a phase modulator 495 may be fabricated directly into a PIC 455. For example, a PIC substrate may be made from lithium niobate, and a phase modulator 495 may be fabricated by depositing an electrode 496 near a portion of a lithium-niobate waveguide 479. Alternatively, a phase modulator 495 may be fabricated separately and then integrated into a PIC 455. For example, the PIC waveguides 479 may be glass-based waveguides, and the phase modulator 495 may be fabricated from lithium niobate. The lithium-niobate phase modulator 495 may be incorporated into the PIC 455 by aligning the waveguide of the modulator 495 with a PIC waveguide 479 and then attaching the modulator 495 to the PIC 455. In particular embodiments, a PIC 455 may not include a phase modulator 495. For example, instead of using a phase modulator 495 to impart frequency changes, a light source 110 that is incorporated into a PIC 455 may impart frequency changes to seed light 440, emitted pulses of light 400, or LO light 430 based on the seed current $I_1$ supplied to a seed laser diode 450 or based on the SOA current $I_2$ supplied to a SOA 460.

In particular embodiments, a PIC 455 may include one or more optical waveguides 479 that direct seed light 440 to a SOA 460 and direct LO light 430 to a receiver 140. For example, a light source 110 may include a PIC 455 with an optical waveguide 479 that receives seed light 440 from a seed laser diode 450 and directs the seed light 440 to a SOA 460. As another example, an optical waveguide 479 may receive seed-laser output light 472 from a seed laser diode 450 and direct a portion of the seed-laser output light 472 (which corresponds to the seed light 440) to a SOA 460. In FIG. 34, an optical waveguide 479 of the PIC 455 receives the seed-laser output light 472 from the front face 452 of the seed laser diode 450 and directs the output light 472 to the splitter 470. The splitter 470 splits the seed-laser output light 472 to produce the seed light 440 and the LO light 430. One optical waveguide 479 directs the seed light 440 from the splitter 470 to the SOA, and along the way, the seed light 440 passes through a phase modulator 495, which may impart a frequency change to the seed light 440. Another optical waveguide 479 directs the LO light 430 from the splitter 470 to the combiner 420 of the receiver 140.

In particular embodiment, a PIC 455 may include one or more optical splitters 470, one or more optical combiners 420, or one or more optical modulators 495. The one or more splitters 470, combiners 420, or modulators 495 may be configured to split, combine, or modulate the seed-laser output light 472, seed light 440, LO light 430, emitted pulses of light 400, or received pulses of light 410. In FIG. 34, the optical splitter 470 is an optical-waveguide splitter 470 that splits the seed-laser output light 472 to produce the seed light 440 and the LO light 430. The phase modulator 495 is an integrated-optic phase modulator 495 configured to change the frequency of the seed light 440. The integrated-optic optical combiner 420 in FIG. 34 (which is similar to the combiner 420 illustrated in FIG. 19) combines the input beam 135, which includes the received pulse of light 410, with the LO light 430 and directs combined beam 422a to detector 340a and combined beam 422b to detector 340b.

In particular embodiments, a PIC 455 may include one or more lenses 490 configured to collimate light emitted from the PIC 455 or focus light into the PIC 455. A lens 490 may be attached to, connected to, or integrated with the PIC 455. For example, a lens 490 may be fabricated separately and then attached to the PIC 455 (or to a substrate to which the PIC 455 is attached) using epoxy or solder. The output lens 490a in FIG. 34 may collimate the emitted pulses of light 400 from the SOA 460 to produce a collimated output beam 125. The output beam 125 may be scanned across a field of regard by a scanner 120 (not illustrated in FIG. 34). Light from an emitted pulse of light 400 may be scattered by a target 130, and a portion of the scattered light may be directed to the receiver 140 as a received pulse of light 410. The input lens 490b in FIG. 34 may focus the received pulse of light 410 into a waveguide 479 of the PIC 455, which directs the received pulse of light 410 to the combiner 420. The combiner 420 combines the received pulse of light 410 with the LO light 430, and portions of the received pulse of light 410 and the LO light 430 are coherently mixed at each of the detectors 340a and 340b.

Figure 35:
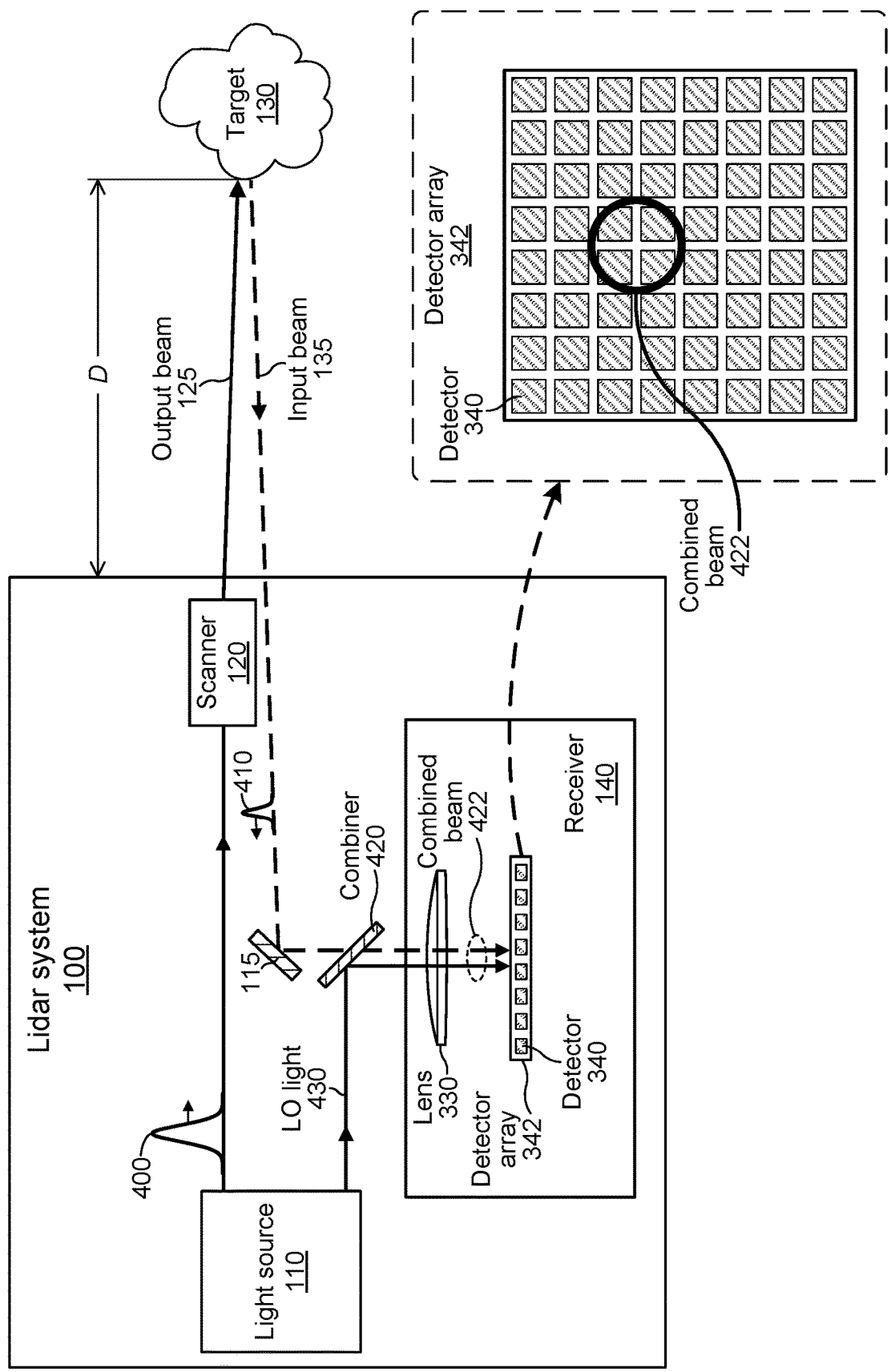
FIG. 35 illustrates an example lidar system with a receiver that includes a detector array.

FIG. 35 illustrates an example lidar system 100 with a receiver 140 that includes a detector array 342. A detector array 342 may include a two-dimensional arrangement of detectors 340. For example, a detector array 342 may include any suitable M×N array of detectors (where M and N are integers), such as for example, a 4×4, 10×10, 50×50, 100×100, 100×500, 200×1,000, or 1,000×1,000 array of detectors 340. The dashed-line inset in FIG. 35 illustrates a top view of an 8×8 detector array 342. Each detector 340 in a detector array 342 may be individually controllable or addressable. For example, the receiver 140 in FIG. 35 may be configured to activate or detect light using only the four detectors that are illuminated by the combined beam 422. The remaining detectors not illuminated by the combined beam 422 may be inactivated, or the photocurrents produced by the remaining detectors may be disregarded. The combined beam 422 may include the input beam 135 and at least a portion of the LO light 430.

Each detector 340 in a detector array 342 may include any suitable type of detector, such as for example, an APD, SPAD, PN photodiode, or PIN photodiode. Additionally, each detector 340 in a detector array 342 may include any suitable combination of one or more of the following elements: silicon (Si), germanium (Ge), tin (Sn), aluminum (Al), indium (In), gallium (Ga), arsenic or arsenide (As), phosphorous or phosphide (P), and antimony or antimonide (Sb). For example, a detector 340 in a detector array 342 may be a PIN photodiode or an APD with an active region or an avalanche-multiplication region that includes silicon, germanium, germanium-silicon (GeSi), germanium-tin (GeSn), germanium-silicon-tin (GeSiSn), InGaAs, InGaAsP, InAsSb, AlAsSb, or AlInAsSb. A GeSi material may be a germanium-silicon alloy represented by $Ge_{1-x}Si_x$, where x is a value from 0 to 1 (e.g., $Ge_{0.3}Si_{0.7}$ when x is 0.7). A GeSiSn material may be a germanium-silicon-tin alloy represented by $Ge_{1-x-y}Si_xSn_y$, where x and y each have a value from 0 to 1 such that 1−x−y is also a value from 0 to 1 (e.g., $Ge_{0.1}Si_{0.85}Sn_{0.05}$ when x is 0.85 and y is 0.05). As another example, one or more of the detectors 340 in a detector array 342 may be a GeSi photodiode that includes any suitable combination of one or more of the following materials: germanium, silicon, and GeSi. A GeSi photodiode may be referred to as a GeSi detector and may be configured to detect light at an operating wavelength of a lidar system 100. A GeSi detector may include a structure with an intrinsic (undoped) germanium or GeSi region located between a p-doped germanium, silicon, or GeSi region on one side and an n-doped germanium, silicon, or GeSi region on the other side. Alternatively, the intrinsic region may include a multiple quantum well with alternating layers of GeSi and silicon. As another example, one or more of the detectors 340 in a detector array 342 may be a GeSiSn photodiode that includes any suitable combination of one or more of the following materials: germanium, silicon, GeSi, GeSn, and GeSiSn. A GeSiSn photodiode may be referred to as a GeSiSn detector and may be configured to detect light at an operating wavelength of a lidar system 100. A GeSiSn detector may include a structure with a GeSiSn region and p-doped and n-doped regions that each include germanium, silicon, GeSi, or GeSiSn.

The detectors 340 in a detector array 342 may include a combination of (i) GeSi or GeSiSn detectors and (ii) silicon detectors. The GeSi or GeSiSn detectors may be configured to detect light at one or more wavelengths between approximately 900 nm and approximately 1700 nm (e.g., light at a 1550-nm operating wavelength of the lidar system 100). The silicon detectors may be configured to detect visible light (e.g., light between approximately 380 nm and approximately 750 nm). The detectors 340 may be arranged in an interlaced or alternating pattern where, for example, one or more GeSi detectors are located between or adjacent to one or more silicon detectors. The GeSi detectors may be configured to detect the LO light 430 and the input beam 135 (which may have a wavelength of 1400-1600 nm), and one or more of the detectors may produce one or more respective photocurrent signals corresponding to the coherent mixing of the LO light 430 and a received pulse of light 410. The silicon detectors may be configured to detect visible light that is emitted, scattered, or reflected by objects located within the FOV of the detector array 342. The visible light may include ambient light (e.g., sunlight) or light produced by other sources (e.g., streetlights or vehicle headlights). The silicon detectors may include optical filters so that each silicon detector detects a particular wavelength range or color of visible light (e.g., red, blue, or green light). The visible light detected by the silicon detectors may be used to produce an image that includes objects located within the FOV of the detector array.

A detector array 342 in a receiver 140 may be front-side illuminated or back-side illuminated. For front-side illumination, the detector array 342 may be oriented so that the combined beam 422 is incident on the top surface of the detectors 340, opposite the detector substrate material. For back-side illumination, the detector array 342 may be oriented so that the combined beam 422 is incident on the substrate material, and the combined beam 422 may travel through the detector substrate material to reach the detectors 340. The substrate material may be substantially transparent to light at the wavelength of the combined beam 422. For example, a detector array 342 that includes GeSi detectors 340 may be grown or fabricated on a silicon substrate, and the silicon substrate may be substantially transparent to light with a 1400-1600 nm wavelength. For back-side illumination, the GeSi detector array 342 may be oriented so that the combined beam 422 is incident on and travels through the silicon substrate to reach the GeSi detectors 340.

A pattern of material may be applied to or removed from a detector array 342 to provide a particular phase shift to light that is incident on each of the detectors 340. For example, a detector array 342 may include an alternating pattern of regions that impart a relative phase shift to incident light of either zero degrees or 90 degrees (which may be expressed respectively as zero radians or π/2 radians). For a front-side illuminated detector array 342, the alternating pattern may be achieved by applying a thin film having different thicknesses to the top surface of the detector array 342. The difference in thickness between two regions may correspond to a 90-degree phase shift (or, a π/2 phase shift). For a back-side illuminated detector array 342, the substrate material (e.g., silicon) may be selectively etched to produce an alternating pattern of different phase shifts. For example, a detector array 342 with GeSi or GeSiSn detectors 340 may be grown or fabricated on a silicon substrate. The refractive index of silicon at 1550 nm is approximately 3.45, and a relative phase shift of 90 degrees for 1550-nm light may be achieved by selectively etching away approximately 158 nm of the silicon substrate material.

The detectors 340 in a detector array 342 may be calibrated to ensure accurate measurement of the energy, power, or intensity of a received pulse of light 410. Each detector 340 may have a slightly different response to received light. For example, the responsivity of the detectors 340 in a detector array 342 may vary by approximately 1%, 5%, 10%, or 20%. Two detectors 340 with respective responsivities of 0.95 A/W and 1.05 A/W may be referred to as having a 10% responsivity variation. To account for a variation in responsivity, the detectors 340 in a detector array 342 may be calibrated. For example, the detectors 340 may be illuminated by calibration light having a known wavelength and optical power. For each detector 340, the electrical signal resulting from the calibration light may be measured, and a corresponding calibration factor may be determined. During operation of the detector array 342, when a particular detector 340 detects a received pulse of light 410, the corresponding calibration factor may be applied to an electrical signal produced by the detector. Calibrating the detectors 340 of a detector array 342 may allow the accurate determination of the energy, power, or intensity of a received pulse of light 410.

A lidar system 100 may include a scanner 120 that scans the output beam 125 across a field of regard (FOR) of the lidar system 100. In particular embodiments, the scanner 120 may only scan the output beam 125 and may not scan the receiver FOV (e.g., the receiver FOV may bypass the scanner 120). In FIG. 35, the output beam 125 is scanned by the scanner 120, and the input beam 135 is directed to the receiver 140 without passing through the scanner 120. Since the scanner 120 only scans the output beam 125, the size of the scanner may be reduced compared to a scanner that scans both the light-source FOV and the receiver FOV. For example, the scanner 120 may include miniature optical scanning components, such as one or more small scanning mirrors, one or more small scanning polygon mirrors, or one or more MEMS-based scanners. The miniature optical scanning components may each have an aperture size of less than or equal to approximately 0.5 mm, 1 mm, 2 mm, or 5 mm.

For a receiver 140 with a detector array 342, the receiver FOV may be static and may not be scanned by the scanner 120. The FOV of the entire detector array 342 may correspond approximately to the field of regard of the lidar system 100, and each detector 340 of the detector array 342 may have a field of view that covers a subsection of the field of regard of the lidar system 100. The input beam 135 may be focused onto the detector array 342 by a lens 330, and at any particular instant of time, the input beam 135 may illuminate a portion of the detectors 340 of the detector array 342. In FIG. 35, the combined beam 422 (which includes the input beam 135 and at least a portion of the LO light 430) illuminates four detectors. As the output beam 125 is scanned across the field of regard of the lidar system 100, the input beam 135 may scan across the detector array 342 in a similar manner. For example, the field of regard may be imaged onto the plane of the detector array, and the input beam 135 may scan across the detector array in a pattern corresponding to the scan pattern 200 of the output beam 125 across the field of regard. The LO light 430 may be configured to illuminate the entire detector array 342, and coherent mixing between the LO light 430 and the input beam 135 may only occur at the portion of the detectors 340 that are illuminated by the input beam 135. In particular embodiments, the receiver 140 may activate only those detectors 340 that are illuminated by the input beam 135, or the receiver 140 may disregard the photocurrents produced by detectors 340 that are not illuminated by the input beam 135. For example, the receiver 140 may measure or process photocurrent signals only from the detectors 340 that are illuminated by the input beam 135. As the input beam 135 scans across the detector array 342, the detectors 340 whose photocurrent signals are measured or processed may be dynamically changed to follow the input beam 135.

Figure 36:
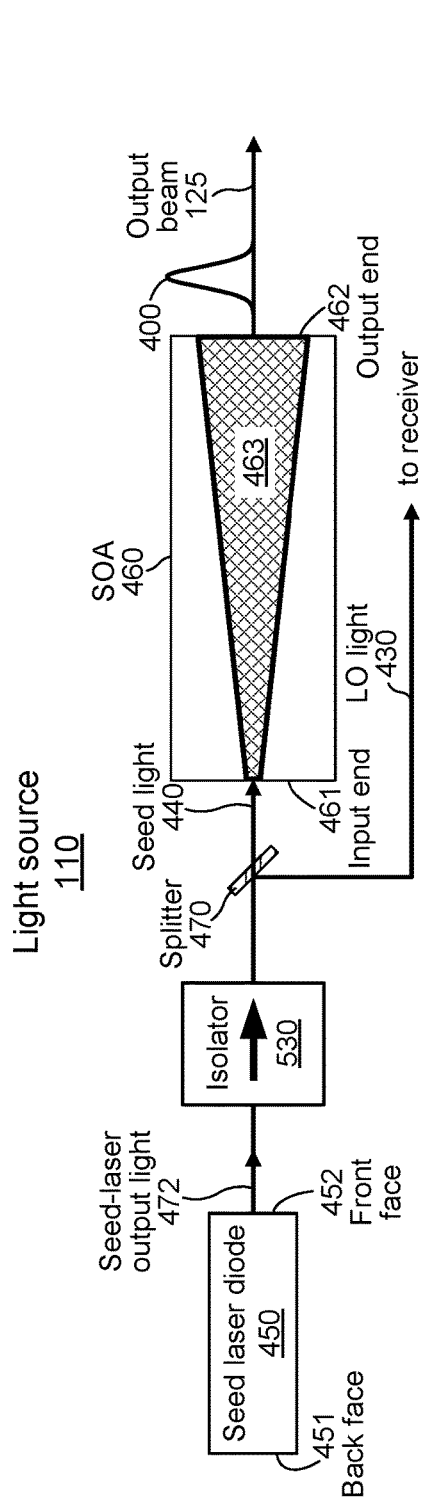
FIG. 36 illustrates an example light source that includes a free-space isolator.

FIG. 36 illustrates an example light source 110 that includes a free-space isolator 530. In particular embodiments, a light source 110 configured to emit an optical signal may include a seed laser diode 450, a semiconductor optical amplifier (SOA) 460, and an optical isolator 530 disposed between the seed laser diode 450 and the SOA 460. The seed laser diode 450 may produce a seed optical signal, and the SOA 460 may amplify the seed optical signal to produce the emitted optical signal. The seed optical signal may include or may be referred to as seed light 440 or seed-laser output light 472, and the seed optical signal may include pulses of light or light having a substantially constant optical power. The emitted optical signal may be referred to as an output beam 125, and the emitted optical signal may include pulses of light 400 (e.g., as illustrated in FIG. 36) or light having a substantially constant optical power. The optical isolator 530 may (i) transmit the seed optical signal to the SOA 460 and (ii) reduce an amount of light that propagates from the SOA 460 toward the seed laser diode 450. An optical isolator 530 may be a free-space isolator, a fiber-optic isolator, an integrated-optic isolator, or any other suitable type of optical isolator.

In particular embodiments, a seed optical signal or an emitted optical signal may include light having a substantially constant optical power. Light that has a substantially constant optical power may refer to light with an optical power that varies by less than a particular amount over any suitable time interval. For example, light with a substantially constant optical power may have an average optical power that varies by less than or equal to 20%, 10%, 1%, 0.5%, or 0.1% over a time interval of approximately $10^4$ s, $10^3$ s, $10^2$ s, 10 s, 1 s, 100 ms, 10 ms, 1 ms, 100 µs, or 10 µs. As another example, a light source 110 that emits an output beam 125 with an optical power that varies between 1 mW and 1.05 mW (which corresponds to a variation in optical power of approximately 5%) over a 60-second time interval may be referred to as a light source 110 that emits an optical signal having a substantially constant optical power. As another example, an electronic driver 480 may supply a seed laser diode 450 with a substantially constant electrical current (e.g., a 100-mA DC current that varies by less than 1% over a 10-second time interval), and the seed laser diode 450 may emit seed light 440 with a substantially constant optical power (e.g., an average optical power of 10 mW with a variation of less than 2% over a 10-second time interval). Light with a substantially constant optical power may include continuous-wave (CW) light or light that does not include pulses of light. In particular embodiments, a seed optical signal or an emitted optical signal may include (i) a first portion with pulses of light and (ii) a second portion of light with a substantially constant optical power. For example, an output beam 125 may include pulses of light as well as light having a substantially constant optical power.

An optical isolator may refer to an optical component configured to transmit light in one direction and block light propagating in the reverse direction. For example, the optical isolator 530 in FIG. 36 may allow the seed-laser output light 472 to pass in the direction of the arrow drawn in the isolator (which may be referred to as a forward direction) and block light propagating in the reverse direction from the SOA 460 toward the seed laser diode 450. An optical isolator 530 may include a Faraday rotator, and the operation of an optical isolator may be based on the Faraday effect where the polarization of light traveling through a Faraday rotator is rotated in the same angular direction (e.g., clockwise or counterclockwise about the longitudinal axis of the rotator) regardless of the direction of travel of the light through the isolator. A Faraday rotator may include a permanent magnet and a magneto-optic material (which may be referred to as a Faraday-rotator material, a gyrotropic material, or a gyromagnetic material). The permanent magnet supplies a static magnetic field to the magneto-optic material, which causes the magneto-optic material to alter the polarization of light traveling through the Faraday rotator. The magneto-optic material of a Faraday rotator may include a terbium-doped glass, a terbium-gallium-garnet ($Tb_3Ga_5O_{12}$, or TGG) crystal, a yttrium-iron-garnet ($Y_3Fe_5O_{12}$, or YIG) crystal, a cerium-doped YIG crystal (Ce:YIG), a bismuth-doped YIG crystal (Bi:YIG), any other suitable Faraday-rotator material, or any suitable combination thereof. An optical isolator 530 that includes a Faraday rotator may be referred to as a Faraday optical isolator, a Faraday isolator, a Faraday-type optical isolator, or a Faraday-type isolator.

In addition to a Faraday rotator, an optical isolator 530 may include one or more polarizers, birefringent wedges, lenses, or wave plates. For example, an optical isolator 530 may include an input polarizer, an output polarizer, and a Faraday rotator located between the two polarizers. The transmission axes of the two polarizers may be oriented at 45 degrees with respect to one another, and the Faraday rotator may be configured to rotate the polarization of light by 45 degrees in a particular direction (e.g., clockwise) regardless of the direction of travel of the light through the rotator. Forward-propagating light with a polarization oriented along the transmit axis of the input polarizer is transmitted through the input polarizer. The Faraday rotator rotates the polarization of the forward-propagating light by +45 degrees, so the polarization is aligned with the transmit axis of the output polarizer. The forward-propagating light is then transmitted through the output polarizer. Backward-propagating light that passes into the optical isolator 530 in the reverse direction first encounters the output polarizer, which polarizes the light along the +45-degree orientation. The rotator then rotates the polarization of the backward-propagating light an additional +45 degrees to a +90-degree orientation. The polarization of the backward-propagating light is then oriented orthogonal to the transmit axis of the input polarizer, and so, the backward-propagating light is blocked by the input polarizer. As another example, an optical isolator 530 may include an input birefringent wedge, an output birefringent wedge, and a Faraday rotator located between the two birefringent wedges. An optical isolator 530 with birefringent wedges may be configured as a polarization independent isolator in which forward-propagating light is transmitted through the isolator regardless of polarization, and backward-propagating light is blocked regardless of its polarization. The birefringent wedges may be configured to impart different lateral or angular offsets to different polarization components (e.g., to horizontal and vertical polarization components). A polarization independent isolator may include an input birefringent wedge that separates an input beam of light into two polarization components that are recombined, after passing through the Faraday rotator, into a single optical beam by an output birefringent wedge. In the reverse direction, the birefringent wedges may impart lateral or angular offsets to backward-propagating light so that the two polarization components are separated and blocked from exiting the isolator.

An optical isolator 530 may transmit light in the forward direction and block light propagating in the reverse direction (e.g., light propagating from a SOA 460 toward a seed laser diode 450). The light propagating from a SOA 460 toward a seed laser diode 450 may be referred to as backward-propagating light, back-propagating light, or back-reflected light. Blocking the light that propagates from the SOA 460 toward the seed laser diode 450 may be referred to as attenuating or reducing the backward-propagating light and may include absorbing, reflecting, filtering, or deflecting the backward-propagating light. Backward-propagating light that is coupled into a seed laser diode 450 may result in damage to the seed laser diode 450 or may destabilize the seed laser diode 450 (e.g., by causing unwanted amplitude or wavelength fluctuations in the light emitted by the seed laser diode 450). An optical isolator 530 may prevent the damage or destabilization associated with backward-propagating light by blocking most of the backward-propagating light (which may prevent most of the backward-propagating light from reaching the seed laser diode 450). Backward-propagating light may arise from one or more of: amplified spontaneous emission (ASE) light produced by a SOA 460, a portion of seed light 440 reflected by an input end 461 of the SOA 460, a portion of seed light 440 reflected by an output end 462 of the SOA 460 (after the seed light 440 has traveled through and been amplified by the SOA 460), and a portion of light from an output beam 125 reflected by an optical element external to the SOA 460. For example, when electrical current is supplied to a SOA 460, the SOA may produce ASE light, and a portion of the ASE light may be coupled into the SOA waveguide 463 and directed toward the seed laser diode 450. As another example, a lens or an input face of an optical fiber located after the SOA 460 may reflect a portion of the light from the output beam 125, and the reflected portion may propagate back through the SOA waveguide 463 toward the seed laser diode 450.

In FIG. 36, the optical isolator 530 transmits the seed-laser output light 472 and blocks backward-propagating light that is directed from the SOA 460 toward the seed laser diode 450. An optical isolator 530 may have an optical transmission of greater than or equal to 70%, 80%, 90%, 95%, or 99% for the forward-propagating seed-laser output light 472 that travels from the seed laser diode 450 and through the optical isolator 530. The optical isolator 530 may reduce the amount of light that propagates from the SOA 460 toward the seed laser diode 450 by absorbing, reflecting, filtering, or deflecting the backward-propagating light. The optical isolator 530 may attenuate the backward-propagating light by any suitable attenuation value, such as for example, by greater than or equal to 10 dB, 20 dB, 30 dB, 40 dB, or 50 dB. The backward-propagating attenuation value of an optical isolator 530 may be referred to as a return loss of the optical isolator 530. An optical isolator 530 may reduce the amount of light that propagates from the SOA 460 toward the seed laser diode 450 by greater than 90% (which corresponds to a return loss of greater than 10 dB). An optical isolator 530 with a return loss of 30 dB corresponds to an optical isolator 530 that reduces the amount of light that propagates from the SOA 460 toward the seed laser diode 450 by 99.9% (e.g., 99.9% of back-propagating light is blocked by the optical isolator 530, and 0.1% of back-propagating light is transmitted through the optical isolator 530).

In particular embodiments, an optical isolator 530 may include two or more optical isolators arranged in series. The overall return loss for the optical isolator 530 may be approximately equal to a sum of return losses for each of the two or more optical isolators. For example, the optical isolator 530 in FIG. 36 may be a dual-stage isolator that includes two optical isolators that each provide a return loss of 25 dB, and the optical isolator 530 may have a total return loss of approximately 50 dB.

In the example of FIG. 36, the optical isolator 530 is a free-space isolator that transmits the seed-laser output light 472 as a free-space optical beam. The seed laser diode 450 and the SOA 460 may be separate devices, and the seed laser diode 450 may emit the seed-laser output light 472 as a free-space beam. The light source 110 may include a collimating lens (not illustrated in FIG. 36), located between the seed laser diode 450 and the isolator 530, that collects and collimates the seed-laser output light 472. For example, the free-space optical isolator 530 in FIG. 36 may have an optical aperture with a 2-mm diameter, and a collimating lens may collimate the seed-laser output light 472 into a free-space beam with a diameter less than or equal to 2 mm. The seed-laser output light 472 is transmitted through the isolator 530, and the light source 110 in FIG. 36 may also include a focusing lens (not illustrated in FIG. 36) located between the isolator 530 and the SOA 460. The focusing lens may focus the seed-laser output light or the seed light 440 into the waveguide 463 of the SOA 460. Back-propagating light (e.g., ASE from the SOA 460 or seed light 440 reflected by the input end 461) that is directed into the isolator 530 as a free-space beam may be blocked by the isolator 530 and prevented from propagating to the seed laser diode 450.

In particular embodiments, the seed-laser output light 472 produced by a seed laser diode 450 may travel through an optical isolator 530 and then be coupled directly into a waveguide 463 of a SOA 460 without passing through an optical splitter. For example, a light source 110 may not include an optical splitter located between the seed laser diode 450 and the SOA 460, and the seed laser diode 450 may emit LO light 430 from the back face 451. Alternatively, a light source 110 may include an optical splitter 470 located between the seed laser diode 450 and the SOA 460. The optical splitter 470 may split off a portion of seed-laser output light 472 to produce LO light 430, and the remaining portion of the seed-laser output light 472 may be sent to the SOA 460. In FIG. 36, a splitter 470 is located between the isolator 530 and the SOA 460 and is configured to split off a portion of the seed-laser output light 472 to produce the LO light 430, which is directed to a receiver (e.g., a receiver 140 of a lidar system 100). The remaining portion of the seed-laser output light 472 passes through the splitter 470 to produce seed light 440, which is coupled into the waveguide 463 of the SOA 460. The seed light 440 (or a temporal portion of the seed light 440) may be amplified while propagating through the waveguide 463 from the input end 461 to the output end 462. The optical splitter 470 in FIG. 36 is a free-space optical splitter that receives the seed-laser output light 472 as a free-space optical beam and produces two free-space optical beams: seed light 440 and LO light 430.

Figure 37:
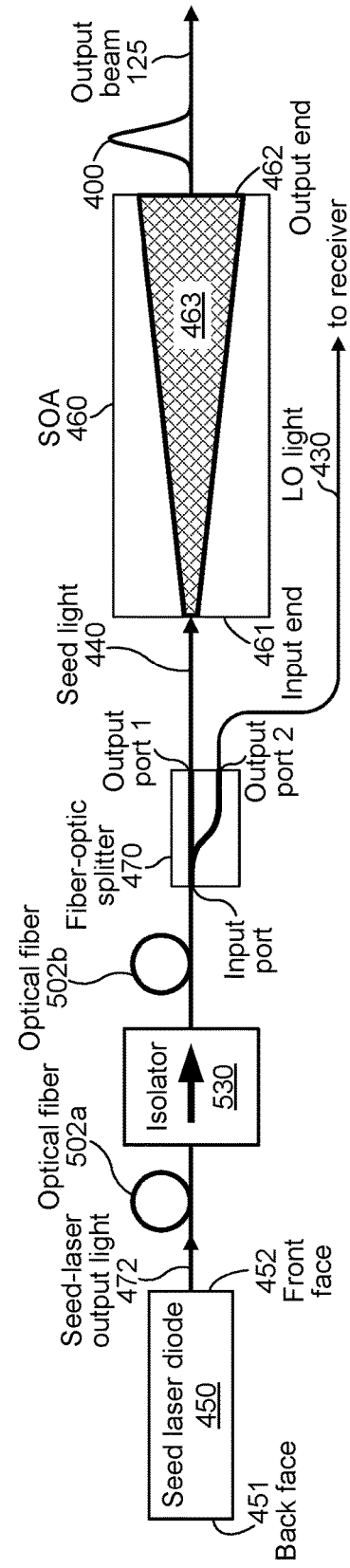
FIG. 37 illustrates an example light source that includes a fiber-optic isolator.

FIG. 37 illustrates an example light source 110 that includes a fiber-optic isolator 530. The fiber-optic isolator 530 in FIG. 37 is located between the seed laser diode 450 and the SOA 460, and the isolator includes an input optical fiber 502a that directs the seed-laser output light 472 from the seed laser diode 450 to the fiber-optic isolator 530. Additionally, the fiber-optic isolator 530 includes an output optical fiber 502b that directs the seed-laser output light 472 to a fiber-optic splitter 470. Each of the optical fibers 502a and 502b may include a passive optical fiber with a fiber-optic core that guides light along the length of the optical fiber. The length of each of the optical fibers 502a and 502b may be approximately 0.1 m, 1 m, 5 m, 10 m, 20 m, or any other suitable length. The fiber-optic isolator 530 may block backward-propagating light that is reflected from or produced by a downstream optical component (e.g., splitter 470 or SOA 460) and prevent the backward-propagating light from reaching the seed laser diode 450.

The optical splitter 470 in FIG. 37 is a fiber-optic splitter that receives the seed-laser output light 472 via optical fiber 502b and splits the seed-laser output light 472 to produce LO light 430 and seed light 440. The optical splitter 470 splits off a portion of seed-laser output light 472 to produce the LO light 430, and the remaining portion of the seed-laser output light 472 is sent to the SOA 460 as seed light 440. The seed light 440 may be directed from output port 1 of the splitter 470 to the input end 461 of the SOA 460 via an optical fiber or an optical waveguide that is part of a PIC 455. Similarly, the LO light 430 may be directed from output port 2 of the splitter to a receiver (e.g., a receiver 140 of a lidar system 100) via an optical fiber or an optical waveguide. For example, an optical fiber may direct the seed light 440 from output port 1 to the SOA 460 and may directly couple the seed light 440 into the SOA waveguide 463 (e.g., one end of the optical fiber may be affixed to the input end 461 of the SOA 460). In particular embodiments, a fiber-optic isolator 530 and a fiber-optic splitter 470 may be combined into a single optical component having one input optical fiber 502a and two output optical fibers. One output optical fiber may direct the seed light 440 to the SOA 460, and the other output optical fiber may direct the LO light 430 to a receiver.

In particular embodiments, the seed-laser output light 472 produced by a seed laser diode 450 may travel through a fiber-optic isolator 530 and then be coupled directly into a waveguide 463 of a SOA 460 without passing through an optical splitter. For example, a light source 110 may not include an optical splitter located between the seed laser diode 450 and the SOA 460, and the seed laser diode 450 may emit LO light 430 from the back face 451. The output optical fiber 502b may direct seed light 440 from the fiber-optic isolator 530 to the SOA 460 without passing through an optical splitter. Alternatively, a light source 110 may include an optical splitter 470 located between the seed laser diode 450 and the SOA 460. In FIG. 37, a fiber-optic splitter 470 is located between the fiber-optic isolator 530 and the SOA 460 and is configured to split off a portion of the seed-laser output light 472 to produce the LO light 430. The remaining portion of the seed-laser output light 472, which corresponds to the seed light 440, is directed into the waveguide 463 of the SOA 460.

Figure 38:
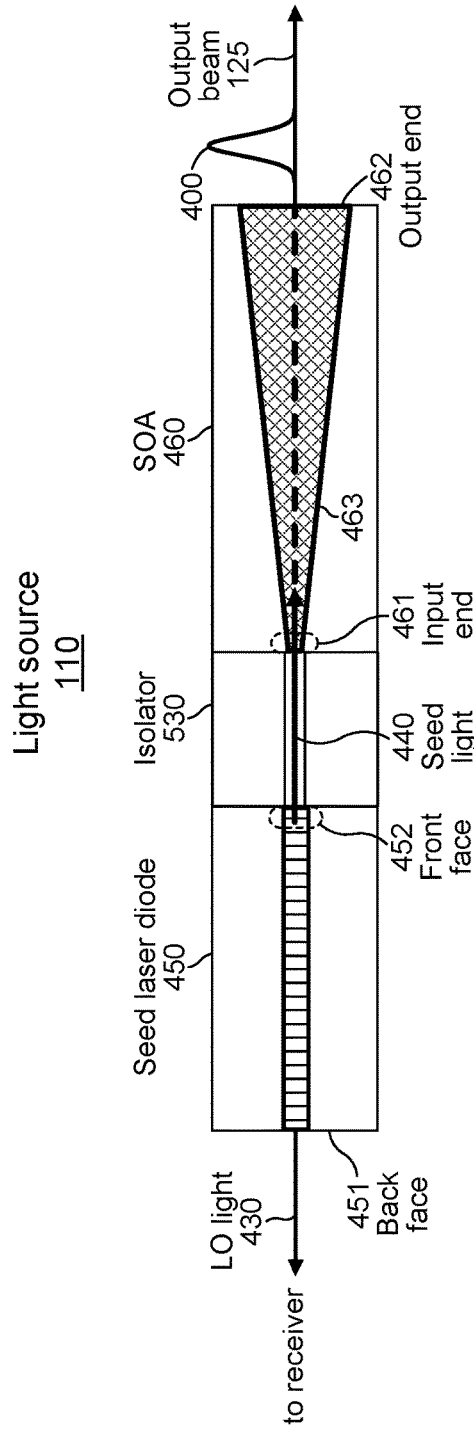
FIG. 38 illustrates an example light source that includes an integrated-optic isolator.

FIG. 38 illustrates an example light source 110 that includes an integrated-optic isolator 530. In particular embodiments, a light source 110 may include an integrated-optic isolator 530 located between a seed laser diode 450 and a SOA 460. The integrated-optic isolator 530 may transmit seed light 440 and block backward-propagating light (e.g., seed light 440 reflected from the input end 461 or output end 462 of the SOA 460). The integrated-optic isolator 530 may include one or more optical waveguides, one or more Faraday-rotator materials, or one or more permanent magnets. The seed laser diode 450 may (i) emit LO light 430 from a back face 451 and (ii) emit seed light 440 from a front face 452. The integrated-optic isolator 530 may include one or more optical waveguides that receive the seed light 440 from the seed laser diode 450 and couple the seed light 440 into the SOA waveguide 463. Additionally, the integrated-optic isolator 530 may include (i) one or more Faraday-rotator materials (e.g., terbium-doped glass, TGG crystal, YIG crystal, Ce:YIG crystal, or Bi:YIG crystal) located within or adjacent to the one or more optical waveguides and (ii) one or more permanent magnets located near each of the Faraday-rotator materials.

In particular embodiments, an integrated-optic isolator 530 may include an input polarizer, an output polarizer, a waveguide, a permanent magnet, and a Faraday-rotator material. The optical waveguide may direct the seed light 440 through the isolator, and the Faraday-rotator material may be located between the two polarizers and located within or adjacent to the optical waveguide. The two polarizers may be oriented at 45 degrees with respect to one another, and the Faraday-rotator material may be configured to rotate the polarization of light by 45 degrees in a particular direction, regardless of the direction of travel of light through the rotator.

In particular embodiments, an integrated-optic isolator 530 may include a Faraday-rotator material located within or adjacent to a waveguide of the isolator, and the isolator may be configured to only alter the polarization of backward-propagating light. The integrated-optic isolator 530 may preserve the polarization of the forward-propagating seed light 440 so that the polarization of the seed light that exits the isolator 530 and is coupled into the SOA waveguide 463 is the same as the polarization of the seed light emitted by the seed laser diode 450. Additionally, the integrated-optic isolator 530 may rotate the polarization of backward-propagating light by 90 degrees so that the polarization of seed light reflected by the input end 461 or output end 462 of the SOA 460 is rotated to be orthogonal to the seed light 440 emitted by the seed laser diode 450. The back-reflected seed light may not destabilize the seed laser diode 450 since its polarization is orthogonal to that of the emitted seed light 440. Additionally or alternatively, the integrated-optic isolator 530 or the seed laser diode 450 may include a waveguide that does not support the propagation of the orthogonal polarization of light. For example, the forward-propagating seed light 440 may propagate in the waveguide, but the backward-propagating orthogonally polarized light may not propagate in the waveguide and may be radiated out of the waveguide.

In particular embodiments, an integrated-optic isolator 530 may include a Mach-Zehnder waveguide interferometer in which forward-propagating light that travels through the two waveguide arms of the interferometer remains in phase and is constructively recombined at the output of the isolator. The forward-propagating seed light 440 from the seed laser diode 450 may be split into two parts that propagate along the two waveguides of the Mach-Zehnder interferometer. The two parts are constructively recombined (e.g., they are added together in-phase) to produce the seed light 440 that is coupled into the SOA 460. Backward-propagating light that travels in the reverse direction through the two arms of the interferometer experiences a relative phase shift of 180 degrees and is destructively recombined at the input of the isolator. For example, seed light 440 that is reflected from the input end 461 of the SOA 460 is split into two parts and then destructively recombined (e.g., added together out of phase with a 180-degree phase shift) so that little or none of the backward-propagating seed light is coupled into the seed laser diode 450. Each waveguide arm of the interferometer may have a Faraday-rotator material located within or adjacent to the waveguide, and two magnets may apply magnetic fields in opposite directions to the two Faraday-rotator materials.

Figure 39:
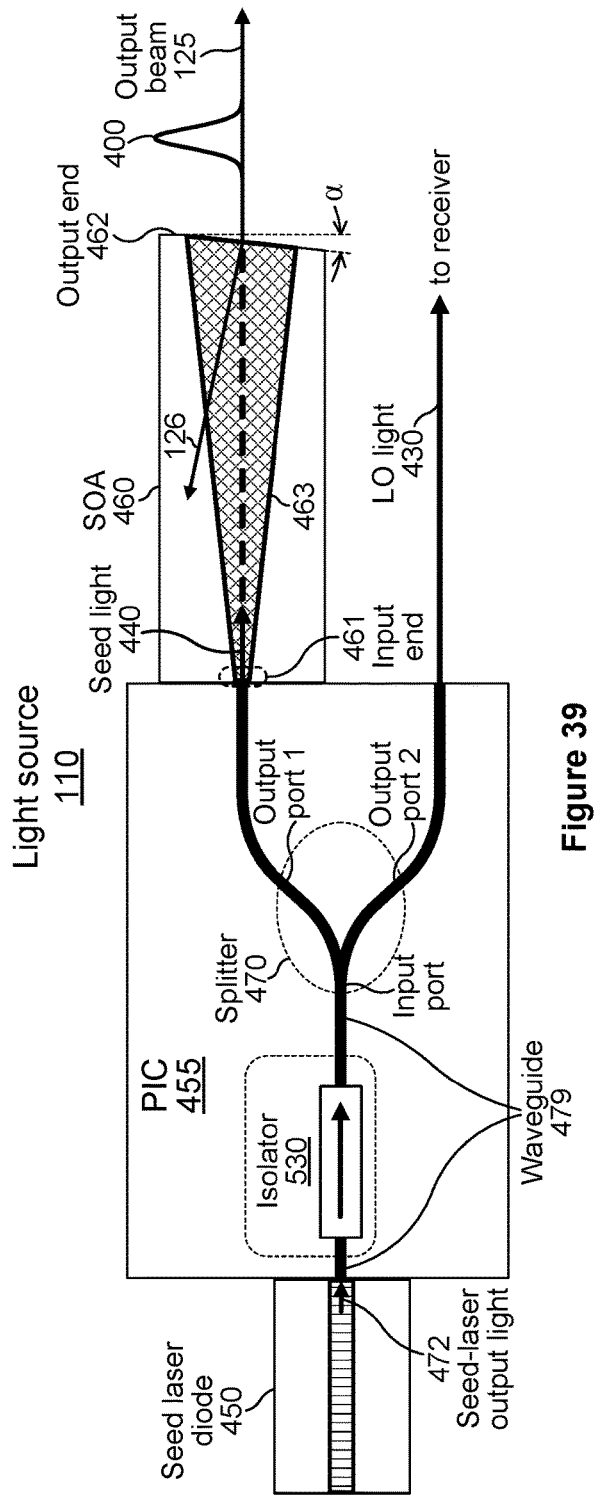
FIG. 39 illustrates an example light source with a photonic integrated circuit (PIC) that includes an integrated-optic isolator.

FIG. 39 illustrates an example light source 110 with a photonic integrated circuit (PIC) 455 that includes an integrated-optic isolator 530. The integrated-optic isolator 530 transmits the seed-laser output light 472 and may block backward-propagating light (e.g., back-reflected seed-laser output light 472, seed light 440, or LO light 430). As illustrated in FIG. 38, the front face 452 of a seed laser diode 450 may be directly attached to an integrated-optic isolator 530 so that the seed-laser output light 472 is directly coupled into a waveguide of the isolator. Alternatively, as illustrated in FIG. 39, a PIC 455 may include an optical waveguide 479 that conveys the seed-laser output light 472 to the integrated-optic isolator 530. After passing through the integrated-optic isolator 530, the seed-laser output light 472 is conveyed to the integrated-optic splitter 470 by another waveguide 479.

In particular embodiments, a light source 110 with an integrated-optic isolator 530 may not include an optical splitter located between a seed laser diode 450 and SOA 460. The seed-laser output light 472 produced by a seed laser diode 450 may travel through an integrated-optic isolator 530 and then may be coupled into a waveguide 463 of a SOA 463 without passing through an optical splitter. For example, seed light 440 may be conveyed from the isolator 530 to the SOA waveguide 463 by an optical waveguide 479 that does not pass through an optical splitter. Alternatively, as illustrated in FIG. 38, an integrated-optic isolator 530 may be directly attached to the input end 461 of the SOA 463 so that the seed light 472 is directly coupled from the isolator into the SOA waveguide 463. Additionally, the seed laser diode 450 may emit LO light 430 from the back face 451.

In particular embodiments, a light source 110 with a PIC 455 may include an integrated-optic splitter 470 located between the seed laser diode 450 and the SOA 460. In the example of FIG. 39, the integrated-optic splitter 470 is located between the isolator 530 and the SOA 460. The optical splitter 470 splits off a portion of the seed-laser output light 472 to produce LO light 430, which is directed to a receiver (e.g., a receiver 140 of a lidar system 100) via output port 2 of the splitter. The remaining portion of the seed-laser output light 472 (which corresponds to seed light 440) is sent to the SOA 460 via output port 1.

In particular embodiments, an output end 462 of a SOA 460 may include an anti-reflection (AR) coating. For example, the output end 462 of a SOA 460 in any of FIGS. 36-39 may have a dielectric coating deposited onto it that reduces the reflectivity of the output end 462 at a wavelength of the output beam 125. An output end 462 without an AR coating may have a reflectivity of approximately 30%. An AR coating may reduce the reflectivity of the output end 462 at a wavelength of the output beam 125 to less than or equal to approximately 5%, 2%, 0.5%, 0.1%, or any other suitable reflectivity value. For example, the output beam 125 may include pulses of light 440 having a center wavelength of approximately 1550 nm, and the output end 462 of the SOA 463 may have an AR coating that provides a reflectivity of less than 0.5% at 1550 nm. Having an AR coating on the output end 462 may reduce the amount of amplified seed light 440 that is reflected from the output end 462 back toward the seed laser diode 450. Reducing the amount of light back-reflected from the output end 462, along with having an optical isolator 530 located between the seed laser diode 450 and the SOA 460, may help to prevent destabilization of (or damage to) the seed laser diode 450.

In particular embodiments, a SOA 460 may have an output end 462 that is angled. In each of FIGS. 38 and 39, the seed light 440 is amplified as it travels through the waveguide 463 from the input end 461 to the output end 462 along a path represented by the dashed line in the waveguide 463. For a SOA 460 with an angled output end 462, the amplified seed light 440 has a nonzero angle of incidence on the output end 462. The angle of incidence corresponds to the angle the amplified seed light 440 makes with a line perpendicular to the output end 462. The SOA 460 or the output end 462 in FIG. 38 may be referred to as not being angled or as having a tilt angle of zero degrees, and the amplified seed light 440 is incident on the output end 462 with an angle of incidence of zero degrees. The SOA 460 or the output end 462 in FIG. 39 may be referred to as being angled or as having a nonzero tilt angle ($\alpha$), and the amplified seed light 440 is incident on the output end 462 with a nonzero angle of incidence. The angle of incidence of the amplified seed light 440 may be approximately equal to the tilt angle $\alpha$. For example, the tilt angle $\alpha$ in FIG. 39 is approximately 6°, and the angle of incidence of the amplified seed light 440 on the output end 462 is approximately 6°. The tilt angle $\alpha$ of an output end 462 (and the associated angle of incidence of the amplified seed light 440) may have an angular value of greater than or equal to 0.1°, 0.5°, 1°, 2°, 5°, or 10°, or any other suitable angular value between approximately 0.1° and approximately 10°.

In particular embodiments, a SOA 460 with an output end 462 that is angled may reduce the amount of amplified seed light 440 that is reflected from the output end 462 back toward the seed laser diode 450. In FIG. 38, since the output end 462 is not angled, the amplified seed light that is reflected from the output end 462 may be directed along the dashed line back toward the seed laser diode 450. In FIG. 39, since the output end 462 is angled, the back-reflected amplified seed light 126 is directed at an angle with respect to the dashed line. This off-axis reflection of the amplified seed light 126 reduces or eliminates the amount of amplified seed light 440 that is reflected from the output end 462 and subsequently propagates along the waveguide back toward the input end 461 (and then back toward the seed laser diode 450). The back-reflected amplified seed light 126 may be directed out of the waveguide 463 or away from the input end 461 so that most of the back-reflected amplified seed light 126 does not propagate back toward the seed laser diode 450. Reducing the amount of back-reflected amplified seed light 126 that propagates back toward the seed laser may help to prevent destabilization of (or damage to) the seed laser diode 450.

In particular embodiments, a light source 110 that is configured to reduce the amount of backward-propagating light directed to a seed laser diode 450 may include one or more of the following: an optical isolator 530 located between the seed laser diode 450 and SOA 460; a SOA with an AR coating on the output end 462; and a SOA with an angled output end 462. For example, in addition to having an optical isolator 530 located between the seed laser diode 450 and SOA 460, the SOA 460 of any of the light sources 110 illustrated in FIGS. 36-39 may also include (i) an AR coating on the output end 462 or (ii) an angled output end 462. Reducing the amount of backward-propagating light may include reducing, by a particular amount, the amplified seed light 440 that is reflected from the output end 462 back toward the seed laser diode 450. For example, an AR coating on the output end 462 of a SOA 460 may reduce the amount of amplified seed light 440 that is reflected from the output end 462 by greater than or equal to 70%, 90%, 95%, 99%, or any other suitable percentage. An output end 462 without an AR coating may reflect approximately 30% of amplified seed light 440, and an AR coating may reduce the reflectivity of the output end 462 at a wavelength of the amplified seed light 440 to less than 1%. Reducing the reflectivity from 30% to 1% corresponds to a greater-than 96% reduction in the amount of amplified seed light 440 that is reflected from the output end 462. As another example, an angled output end 462 may direct greater than 70%, 90%, 95%, 99%, or any other suitable percentage of back-reflected amplified seed light 126 away from the input end 461. Directing greater than 90% of the back-reflected amplified seed light 126 away from the input end 461 corresponds to a greater-than 90% reduction in the amount of amplified seed light 440 that is reflected from the output end 462 and subsequently propagates toward the input end 461.

Figure 40:
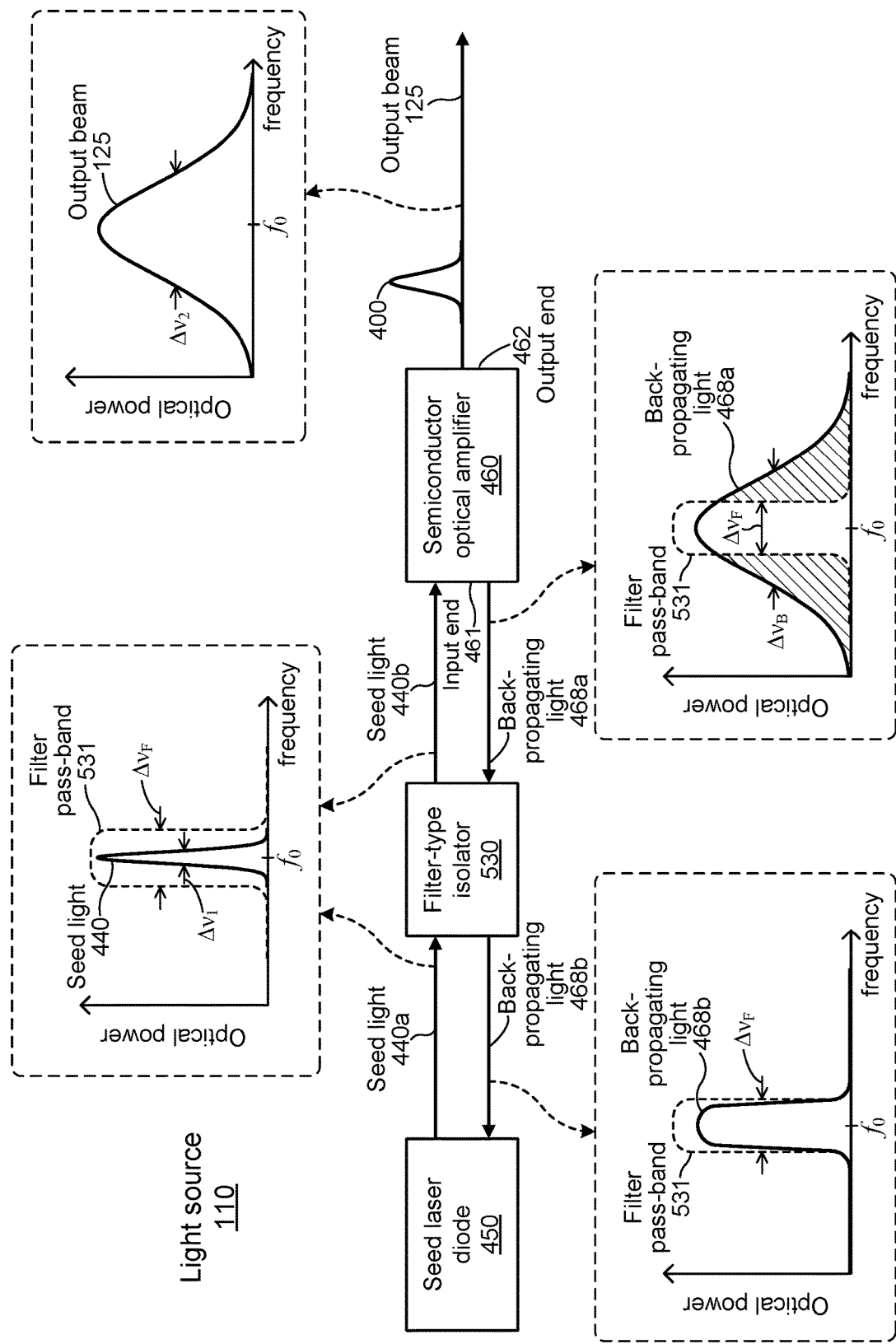
FIG. 40 illustrates an example light source with a filter-type isolator.

FIG. 40 illustrates an example light source 110 with a filter-type isolator 530. In particular embodiments, an optical isolator 530 may include a Faraday-type isolator in which light passes in one direction through the isolator and is blocked or attenuated when propagating in the opposite direction. Additionally or alternatively, an optical isolator 530 may include a filter-type isolator with an optical filter that filters the optical spectrum of light traveling through the isolator in both the forward and backward directions. Forward-propagating seed light 440*a* may have a relatively narrow spectral linewidth ($\Delta v_1$) and thus may pass through a filter-type isolator with minimal attenuation. Backward-propagating light 468*a* may have a relatively broad spectral linewidth ($\Delta v_B$) and may be substantially blocked by a filter-type isolator. An optical isolator 530 may include a Faraday-type isolator, a filter-type isolator, or both a Faraday-type isolator and a filter-type isolator. Each of the optical isolators 530 in FIGS. 36-40 may include a Faraday-type isolator, a filter-type isolator, or both a Faraday-type isolator and a filter-type isolator. A filter-type isolator 530 may be a free-space isolator, a fiber-optic isolator, an integrated-optic isolator, or any other suitable type of optical isolator.

In particular embodiments, a filter-type isolator 530 may include an absorptive filter, dichroic filter, long-pass filter, short-pass filter, band-pass filter, notch filter, Bragg grating, or fiber Bragg grating. For example, a light source 110 may include an integrated-optic isolator 530 (e.g., as illustrated in FIGS. 38-39), and the isolator may include a waveguide optical filter with a Bragg grating located within or adjacent to a waveguide of the isolator. As another example, a light source 110 may include a fiber-optic isolator 530 (e.g., as illustrated in FIG. 37), and the isolator may include an optical fiber with a fiber Bragg grating located within or adjacent to a core or cladding of the optical fiber. A Bragg grating may have a refractive index that varies along the length of a waveguide or optical fiber, and the refractive-index variation may act as a band-pass optical filter that transmits light over a particular optical pass-band 531. Light outside of the optical pass-band 531 may be blocked (e.g., reflected, absorbed, or deflected) by the Bragg grating. An optical filter that is part of a filter-type isolator 530 may be similar to the optical filter 560 as described herein. A filter-type isolator 530 may include an optical band-pass filter having an optical-filter pass-band 531 with a particular optical pass-band width $\Delta V_F$. The width $\Delta V_F$ of the filter pass-band 531 may have any suitable value between approximately 500 kHz and approximately 10 GHz, such as for example, a pass-band width of approximately 500 kHz, 1 MHz, 5 MHz, 10 MHz, 50 MHz, 100 MHz, 500 MHz, 1 GHz, or 10 GHz. Additionally, the filter pass-band 531 may be approximately centered at the wavelength (or, equivalently, the optical frequency) of the seed light 440.

FIG. 40 includes four frequency-domain graphs illustrating example optical spectra of seed light 440, output beam 125, and back-propagating light 468 before and after passing through the filter-type isolator 530. The seed light 440a and the back-propagating light 468b (which in FIG. 40 are separated laterally for clarity) may be coaxial with opposite directions of propagation. Similarly, the seed light 440b and the back-propagating light 468a (which in FIG. 40 are also separated laterally for clarity) may be coaxial with opposite directions of propagation. The seed light 440 has a center optical frequency of $f_0$ and a relatively narrow spectral linewidth of $\Delta v_1$. For example, the spectral linewidth $\Delta v_1$ of the seed light 440 may be less than or equal to 100 kHz, 0.5 MHz, 1 MHz, 3 MHz, 5 MHz, 10 MHz, or 50 MHz. The output beam 125, which includes pulses of light 400, has the same center frequency $f_0$ and a broader spectral linewidth of $\Delta v_2$. For example, the output beam 125 may have a spectral linewidth $\Delta v_2$ of less than or equal to 10 MHz, 50 MHz, 100 MHz, 200 MHz, 300 MHz, 500 MHz, 1 GHz, or 10 GHz. As another example, the seed light 440 may have a spectral linewidth $\Delta v_1$ of approximately 1 MHz, and the output beam 125 may have a spectral linewidth $\Delta v_2$ of approximately 200 MHz.

The filter-type isolator 530 in FIG. 40 has a filter pass-band 531 with an optical pass-band width $\Delta V_F$ that is (i) larger than the spectral linewidth $\Delta v_1$ of the seed light 440 and (ii) approximately centered at the optical frequency $f_0$ of the seed light 440. For example, the spectral linewidth $\Delta v_1$ of the seed light 440 may be approximately 2 MHz, and the filter width $\Delta V_F$ may be approximately 8 MHz. The optical spectrum of the seed light 440b after passing through the filter-type isolator 530 is approximately the same as the optical spectrum of the seed light 440a that enters the isolator. Since the pass-band width $\Delta V_F$ is larger than the spectral linewidth $\Delta v_1$ of the seed light 440, the seed light 440 propagates through the filter-type isolator 530 with little or no attenuation or change to its optical spectrum.

The back-propagating light 468a in FIG. 40 may include one or more of: ASE light produced by the SOA 460, seed light 440b reflected by the input end 461, amplified seed light reflected by the output end 462, and light from the output beam 125 reflected by an optical element external to the SOA 460. For example, the back-propagating light 468a may include amplified seed light reflected by the output end 462 of the SOA and may have spectral linewidth $\Delta V_B$ approximately equal to the spectral linewidth $\Delta v_2$ of the output beam 125. As another example, the back-propagating light 468a may include ASE produced by the SOA 460 and may have a spectral linewidth $\Delta V_B$ greater than the spectral linewidth $\Delta v_2$ of the output beam 125. The back-propagating light 468a in FIG. 40 has a spectral linewidth $\Delta V_B$ that is greater than the width $\Delta v_F$ of the filter pass-band 531. The portions of the back-propagating light 468a with spectral components outside of the filter pass-band 531 (corresponding to the portions with hatched lines) are blocked by the isolator. After propagating through the filter-type isolator 530, the back-propagating light 468b has a spectral linewidth that is reduced to approximately equal to the width $\Delta V_F$ of the filter pass-band 531. The filter-type isolator 530 is configured to transmit most of the seed light 440a (e.g., greater than 90% of the seed light 440a) and block spectral components of the back-propagating light 468a that are outside the filter pass-band 531. For example, if the width $\Delta V_F$ of the filter pass-band 531 is approximately 20 MHz, and the back-propagating light 468a has a spectral linewidth $\Delta V_B$ of approximately 200 MHz, then the filter-type isolator 530 may block approximately 90% of the back-propagating light 468a.

In particular embodiments, a width $\Delta V_F$ of an optical-filter pass-band 531 may be (i) greater than a spectral linewidth of a single longitudinal mode of seed light 440 or seed-laser output light 472 and (ii) less than 1, 2, 3, 5, 10, or 20 times the spectral linewidth $\Delta v_2$ of the output beam 125. For example, the light emitted by a seed laser diode 450 may include one or more longitudinal modes, each longitudinal mode having a spectral linewidth of approximately 1 MHz, and the pass-band width $\Delta V_F$ may be greater than 1 MHz. As another example, the spectral linewidth $\Delta v_1$ of the seed light 440 may be greater than or equal to the spectral linewidth of a single longitudinal mode of the seed laser diode 450, and the pass-band width $\Delta V_F$ may be greater than $\Delta v_1$. As another example, the pass-band width $\Delta V_F$ may be less than the spectral linewidth $\Delta v_2$ of the output beam 125. As another example, the pass-band width $\Delta V_F$ may be less than two times the spectral linewidth $\Delta v_2$ of the output beam 125.

Figure 41:
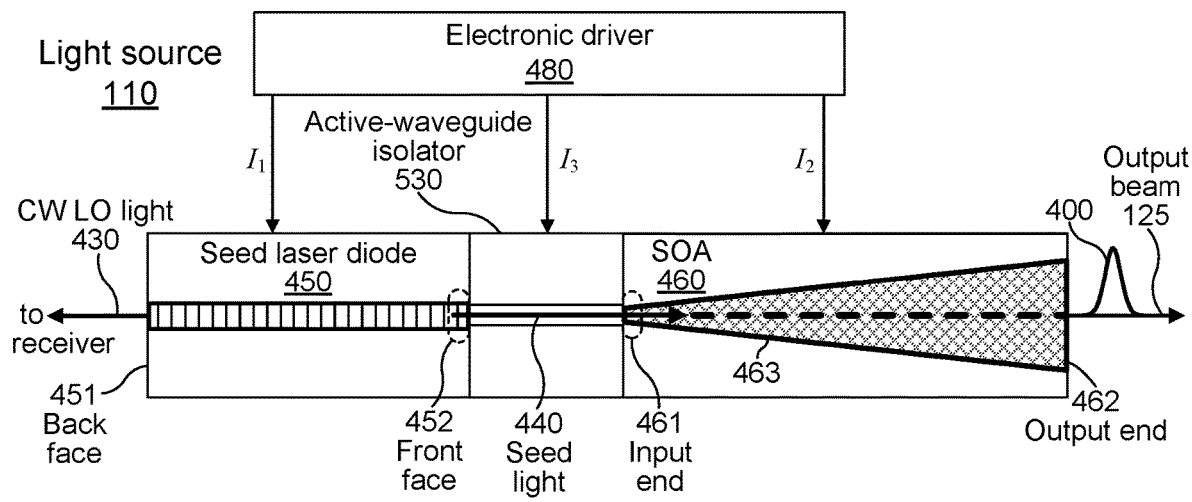
FIG. 41 illustrates an example light source with an active-waveguide isolator.

FIG. 41 illustrates an example light source 110 with an active-waveguide isolator 530. An active-waveguide isolator 530, which may be referred to as an active optical waveguide or an active optical-waveguide isolator, may include an optical waveguide and may be configured to receive an electrical current $I_3$ from an electronic driver 480. The optical waveguide may guide seed light 440 or seed-laser output light 472 received from a seed laser diode 450 and, depending on the amount of electrical current $I_3$ supplied by the electronic driver 480, the optical waveguide may transmit or absorb the seed light 440. When the electrical current $I_3$ exceeds a particular value (which may be referred to as the transparency current), the optical waveguide of the active-waveguide isolator 530 may be optically transparent or transmissive to light at the wavelength of the seed light 440. The electronic driver 480 in FIG. 41 may supply pulses of electrical current $I_3$ to the active-waveguide isolator 530, and each pulse of current may cause the active-waveguide isolator 530 to transmit a temporal portion 441 of the seed light 440 to the SOA 400. Additionally, between successive pulses of current, the active-waveguide isolator 530 may be optically absorbing (e.g., the active optical waveguide may absorb light at the wavelength of the seed light 440).

The optical waveguide of an active-waveguide isolator 530 may be made from a semiconductor material (e.g., InGaAsP) that is configured to be optically absorbing at the wavelength of the seed light 440 when the isolator current $I_3$ is less than the transparency current. For example, when the isolator current $I_3$ is zero amperes, the optical waveguide of the active-waveguide isolator 530 may have an optical absorption of greater than approximately 10 dB, 20 dB, 30 dB, 40 dB, or 50 dB. When a particular isolator current $I_3$ is supplied to the optical waveguide, the active-waveguide isolator 530 may have an optical absorption of approximately 0 dB, which corresponds to the optical waveguide being transparent (e.g., the seed light 440 is transmitted through the optical waveguide without any optical absorption). The particular current that results in a 0-dB optical absorption may be referred to as a transparency current. For isolator currents $I_3$ greater than the transparency current, the active-waveguide isolator 530 may act as an optical amplifier and may amplify the seed light 440 that travels through the optical waveguide. For example, for a particular isolator current $I_3$ greater than the transparency current, the active-waveguide isolator 530 may have an optical absorption of −3 dB at the wavelength of the seed light 440 (which corresponds to an optical gain of +3 dB). When the active-waveguide isolator 530 is supplied with an isolator current $I_3$ greater than or equal to the transparency current, the optical waveguide may transmit the seed light 440 from the seed laser diode 450 to the SOA 460. When the isolator current his less than the transparency current, the optical waveguide may absorb most or all of the seed light 440. For example, if the wavelength of the seed light 440 is 1550 nm, then when the isolator current $I_3$ is less than the transparency current, the optical waveguide may absorb light over a wavelength range from less than 1400 nm to greater than 1600 nm. As another example, if the optical absorption of the active-waveguide isolator 530 is greater than 20 dB when the isolator current $I_3$ is zero amperes, then the optical waveguide of the isolator 530 may absorb greater than 99.9% of the seed light 440 (and less than 0.1% of the seed light 440 may be transmitted to the SOA 460). Additionally, the optical waveguide may absorb most or all of other light that may be present (e.g., back-reflected seed light or ASE light produced by the SOA 460). Since the wavelength range of ASE light may coincide with the wavelength of the seed light 440, the optical waveguide may also absorb greater than 99.9% of backward-propagating ASE light produced by the SOA 460. By absorbing back-reflected seed light or ASE light, the active-waveguide isolator 530 may reduce the amount of light that propagates from the SOA 460 toward the seed laser diode 450, which may prevent damage to or destabilization of the seed laser diode 450 associated with backward-propagating light.

Figure 42:
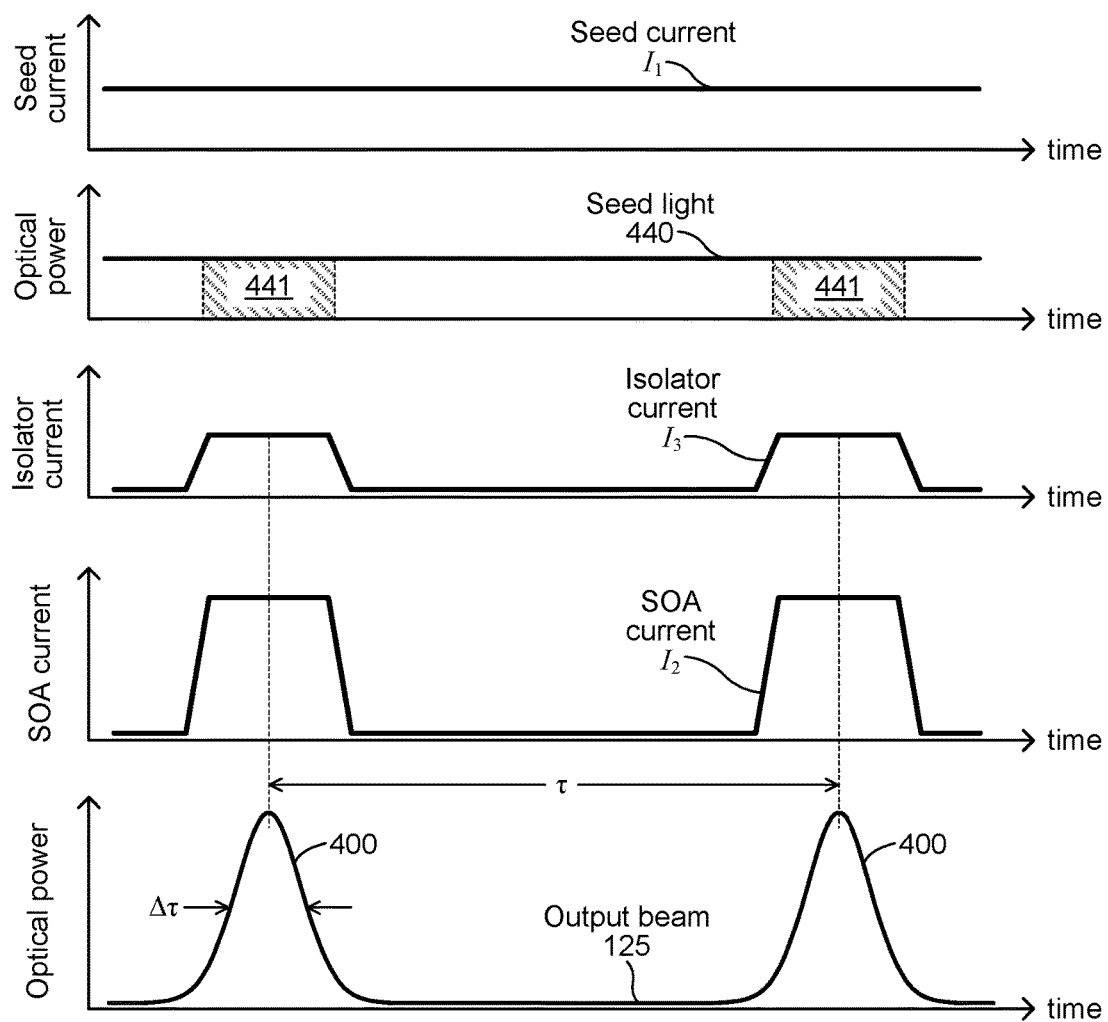
FIG. 42 illustrates example graphs of seed current ($I_1$), seed light, isolator current ($I_3$), SOA current ($I_2$), and emitted optical pulses.

FIG. 42 illustrates example graphs of seed current ($I_1$), seed light 440, isolator current (h), SOA current (h), and emitted optical pulses 400. The seed current $I_1$ supplied to the seed laser diode 450 is a substantially constant DC electrical current, and the seed light 440 and LO light 430 may each include CW light or light having a substantially constant optical power. Alternatively, the electronic driver 480 may supply a modulated or time-varying seed current $I_1$ that results in an offset or modulation of the frequency or amplitude of the seed light 440 produced by the seed laser diode 450. The isolator current $I_3$ and the SOA current $I_2$ supplied by the electronic driver 480 each includes pulses of current, and the output beam 125 includes pulses of light 400. Each pulse of SOA current $I_2$ supplied to the SOA 460 may cause the SOA 460 to amplify a temporal portion 441 of the seed light 440 to produce an emitted pulse of light 400. Additionally, the pulses of isolator current $I_3$ and the pulses of SOA current $I_2$ supplied by the electronic driver 480 may be supplied synchronously. For example, the pulses of isolator current $I_3$ and the pulses of SOA current $I_2$ may be supplied at the same time (e.g., coincident with one another), at the same frequency, or at the same pulse period $\tau$. In the example of FIG. 42, the pulses of current $I_2$ and $I_3$ are applied with approximately the same pulse period $\tau$ (which corresponds to the frequency of the applied pulses of current being approximately equal). Applying the pulses of current $I_2$ and $I_3$ synchronously allows a temporal portion 441 of the seed light 440 to be transmitted by the active-waveguide isolator 530 and subsequently amplified by the SOA 460 to produce an emitted pulse of light 400.

The pulses of current $I_2$ and $I_3$ may be supplied synchronously, and the pulses of current may have approximately the same duration or may have different durations. For example, pulses of current $I_2$ and $I_3$ may both have a duration of approximately 5 ns, and the emitted optical pulses may have a duration $\Delta\tau$ of approximately 4 ns. As another example, the pulses of isolator current $I_3$ may have a longer or shorter duration than the pulses of SOA current $I_2$. The pulses of isolator current $I_3$ may have an 8-ns duration, the pulses of SOA current $I_2$ may have a 6-ns duration, and the emitted optical pulses may have a duration $\Delta\tau$ of approximately 5 ns. The rising or falling edges of the pulses of current $I_2$ and $I_3$ may be coincident with one another or may occur at different times. For example, the rising edges of the pulses of isolator current $I_3$ may precede the corresponding rising edges of the pulses of SOA current $I_2$. The pulses of isolator current $I_3$ may have a 6-ns duration, and the pulses of SOA current $I_2$ may have a 5-ns duration. In this case, the rising edges of the pulses of isolator current $I_3$ may precede the corresponding rising edges of the pulses of SOA current $I_2$ by approximately 1 ns. Additionally, the falling edges of the pulses of isolator current $I_3$ may be approximately coincident with the falling edges of the pulses of SOA current $I_2$.

An optical isolator 530 may include a Faraday-type isolator, a filter-type isolator, an active-waveguide isolator, or any suitable combination thereof. Each of the optical isolators 530 in FIGS. 36-41 may include one or more of a Faraday-type isolator, a filter-type isolator, and an active-waveguide isolator. For example, in addition to the active-waveguide isolator 530, the light source 110 in FIG. 41 may also include a Faraday-type isolator or a filter-type isolator.

A light source 110 that includes a seed laser diode 450 that produces seed light 440 that is amplified by a SOA 460 may be referred to as a master-oscillator power-amplifier light source (MOPA light source) or a MOPA laser. A light source 110 that includes an optical isolator 530 disposed between a seed laser diode 450 and a SOA 460 (e.g., as illustrated in FIGS. 36-41) may be referred to as a MOPA light source with an optical isolator or a MOPA laser with an optical isolator. The seed laser diode 450 may be referred to as a master oscillator, and the SOA 460 may be referred to as a power amplifier. In particular embodiments, a MOPA light source that includes an optical isolator 530 disposed between a seed laser diode 450 and a SOA 460 may also include a fiber-optic amplifier 500. The fiber-optic amplifier 500 may be similar to that illustrated in FIGS. 13-14 and described herein. The fiber-optic amplifier 500 may receive an optical signal from the SOA 460 and further amplify the optical signal to produce an output beam 125.

In particular embodiments, a light source 110 that includes an optical isolator 530 disposed between a seed laser diode 450 and a SOA 460 (e.g., as illustrated in FIGS. 36-41) may also include an electronic driver 480 that supplies electrical current to the seed laser diode 450 and the SOA 460. For example, an electronic driver 480 may supply a substantially constant seed current $I_1$ to the seed laser diode 450 so that the seed-laser output light 472 has a substantially constant optical power. Alternatively, the electronic driver 480 may supply a modulated or time-varying seed current $I_1$ that results in an offset or modulation of the frequency or amplitude of the seed light 440 produced by the seed laser diode 450. The electronic driver 480 may supply SOA current $I_2$ to the SOA 460. The SOA current $I_2$ may include pulses of electrical current, where each pulse of current causes the SOA 460 to amplify a temporal portion of seed light 440 to produce an emitted pulse of light 400.

In particular embodiments, a light source 110 of a lidar system 100 may include a seed laser diode 450, a SOA 460, and an optical isolator 530 disposed between the seed laser diode 450 and the SOA 460. The light source 110 may emit an output beam 125, and, in addition to the light source 110, the lidar system 100 may include a receiver 140 and a processor or controller 150. The receiver 140 may detect an input beam 135 that includes a portion of light from the output beam 125 that is scattered by a target 130 located a distance D from the lidar system 100. The processor or controller 150 may determine the distance to the target 130 based on a round-trip time for the portion of light from the output beam 125 to travel from the lidar system 100 to the target 130 and back to the lidar system 100. The lidar system 100 may also include a scanner 120 that scans the output beam 125 produced by the light source 110 across a field of regard of the lidar system 100.

In particular embodiments, a light source 110 that includes an optical isolator 530 disposed between a seed laser diode 450 and a SOA 460 (e.g., as illustrated in FIGS. 36-41) may be part of a coherent pulsed lidar system 100. The light source 110 may emit LO light 430 and an output beam 125 that includes pulses of light 400, where each emitted pulse of light 400 is coherent with a corresponding portion of the LO light 430. In addition to the light source 110, the lidar system 100 may include a receiver 140 and a processor or controller 150. The receiver 140 may detect the LO light 430 and a received pulse of light 410, where the LO light 430 and the received pulse of light 410 are coherently mixed together at the receiver 140. The received pulse of light 410 may include light from one of the emitted pulses of light 400 scattered by a target 130 located a distance D from the lidar system 100, and the processor or controller 150 may determine the distance to the target 130 based on a time of arrival for the received pulse of light 410. The lidar system 100 may also include a scanner 120 that scans the output beam 125 across a field of regard of the lidar system 100.

Figure 43:
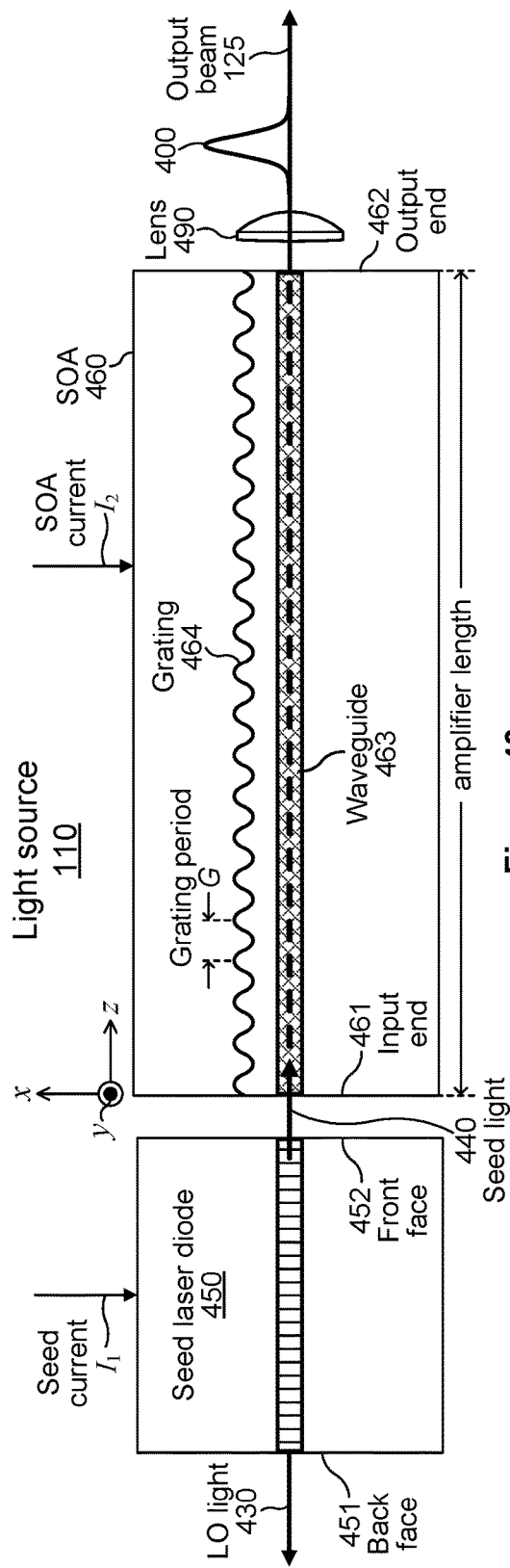
FIG. 43 illustrates a side view of an example light source that includes a semiconductor optical amplifier (SOA) with a grating.

FIG. 43 illustrates a side view of an example light source 110 that includes a semiconductor optical amplifier (SOA) 460 with a grating 464. The grating 464 in FIG. 43 is located above (in the x direction) and parallel to the SOA waveguide 463. The seed laser diode 450 emits seed light 440 from the front face 452, and the seed light 440 is coupled into the waveguide 463 of the SOA 460 via the input end 461. Additionally, the seed laser diode 450 emits LO light 430 from the back face 451. The seed laser diode 450 in FIG. 43 may emit the seed light 440 as a free-space optical beam that is coupled into the waveguide 463 by one or more lenses (not illustrated in FIG. 43). Alternatively, the seed laser diode 450 and the SOA 460 may be integrated together with (i) the front face 452 combined with or directly connected to the input end 461 or (ii) the seed light 440 coupled from the seed laser diode 450 to the SOA waveguide 463 by one or more optical waveguides 479.

Figure 44:
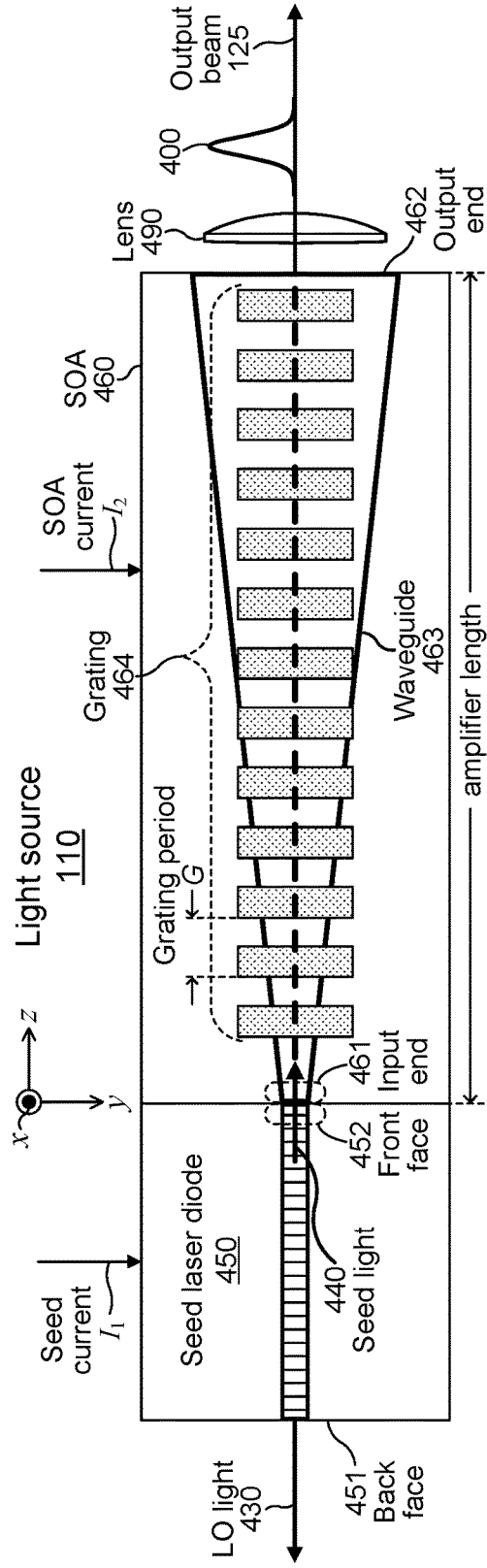
FIG. 44 illustrates a top view of an example light source that includes a semiconductor optical amplifier (SOA) with a grating.

FIG. 44 illustrates a top view of an example light source 110 that includes a semiconductor optical amplifier (SOA) 460 with a grating 464. The SOA waveguide 463 is a tapered optical waveguide with a width that increases from the input end 461 to the output end 462, and the grating 464 may be located above or below (in the x direction) the waveguide 463. The grating 464 may extend in the y direction over the full width of the SOA 460, or the grating 464 may extend in the y direction over a portion of the SOA. For example, the grating 464 may extend in the y direction over most or all of the SOA waveguide 463 but may not extend to the edges of the SOA 460. The grating 464 in FIG. 44 extends over most of the SOA waveguide 463 but does not extend along the y direction to the edges of the SOA 460. In the example of FIG. 44, the front face 452 of the seed laser diode 450 may be directly connected to, combined with, or merged with the input end 461 of the SOA 460. Alternatively, the seed light 440 may be conveyed from the front face 452 to the input end 461 by one or more optical components (e.g., optical waveguide 479, optical isolator 530, or optical splitter 470) located between the seed laser diode 450 and the SOA 460.

In particular embodiments, a light source 110 configured to emit an optical signal may include a seed laser diode 450 and a SOA 460 with a grating 464. A grating 464 may be referred to as a Bragg grating or an optical grating. The seed laser diode 450 may produce a seed optical signal, and the SOA 460 may amplify the seed optical signal to produce the emitted optical signal. The seed optical signal may include or may be referred to as seed light 440 or seed-laser output light 472, and the seed optical signal may include pulses of light or light having a substantially constant optical power. The emitted optical signal may be referred to as an output beam 125, and the emitted optical signal may include pulses of light 400 (e.g., as illustrated in FIGS. 43 and 44) or light having a substantially constant optical power.

In particular embodiments, a SOA 460 may include an optical waveguide 463 that extends along a longitudinal direction from an input end 461 of the SOA to an output end 462 of the SOA. The dashed line in the SOA waveguide 463 in each of FIGS. 43 and 44 is oriented parallel to the z axis and represents the longitudinal direction (which may be referred to as a longitudinal axis). The seed light 440 propagates in the longitudinal direction along the SOA waveguide 463 from the input end 461 to the output end 462. The SOA waveguide 463 may guide and amplify the seed light 440 while the seed light 440 propagates in the longitudinal direction along the waveguide 463 from the input end 461 to the output end 462. The optical gain provided to the seed light 440 by the SOA waveguide 463 may result from SOA current $I_2$ supplied to the SOA 460 by an electronic driver 480. The SOA current $I_2$ may produce electronic carriers (e.g., electrons and holes) in the waveguide 463, and the electronic carriers may provide optical gain to the seed light 440 through stimulated emission of photons.

The optical guiding or confinement provided by the SOA waveguide 463 to the seed light 440 may arise from refractive-index guiding, gain guiding, or a combination of refractive-index and gain guiding. For example, the waveguide 463 may have a higher refractive index than the surrounding material of the SOA 460, and this difference in refractive indices may provide optical guiding for the seed light 440 in one or both lateral directions (e.g., along the x and/or y directions). As another example, the optical gain provided by the SOA waveguide 463 may confine the seed light 440 within the waveguide 463 through gain guiding. Since the optical gain in the waveguide 463 is higher than outside the waveguide, the seed light 440 may be gain guided so that it propagates mostly within the higher-gain waveguide 463 rather than propagating in the lower-gain or optically lossy regions outside the waveguide.

In particular embodiments, a SOA 460 may include a grating 464 located parallel to the SOA waveguide 463. The grating 464 (which may be referred to as a Bragg grating or an optical grating) may be located adjacent to the waveguide 463 (e.g., above, below, or beside the waveguide 463), or the grating 464 may be at least partially incorporated into the waveguide 463. In each of FIGS. 43 and 44, the grating 464 runs parallel to the SOA waveguide 463 as well as the longitudinal axis of the SOA waveguide 463. In FIG. 43, the grating 464 is located above the SOA waveguide 463, and in FIG. 44, the grating 464 may be located above or below the SOA waveguide 463. In particular embodiments, a grating 464 may include one or more grating regions. For example, a grating 464 may include a single grating region located above, below, beside, or at least partially within the SOA waveguide 463. As another example, a grating 464 may include two grating regions located (i) above and below the SOA waveguide 463 in the x direction or (ii) on either side of the SOA waveguide 463 in the y direction.

In particular embodiments, a grating 464 may include a region of a SOA 460 with a refractive index that varies along the longitudinal axis of the SOA 460. For example, the refractive index of a grating 464 may vary periodically with distance along the longitudinal direction. The periodic variation of refractive index may be uniform with a constant grating period G. As another example, a grating 464 may include a phase shift where, between two sections of the grating, the grating has a phase discontinuity or a discrete change in the refractive index. As another example, the refractive index of a grating 464 may vary in a non-uniform manner. A grating 464 with a non-uniform grating period G may have a grating period that varies with distance along the longitudinal axis. A non-uniform grating 464 may be a chirped grating with a grating period G that varies linearly, quadratically, exponentially, or in any other suitable monotonic manner along the length of the grating.

The refractive-index variation or profile of a grating 464 may have any suitable shape, such as for example, a sinusoidal, triangle, sawtooth, piecewise linear, or square-wave shape. In FIG. 43, the grating 464 is represented by a sinusoidal shape that corresponds to a uniform periodic variation of refractive index along the length of the SOA 460 with a period of length G. The peaks of the sinusoid may correspond to regions of higher refractive index, and the valleys of the sinusoid may correspond to regions of lower refractive index. In FIG. 44, the grating 464 has a square-wave shape represented by evenly spaced rectangular regions positioned along the longitudinal axis with a uniform grating period G. Each rectangular region may correspond to a region of higher refractive index, and the regions in between may correspond to lower refractive-index regions.

The grating period G in each of FIGS. 43 and 44 may have any suitable length value, such as for example a length of approximately 0.1 µm, 0.2 µm, 0.5 µm, 1 µm, 2 µm, 5 µm, or 10 µm. A grating period G may be selected based on the expression $G = m \cdot \lambda/(2n)$, where m is a positive integer, $\lambda$ is the wavelength of the seed light 440 (which corresponds to the wavelength of the output beam 125), and n is an average refractive index of the waveguide 463 or of the material in the region of the SOA where the grating 464 is located. For example, for (i) a light source 110 that emits an output beam 125 with a wavelength of approximately 1540 nm and (ii) a SOA 460 with a refractive index of approximately 3.35, the grating period G may be approximately 0.23 µm. Alternatively, the grating period G may be any integer multiple of 0.23 µm, such as for example, approximately 0.46 µm (for m=2), 0.69 µm (for m=3), or 2.3 µm (for m=10).

The number of refractive-index periods P included in a grating 464 with a uniform grating period G may be determined from the expression P=A/G, where A is a length of the grating 464 along the longitudinal axis. If a grating 464 extends along the full length of the SOA 460, the length A of the grating 464 may be approximately equal to the amplifier length. Alternatively, a grating 464 may extend along a portion of the amplifier length (e.g., the grating length A may be approximately 99%, 90%, 80%, 70%, 50%, or any other suitable fraction of the amplifier length). For example, a SOA 460 may have an amplifier length of approximately 2 mm, and the grating 464 may extend along the length of the SOA 460. If the grating 464 has a grating period G of approximately 0.23 µm, then the grating 464 may include approximately 8,700 refractive-index periods. If the grating 464 has a length of approximately 1.8 mm (e.g., the grating 464 extends along 90% of the amplifier length), then the grating 464 may include approximately 7,800 refractive-index periods.

A grating 464 may have a refractive-index variation of $\Delta n$, where $\Delta n$ is the difference between the maximum and minimum refractive indices of the grating 464. The normalized refractive-index variation of a grating 464 may be expressed as $V_n = \Delta n/n_{avg}$, where $n_{avg}$ is an average refractive index of the grating 464 or of the material in the region of the SOA near the grating 464. The normalized refractive-index variation may have any suitable value, such as for example, a value less than or equal to approximately 0.0001%, 0.001%, 0.01%, 0.1%, 1%, or 10%. For example, a grating 464 may have a maximum refractive index of 3.35 and a minimum refractive index of 3.34, which corresponds to a refractive-index variation of 0.01 and a normalized refractive-index variation of approximately 0.3%. The refractive-index variation $\Delta n$ may be substantially uniform or may change with distance along the length of the grating 464. In FIG. 43, the refractive-index variation is substantially uniform along the length of the grating 464. Alternatively, a grating 464 may have a variation of refractive index $\Delta n$ that changes with distance along the grating. For example, a grating 464 may be an apodized grating where the refractive-index variation $\Delta n$ has a maximum near the center of the grating and decreases as the grating approaches the input end 461 and the output end 462.

In particular embodiments, a grating 464 may be formed in a SOA 460 during or after the fabrication of the SOA 460. For example, a grating 464 may be formed by etching away portions of the SOA material having refractive index $n_1$ to produce a periodic variation in the material corresponding to the periodic variation in the refractive index of the grating 464. After etching away the material, a re-growth process may be performed in which another material having a different refractive index $n_2$ is deposited onto the etched surface. The refractive-index variation $\Delta n$ of the grating 464 may correspond to the difference between the two refractive indices, or $|n_1 - n_2|$.

In particular embodiments, a SOA grating 464 may provide a distributed reflection of light within a particular wavelength or frequency range. For example, a grating 464 may act as a distributed optical reflector that preferentially reflects light within a particular range of optical frequencies and provides little or no reflection to light outside of the particular frequency range. The particular wavelength or frequency range of a grating 464 may be referred to as a reflection band, and the reflection band of a grating 464 may have a particular center wavelength or frequency and a particular spectral width. For example, the reflection band may be approximately centered at the wavelength of the seed light 440 so that the center wavelength of the grating 464 approximately coincides with the wavelength of the seed light 440. As another example, the seed light 440 may have a wavelength of approximately 1505 nm (which may be expressed as an optical frequency of approximately 199.2 THz), and the reflection band of the grating 464 may be centered at approximately 1505 nm with a spectral width of approximately 1 GHz.

A SOA grating 464 may be configured so that light within the reflection band propagating along the SOA waveguide 463 receives greater optical gain from the waveguide 463 than light outside of the reflection band. The optical reflection provided by a SOA grating 464 may be referred to as being distributed since it occurs along the length of the SOA waveguide 463 and is different from a discrete reflection such as the reflection of light at the surface of a metallic mirror. A grating 464 may be designed (e.g., by selecting a grating period G, a refractive-index variation Δn, and a number of refractive-index periods P) so that the wavelength range over which the grating 464 reflects light coincides with the wavelength of the seed light 440. The seed light 440 may be amplified while propagating along the SOA waveguide 463 from the input end 461 to the output end 462. Additionally, portions of the seed light 440 may be reflected by the grating 464 in the backward and forward directions, and the reflected portions of seed light 440 may propagate back and forth along the SOA waveguide 463 before being emitted from the output end 462. Light within the reflection band of the grating 464 may receive greater optical gain while propagating along the SOA waveguide 463 than light outside the reflection band. Due to the multiple back-and-forth reflections of the seed light 440 provided by the grating 464, the seed light 440 may experience a longer effective length of travel through the SOA waveguide 463 and a corresponding greater optical gain compared to light having wavelengths outside the reflection band of the grating 464. For example, light within the reflection band of the grating 464 may experience an optical gain of greater than 10 dB, and light outside the reflection band may experience an optical gain of less than 10 dB.

The spectral width of the reflection band of a grating 464 may have any suitable value, such as for example, a spectral width of less than or equal to approximately 10 MHz, 50 MHz, 100 MHz, 300 MHz, 500 MHz, 1 GHz, 2 GHz, 10 GHz, 20 GHz, or 100 GHz. For example, the seed light 440 may have a wavelength of approximately 1550 nm, and the reflection band of the grating 464 may be centered at approximately 1550 nm with a spectral width of less than 2 GHz. As another example, the output beam 125 emitted from a SOA 460 may include pulses of light 400, and the spectral width of the reflection band of the grating 464 may correspond to the spectral linewidth of the emitted pulses of light 400. For example, the spectral width of the reflection band may be greater than or equal to the spectral linewidth of the emitted pulses of light 400 and less than or equal to 20× the spectral linewidth of the emitted pulses of light 400. As another example, the spectral width of the reflection band may be approximately equal to the spectral linewidth of the emitted pulses of light 400, or the spectral width may be less than approximately 2×, 3×, 5×, 10×, or 20× the spectral linewidth of the emitted pulses of light 400. As another example, the emitted pulses of light 400 may have a pulse duration of approximately 3 ns and a spectral linewidth of approximately 300 MHz. The spectral width of the reflection band of the SOA grating 464 may be approximately equal to 300 MHz. Alternatively, the spectral width may be less than approximately 500 MHz, less than approximately 1 GHz, or less than approximately 2 GHz. The spectral linewidth of the emitted pulses of light 400 as described with respect to a light source 110 that includes a SOA 460 with a grating 464 may correspond to the spectral linewidth $\Delta v_2$ as described herein and as illustrated in FIG. 17, 27, 31, or 40.

In particular embodiments, a SOA grating 464 may provide a reduction in the spectral linewidth of an output beam 125 emitted by a SOA 460. A light source 110 that includes a seed laser diode 450 and a SOA 460 with a grating 464 may produce an output beam 125 with a narrower spectral linewidth than a light source with a SOA that does not include a grating. An output beam 125 may include pulses of light 400 that are produced by supplying pulses of electrical current $I_2$ to the SOA 460. Each pulse of electrical current may cause the SOA 460 to amplify a portion of seed light 440 propagating through the SOA waveguide 463 to produce an emitted pulse of light 400. The SOA 460 may also produce light having additional optical frequency components through nonlinear optical effects within the SOA waveguide 463 or through coupled-cavity effects between the SOA 460 and the seed laser diode 450 (e.g., light from the SOA 460 may be mixed with seed light 440, resulting in additional optical frequency components). The additional optical frequency components may include unwanted light with wavelengths outside the spectral width of the reflection band of the SOA grating 464. Since a SOA grating 464 may cause the SOA 460 to provide greater optical gain to light within the reflection band, the optical frequency components outside the reflection band may be suppressed or attenuated with respect to light within the reflection band. For example, a light source 110 with a SOA 460 that does not include a grating may produce pulses of light with a 3-ns pulse duration and a spectral linewidth of greater than 10 GHz, and a light source 110 with a SOA 460 that includes a grating 464 may produce 3-ns pulses of light 400 with a spectral linewidth of less than 1 GHz. The pulses of light with a >10-GHz spectral linewidth (produced by a SOA without a grating) may include unwanted frequency components that may not contribute to the formation of the 3-ns pulses and that may add unwanted optical noise to the output beam. By adding a grating 464 to the SOA 460, the spectral linewidth of the emitted pulses of light 400 may include little or none of the unwanted frequency components located outside the reflection band of the grating 464. As a result, the emitted pulses of light 400 from a SOA 460 with a grating 464 may have a reduced amount of optical noise compared to pulses of light emitted by a SOA without a grating. For a light source that does not include a grating, the unwanted frequency components may contribute additional optical noise to the output beam. For a light source 110 that includes a SOA 460 with a grating 464, the emitted pulses of light 400 may not include additional unwanted frequency components, and so the output beam 125 may have less optical noise compared to a light source that does not include a grating. Additionally, a SOA 460 with a grating 464 may produce pulses of light 400 that have a higher pulse energy since more of the optical energy of each emitted pulse of light 400 is located within the spectral linewidth of the pulses of light 400 and less optical energy is located in an unwanted spectral range that may not contribute to the formation of the pulses.

In particular embodiments, a light source 110 that includes a seed laser diode 450 and a SOA 460 with a Bragg grating 464 may also include an electronic driver 480 that supplies electrical current to the seed laser diode 450 and the SOA 460. For example, an electronic driver 480 may supply a substantially constant seed current $I_1$ to the seed laser diode 450 so that the seed light 440 or the seed-laser output light 472 has a substantially constant optical power. Additionally or alternatively, an electronic driver 480 may supply a modulated or time-varying seed current $I_1$ that results in an offset or modulation of the frequency or amplitude of the seed light 440 produced by the seed laser diode 450. The electronic driver 480 may supply SOA current $I_2$ to the SOA 460. The SOA current $I_2$ may include pulses of electrical current, where each pulse of current causes the SOA 460 to amplify a temporal portion of seed light 440 to produce an emitted pulse of light 400.

In particular embodiments, a light source 110 with a seed laser diode 450 and a SOA 460 may be configured as a three-terminal device or a four-terminal device. A three-terminal device may include (i) a common cathode and separate, electrically isolated anodes or (ii) a common anode and separate, electrically isolated cathodes. A seed laser diode 450 and a SOA 460 may each have a cathode and an anode, and a common-cathode configuration may refer to the cathodes of the seed laser diode 450 and the SOA 460 being electrically connected together into a single electrical terminal or contact that may be connected to an electronic driver 480. Alternatively, a light source 110 may be configured as a three-terminal common-anode device with a seed laser cathode, a SOA cathode, and a common anode. The common-anode configuration may refer to the anodes of the seed laser diode 450 and the SOA 460 being electrically connected together to form the common anode, while the cathodes of the seed laser diode 450 and the SOA 460 are electrically isolated.

Two terminals (e.g., two anodes or two cathodes) being electrically isolated may refer to the two terminals having greater than a particular value of electrical resistance between them (e.g., the resistance between two electrically isolated anodes may be greater than 1 kΩ, 10 kΩ, 100 kΩ, or 1Ω). Two terminals (e.g., two anodes or two cathodes) being electrically connected may refer to the two terminals having less than a particular value of electrical resistance between them (e.g., the resistance between two electrically connected cathodes may be less than 1 kΩ, 100 Ω, 10Ω, or 1Ω). A common-anode or common-cathode configuration may be provided by combining or electrically connecting the respective anodes or cathodes through a substrate. For example, a substrate may include indium phosphide (InP), and the seed laser diode 450 and the SOA 460 may each include an InGaAs or InGaAsP semiconductor structure grown on the InP substrate. The InP substrate may be n-doped or p-doped so that it is electrically conductive, and the anodes or cathodes of the seed laser diode 450 and the SOA 460 may each be electrically connected to the InP substrate so that the InP substrate acts as a common anode or cathode.

One or more of the light sources 110 illustrated in FIGS. 36-41 and 43-46 and described herein may be configured as a three-terminal device (with a common cathode or a common anode) or as a four-terminal device. For example, the light source 110 in FIG. 44 may be configured as a three-terminal common-cathode device having electrical connections between an electronic driver 480 and each of these three electrical terminals or contacts: (i) seed laser anode, (ii) SOA anode, and (iii) common cathode. In a three-terminal common-cathode device, the seed laser anode and the SOA anode may be electrically isolated from one another, and an electronic driver 480 may drive the seed laser diode 450 and the SOA 460 by supplying separate electrical signals to the seed laser anode and the SOA anode. The common cathode may act as a common return path for currents from the seed laser diode 450 and the SOA 460 to combine and return to the electronic driver 480. In a four-terminal light source 110, the seed laser anode and the SOA anode may be electrically isolated from one another, and instead of having a common cathode, the seed laser cathode and the SOA cathode may be electrically isolated from one another. For example, the light source 110 in FIG. 40 may be configured as a four-terminal device with two electrically isolated anodes (e.g., seed laser anode and SOA anode) and two electrically isolated cathodes (e.g., seed laser cathode and SOA cathode). A light source 110 that is configured as a four-terminal device may have electrically isolated anodes and electrically isolated cathodes, and an electronic driver 480 may drive the anode and cathode of the seed laser diode 450 separately or independently from the anode and cathode of the SOA 460.

In particular embodiments, a light source 110 that includes a seed laser diode 450 and a SOA 460 with a Bragg grating 464 may also include a fiber-optic amplifier 500. The fiber-optic amplifier 500 may be similar to that illustrated in FIGS. 13-14 and described herein. The fiber-optic amplifier 500 may receive an optical signal from the SOA 460 and further amplify the optical signal to produce an output beam 125. For example, the SOA 460 may amplify portions of seed light 440 to produce pulses of light, and the fiber-optic amplifier 500 may further amplify the pulses of light to produce an output beam 125 that includes emitted pulses of light 400.

In particular embodiments, a light source 110 that includes a seed laser diode 450 and a SOA 460 with a Bragg grating 464 may also include an optical isolator 530 or an optical splitter 470. For example, a light source 110 that includes a SOA 460 with a grating 464 may also include an optical isolator 530 located between the seed laser diode 450 and the SOA 460. Additionally, the light source 110 may include an optical splitter 470 that splits off a portion of the seed-laser output light 472 to produce LO light 430. As another example, for each of the light sources 110 illustrated in FIGS. 36-41 and described herein, the SOA 460 may include a Bragg grating 464.

In particular embodiments, a light source 110 that includes a seed laser diode 450 and a SOA 460 with a Bragg grating 464 may be part of a lidar system 100. For example, the light source 110 illustrated in FIG. 43 or 44 and described herein may be part of a lidar system 100. The light source 110 may emit an output beam 125, and, in addition to the light source 110, the lidar system 100 may include a scanner 120, a receiver 140, and a processor or controller 150. The scanner 120 may direct the output beam 125 into a field of regard of the lidar system 100 (e.g., the scanner 120 may scan the output beam 125 across the field of regard). The receiver 140 may detect an input beam 135 that includes a portion of light from the output beam 125 that is scattered by a target 130 located a distance D from the lidar system 100. The processor or controller 150 may determine the distance to the target 130 based on a round-trip time for the portion of light from the output beam 125 to travel from the lidar system 100 to the target 130 and back to the lidar system 100.

In particular embodiments, a SOA grating 464 may be configured so that light propagating along the SOA waveguide 463 that is within the reflection band of the grating 464 receives greater optical gain from the waveguide 463 than light outside the reflection band. For example, the wavelength of the seed light 440 may coincide with the reflection band, and the seed light 440 may experience greater optical gain compared to light having wavelengths outside the reflection band of the grating 464. In particular embodiments, a spectral width of the reflection band of a SOA grating 464 may correspond to an electrical bandwidth of a receiver 140. For example, in a lidar system 100 that includes a SOA 460 with a grating 464, the spectral width of the grating reflection band may be approximately equal to the electrical bandwidth of the receiver 140. The spectral width of the reflection band may be less than 2 GHz and may be approximately equal to the electrical bandwidth of the receiver 140. The spectral width of the reflection band may be approximately 200 MHz, 300 MHz, 500 MHz, 1 GHz, or 2 GHz, and the electrical bandwidth of the receiver 140 may be approximately 200 MHz, 300 MHz, 500 MHz, 1 GHz, or 2 GHz, respectively. As another example, the receiver 140 may have an electrical bandwidth that is (i) greater than or equal to one-half of the spectral width of the reflection band and (ii) less than or equal to two times the spectral width of the reflection band.

In particular embodiments, a spectral linewidth of pulses of light 400 emitted by a SOA 460 may correspond to an electrical bandwidth of a receiver 140. For example, in a lidar system 100 that includes a SOA 460 with a grating 464, the grating 464 and the receiver 140 may be configured so that the spectral linewidth of the emitted pulses of light 400 may be approximately equal to the electrical bandwidth of the receiver 140. The spectral linewidth of the pulses of light 400 may be less than 2 GHz and may be approximately equal to the electrical bandwidth of the receiver 140. The spectral linewidth of the pulses of light 400 may be approximately 200 MHz, 300 MHz, 500 MHz, 1 GHz, or 2 GHz, and the electrical bandwidth of the receiver 140 may be approximately 200 MHz, 300 MHz, 500 MHz, 1 GHz, or 2 GHz, respectively. As another example, the receiver 140 may have an electrical bandwidth that is (i) greater than or equal to one-half of the spectral linewidth of the pulses of light 400 and (ii) less than or equal to two times the spectral linewidth of the pulses of light 400.

In particular embodiments, a lidar system 100 may include a receiver 140 with an electrical bandwidth that corresponds to or is matched to (i) a spectral width of the reflection band of a SOA grating 464 or (ii) a spectral linewidth of pulses of light 400 emitted by a SOA 460. The electrical bandwidth of the receiver 140, which may be referred to as a frequency response of the receiver 140, represents a frequency range over which the receiver 140 may detect an input optical signal 135. For example, the electrical bandwidth of the receiver 140 may be configured by setting the frequency response of a low-pass filter that is part of an amplifier 350 of the receiver 140. Having the receiver electrical bandwidth match the spectral width of the reflection band or the spectral linewidth of the pulses of light 400 may include the electrical bandwidth being approximately equal to the spectral width of the reflection band or the spectral linewidth of the pulses of light 400. For example, a receiver 150 with a 300-MHz electrical bandwidth may be configured to detect a received pulse of light 410 that has a spectral linewidth of approximately 300 MHz. As another example, the electrical bandwidth of the receiver 140 may be configured to be within approximately ±20% of the spectral width of the reflection band or the spectral linewidth of the pulses of light 400. By matching the electrical bandwidth of the receiver 140 to the spectral width of the reflection band or to the spectral linewidth of the pulses of light 400, the receiver 140 may detect received pulses of light 410 without adding significant distortion or noise to the voltage signal 360 produced by the amplifier 350. If the electrical bandwidth of the receiver 140 is less than the spectral linewidth of the pulses of light 400, the receiver 140 may distort or lose information associated with the received pulses of light 410. Conversely, if the electrical bandwidth of the receiver 140 exceeds the spectral linewidth of the pulses of light, then the receiver 140 may contribute excess noise to the voltage signal 360 produced by the amplifier 350.

In particular embodiments, a light source 110 that includes a seed laser diode 450 and a SOA 460 with a Bragg grating 464 may be part of a coherent pulsed lidar system 100. For example, the light source 110 illustrated in FIG. 43 or 44 and described herein may be part of a coherent pulsed lidar system 100. The light source 110 may emit LO light 430 and an output beam 125 that includes pulses of light 400, where each emitted pulse of light 400 is coherent with a corresponding portion of the LO light 430. In addition to the light source 110, the lidar system 100 may include a receiver 140 and a processor or controller 150. The receiver 140 may detect the LO light 430 and a received pulse of light 410, where the LO light 430 and the received pulse of light 410 are coherently mixed together at the receiver 140. The received pulse of light 410 may include light from one of the emitted pulses of light 400 scattered by a target 130 located a distance D from the lidar system 100, and the processor or controller 150 may determine the distance to the target 130 based on a time of arrival for the received pulse of light 410. The lidar system 100 may also include a scanner 120 that scans the output beam 125 across a field of regard of the lidar system 100.

Figure 45:
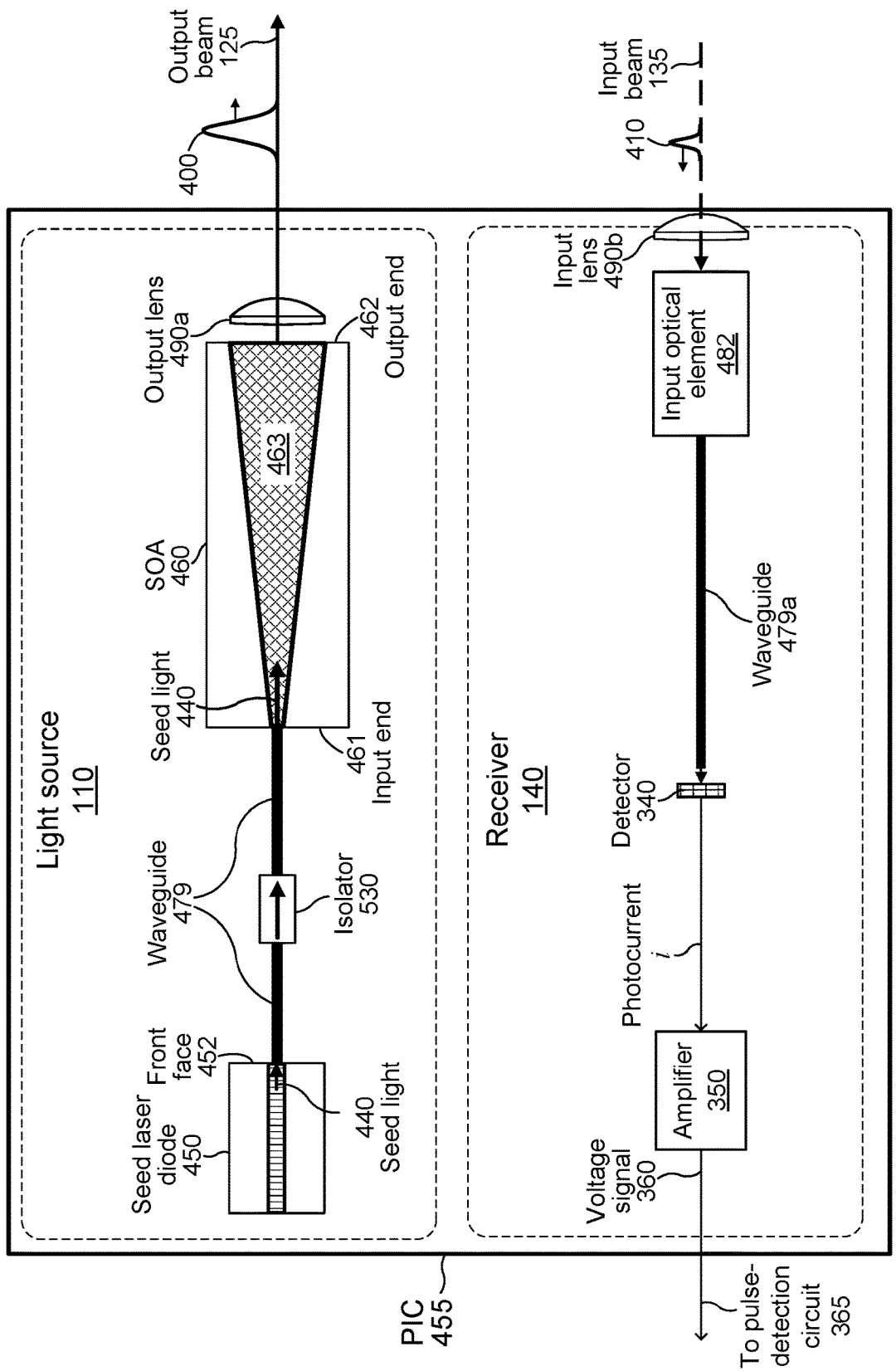
FIG. 45 illustrates an example light source and receiver integrated into a photonic integrated circuit (PIC).

FIG. 45 illustrates an example light source 110 and receiver 140 integrated into a photonic integrated circuit (PIC) 455. At least part of the light source 110 or at least part of the receiver 140 may be disposed on or in the PIC 455, and the light source 110, receiver 140, and PIC 455 may be part of a lidar system 100. In particular embodiments, a lidar system 100 that includes a PIC 455 with an input optical element 482 may include a light source 110, a receiver 140, and a processor or controller 150. The light source 110 may emit an output beam 125 (which may be referred to as an optical signal or an emitted optical signal), and the receiver 140 may include one or more detectors 340 configured to detect an input beam 135 that includes a portion of the output beam 125 that is scattered by a target 130 located a distance D from the lidar system 100. The input optical element 482 may receive the input beam 135 and couple the input beam 135 into an input optical waveguide 479a. The processor or controller 150 may determine the distance to the target 130 based on a round-trip time for the portion of the scattered output beam 125 to travel from the lidar system 100 to the target 130 and back to the lidar system 100. All or part of the processor or controller 150 may be attached to, electrically coupled to, or located near the PIC 455. The lidar system 100 may also include a scanner 120 that directs the output beam 125 into a field of regard of the lidar system 100. For example, the scanner 120 may receive the output beam 125 from the light source 110 and scan the output beam 125 across the field of regard.

In the example of FIG. 45, the light source 110 emits an output beam 125 that includes a pulse of light 400, and the receiver 140 detects an input beam 135 that includes a received pulse of light 410 that may include light from the emitted pulse of light 400 scattered by a target 130. The PIC 455 in FIG. 45 includes the following optical components: seed laser diode 450, isolator 530, SOA 460, output lens 490a, input lens 490b, input optical element 482, and detector 340. Additionally, the PIC 455 includes optical waveguides 479 that convey light from one optical component to another. The amplifier 350 or the pulse-detection circuit 365 may be attached to, electrically coupled to, or located near the PIC 455. One or more optical components of the light source 110 or receiver 140 may be fabricated separately and then integrated with the PIC 455. For example, the seed laser diode 450, isolator 530, SOA 460, lenses 490a and 490b, input optical element 482, or detector 340 may be fabricated separately and then integrated into the PIC 455.

In particular embodiments, a PIC 455 may include an input optical element 482 that receives an input beam 135 (which may be referred to as an input optical signal or a received optical signal) and couples the input beam 135 into an input optical waveguide 479a. In FIG. 45, the input lens 490b focuses the input beam 135 into the input optical element 482. The input optical element 482 receives the input beam 135 and couples the input beam 135 into the input optical waveguide 479a, which directs the input beam 135 to the detector 340. The detector 340 produces a photocurrent signal i that corresponds to the input beam 135, and the photocurrent signal i is amplified by an electronic amplifier 350, which produces a voltage signal 360 that corresponds to the photocurrent signal i.

Figure 46:
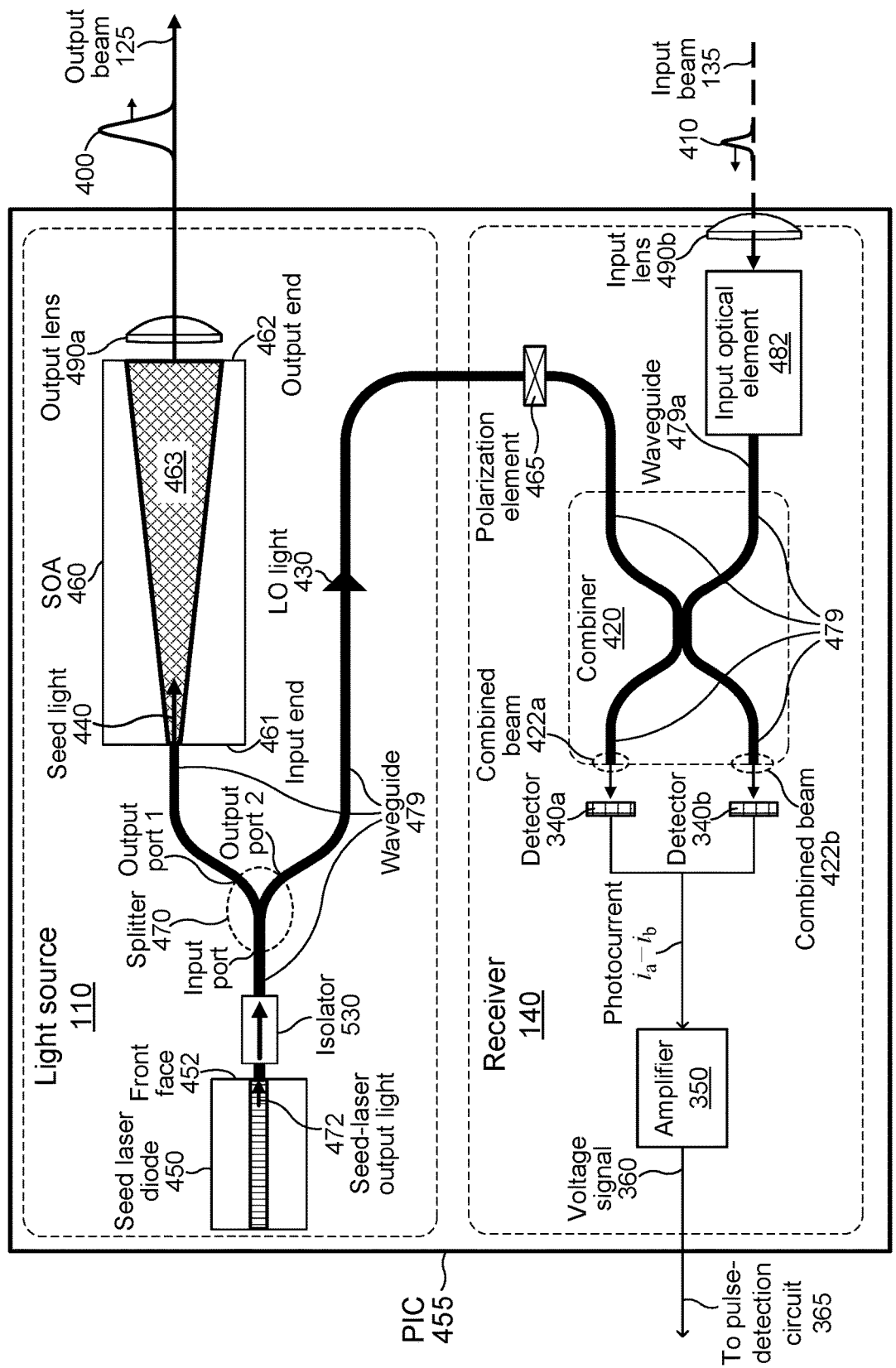
FIG. 46 illustrates an example light source and receiver integrated into a photonic integrated circuit (PIC) that is part of a coherent pulsed lidar system.

FIG. 46 illustrates an example light source 110 and receiver 140 integrated into a photonic integrated circuit (PIC) 455 that is part of a coherent pulsed lidar system 100. In particular embodiments, a coherent pulsed lidar system 100 may include a light source 110, a receiver 140, a PIC 455 with an input optical element 482, and a processor or controller 150. At least part of the light source 110 or at least part of the receiver 140 may be disposed on or in the PIC 455. In the example of FIG. 46, both the light source 110 and the receiver 140 are disposed on or in the PIC 455. As another example, the receiver 140 may be disposed on or in the PIC 455, and the light source may be packaged separately from the PIC 455. The light source 110 may emit (i) LO light 430 and (ii) an output beam 125 that includes pulses of light 400, where each emitted pulse of light 400 is coherent with a corresponding portion of the LO light 430. The receiver 140 may include one or more detectors 340 that detect the LO light 430 and a received pulse of light 410, where the LO light 430 and the received pulse of light 410 are coherently mixed together at the receiver 140. The received pulse of light 410 may include light from one of the emitted pulses of light 400 scattered by a target 130 located a distance D from the lidar system 100, and the processor or controller 150 may determine the distance to the target 130 based on a time of arrival for the received pulse of light 410. All or part of the processor or controller 150 may be attached to, electrically coupled to, or located near the PIC 455. A coherent pulsed lidar system 100 that includes a PIC 455 with an input optical element 482 may also include a scanner 120 that scans the output beam 125 across a field of regard of the lidar system 100.

In the example of FIG. 46, the light source emits an output beam 125 that includes a pulse of light 400, and the receiver 140 detects an input beam 135 that includes a received pulse of light 410 that may include light from the emitted pulse of light 400 scattered by a target 130. The PIC 455 in FIG. 46 includes the following optical components: seed laser diode 450, isolator 530, splitter 470, SOA 460, output lens 490a, polarization element 465, input lens 490b, input optical element 482, combiner 420, and detectors 340a and 340b. Additionally, the PIC 455 includes optical waveguides 479 that convey light from one optical component to another. The amplifier 350 or the pulse-detection circuit 365 may be attached to, electrically coupled to, or located near the PIC 455. One or more optical components of the light source 110 or receiver 140 may be fabricated separately and then integrated with the PIC 455. For example, the seed laser diode 450, isolator 530, SOA 460, lenses 490a and 490b, input optical element 482, or detectors 340a and 340b may be fabricated separately and then integrated into the PIC 455.

In FIG. 46, the input lens 490b focuses the input beam 135 (which includes a received pulse of light 410) into the input optical element 482. The input optical element 482 receives the pulse of light 410 and couples the pulse of light 410 into the input optical waveguide 479a. The input optical waveguide 479a along with one or more additional optical waveguides 479 are configured to convey the LO light 430 and the received pulse of light 410 to the detectors 340a and 340b via the combiner 420. The input optical waveguide 479a directs the received pulse of light 410 to the combiner 420, which combines the received pulse of light 410 with the LO light 430 and directs the combined beams 422a and 422b to the respective detectors 340a and 340b. The LO light 430 and the received pulse of light 410 are coherently mixed together at the detectors 340a and 340b, and the detectors 340a and 340b produce a subtracted photocurrent signal $i_a - i_b$, which is directed to the amplifier 350.

The PIC 455 illustrated in FIG. 45 or 46 may be similar to the PIC 455 illustrated in FIG. 11, 26, 28, 29, 34, or 39. Some of the optical components illustrated in FIG. 45 or 46 may be configured to operate in a manner similar to the corresponding optical components described herein and illustrated in the PIC 455 in FIG. 11, 26, 28, 29, 34, or 39. For example, the optical waveguides 479 in FIGS. 45 and 46 may be similar to the waveguides 479 illustrated in FIG. 34 or 39 and described herein. As another example, the splitter 470 in FIG. 46 may be similar to the splitter illustrated in FIG. 11, 26, 28, 34, or 39 and described herein. The splitter 470 in FIG. 46 is an optical-waveguide splitter that splits the seed-laser output light 472 to produce the seed light 440 (which is directed to the SOA 460) and the LO light 430 (which is directed to the receiver 140). As another example, the integrated-optic combiner 420 in FIG. 46 may be similar to the integrated-optic combiner 420 illustrated in FIG. 19 or 34 and described herein. The combiner 420 in FIG. 46 is an integrated-optic optical combiner 420 that combines the LO light 430 and the received pulse of light 410 and directs combined beam 422a to detector 340a and combined beam 422b to detector 340b.

A receiver 140 of a lidar system 100 that includes a PIC 455 with an input optical element 482 may include 1, 2, 4, 8, or any other suitable number of detectors 340. In the example of FIG. 46, the receiver 140 includes one integrated-optic combiner 420 and two detectors 340a and 340b. The integrated-optic combiner 420 combines the LO light and the received pulse of light 410 and produces two combined beams 422a and 422b. Detector 340a detects the combined beam 422a (which includes a first portion of the combined LO light 430 and received pulse of light 410), and detector 340b detects the combined beam 422b (which includes a second portion of the combined LO light 430 and received pulse of light 410). As another example, a receiver 140 may include two integrated-optic combiners 420 and four detectors 340 (e.g., one combiner 420 and two detectors 340 may combine and detect a first polarization component, and the other combiner 420 and two detectors 340 may combine and detect a second polarization component orthogonal to the first polarization component). As another example, a receiver 140 may include an integrated-optic 90-degree optical hybrid 428 and four detectors 340 (e.g., as illustrated in FIG. 20 and described herein). As another example, a receiver 140 may include two integrated-optic 90-degree optical hybrids 428 and eight detectors 340 (e.g., one 90-degree optical hybrid 428 and four detectors 340 may combine and detect a first polarization component, and the other 90-degree optical hybrid 428 and four detectors 340 may combine and detect a second polarization component orthogonal to the first polarization component).

A lidar system 100 that includes a PIC 455 with an input optical element 482 may include any suitable type of light source 110. For example, the light source 110 of a PIC-based lidar system 100 with an input optical element 482 may include a direct-emitter laser diode that produces a free-space output beam 125. The light source 110 may also include an output lens that collimates the output beam 125. The direct-emitter laser diode may be driven by an electronic driver 480 that supplies current pulses to the laser diode, and the direct-emitter laser diode may emit pulses of light 400 directly as a free-space output beam 125. A light source 110 may be packaged separately from a PIC 455, or all or part of the light source 110 may be integrated into the PIC 455. For example, a direct-emitter laser diode may be located separate from the PIC 455 or may be integrated into the PIC 455.

In FIG. 45, the light source 110 includes a seed laser diode 450 and a SOA 460. The seed laser diode 450 produces seed light 440 that is amplified by the SOA 460 to produce the output beam 125. The SOA 460 has a tapered waveguide 463 in which a width of the SOA waveguide 463 increases from the input end 461 to the output end 462. The light source 110 also includes an output lens 490a that receives and collimates the output beam 125. The light source 110 may include an electronic driver 480 (not illustrated in FIG. 45) that (i) supplies a modulated or substantially constant electrical current to the seed laser diode 450 and (ii) supplies pulses of current to the SOA 460. The SOA 460 may amplify temporal portions of the seed light 440 to produce an output beam 125 that includes emitted pulses of light 400. The light source 110 may also include a fiber-optic amplifier 500 (not illustrated in FIG. 45). The fiber-optic amplifier 500, which may be similar to that illustrated in FIGS. 13-14 and described herein, may receive an optical signal from the SOA 460 and further amplify the optical signal to produce an output beam 125. For example, the SOA 460 may amplify temporal portions of seed light 440 to produce pulses of light, and the fiber-optic amplifier 500 may further amplify the pulses of light to produce an output beam 125 that includes emitted pulses of light 400.

In FIG. 46, the light source 110 includes a seed laser diode 450 that emits seed-laser output light 472 that is split to produce seed light 440 and LO light 430. The SOA 460, which has a tapered waveguide 463, amplifies the seed light 440 to produce the output beam 125. For example, the SOA 460 may amplify temporal portions of the seed light 440 to produce an output beam 125 that includes emitted pulses of light 400, where each amplified temporal portion of the seed light 440 corresponds to one of the emitted pulses of light 400. The light source 110 may also include a fiber-optic amplifier 500 (not illustrated in FIG. 46) that further amplifies light produced by the SOA 460. For example, the SOA 460 may amplify portions of seed light 440 to produce pulses of light, and the fiber-optic amplifier 500 may further amplify the pulses of light to produce an output beam 125 that includes emitted pulses of light 400.

In particular embodiments, a lidar system 100 that includes a PIC 455 with an input optical element 482 may include a light source 110 with an optical isolator 530. In each of FIGS. 45 and 46, the light source 110 includes a seed laser diode 450, an optical isolator 530, and a SOA 460, where the optical isolator 530 is located between the seed laser diode 450 and the SOA 460. The optical isolator 530 illustrated in each of FIGS. 45 and 46 may be an integrated-optic isolator 530 and may be similar to the isolator illustrated in FIG. 38, 39, or 40 and described herein. For example, the isolator 530 in FIG. 46 may include a Faraday-type isolator or a filter-type isolator and may be configured to (i) transmit seed light 440 to the SOA 460 and (ii) reduce an amount of light that propagates from the SOA 460 toward the seed laser diode 450.

In particular embodiments, a lidar system 100 that includes a PIC 455 with an input optical element 482 may include a light source 110 with a SOA 460 that includes a grating 464. The SOA 460 illustrated in each of FIGS. 45 and 46 may be similar to the SOA 460 illustrated in FIG. 43 or 44 and described herein. For example, the SOA 460 illustrated in each of FIGS. 45 and 46 may include a Bragg grating 464 that provides a distributed reflection of light within a particular wavelength or frequency range.

In particular embodiments, a coherent pulsed lidar system 100 that includes a PIC 455 with an input optical element 482 may include an optical polarization element 465. For example, the optical polarization element 465 in FIG. 46 may alter the polarization of the LO light 430 so that the LO light 430 and the received pulse of light 410 may be coherently mixed. The polarization element 465 may ensure that at least a portion of the received pulse of light 410 and the LO light 430 have polarizations that are oriented in the same direction. The polarization element 465 may include one or more quarter-wave plates, one or more half-wave plates, one or more optical polarizers, one or more optical depolarizers, or any suitable combination thereof. For example, the polarization element 465 may include a quarter-wave plate that converts linearly polarized LO light 430 produced by the seed laser diode 450 into circular or elliptically polarized light. In the example of FIG. 46, the polarization element 465 may be an integrated-optic component.

In particular embodiments, a lidar system 100 that includes a PIC 455 with an input optical element 482 may be included in a vehicle. For example, a lidar system 100 may provide information about the environment around the vehicle or through which the vehicle is moving. The information may include one or more distances to one or more respective targets 130 located within the environment of the vehicle. The vehicle may include a vehicle navigation system that (i) receives the information about the environment through which the vehicle is moving and (ii) provides instructions to one or more operational subsystems of the vehicle (e.g., brakes, accelerator, steering mechanism, lights, or turn signals) to assist in guiding the vehicle through the environment. For example, the vehicle navigation system may be an advanced driver assistance system (ADAS), and the instructions provided to the operational subsystems may assist a driver of the vehicle in operating the vehicle. As another example, the vehicle may be an autonomous vehicle, and the vehicle navigation system may be an autonomous-vehicle driving system that provides instructions to the operation subsystems to autonomously guide the vehicle through the environment.

In particular embodiments, a lidar system 100 may include a PIC 455 with an input optical element 482 that receives an input beam 135 and couples the input beam 135 into an input optical waveguide 479a. The lidar system 100 may include a receiver 140 with one or more detectors 340 that detect at least a portion of the input beam 135. The input optical waveguide 479a may be one of one or more optical waveguides 479 of the PIC 455 that convey the input beam 135 to the one or more detectors 340. In FIG. 45, the PIC 455 includes one waveguide (the input optical waveguide 479a) that conveys the input beam 135 from the input optical element 482 to the detector 340. In FIG. 46, the PIC includes four optical waveguides 479 associated with the combiner 420 in addition to the input optical waveguide 479a that conveys the input beam 135 from the input optical element 482 to the combiner 420. The combiner 420 is an integrated-optic combiner that includes or is coupled to the four optical waveguides 479 that convey the LO light 430 and the input beam 135 into the combiner 420 and convey the combined beams 422a and 422b to the respective detectors 340a and 340b.

Figure 47:
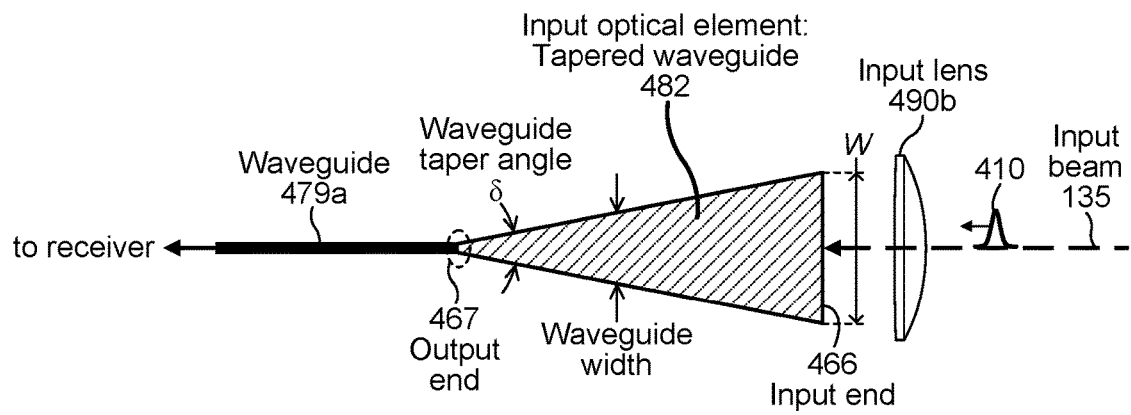
FIG. 47 illustrates an example tapered waveguide configured to receive an input beam.

FIG. 47 illustrates an example tapered waveguide 482 configured to receive an input beam 135. In particular embodiments, an input optical element 482 of a PIC 455 may include a tapered optical waveguide 482. A tapered optical waveguide 482, which may be referred to as an input optical element 482, may receive an input beam 135 and couple the input beam 135 into an input optical waveguide 479a. A tapered optical waveguide 482 may include (i) an input end 466 that receives the input beam 135 and (ii) an output end 467 that couples the input beam 135 into an input optical waveguide 479a. A tapered optical waveguide 482 may be configured to convey the input beam 135 from the input end 466 to the output end 467 and couple the input beam 135 into an input optical waveguide 479a without excessive optical loss. For example, greater than 60%, 70%, 80%, or 90% of light from the input beam 135 that is received at the input end 466 of a tapered optical waveguide 482 may be coupled into the input optical waveguide 479a.

A tapered optical waveguide 482 may have a waveguide width that decreases from the input end 466 to the output end 467. In FIG. 47, the tapered optical waveguide 482 has a width W at the input end 466, and the waveguide width decreases linearly toward the output end 467. For example, the width W of the tapered optical waveguide 482 at the input end 466 may be less than or equal to approximately 1 mm, 500 μm, 200 μm, 100 μm, 50 μm, or 20 μm. The waveguide width at the output end 467 may be approximately equal to the width of the input optical waveguide 479a. For example, the waveguide width at the output end 467 and the width of the input optical waveguide 479a may each be less than or equal to approximately 50 μm, 20 μm, 10 μm, 5 μm, or 1 μm.

A tapered optical waveguide 482 may have two boundaries corresponding to the two edges of the optical waveguide 482 located along the waveguide width. A boundary of a tapered optical waveguide 482 may have any suitable shape. For example, at least a portion of a boundary of a tapered optical waveguide 482 may have a linear, sinusoidal, exponential, parabolic, or Gaussian shape. Each of the two boundaries of the tapered optical waveguide 482 in FIG. 47 has a linear or straight-line shape.

Figure 48:
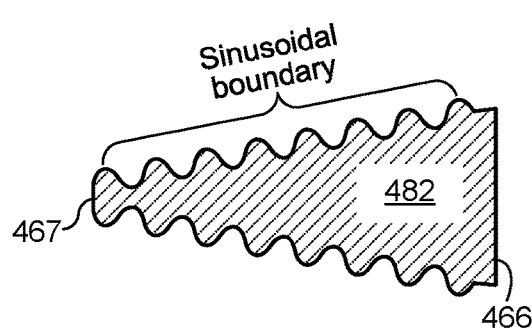
FIG. 48 illustrates an example tapered waveguide with a boundary that includes a sinusoidal shape.

FIG. 48 illustrates an example tapered waveguide 482 with a boundary that includes a sinusoidal shape. Each boundary on either side of the tapered optical waveguide 482 has a sinusoidal shape that extends along a direction from the input end 466 to the output end 467.

Figure 49:
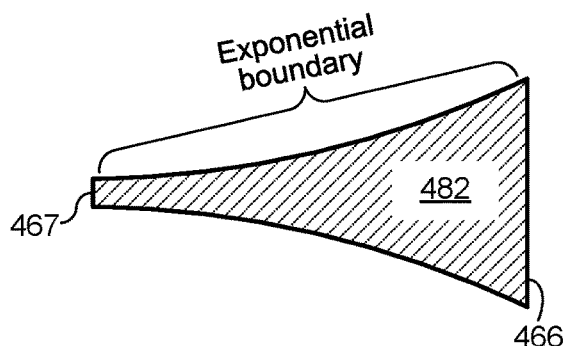
FIG. 49 illustrates an example tapered waveguide with a boundary that includes an exponential shape.

FIG. 49 illustrates an example tapered waveguide 482 with a boundary that includes an exponential shape. Each boundary on either side of the tapered optical waveguide 482 has an exponential shape that extends along a direction from the input end 466 to the output end 467.

In particular embodiments, a tapered optical waveguide 482 may be an adiabatic tapered optical waveguide. An adiabatic tapered optical waveguide 482 may refer to a tapered waveguide that conveys an input beam 135 along the waveguide 482 and couples the input beam 135 into an input optical waveguide 479a without excessive loss. For example, greater than or equal to 60%, 70%, 80%, or 90% of light from the input beam 135 that is received at the input end 466 of an adiabatic tapered optical waveguide 482 may be coupled into the input optical waveguide 479a. An adiabatic tapered optical waveguide 482 may convey the input beam 135 through the waveguide 482 as a Gaussian mode.

In particular embodiments, a tapered optical waveguide 482 may have a waveguide taper angle of δ that represents the angle between the edges or boundaries of the waveguide 482. In FIG. 47, the waveguide taper angle δ corresponds to the angle between the two straight-line boundaries of the tapered optical waveguide 482. A tapered optical waveguide 482 may be designed so that the taper angle δ is less than approximately λ/(W·n), where λ is a wavelength of the output beam 125 or input beam 135, W is a width of the tapered optical waveguide 482 at the input end 466, and n is a refractive index of the tapered optical waveguide 482. For example, for an input-beam wavelength of 1550 nm, an input-end width of 100 μm, and a waveguide refractive index of 1.5, the taper angle of a tapered optical waveguide may be selected to be less than or equal to approximately 0.01 radians (or, less than or equal to approximately 0.6 degrees).

A tapered optical waveguide 482 and an input optical waveguide 479a may be fabricated on or in a substrate of a PIC 455. For example, a PIC 455 may be fabricated from any suitable substrate material, such as for example, silicon, InP, glass (e.g., silica), a polymer, or an electro-optic material (e.g., lithium niobate or lithium tantalate). A tapered optical waveguide 482 and an input optical waveguide 479a may be formed on or in a PIC substrate using microfabrication techniques, such as for example, lithography, deposition, or etching. For example, a tapered optical waveguide 482 and an input optical waveguide 479a may be formed on a glass or silicon substrate by depositing material or selectively etching material to form a ridge or channel waveguide on the substrate. As another example, a tapered optical waveguide 482 and an input optical waveguide 479a may be formed by implanting or diffusing a material into a substrate (e.g., by diffusing titanium into a $LiNbO_3$ substrate) to form a region in the substrate having a higher refractive index than the surrounding substrate material.

In particular embodiments, the input end 466 of a tapered optical waveguide 482 may include an anti-reflection (AR) coating that reduces the reflectivity of the input end 466 at a wavelength of the output beam 125 or the input beam 135. The AR coating may include a dielectric coating that provides a reflectivity at the wavelength of the input beam 135 of less than 5%, 2%, 0.5%, 0.1%, or any other suitable reflectivity value. The AR coating may reduce the amount of light from the input beam 135 that is reflected by the input end 466, which in turn may increase the amount of light from the input beam 135 that is coupled into the tapered waveguide 482. For example, the wavelength of the output beam 125 and the input beam 135 may be approximately 1550 nm, and without an AR coating, the input end 466 may have a reflectivity at 1550 nm of approximately 10%. An AR coating may be deposited onto the input end 466, and the AR coating may reduce the reflectivity at 1550 nm to less than 1% (which corresponds to a reduction of greater than 90% in the reflectivity of the input end).

In particular embodiments, a lidar system 100 that includes a PIC 455 with a tapered optical waveguide 482 may include an input lens 490b that focuses an input beam 135 into the tapered optical waveguide 482 via the input end 466. In FIG. 47, the input lens 490a receives the input beam 135 and focuses the input beam 135 into the tapered optical waveguide 482. The focused input beam 135 propagates through the input end 466 and is coupled into the tapered optical waveguide 482. The input lens 490b may be attached to, connected to, or integrated with the PIC 455. For example, an input lens 490b may be directly attached to the input end 466 of the tapered optical waveguide 482. As another example, an input lens 490*b* may be attached or connected to the PIC 455 and located some distance from the input end 466 of the tapered optical waveguide 482.

Figure 50:
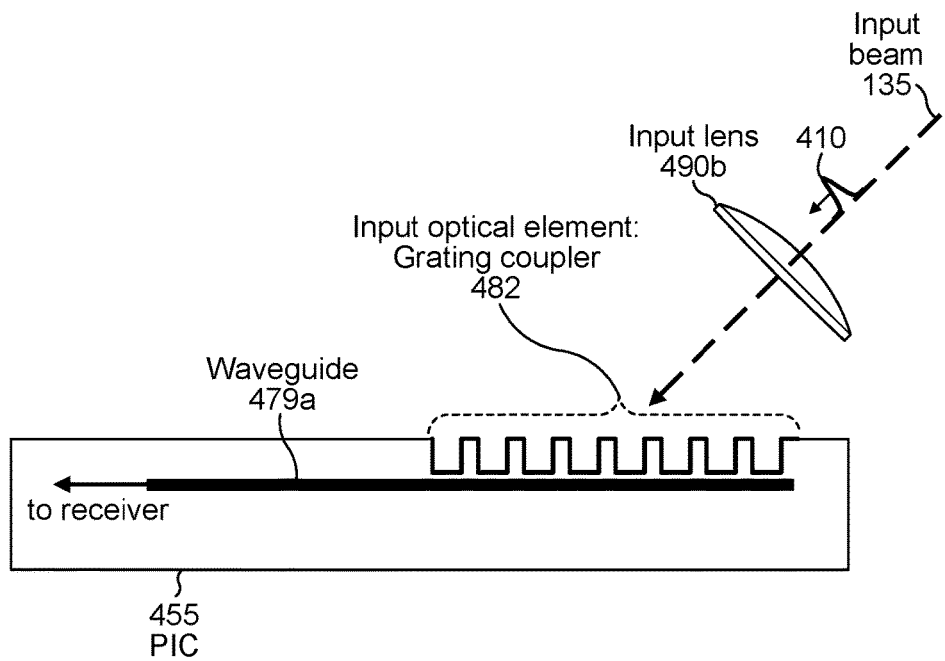
FIG. 50 illustrates an example grating coupler configured to receive an input beam.

FIG. 50 illustrates an example grating coupler 482 configured to receive an input beam 135. In particular embodiments, an input optical element 482 of a PIC 455 may include a grating coupler 482. A grating coupler 482, which may be referred to as an input optical element 482, may receive an input beam 135 and couple the input beam 135 into an input optical waveguide 479*a*. The grating coupler 482 may include a diffraction grating having a periodic variation of refractive index. The diffraction grating may be formed on or in a PIC 455 by depositing or implanting material or by selectively etching material to form a periodic pattern of materials with different refractive indices. In FIG. 50, the grating coupler 482 is represented by a square-wave-type structure in which the peaks may correspond to regions with a higher refractive index and the valleys may correspond to regions with a lower refractive index. The periodic variation of refractive index of a grating coupler 482 may be configured to diffract or angularly deflect light at the wavelength of the input beam 135 so that the input beam 135 is coupled into the input optical waveguide 479*a*. The input beam 135 may be incident on the grating coupler 482 at an angle, and the grating coupler 482 may diffract the input beam 135 so that it is directed along the plane of the PIC 455 and coupled into the input optical waveguide 479*a*. As illustrated in FIG. 50, at least a portion of the input optical waveguide 479*a* may extend under the grating coupler 482. A lidar system 100 that includes a PIC 455 with a grating coupler 482 may also include an input lens 490*b* that focuses the input beam 135 onto the grating coupler 482.

In particular embodiments, a lidar system 100 may include a PIC 455 with an input optical element 482 that includes a grating coupler and a tapered optical waveguide. The input end 466 of the tapered optical waveguide may be located near or may be coupled to the diffraction grating of the grating coupler, and the output end 467 of the tapered optical waveguide may be coupled to the input optical waveguide 479*a*. At least a portion of the tapered optical waveguide may extend under the grating coupler 482. The input beam 135 may be angularly deflected by the grating coupler and coupled into the tapered optical waveguide, and the tapered optical waveguide may then couple the input beam 135 into the input optical waveguide 479*a*.

In particular embodiments, a lidar system 100 may include a PIC 455 with an input optical element 482 that includes one or more of a photonic crystal and a metamaterial. A photonic crystal may include a periodic optical nanostructure that may affect or change the motion of light propagating through the photonic crystal. A metamaterial may include an engineered material having features or repeating patterns at scales smaller than the wavelength of the input beam 135, and a metamaterial may affect or change the motion of light propagating through the metamaterial. For example, an input optical element 482 may include a photonic crystal or a metamaterial configured to receive an input beam 135 and couple the input beam 135 into an input optical waveguide 479*a*. As another example, an input optical element 482 may include a photonic crystal or a metamaterial that is combined with a tapered optical waveguide or a grating coupler.

Figure 51:
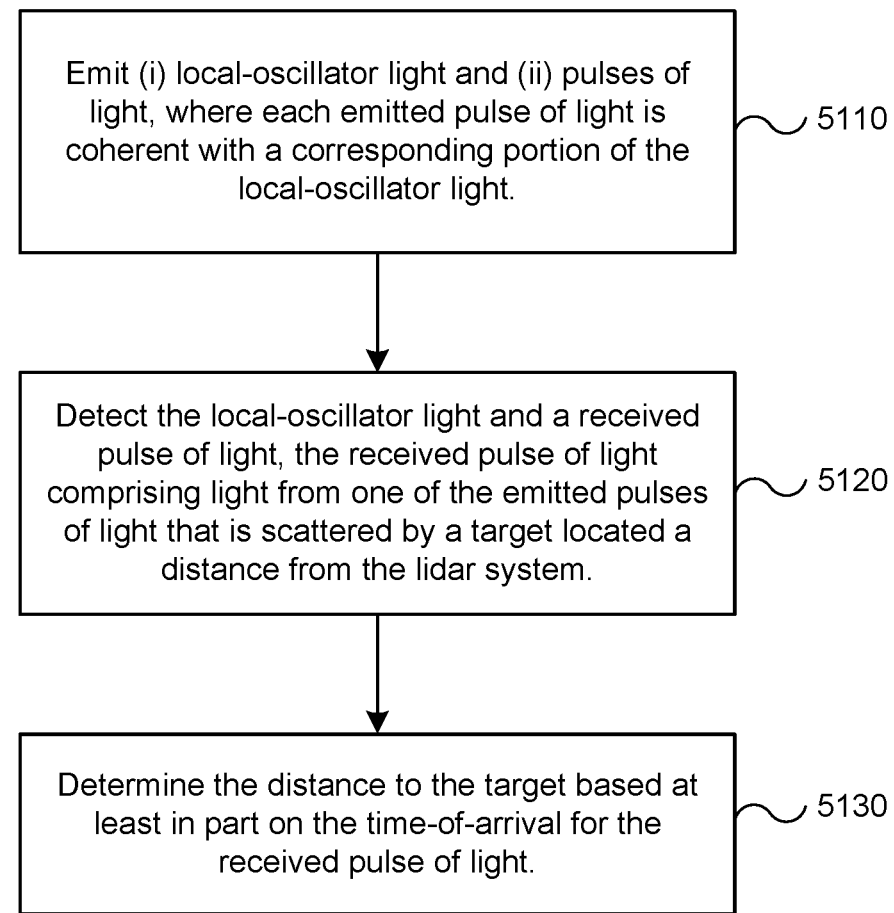
FIG. 51 illustrates an example method for determining a distance from a lidar system to a target.

FIG. 51 illustrates an example method for determining a distance from a lidar system 100 to a target 130. The method 5100 may begin at step 5110, where a light source 110 of a lidar system 100 emits (i) local-oscillator (LO) light 430 and (ii) pulses of light 400, where each emitted pulse of light 400 is coherent with a corresponding portion of the LO light 430. Emitting the LO light 430 and the pulses of light 400 may include: (i) producing, by a seed laser 450 of the light source 110, seed light 440 and the LO light 430, and (ii) amplifying, by a pulsed optical amplifier 460 of the light source 110, temporal portions of the seed light 440 to produce the emitted pulses of light 400, where each amplified temporal portion of the seed light corresponds to one of the emitted pulses of light. For example, the seed laser may include a seed laser diode 450 and the pulsed optical amplifier may include a semiconductor optical amplifier (SOA) 410. At step 5120, a receiver 140 of the lidar system 100 may detect the LO light 430 and a received pulse of light 410, the received pulse of light comprising light from one of the emitted pulses of light that is scattered by a target 130 located a distance from the lidar system 100. The LO light 430 and the received pulse of light 410 may be coherently mixed together at the receiver 140. Detecting the LO light 430 and the received pulse of light 410 may include: (i) producing, by one or more detectors 340 of the receiver 140, one or more respective photocurrent signals corresponding to the coherent mixing of the LO light 430 and the received pulse of light 410, and (ii) determining, by a pulse-detection circuit 365 of the receiver 140 and based at least in part on the one or more photocurrent signals, a time-of-arrival for the received pulse of light 410. For example, the time-of-arrival for the received pulse of light 410 may correspond to a round-trip time for the emitted pulse of light to travel from the lidar system 100 to the target 130 and back to the lidar system 100. At step 5130, the distance D from the lidar system 100 to the target 130 may be determined based at least in part on the time-of-arrival for the received pulse of light, at which point the method 5100 may end. For example, a processor or controller 150 may determine the distance D based at least in part on a round-trip time for the emitted pulse of light. The distance D may be determined from the expression $D = c \cdot \Delta T / 2$, where c is the speed of light and $\Delta T$ is the round-trip time.

Various example aspects described below are directed to (A) a light source 110 that includes an optical isolator 530 located between a seed laser diode 450 and a SOA 460, (B) a light source 110 that includes a SOA 460 with a grating 464, and (C) a lidar system 100 that includes a PIC 455 with an input optical element 482.

Aspect 1A. A light source configured to emit an optical signal, the light source comprising: a seed laser diode configured to produce a seed optical signal; a semiconductor optical amplifier (SOA) configured to amplify the seed optical signal to produce the emitted optical signal; and an optical isolator disposed between the seed laser diode and the SOA, wherein the optical isolator is configured to (i) transmit the seed optical signal to the SOA and (ii) reduce an amount of light that propagates from the SOA toward the seed laser diode.

Aspect 2A. The light source of aspect 1A, wherein the optical isolator is a free-space isolator configured to transmit the seed optical signal as a free-space optical beam.

Aspect 3A. The light source of aspect 1A, wherein the optical isolator is a fiber-optic isolator comprising (i) an input optical fiber that directs the seed optical signal from the seed laser diode to the fiber-optic isolator and (ii) an output optical fiber that directs the seed optical signal from the fiber-optic isolator to the SOA.

Aspect 4A. The light source of aspect 1A, wherein the optical isolator is an integrated-optic isolator comprising one or more Faraday-rotator materials disposed within or adjacent to one or more optical waveguides of the isolator.

Aspect 5A. The light source of aspect 4A, wherein the one or more Faraday-rotator materials include one or more of: a terbium-doped glass, a terbium-gallium-garnet (TGG) crystal, a yttrium-iron-garnet (YIG) crystal, a cerium-doped YIG crystal (Ce:YIG), and a bismuth-doped YIG crystal (Bi:YIG).

Aspect 6A. The light source of aspect 1A, wherein the optical isolator comprises an optical filter with an optical pass-band width that is (i) greater than a spectral linewidth of a single longitudinal mode of the seed optical signal and (ii) less than a spectral linewidth of the emitted optical signal.

Aspect 7A. The light source of aspect 6A, wherein the optical filter comprises a Bragg grating disposed within or adjacent to an optical waveguide or an optical fiber configured to transmit the seed optical signal.

Aspect 8A. The light source of aspect 1A, wherein the optical isolator comprises an optical filter with an optical pass-band width that is greater than 500 kHz and less than 1 GHz, wherein the optical pass-band is centered at a wavelength of the seed optical signal.

Aspect 9A. The light source of aspect 1A, wherein: the optical isolator comprises an active optical waveguide; and the light source further comprises an electronic driver configured to supply pulses of electrical current to the active optical waveguide, wherein: each pulse of current causes the active optical waveguide to transmit a temporal portion of the seed optical signal to the SOA; and between successive pulses of current, the active optical waveguide is configured to absorb light at a wavelength of the seed optical signal.

Aspect 10A. The light source of aspect 9A, wherein the electronic driver is further configured to: supply a substantially constant electrical current to the seed laser diode so that the seed optical signal comprises light having a substantially constant optical power; and supply pulses of electrical current to the SOA so that the emitted optical signal comprises pulses of light, wherein: the pulses of current supplied to the SOA are supplied synchronously with the pulses of current supplied to the active optical waveguide; and each pulse of current supplied to the SOA causes the SOA to amplify the temporal portion of the seed optical signal transmitted by the active optical waveguide to produce one of the emitted pulses of light.

Aspect 11A. The light source of aspect 1A, wherein the optical isolator reducing the amount of light that propagates from the SOA toward the seed laser diode corresponds to the optical isolator absorbing, reflecting, filtering, or deflecting greater than 90% of the light that propagates from the SOA toward the seed laser diode.

Aspect 12A. The light source of aspect 1A, wherein the light that propagates from the SOA toward the seed laser diode comprises one or more of: amplified spontaneous emission (ASE) light produced by the SOA, a portion of light from the seed optical signal reflected by an input end of the SOA, a portion of light from the seed optical signal reflected by an output end of the SOA, and a portion of light from the emitted optical signal reflected by an optical element external to the SOA.

Aspect 13A. The light source of aspect 1A, wherein the SOA comprises (i) an input end configured to receive the seed optical signal and (ii) an output end configured to emit the optical signal, wherein the output end comprises an anti-reflection coating configured to reduce a reflectivity of the output end at a wavelength of the emitted optical signal.

Aspect 14A. The light source of aspect 1A, wherein the SOA comprises (i) an input end configured to receive the seed optical signal, (ii) an output end configured to emit the optical signal, and (iii) a waveguide extending from the input end to the output end, wherein: the seed optical signal is amplified while propagating through the waveguide from the input end to the output end; and the output end is angled so that the amplified seed optical signal is incident on the output end with a nonzero angle of incidence.

Aspect 15A. The light source of aspect 14A, wherein the angled output end is configured to reduce an amount of light from the amplified seed optical signal that reflects from the output end and subsequently propagates along the waveguide back toward the input end.

Aspect 16A. The light source of aspect 1A, wherein the SOA comprises a tapered optical waveguide extending from an input end of the SOA to an output end of the SOA, wherein a width of the tapered optical waveguide increases from the input end to the output end.

Aspect 17A. The light source of aspect 1A, further comprising an optical splitter disposed between the optical isolator and the SOA, wherein the optical splitter is configured to split off a portion of the seed optical signal to produce a local-oscillator light signal.

Aspect 18A. The light source of aspect 1A, wherein the light source is part of a lidar system, the lidar system comprising: a scanner configured to direct the emitted optical signal into a field of regard of the lidar system; a receiver configured to detect a portion of the emitted optical signal scattered by a target located a distance from the lidar system; and a processor configured to determine the distance from the lidar system to the target based on a round-trip time for at least a portion of the emitted optical signal to travel from the lidar system to the target and back to the lidar system.

Aspect 19A. The light source of aspect 1A, further comprising a fiber-optic amplifier configured to receive the emitted optical signal from the SOA and further amplify the emitted optical signal.

Aspect 20A. The light source of aspect 1A, wherein the light source further comprises an electronic driver configured to: supply a substantially constant electrical current to the seed laser diode so that the seed optical signal comprises light having a substantially constant optical power; and supply pulses of electrical current to the SOA so that the emitted optical signal comprises pulses of light, wherein each pulse of current causes the SOA to amplify a temporal portion of the seed optical signal to produce one of the emitted pulses of light.

Aspect 21A. A lidar system comprising: a light source configured to emit an optical signal, the light source comprising: a seed laser diode configured to produce a seed optical signal; a semiconductor optical amplifier (SOA) configured to amplify the seed optical signal to produce the emitted optical signal; and an optical isolator disposed between the seed laser diode and the SOA, wherein the optical isolator is configured to (i) transmit the seed optical signal to the SOA and (ii) reduce an amount of light that propagates from the SOA toward the seed laser diode; a scanner configured to direct the emitted optical signal into a field of regard of the lidar system; a receiver configured to detect a portion of the emitted optical signal scattered by a target located a distance from the lidar system; and a processor configured to determine the distance from the lidar system to the target based on a round-trip time for the portion of the emitted optical signal to travel from the lidar system to the target and back to the lidar system.

Aspect 22A. A lidar system comprising: a light source configured to emit (i) local-oscillator light and (ii) pulses of light, wherein each emitted pulse of light is coherent with a corresponding portion of the local-oscillator light, and wherein the light source comprises: a seed laser diode configured to produce a seed optical signal and the local-oscillator light; a semiconductor optical amplifier (SOA) configured to amplify temporal portions of the seed optical signal to produce the emitted pulses of light, wherein each amplified temporal portion of the seed optical signal corresponds to one of the emitted pulses of light; and an optical isolator disposed between the seed laser diode and the SOA, wherein the optical isolator is configured to (i) transmit the seed optical signal to the SOA and (ii) reduce an amount of light that propagates from the SOA toward the seed laser diode; a receiver configured to detect the local-oscillator light and a received pulse of light, the received pulse of light comprising light from one of the emitted pulses of light that is scattered by a target located a distance from the lidar system, wherein the local-oscillator light and the received pulse of light are coherently mixed together at the receiver; and a processor configured to determine the distance to the target based at least in part on a time-of-arrival for the received pulse of light.

Aspect 1B. A light source configured to emit an optical signal, the light source comprising: a seed laser diode configured to produce a seed optical signal; and a semiconductor optical amplifier (SOA) configured to amplify the seed optical signal to produce the emitted optical signal, wherein the SOA comprises: an optical waveguide extending along a longitudinal direction from an input end of the SOA to an output end of the SOA, wherein the optical waveguide is configured to guide and provide optical gain to the seed optical signal while the seed optical signal propagates in the longitudinal direction along the optical waveguide from the input end to the output end; and a Bragg grating disposed parallel to the optical waveguide, wherein the Bragg grating comprises a region of the SOA having a refractive index that varies along the longitudinal direction.

Aspect 2B. The light source of aspect 1B, wherein the refractive index varies periodically along the longitudinal direction.

Aspect 3B. The light source of aspect 1B, wherein the Bragg grating is configured to provide a distributed reflection of light within a particular wavelength range.

Aspect 4B. The light source of aspect 1B, wherein the Bragg grating is configured so that light within a particular wavelength range propagating along the optical waveguide receives greater optical gain from the optical waveguide than light outside of the particular wavelength range.

Aspect 5B. The light source of aspect 4B, wherein the particular wavelength range is centered at a wavelength of the seed optical signal and has a spectral width of less than 2 GHz.

Aspect 6B. The light source of aspect 4B, wherein: the emitted optical signal comprises pulses of light; and the particular wavelength range that receives greater optical gain from the optical waveguide corresponds to a spectral linewidth of the emitted pulses of light.

Aspect 7B. The light source of aspect 1B, wherein the light source is part of a lidar system, the lidar system comprising: a scanner configured to direct the emitted optical signal into a field of regard of the lidar system; a receiver configured to detect a portion of the emitted optical signal scattered by a target located a distance from the lidar system; and a processor configured to determine the distance from the lidar system to the target based on a round-trip time for the portion of the emitted optical signal to travel from the lidar system to the target and back to the lidar system.

Aspect 8B. The light source of aspect 7B, wherein the Bragg grating is configured so that light within a particular wavelength range propagating along the optical waveguide receives greater optical gain from the optical waveguide than light outside of the particular wavelength range, wherein a spectral width of the particular wavelength range corresponds to an electrical bandwidth of the receiver.

Aspect 9B. The light source of aspect 8B, wherein the spectral width of the particular wavelength range is less than 2 GHz and is approximately equal to the electrical bandwidth of the receiver.

Aspect 10B. The light source of aspect 8B, wherein the spectral width of the particular wavelength range is approximately 300 MHz, and the electrical bandwidth of the receiver is approximately 300 MHz.

Aspect 11B. The light source of aspect 7B, wherein: the Bragg grating is configured so that light within a particular wavelength range propagating along the optical waveguide receives greater optical gain from the optical waveguide than light outside of the particular wavelength range; the emitted optical signal comprises pulses of light; and a spectral linewidth of the pulses of light corresponds to an electrical bandwidth of the receiver.

Aspect 12B. The light source of aspect 11B, wherein the spectral linewidth of the pulses of light is less than 2 GHz and is approximately equal to the electrical bandwidth of the receiver.

Aspect 13B. The light source of aspect 11B, wherein the spectral linewidth of the pulses of light is approximately 300 MHz, and the electrical bandwidth of the receiver is approximately 300 MHz.

Aspect 14B. The light source of aspect 1B, wherein the optical waveguide is a tapered optical waveguide, wherein a width of the tapered optical waveguide increases from the input end to the output end.

Aspect 15B. The light source of aspect 1B, wherein the light source further comprises an electronic driver configured to: supply a substantially constant electrical current to the seed laser diode so that the seed optical signal comprises light having a substantially constant optical power; and supply pulses of electrical current to the SOA so that the emitted optical signal comprises pulses of light, wherein each pulse of current causes the SOA to amplify a temporal portion of the seed optical signal to produce one of the emitted pulses of light.

Aspect 16B. The light source of aspect 1B, further comprising a fiber-optic amplifier configured to receive the emitted optical signal from the SOA and further amplify the emitted optical signal.

Aspect 17B. A lidar system comprising: a light source configured to emit an optical signal, the light source comprising: a seed laser diode configured to produce a seed optical signal; and a semiconductor optical amplifier (SOA) configured to amplify the seed optical signal to produce the emitted optical signal, wherein the SOA comprises: an optical waveguide extending along a longitudinal direction from an input end of the SOA to an output end of the SOA, wherein the optical waveguide is configured to guide and provide optical gain to the seed optical signal while the seed optical signal propagates in the longitudinal direction along the optical waveguide from the input end to the output end; and a Bragg grating disposed parallel to the optical waveguide, wherein the Bragg grating comprises a region of the SOA having a refractive index that varies along the longitudinal direction; a scanner configured to direct the emitted optical signal into a field of regard of the lidar system; a receiver configured to detect a portion of the emitted optical signal scattered by a target located a distance from the lidar system; and a processor configured to determine the distance from the lidar system to the target based on a round-trip time for the portion of the emitted optical signal to travel from the lidar system to the target and back to the lidar system.

Aspect 18B. A lidar system comprising: a light source configured to emit (i) local-oscillator light and (ii) pulses of light, wherein each emitted pulse of light is coherent with a corresponding portion of the local-oscillator light, and wherein the light source comprises: a seed laser diode configured to produce a seed optical signal and the local-oscillator light; and a semiconductor optical amplifier (SOA) configured to amplify temporal portions of the seed optical signal to produce the emitted pulses of light, wherein each amplified temporal portion of the seed optical signal corresponds to one of the emitted pulses of light, and wherein the SOA comprises: an optical waveguide extending along a longitudinal direction from an input end to an output end of the SOA, wherein the optical waveguide is configured to guide and provide optical gain to the temporal portions of the seed optical signal while the temporal portions of the seed optical signal propagate in the longitudinal direction along the optical waveguide from the input end to the output end; and a Bragg grating disposed parallel to the optical waveguide, wherein the Bragg grating comprises a region of the SOA having a refractive index that varies along the longitudinal direction; a receiver configured to detect the local-oscillator light and a received pulse of light, the received pulse of light comprising light from one of the emitted pulses of light that is scattered by a target located a distance from the lidar system, wherein the local-oscillator light and the received pulse of light are coherently mixed together at the receiver; and a processor configured to determine the distance from the lidar system to the target based at least in part on a time-of-arrival for the received pulse of light.

Aspect 1C. A lidar system comprising: a light source configured to emit an optical signal; a receiver comprising one or more detectors configured to detect a portion of the emitted optical signal scattered by a target located a distance from the lidar system; a photonic integrated circuit (PIC) comprising an input optical element configured to receive the portion of the scattered optical signal and couple the portion of the scattered optical signal into an input optical waveguide, wherein the input optical waveguide is one of one or more optical waveguides of the PIC configured to convey the portion of the scattered optical signal to the one or more detectors of the receiver; and a processor configured to determine the distance from the lidar system to the target based on a round-trip time for the portion of the scattered optical signal to travel from the lidar system to the target and back to the lidar system.

Aspect 2C. The lidar system of aspect 1C, wherein the input optical element comprises a tapered optical waveguide comprising (i) an input end configured to receive the portion of the scattered optical signal and (ii) an output end configured to couple the portion of the scattered optical signal into the input optical waveguide, wherein a width of the tapered optical waveguide decreases from the input end to the output end.

Aspect 3C. The lidar system of aspect 2C, wherein the tapered optical waveguide has a taper angle of less than $\lambda/(W \cdot n)$, wherein $\lambda$ is a wavelength of the emitted optical signal, W is a width of the tapered optical waveguide at the input end, and n is a refractive index of the tapered optical waveguide.

Aspect 4C. The lidar system of aspect 2C, wherein the tapered optical waveguide is an adiabatic tapered optical waveguide.

Aspect 5C. The lidar system of aspect 2C, wherein at least a portion of a boundary of the tapered optical waveguide has a linear, sinusoidal, exponential, parabolic, or Gaussian shape.

Aspect 6C. The lidar system of aspect 2C, wherein the input end of the tapered optical waveguide comprises an anti-reflection coating configured to reduce a reflectivity of the input end at a wavelength of the emitted optical signal.

Aspect 7C. The lidar system of aspect 2C, further comprising an input lens attached to, connected to, or integrated with the PIC, wherein the input lens is configured to focus the portion of the scattered optical signal into the tapered optical waveguide via the input end.

Aspect 8C. The lidar system of aspect 1C, wherein the input optical element comprises a grating coupler comprising a diffraction grating having a periodic variation of refractive index.

Aspect 9C. The lidar system of aspect 8C, wherein the input optical element further comprises a tapered optical waveguide having an input end coupled to the diffraction grating and an output end coupled to the input optical waveguide.

Aspect 10C. The lidar system of aspect 1C, wherein the input optical element comprises one or more of a photonic crystal and a metamaterial.

Aspect 11C. The lidar system of aspect 1C, wherein the light source comprises a direct-emitter laser diode configured to produce the emitted optical signal.

Aspect 12C. The lidar system of aspect 1C, wherein the light source comprises: a seed laser diode configured to produce a seed optical signal; and a semiconductor optical amplifier (SOA) configured to amplify the seed optical signal to produce the emitted optical signal.

Aspect 13C. The lidar system of aspect 12C, wherein the light source further comprises a fiber-optic amplifier configured to receive the emitted optical signal from the SOA and further amplify the emitted optical signal.

Aspect 14C. The lidar system of aspect 1C, further comprising a scanner configured to direct the emitted optical signal into a field of regard of the lidar system.

Aspect 15C. A lidar system comprising: a light source configured to emit (i) local-oscillator light and (ii) pulses of light, wherein each emitted pulse of light is coherent with a corresponding portion of the local-oscillator light, and wherein the light source comprises: a seed laser diode configured to produce a seed optical signal and the local-oscillator light; and a semiconductor optical amplifier (SOA) configured to amplify temporal portions of the seed optical signal to produce the emitted pulses of light, wherein each amplified temporal portion of the seed optical signal corresponds to one of the emitted pulses of light; a receiver comprising one or more detectors configured to detect the local-oscillator light and a received pulse of light, the received pulse of light comprising light from one of the emitted pulses of light that is scattered by a target located a distance from the lidar system, wherein the local-oscillator light and the received pulse of light are coherently mixed together at the receiver; a photonic integrated circuit (PIC) comprising an input optical element configured to receive the received pulse of light and couple the received pulse of light into an input optical waveguide, wherein the input optical waveguide is one of one or more optical waveguides of the PIC configured to convey the local-oscillator light and the received pulse of light to the one or more detectors of the receiver; and a processor configured to determine the distance from the lidar system to the target based at least in part on a time-of-arrival for the received pulse of light.

Aspect 16C. The lidar system of aspect 15C, wherein the PIC further comprises an integrated-optic optical combiner configured to: combine the local-oscillator light and the received pulse of light; and direct a first portion of the combined light to a first output and direct a second portion of the combined light to a second output.

Aspect 17C. The lidar system of aspect 16C, wherein the one or more detectors comprise a first detector configured to detect the first portion of the combined light from the first output and a second detector configured to detect the second portion of the combined light from the second output.

Aspect 18C. A vehicle comprising: a lidar system configured to configured to provide information about an environment through which the vehicle is moving, the information comprising a distance to a target located within the environment, the lidar system comprising: a light source configured to emit an optical signal; a receiver comprising one or more detectors configured to detect a portion of the emitted optical signal scattered by the target; a photonic integrated circuit (PIC) comprising an input optical element configured to receive the portion of the scattered optical signal and couple the portion of the scattered optical signal into an input optical waveguide, wherein the input optical waveguide is one of one or more optical waveguides of the PIC configured to convey the portion of the scattered optical signal to the one or more detectors of the receiver; and a processor configured to determine the distance from the lidar system to the target based on a round-trip time for the portion of the scattered optical signal to travel from the lidar system to the target and back to the lidar system; and a vehicle navigation system configured to: receive the information about the environment through which the vehicle is moving; and provide instructions to one or more operational subsystems of the vehicle to assist in guiding the vehicle through the environment.

Aspect 19C. The vehicle of aspect 18C, wherein the vehicle navigation system is an advanced driver assistance system (ADAS), wherein the instructions provided to the operational subsystems are configured to assist a driver of the vehicle in operating the vehicle.

Aspect 20C. The vehicle of aspect 18C, wherein the vehicle navigation system is an autonomous-vehicle driving system, wherein the instructions provided to the operational subsystems are configured to autonomously guide the vehicle through the environment.

Figure 52:
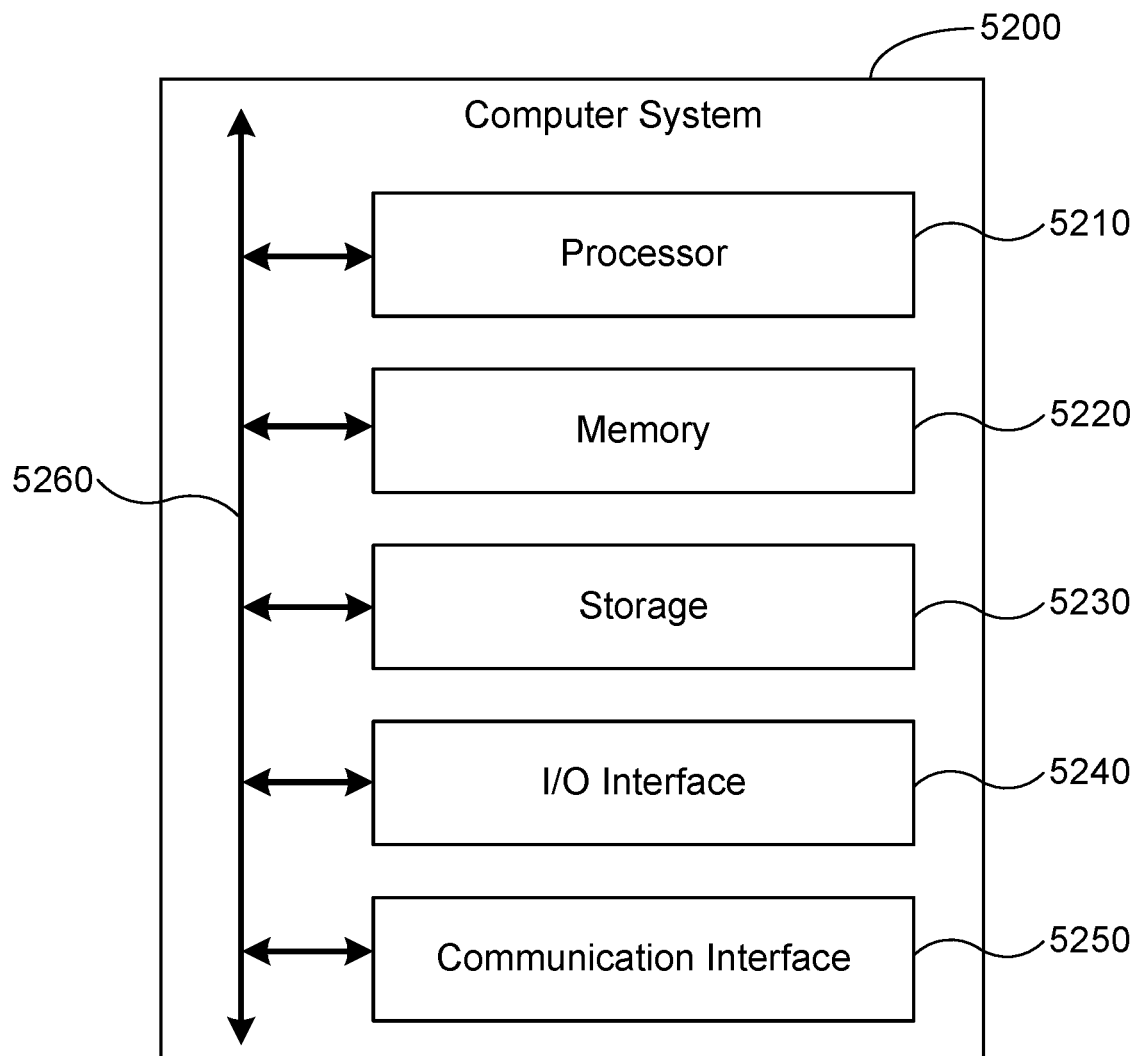
FIG. 52 illustrates an example computer system.

FIG. 52 illustrates an example computer system 5200. In particular embodiments, one or more computer systems 5200 may perform one or more steps of one or more methods described or illustrated herein. In particular embodiments, one or more computer systems 5200 may provide functionality described or illustrated herein. In particular embodiments, software running on one or more computer systems 5200 may perform one or more steps of one or more methods described or illustrated herein or may provide functionality described or illustrated herein. Particular embodiments may include one or more portions of one or more computer systems 5200. In particular embodiments, a computer system may be referred to as a processor, a controller, a computing device, a computing system, a computer, a general-purpose computer, or a data-processing apparatus. Herein, reference to a computer system may encompass one or more computer systems, where appropriate.

Computer system 5200 may take any suitable physical form. As an example, computer system 5200 may be an embedded computer system, a system-on-chip (SOC), a single-board computer system (SBC), a desktop computer system, a laptop or notebook computer system, a mainframe, a mesh of computer systems, a server, a tablet computer system, or any suitable combination of two or more of these. As another example, all or part of computer system 5200 may be combined with, coupled to, or integrated into a variety of devices, including, but not limited to, a camera, camcorder, personal digital assistant (PDA), mobile telephone, smartphone, electronic reading device (e.g., an e-reader), game console, smart watch, clock, calculator, television monitor, flat-panel display, computer monitor, vehicle display (e.g., odometer display or dashboard display), vehicle navigation system, lidar system, ADAS, autonomous vehicle, autonomous-vehicle driving system, cockpit control, camera view display (e.g., display of a rear-view camera in a vehicle), eyewear, or head-mounted display. Where appropriate, computer system 5200 may include one or more computer systems 5200; be unitary or distributed; span multiple locations; span multiple machines; span multiple data centers; or reside in a cloud, which may include one or more cloud components in one or more networks. Where appropriate, one or more computer systems 5200 may perform without substantial spatial or temporal limitation one or more steps of one or more methods described or illustrated herein. As an example, one or more computer systems 5200 may perform in real time or in batch mode one or more steps of one or more methods described or illustrated herein. One or more computer systems 5200 may perform at different times or at different locations one or more steps of one or more methods described or illustrated herein, where appropriate.

As illustrated in the example of FIG. 52, computer system 5200 may include a processor 5210, memory 5220, storage 5230, an input/output (I/O) interface 5240, a communication interface 5250, or a bus 5260. Computer system 5200 may include any suitable number of any suitable components in any suitable arrangement.

In particular embodiments, processor 5210 may include hardware for executing instructions, such as those making up a computer program. As an example, to execute instructions, processor 5210 may retrieve (or fetch) the instructions from an internal register, an internal cache, memory 5220, or storage 5230; decode and execute them; and then write one or more results to an internal register, an internal cache, memory 5220, or storage 5230. In particular embodiments, processor 5210 may include one or more internal caches for data, instructions, or addresses. Processor 5210 may include any suitable number of any suitable internal caches, where appropriate. As an example, processor 5210 may include one or more instruction caches, one or more data caches, or one or more translation lookaside buffers (TLBs). Instructions in the instruction caches may be copies of instructions in memory 5220 or storage 5230, and the instruction caches may speed up retrieval of those instructions by processor 5210. Data in the data caches may be copies of data in memory 5220 or storage 5230 for instructions executing at processor 5210 to operate on; the results of previous instructions executed at processor 5210 for access by subsequent instructions executing at processor 5210 or for writing to memory 5220 or storage 5230; or other suitable data. The data caches may speed up read or write operations by processor 5210. The TLBs may speed up virtual-address translation for processor 5210. In particular embodiments, processor 5210 may include one or more internal registers for data, instructions, or addresses. Processor 5210 may include any suitable number of any suitable internal registers, where appropriate. Where appropriate, processor 5210 may include one or more arithmetic logic units (ALUs); may be a multi-core processor; or may include one or more processors 5210.

In particular embodiments, memory 5220 may include main memory for storing instructions for processor 5210 to execute or data for processor 5210 to operate on. As an example, computer system 5200 may load instructions from storage 5230 or another source (such as, for example, another computer system 5200) to memory 5220. Processor 5210 may then load the instructions from memory 5220 to an internal register or internal cache. To execute the instructions, processor 5210 may retrieve the instructions from the internal register or internal cache and decode them. During or after execution of the instructions, processor 5210 may write one or more results (which may be intermediate or final results) to the internal register or internal cache. Processor 5210 may then write one or more of those results to memory 5220. One or more memory buses (which may each include an address bus and a data bus) may couple processor 5210 to memory 5220. Bus 5260 may include one or more memory buses. In particular embodiments, one or more memory management units (MMUs) may reside between processor 5210 and memory 5220 and facilitate accesses to memory 5220 requested by processor 5210. In particular embodiments, memory 5220 may include random access memory (RAM). This RAM may be volatile memory, where appropriate. Where appropriate, this RAM may be dynamic RAM (DRAM) or static RAM (SRAM). Memory 5220 may include one or more memories 5220, where appropriate.

In particular embodiments, storage 5230 may include mass storage for data or instructions. As an example, storage 5230 may include a hard disk drive (HDD), a floppy disk drive, flash memory, an optical disc, a magneto-optical disc, magnetic tape, or a Universal Serial Bus (USB) drive or a combination of two or more of these. Storage 5230 may include removable or non-removable (or fixed) media, where appropriate. Storage 5230 may be internal or external to computer system 5200, where appropriate. In particular embodiments, storage 5230 may be non-volatile, solid-state memory. In particular embodiments, storage 5230 may include read-only memory (ROM). Where appropriate, this ROM may be mask ROM (MROM), programmable ROM (PROM), erasable PROM (EPROM), electrically erasable PROM (EEPROM), flash memory, or a combination of two or more of these. Storage 5230 may include one or more storage control units facilitating communication between processor 5210 and storage 5230, where appropriate. Where appropriate, storage 5230 may include one or more storages 5230.

In particular embodiments, I/O interface 5240 may include hardware, software, or both, providing one or more interfaces for communication between computer system 5200 and one or more I/O devices. Computer system 5200 may include one or more of these I/O devices, where appropriate. One or more of these I/O devices may enable communication between a person and computer system 5200. As an example, an I/O device may include a keyboard, keypad, microphone, monitor, mouse, printer, scanner, speaker, camera, stylus, tablet, touch screen, trackball, another suitable I/O device, or any suitable combination of two or more of these. An I/O device may include one or more sensors. Where appropriate, I/O interface 5240 may include one or more device or software drivers enabling processor 5210 to drive one or more of these I/O devices. I/O interface 5240 may include one or more I/O interfaces 5240, where appropriate.

In particular embodiments, communication interface 5250 may include hardware, software, or both providing one or more interfaces for communication (such as, for example, packet-based communication) between computer system 5200 and one or more other computer systems 5200 or one or more networks. As an example, communication interface 5250 may include a network interface controller (NIC) or network adapter for communicating with an Ethernet or other wire-based network or a wireless NIC (WNIC); a wireless adapter for communicating with a wireless network, such as a WI-FI network; or an optical transmitter (e.g., a laser or a light-emitting diode) or an optical receiver (e.g., a photodetector) for communicating using fiber-optic communication or free-space optical communication. Computer system 5200 may communicate with an ad hoc network, a personal area network (PAN), an in-vehicle network (IVN), a local area network (LAN), a wide area network (WAN), a metropolitan area network (MAN), or one or more portions of the Internet or a combination of two or more of these. One or more portions of one or more of these networks may be wired or wireless. As an example, computer system 5200 may communicate with a wireless PAN (WPAN) (such as, for example, a BLUETOOTH WPAN), a WI-FI network, a Worldwide Interoperability for Microwave Access (WiMAX) network, a cellular telephone network (such as, for example, a Global System for Mobile Communications (GSM) network), or other suitable wireless network or a combination of two or more of these. As another example, computer system 5200 may communicate using fiber-optic communication based on 100 Gigabit Ethernet (100 GbE), 10 Gigabit Ethernet (10 GbE), or Synchronous Optical Networking (SONET). Computer system 5200 may include any suitable communication interface 5250 for any of these networks, where appropriate. Communication interface 5250 may include one or more communication interfaces 5250, where appropriate.

In particular embodiments, bus 5260 may include hardware, software, or both coupling components of computer system 5200 to each other. As an example, bus 5260 may include an Accelerated Graphics Port (AGP) or other graphics bus, a controller area network (CAN) bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local bus (VLB), or another suitable bus or a combination of two or more of these. Bus 5260 may include one or more buses 5260, where appropriate.

In particular embodiments, various modules, circuits, systems, methods, or algorithm steps described in connection with the implementations disclosed herein may be implemented as electronic hardware, computer software, or any suitable combination of hardware and software. In particular embodiments, computer software (which may be referred to as software, computer-executable code, computer code, a computer program, computer instructions, or instructions) may be used to perform various functions described or illustrated herein, and computer software may be configured to be executed by or to control the operation of computer system 5200. As an example, computer software may include instructions configured to be executed by processor 5210. In particular embodiments, owing to the interchangeability of hardware and software, the various illustrative logical blocks, modules, circuits, or algorithm steps have been described generally in terms of functionality. Whether such functionality is implemented in hardware, software, or a combination of hardware and software may depend upon the particular application or design constraints imposed on the overall system.

In particular embodiments, a computing device may be used to implement various modules, circuits, systems, methods, or algorithm steps disclosed herein. As an example, all or part of a module, circuit, system, method, or algorithm disclosed herein may be implemented or performed by a general-purpose single- or multi-chip processor, a digital signal processor (DSP), an ASIC, a FPGA, any other suitable programmable-logic device, discrete gate or transistor logic, discrete hardware components, or any suitable combination thereof. A general-purpose processor may be a microprocessor, or, any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In particular embodiments, one or more implementations of the subject matter described herein may be implemented as one or more computer programs (e.g., one or more modules of computer-program instructions encoded or stored on a computer-readable non-transitory storage medium). As an example, the steps of a method or algorithm disclosed herein may be implemented in a processor-executable software module which may reside on a computer-readable non-transitory storage medium. In particular embodiments, a computer-readable non-transitory storage medium may include any suitable storage medium that may be used to store or transfer computer software and that may be accessed by a computer system. Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs (e.g., compact discs (CDs), CD-ROM, digital versatile discs (DVDs), blu-ray discs, or laser discs), optical disc drives (ODDs), magneto-optical discs, magneto-optical drives, floppy diskettes, floppy disk drives (FDDs), magnetic tapes, flash memories, solid-state drives (SSDs), RAM, RAM-drives, ROM, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

In particular embodiments, certain features described herein in the context of separate implementations may also be combined and implemented in a single implementation. Conversely, various features that are described in the context of a single implementation may also be implemented in multiple implementations separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

While operations may be depicted in the drawings as occurring in a particular order, this should not be understood as requiring that such operations be performed in the particular order shown or in sequential order, or that all operations be performed. Further, the drawings may schematically depict one more example processes or methods in the form of a flow diagram or a sequence diagram. However, other operations that are not depicted may be incorporated in the example processes or methods that are schematically illustrated. For example, one or more additional operations may be performed before, after, simultaneously with, or between any of the illustrated operations. Moreover, one or more operations depicted in a diagram may be repeated, where appropriate. Additionally, operations depicted in a diagram may be performed in any suitable order. Furthermore, although particular components, devices, or systems are described herein as carrying out particular operations, any suitable combination of any suitable components, devices, or systems may be used to carry out any suitable operation or combination of operations. In certain circumstances, multitasking or parallel processing operations may be performed. Moreover, the separation of various system components in the implementations described herein should not be understood as requiring such separation in all implementations, and it should be understood that the described program components and systems may be integrated together in a single software product or packaged into multiple software products.

Various embodiments have been described in connection with the accompanying drawings. However, it should be understood that the figures may not necessarily be drawn to scale. As an example, distances or angles depicted in the figures are illustrative and may not necessarily bear an exact relationship to actual dimensions or layout of the devices illustrated.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes or illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend.

The term "or" as used herein is to be interpreted as an inclusive or meaning any one or any combination, unless expressly indicated otherwise or indicated otherwise by context. Therefore, herein, the expression "A or B" means "A, B, or both A and B." As another example, herein, "A, B or C" means at least one of the following: A; B; C; A and B; A and C; B and C; A, B and C. An exception to this definition will occur if a combination of elements, devices, steps, or operations is in some way inherently mutually exclusive.

As used herein, words of approximation such as, without limitation, "approximately, "substantially," or "about" refer to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as having the required characteristics or capabilities of the unmodified feature. In general, but subject to the preceding discussion, a numerical value herein that is modified by a word of approximation such as "approximately" may vary from the stated value by ±0.5%, ±1%, ±2%, ±3%, ±4%, ±5%, ±10%, ±12%, or ±15%. The term "substantially constant" refers to a value that varies by less than a particular amount over any suitable time interval. For example, a value that is substantially constant may vary by less than or equal to 20%, 10%, 1%, 0.5%, or 0.1% over a time interval of approximately $10^4$ s, $10^3$ s, $10^2$ s, 10 s, 1 s, 100 ms, 10 ms, 1 ms, 100 µs, 10 µs, or 1 µs. The term "substantially constant" may be applied to any suitable value, such as for example, an optical power, a pulse repetition frequency, an electrical current (e.g., a DC seed current $I_1$ supplied to a seed laser diode 450), a wavelength, an optical or electrical frequency, or an optical or electrical phase.

As used herein, the terms "first," "second," "third," etc. may be used as labels for nouns that they precede, and these terms may not necessarily imply a particular ordering (e.g., a particular spatial, temporal, or logical ordering). As an example, a system may be described as determining a "first result" and a "second result," and the terms "first" and "second" may not necessarily imply that the first result is determined before the second result.

As used herein, the terms "based on" and "based at least in part on" may be used to describe or present one or more factors that affect a determination, and these terms may not exclude additional factors that may affect a determination. A determination may be based solely on those factors which are presented or may be based at least in part on those factors. The phrase "determine A based on B" indicates that B is a factor that affects the determination of A. In some instances, other factors may also contribute to the determination of A. In other instances, A may be determined based solely on B.

What is claimed is:

1. A light source configured to emit an optical signal, the light source comprising:
    a seed laser diode configured to produce a seed optical signal;
    a semiconductor optical amplifier (SOA) configured to amplify the seed optical signal to produce the emitted optical signal;
    an optical isolator disposed between the seed laser diode and the SOA, wherein the optical isolator is configured to (i) transmit the seed optical signal to the SOA and (ii) reduce an amount of light that propagates from the SOA toward the seed laser diode; and
    an optical splitter disposed between the optical isolator and the SOA, wherein the optical splitter is configured to split off a portion of the seed optical signal to produce a local-oscillator light signal.

2. The light source of claim 1, wherein the optical isolator is a free-space isolator configured to transmit the seed optical signal as a free-space optical beam.

3. The light source of claim 1, wherein the optical isolator is a fiber-optic isolator comprising (i) an input optical fiber that directs the seed optical signal from the seed laser diode to the fiber-optic isolator and (ii) an output optical fiber that directs the seed optical signal from the fiber-optic isolator to the SOA.

4. The light source of claim 1, wherein the optical isolator is an integrated-optic isolator comprising one or more Faraday-rotator materials disposed within or adjacent to one or more optical waveguides of the isolator.

5. The light source of claim 4, wherein the one or more Faraday-rotator materials include one or more of: a terbium-doped glass, a terbium-gallium-garnet (TGG) crystal, a yttrium-iron-garnet (YIG) crystal, a cerium-doped YIG crystal (Ce:YIG), and a bismuth-doped YIG crystal (Bi:YIG).

6. The light source of claim 1, wherein the optical isolator comprises an optical filter with an optical pass-band width that is greater than 500 kHz and less than 1 GHz, wherein the optical pass-band is centered at a wavelength of the seed optical signal.

7. The light source of claim 1, wherein the optical isolator reducing the amount of light that propagates from the SOA toward the seed laser diode corresponds to the optical isolator absorbing, reflecting, filtering, or deflecting greater than 90% of the light that propagates from the SOA toward the seed laser diode.

8. The light source of claim 1, wherein the light that propagates from the SOA toward the seed laser diode comprises one or more of: amplified spontaneous emission (ASE) light produced by the SOA, a portion of light from the seed optical signal reflected by an input end of the SOA, a portion of light from the seed optical signal reflected by an output end of the SOA, and a portion of light from the emitted optical signal reflected by an optical element external to the SOA.

9. The light source of claim 1, wherein the SOA comprises (i) an input end configured to receive the seed optical signal and (ii) an output end configured to emit the optical signal, wherein the output end comprises an anti-reflection coating configured to reduce a reflectivity of the output end at a wavelength of the emitted optical signal.

10. The light source of claim 1, wherein the SOA comprises a tapered optical waveguide extending from an input end of the SOA to an output end of the SOA, wherein a width of the tapered optical waveguide increases from the input end to the output end.

11. The light source of claim 1, further comprising a fiber-optic amplifier configured to receive the emitted optical signal from the SOA and further amplify the emitted optical signal.

12. The light source of claim 1, wherein the light source further comprises an electronic driver configured to:
    supply a substantially constant electrical current to the seed laser diode so that the seed optical signal comprises light having a substantially constant optical power; and
    supply pulses of electrical current to the SOA so that the emitted optical signal comprises pulses of light, wherein each pulse of current causes the SOA to amplify a temporal portion of the seed optical signal to produce one of the emitted pulses of light.

13. A lidar system comprising:
    a light source configured to emit an optical signal, the light source comprising:
        a seed laser diode configured to produce a seed optical signal;
        a semiconductor optical amplifier (SOA) configured to amplify the seed optical signal to produce the emitted optical signal;
        an optical isolator disposed between the seed laser diode and the SOA, wherein the optical isolator is configured to (i) transmit the seed optical signal to the SOA and (ii) reduce an amount of light that propagates from the SOA toward the seed laser diode; and
        an optical splitter disposed between the optical isolator and the SOA, wherein the optical splitter is configured to split off a portion of the seed optical signal to produce a local-oscillator light signal;
a scanner configured to direct the emitted optical signal into a field of regard of the lidar system;
a receiver configured to detect a portion of the emitted optical signal scattered by a target located a distance from the lidar system; and
a processor configured to determine the distance from the lidar system to the target based on a round-trip time for the portion of the emitted optical signal to travel from the lidar system to the target and back to the lidar system.

14. A lidar system comprising:
a light source configured to emit (i) local-oscillator light and (ii) pulses of light, wherein each emitted pulse of light is coherent with a corresponding portion of the local-oscillator light, and wherein the light source comprises:
  a seed laser diode configured to produce a seed optical signal and the local-oscillator light;
  a semiconductor optical amplifier (SOA) configured to amplify temporal portions of the seed optical signal to produce the emitted pulses of light, wherein each amplified temporal portion of the seed optical signal corresponds to one of the emitted pulses of light; and
  an optical isolator disposed between the seed laser diode and the SOA, wherein the optical isolator is configured to (i) transmit the seed optical signal to the SOA and (ii) reduce an amount of light that propagates from the SOA toward the seed laser diode,
a receiver configured to detect the local-oscillator light and a received pulse of light, the received pulse of light comprising light from one of the emitted pulses of light that is scattered by a target located a distance from the lidar system, wherein the local-oscillator light and the received pulse of light are coherently mixed together at the receiver; and
a processor configured to determine the distance to the target based at least in part on a time-of-arrival for the received pulse of light.

15. A light source configured to emit an optical signal, the light source comprising:
a seed laser diode configured to produce a seed optical signal;
a semiconductor optical amplifier (SOA) configured to amplify the seed optical signal to produce the emitted optical signal; and
an optical isolator disposed between the seed laser diode and the SOA, wherein:
  the optical isolator is configured to (i) transmit the seed optical signal to the SOA and (ii) reduce an amount of light that propagates from the SOA toward the seed laser diode, and
  the optical isolator comprises an optical filter with an optical pass-band width that is (i) greater than a spectral linewidth of a single longitudinal mode of the seed optical signal and (ii) less than a spectral linewidth of the emitted optical signal.

16. The light source of claim 15, wherein the optical filter comprises a Bragg grating disposed within or adjacent to an optical waveguide or an optical fiber configured to transmit the seed optical signal.

17. A light source configured to emit an optical signal, the light source comprising:
a seed laser diode configured to produce a seed optical signal;
a semiconductor optical amplifier (SOA) configured to amplify the seed optical signal to produce the emitted optical signal,
an optical isolator disposed between the seed laser diode and the SOA, wherein:
  the optical isolator is configured to (i) transmit the seed optical signal to the SOA and (ii) reduce an amount of light that propagates from the SOA toward the seed laser diode, and
  the optical isolator comprises an active optical waveguide;
an electronic driver configured to supply pulses of electrical current to the active optical waveguide, wherein:
  each pulse of current causes the active optical waveguide to transmit a temporal portion of the seed optical signal to the SOA; and
  between successive pulses of current, the active optical waveguide is configured to absorb light at a wavelength of the seed optical signal.

18. The light source of claim 17, wherein the electronic driver is further configured to:
supply a substantially constant electrical current to the seed laser diode so that the seed optical signal comprises light having a substantially constant optical power; and
supply pulses of electrical current to the SOA so that the emitted optical signal comprises pulses of light, wherein:
  the pulses of current supplied to the SOA are supplied synchronously with the pulses of current supplied to the active optical waveguide; and
  each pulse of current supplied to the SOA causes the SOA to amplify the temporal portion of the seed optical signal transmitted by the active optical waveguide to produce one of the emitted pulses of light.

19. A light source configured to emit an optical signal, the light source comprising:
a seed laser diode configured to produce a seed optical signal;
a semiconductor optical amplifier (SOA) configured to amplify the seed optical signal to produce the emitted optical signal, wherein the SOA comprises (i) an input end configured to receive the seed optical signal, (ii) an output end configured to emit the optical signal, and (iii) a waveguide extending from the input end to the output end, wherein:
  the seed optical signal is amplified while propagating through the waveguide from the input end to the output end, and
  the output end is angled so that the amplified seed optical signal is incident on the output end with a nonzero angle of incidence;
an optical isolator disposed between the seed laser diode and the SOA, wherein the optical isolator is configured to (i) transmit the seed optical signal to the SOA and (ii) reduce an amount of light that propagates from the SOA toward the seed laser diode.

20. The light source of claim 19, wherein the angled output end is configured to reduce an amount of light from the amplified seed optical signal that reflects from the output end and subsequently propagates along the waveguide back toward the input end.

21. The lidar system of claim 15, wherein the optical isolator is a free-space isolator configured to transmit the seed optical signal as a free-space optical beam.

22. The lidar system of claim 15, wherein the optical isolator is a fiber-optic isolator comprising (i) an input optical fiber that directs the seed optical signal from the seed laser diode to the fiber-optic isolator and (ii) an output optical fiber that directs the seed optical signal from the fiber-optic isolator to the SOA.

23. The lidar system of claim 15, wherein the SOA comprises a tapered optical waveguide extending from an input end of the SOA to an output end of the SOA, wherein a width of the tapered optical waveguide increases from the input end to the output end.

24. The lidar system of claim 15, further comprising a fiber-optic amplifier configured to receive the emitted optical signal from the SOA and further amplify the emitted optical signal.

25. The lidar system of claim 14, wherein the optical isolator is a free-space isolator configured to transmit the seed optical signal as a free-space optical beam.

26. The lidar system of claim 14, wherein the optical isolator is a fiber-optic isolator comprising (i) an input optical fiber that directs the seed optical signal from the seed laser diode to the fiber-optic isolator and (ii) an output optical fiber that directs the seed optical signal from the fiber-optic isolator to the SOA.

27. The lidar system of claim 14, wherein the SOA comprises a tapered optical waveguide extending from an input end of the SOA to an output end of the SOA, wherein a width of the tapered optical waveguide increases from the input end to the output end.

28. The lidar system of claim 14, further comprising a fiber-optic amplifier configured to receive the emitted optical signal from the SOA and further amplify the emitted optical signal.

\* \* \* \* \*